US010924136B2

(12) United States Patent
Yamamoto et al.

(10) Patent No.: US 10,924,136 B2

(45) Date of Patent: Feb. 16, 2021

(54) TRANSMISSION DEVICE, TRANSMISSION METHOD, RECEPTION DEVICE, AND RECEPTION METHOD

(71) Applicant: SONY CORPORATION, Tokyo (JP)

(72) Inventors: Makiko Yamamoto, Tokyo (JP); Yuji Shinohara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/606,935

(22) PCT Filed: May 17, 2018

(86) PCT No.: PCT/JP2018/019107

§ 371 (c)(1),
(2) Date: Oct. 21, 2019

(87) PCT Pub. No.: WO2018/221243

PCT Pub. Date: Dec. 6, 2018

(65) Prior Publication Data

US 2020/0204195 A1 Jun. 25, 2020

(30) Foreign Application Priority Data

May 31, 2017 (JP) ............................ JP2017-107534

(51) Int. Cl.
*H03M 13/00* (2006.01)
*H03M 13/11* (2006.01)

(52) U.S. Cl.
CPC ..... *H03M 13/1148* (2013.01); *H03M 13/616* (2013.01)

(58) Field of Classification Search
None
See application file for complete search history.

(56) References Cited

U.S. PATENT DOCUMENTS

2009/0204869 A1* 8/2009 Myung ............... H03M 13/618 714/752
2010/0211847 A1* 8/2010 Livshitz ................ H04L 1/0068 714/752

(Continued)

FOREIGN PATENT DOCUMENTS

EP 3148090 A1 3/2017
EP 3633860 A1 4/2020

(Continued)

OTHER PUBLICATIONS

Zhu Miao, Fei Zesong, Zhao Shenghui and Kuang Jingming, "Construction and performance analysis of moderate-length rate-compatible LDPC codes," 2005 IEEE International Symposium on Microwave, Antenna, Propagation and EMC Technologies for Wireless Communications, Beijing, 2005, pp. 1088-1091 vol. 2, (Year: 2005).*

(Continued)

*Primary Examiner* — Daniel F. McMahon
(74) *Attorney, Agent, or Firm* — Chip Law Group

(57) ABSTRACT

The present technology relates to a transmission device, a transmission method, a reception device, and a reception method for securing good communication quality in data transmission using an LDPC code. LDPC coding for information bits with an information length K=N×r is performed on the basis of an extended parity check matrix having rows and columns each extended by a predetermined puncture length L with respect to a parity check matrix of an LDPC code with a code length N of 69120 bits and a coding rate r of 14/16, so that an extended LDPC code having parity bits with a parity length M=N+L−K is generated. Then, a head of the information bits of the extended LDPC code is punctured by a puncture length L, so that a punctured LDPC code with the code length N of 69120 bits and the coding rate r is generated. The extended parity check matrix (Continued)

includes an information matrix portion corresponding to the information bits and a parity matrix portion corresponding to the parity bits. The present technology can be applied to, for example, data transmission using an LDPC code.

24 Claims, 116 Drawing Sheets

(56) References Cited

U.S. PATENT DOCUMENTS

| | | | | |
|---|---|---|---|---|
| 2011/0197105 | A1* | 8/2011 | Murakami | H03M 13/116 714/752 |
| 2016/0164540 | A1 | 6/2016 | Shinohara et al. | |

FOREIGN PATENT DOCUMENTS

| | | | |
|---|---|---|---|
| JP | 2012-054681 | A | 3/2012 |
| JP | 2018-207198 | A | 12/2018 |
| WO | 2015/178216 | A1 | 11/2015 |
| WO | 2018/221242 | A1 | 12/2018 |

OTHER PUBLICATIONS

"Physical Layer Protocol", Advanced Television Systems Committee (ATSC Standard), Document: A/322:2016, Sep. 7, 2016, 258 pages.
Kim, et al., "Low-Density Parity-Check Codes for ATSC 3.0", IEEE Transaction on Broadcasting, vol. 62, No. 1, Feb. 24, 2016, pp. 189-196.
"Frame structure channel coding and modulation for a second generation digital terrestrial television broadcasting system", Digital Video Broadcasting (DVB-T2), European Standard Telecommunications series, ETSI EN 302 755 V1.3.1, Apr. 2012, 18 pages.
Xu, et al., Improved Shortening Algorithm for Irregular QC-LDPC Codes Using Known Bits, IEEE Transactions on Consumer Electronics, vol. 57, No. 3, Sep. 15, 2011, pp. 1057-1063.
Jayasooriya, et al., "A New Density Evolution Approximation for LDPC and Multi-Edge Type LDPC Codes", IEEE Transactions on Communications, vol. 64, No. 10, Aug. 16, 2016, pp. 4044-4056.
Zhang, et al., "Progressive Matrix Growth Algorithm for Constructing Rate-Compatible Length-Scalable Raptor-Like Quasi-Cyclic LDPC Codes", IEEE Transactions on Broadcasting, vol. 64, No. 10, Jan. 23, 2018, pp. 816-829.
"ATSC Standard: Physical Layer Protocol (A/322)", Advanced Television Systems Committee, Sep. 7, 2016, 258 pages.
International Search Report and Written Opinion of PCT Application No. PCT/JP2018/019107, dated Aug. 7, 2018, 09 pages of ISRWO.
Kim, et al., "Low-Density Parity-Check Codes for ATSC 3.0", IEEE Transactions on Broadcasting, vol. 62, No. 1, Mar. 2016, pp. 189-196.
"LDPC Code Design for NR", 3GPP TSG RAN WG1 Meeting #86, R1-1 66929, Ericsson, Gothenburg, Sweden, Aug. 22-26, 2016, 10 pages.
"ATSC Standard: Physical Layer Protocol (A1322)", ATSC Standard, Sep. 7, 2016, 60 pages.
Nippon Hoso Kyokai: "1.9 Terrestrial 1-12 Broadcasting Transmission Technology, Annual Report 2017", NHK Science & Technology Research Laboratories, vol. 2017, Jan. 1, 2017, 60 pages.
"Rate matching design of LDPC code", 3GPP TSG RAN WG1 #88, R1- 1702493, LG Electronics, Athens, Greece Feb. 13-17, 2017, 4 pages.
Extended European Search Report of EP Application No. 18808931.2, dated Apr. 29, 2020, 14 pages.

* cited by examiner

FIG. 3

$$H=\begin{bmatrix} 1&1&1&0&0&0&1&0&1&1&0&0\\ 1&1&0&1&1&0&0&0&0&0&1&1\\ 0&0&1&1&1&1&1&0&0&1&0&0\\ 0&0&0&1&1&1&0&1&1&0&0&1\\ 1&1&0&0&0&1&0&1&0&1&1&0\\ 0&0&1&0&0&0&1&1&1&0&1&1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal CODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | – | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | ---- | ---- | ---- | ---- |

STEP STRUCTURE OF PARITY MATRIX

STEP STRUCTURE PORTION OF Tanner Graph r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 21

ROW NUMBER OF PARITY CHECK MATRIX (INFORMATION MATRIX $H_A$) OF EVERY OTHER 360 COLUMNS FROM FIRST COLUMN IS DISPLAYED

ROW NUMBER OF PARITY CHECK MATRIX

1ST COLUMN OF $H_A$
361ST COLUMN OF $H_A$
721ST COLUMN OF $H_A$
1081ST COLUMN OF $H_A$ 0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

$h_{3,5}$ (the boxed value 2650)

PARITY CHECK MATRIX INITIAL VALUE TABLE 2 6 18
2 10 19
22
19
15

FIG. 32

| Input Data Cell y | Constellation Point $z_s$ |
|---|---|
| 00 | $(1+j1)/\sqrt{2}$ |
| 01 | $(-1+j1)/\sqrt{2}$ |
| 10 | $(+1-j1)/\sqrt{2}$ |
| 11 | $(-1-j1)/\sqrt{2}$ |

FIG. 33

| w/CR | 2/15 | 3/15 | 4/15 | 5/15 | 6/15 | 7/15 |
|---|---|---|---|---|---|---|
| w0 | 0. 7062+j0. 7075 | 0. 3620+j0. 5534 | 0. 3412+j0. 5241 | 0. 3192+j0. 5011 | 0. 5115+j1. 2092 | 0. 2592+j0. 4888 |
| w1 | 0. 7075+j0. 7062 | 0. 5534+j0. 3620 | 0. 5241+j0. 3412 | 0. 5011+j0. 3192 | 1. 2092+j0. 5115 | 0. 4888+j0. 2592 |
| w2 | 0. 7072+j0. 7077 | 0. 5940+j1. 1000 | 0. 5797+j1. 1282 | 0. 5575+j1. 1559 | 0. 2663+j0. 4530 | 0. 5072+j1. 1980 |
| w3 | 0. 7077+j0. 7072 | 1. 1000+j0. 5940 | 1. 1282+j0. 5797 | 1. 1559+j0. 5575 | 0. 4530+j0. 2663 | 1. 1980+j0. 5072 |

| w/CR | 8/15 | 9/15 | 10/15 | 11/15 | 12/15 | 13/15 |
|---|---|---|---|---|---|---|
| w0 | 0. 2535+j0. 4923 | 0. 2386+j0. 5296 | 0. 4487+j1. 1657 | 0. 9342+j0. 9847 | 0. 9555+j0. 9555 | 0. 9517+j0. 9511 |
| w1 | 0. 4923+j0. 2535 | 0. 5296+j0. 2386 | 1. 2080+j0. 5377 | 0. 9866+j0. 2903 | 0. 9555+j0. 2949 | 0. 9524+j0. 3061 |
| w2 | 0. 4927+j1. 2044 | 0. 4882+j1. 1934 | 0. 2213+j0. 4416 | 0. 2716+j0. 9325 | 0. 2949+j0. 9555 | 0. 3067+j0. 9524 |
| w3 | 1. 2044+j0. 4927 | 1. 1934+j0. 4882 | 0. 6186+j0. 2544 | 0. 2901+j0. 2695 | 0. 2949+j0. 2949 | 0. 3061+j0. 3067 |

FIG. 34

| u/CR | 2/15 | 3/15 | 4/15 | 5/15 | 6/15 | 7/15 |
|---|---|---|---|---|---|---|
| u0 | 0.3317 | 0.2382 | 0.1924 | 0.1313 | 0.1275 | 0.0951 |
| u1 | 0.3321 | 0.2556 | 0.1940 | 0.1311 | 0.1276 | 0.0949 |
| u2 | 0.3322 | 0.2749 | 0.2070 | 0.1269 | 0.1294 | 0.1319 |
| u3 | 0.3321 | 0.2558 | 0.2050 | 0.1271 | 0.1295 | 0.1322 |
| u4 | 0.3327 | 0.2748 | 0.3056 | 0.3516 | 0.3424 | 0.3170 |
| u5 | 0.3328 | 0.2949 | 0.3096 | 0.3504 | 0.3431 | 0.3174 |
| u6 | 0.3322 | 0.2749 | 0.2890 | 0.3569 | 0.3675 | 0.3936 |
| u7 | 0.3322 | 0.2558 | 0.2854 | 0.3581 | 0.3666 | 0.3921 |
| u8 | 0.9369 | 0.9486 | 0.7167 | 0.6295 | 0.6097 | 0.5786 |
| u9 | 0.9418 | 0.8348 | 0.7362 | 0.6301 | 0.6072 | 0.5789 |
| u10 | 0.9514 | 0.7810 | 0.7500 | 0.6953 | 0.7113 | 0.7205 |
| u11 | 0.9471 | 0.8348 | 0.7326 | 0.6903 | 0.7196 | 0.7456 |
| u12 | 0.9448 | 0.9463 | 0.9667 | 0.9753 | 0.9418 | 0.9299 |
| u13 | 0.9492 | 0.8336 | 0.9665 | 1.0185 | 1.0048 | 1.0084 |
| u14 | 0.9394 | 0.9459 | 1.1332 | 1.2021 | 1.2286 | 1.2349 |
| u15 | 0.9349 | 1.4299 | 1.4761 | 1.4981 | 1.5031 | 1.5118 |

| u/CR | 8/15 | 9/15 | 10/15 | 11/15 | 12/15 | 13/15 |
|---|---|---|---|---|---|---|
| u0 | 0.0773 | 0.0638 | 0.0592 | 0.0502 | 0.0354 | 0.0325 |
| u1 | 0.0773 | 0.0638 | 0.0594 | 0.0637 | 0.0921 | 0.0967 |
| u2 | 0.1614 | 0.1757 | 0.1780 | 0.1615 | 0.1602 | 0.1623 |
| u3 | 0.1614 | 0.1756 | 0.1790 | 0.1842 | 0.2185 | 0.2280 |
| u4 | 0.3086 | 0.3069 | 0.2996 | 0.2760 | 0.2910 | 0.2957 |
| u5 | 0.3085 | 0.3067 | 0.3041 | 0.3178 | 0.3530 | 0.3645 |
| u6 | 0.4159 | 0.4333 | 0.4241 | 0.4040 | 0.4264 | 0.4361 |
| u7 | 0.4163 | 0.4343 | 0.4404 | 0.4586 | 0.4947 | 0.5100 |
| u8 | 0.5810 | 0.5765 | 0.5561 | 0.5535 | 0.5763 | 0.5878 |
| u9 | 0.5872 | 0.5862 | 0.6008 | 0.6362 | 0.6531 | 0.6696 |
| u10 | 0.7213 | 0.7282 | 0.7141 | 0.7293 | 0.7417 | 0.7566 |
| u11 | 0.7604 | 0.7705 | 0.8043 | 0.8302 | 0.8324 | 0.8497 |
| u12 | 0.9212 | 0.9218 | 0.9261 | 0.9432 | 0.9386 | 0.9498 |
| u13 | 1.0349 | 1.0364 | 1.0639 | 1.0704 | 1.0529 | 1.0588 |
| u14 | 1.2281 | 1.2234 | 1.2285 | 1.2158 | 1.1917 | 1.1795 |
| u15 | 1.4800 | 1.4646 | 1.4309 | 1.3884 | 1.3675 | 1.3184 |

FIG. 35A

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(Z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(Z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 35B

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(Z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(Z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 36

| | | |
|---|---|---|
| $y_{0,q}$ | 1 | 0 |
| $Re(z_q)$ | −1 | 1 |

FIG. 37

| | | |
|---|---|---|
| $y_{1,q}$ | 1 | 0 |
| $Im(z_q)$ | −1 | 1 |

FIG. 38

| | | | | |
|---|---|---|---|---|
| $y_{0,q}$<br>$y_{2,q}$ | 1<br>0 | 1<br>1 | 0<br>1 | 0<br>0 |
| $Re(z_q)$ | −3 | −1 | 1 | 3 |

FIG. 39

| | | | | |
|---|---|---|---|---|
| $y_{1,q}$<br>$y_{3,q}$ | 1<br>0 | 1<br>1 | 0<br>1 | 0<br>0 |
| $Im(z_q)$ | −3 | −1 | 1 | 3 |

FIG. 40

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

FIG. 41

| | | | | | | | | |
|---|---|---|---|---|---|---|---|---|
| $y_{1,q}$<br>$y_{3,q}$<br>$y_{5,q}$ | 1<br>0<br>0 | 1<br>0<br>1 | 1<br>1<br>1 | 1<br>1<br>0 | 0<br>1<br>0 | 0<br>1<br>1 | 0<br>0<br>1 | 0<br>0<br>0 |
| $Im(z_q)$ | −7 | −5 | −3 | −1 | 1 | 3 | 5 | 7 |

FIG. 42

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

FIG. 43

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

FIG. 44

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

FIG. 45

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

FIG. 46

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −63 | −61 | −59 | −57 | −55 | −53 | −51 | −49 | −47 | −45 | −43 | −41 | −39 | −37 | −35 | −33 |
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

FIG. 47

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_Q)$ | −63 | −61 | −59 | −57 | −55 | −53 | −51 | −49 | −47 | −45 | −43 | −41 | −39 | −37 | −35 | −33 |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_Q)$ | −31 | −29 | −27 | −25 | −23 | −21 | −19 | −17 | −15 | −13 | −11 | −9 | −7 | −5 | −3 | −1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_Q)$ | 1 | 3 | 5 | 7 | 9 | 11 | 13 | 15 | 17 | 19 | 21 | 23 | 25 | 27 | 29 | 31 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_Q)$ | 33 | 35 | 37 | 39 | 41 | 43 | 45 | 47 | 49 | 51 | 53 | 55 | 57 | 59 | 61 | 63 |

FIG. 48

| w/CR | 2/16 | 4/16 | 6/16 | 8/16 | 10/16 | 12/16 | 14/16 |
|---|---|---|---|---|---|---|---|
| w0 | 0.707107+j0.707107 | 0.707107+j0.707107 | 0.483340+j0.284181 | 0.457029+j0.284235 | 0.493628+j0.253004 | 0.418817+j0.217283 | 0.297592+j0.297592 |
| w1 | 0.707107+j0.707107 | 0.707107+j0.707107 | 0.284181+j0.483340 | 0.284235+j0.457029 | 0.253004+j0.493628 | 0.257090+j0.657759 | 0.297592+j0.954693 |
| w2 | 0.707107+j0.707107 | 0.707107+j0.707107 | 1.182750+j0.530940 | 1.210202+j0.506671 | 1.204042+j0.492548 | 1.144505+j0.432808 | 0.954693+j0.297592 |
| w3 | 0.707107+j0.707107 | 0.707107+j0.707107 | 0.530940+j1.182750 | 0.506671+j1.210202 | 0.492548+j1.204042 | 0.566917+j1.209827 | 0.954693+j0.954693 |

FIG. 49

| w/CR | 3/16 | 5/16 | 7/16 | 9/16 | 11/16 | 13/16 |
|---|---|---|---|---|---|---|
| w0 | 0.587870+j0.405339 | 0.453023+j0.268260 | 0.541390+j0.300280 | 0.608698+j0.348004 | 0.611105+j0.349327 | 0.700327+j0.329907 |
| w1 | 0.587870+j0.405339 | 0.453023+j0.268260 | 0.559688+j0.242873 | 0.673707+j0.198861 | 0.675806+j0.148761 | 0.889256+j0.139511 |
| w2 | 0.587870+j0.405339 | 0.453023+j0.268260 | 0.357657+j0.209444 | 0.301149+j0.189680 | 0.259839+j0.153788 | 0.447489+j0.131347 |
| w3 | 0.587870+j0.405339 | 0.453023+j0.268260 | 0.356882+j0.194677 | 0.302029+j0.151421 | 0.261152+j0.128726 | 0.138016+j0.101309 |
| w4 | 0.405339+j0.587870 | 0.268260+j0.453023 | 0.300280+j0.541390 | 0.348004+j0.608698 | 0.416770+j0.616005 | 0.448992+j0.568992 |
| w5 | 0.405339+j0.587870 | 0.268260+j0.453023 | 0.242873+j0.559688 | 0.198861+j0.673707 | 0.174807+j0.744087 | 0.142863+j0.669640 |
| w6 | 0.405339+j0.587870 | 0.268260+j0.453023 | 0.209444+j0.357657 | 0.189680+j0.301149 | 0.182358+j0.382221 | 0.343126+j0.358344 |
| w7 | 0.405339+j0.587870 | 0.268260+j0.453023 | 0.194677+j0.356882 | 0.151421+j0.302029 | 0.128870+j0.410574 | 0.121210+j0.383416 |
| w8 | 1.056554+j0.611394 | 1.208224+j0.511520 | 0.949654+j0.564434 | 0.895139+j0.562982 | 0.890809+j0.557418 | 0.889124+j0.602821 |
| w9 | 1.056554+j0.611394 | 1.208224+j0.511520 | 1.087076+j0.274652 | 1.019339+j0.225537 | 1.029824+j0.193508 | 1.233619+j0.212708 |
| w10 | 1.056554+j0.611394 | 1.208224+j0.511520 | 1.285348+j0.819022 | 1.259403+j0.843530 | 1.248728+j0.812443 | 1.067498+j0.963512 |
| w11 | 1.056554+j0.611394 | 1.208224+j0.511520 | 1.452789+j0.300853 | 1.486685+j0.292085 | 1.462463+j0.283106 | 1.394097+j0.591196 |
| w12 | 0.611394+j1.056554 | 0.511520+j1.208224 | 0.564434+j0.949654 | 0.562982+j0.895139 | 0.617897+j0.860530 | 0.563858+j0.843483 |
| w13 | 0.611394+j1.056554 | 0.511520+j1.208224 | 0.274652+j1.087076 | 0.225537+j1.019339 | 0.218681+j1.046861 | 0.184790+j0.974535 |
| w14 | 0.611394+j1.056554 | 0.511520+j1.208224 | 0.819022+j1.285348 | 0.843530+j1.259403 | 0.842216+j1.227784 | 0.673475+j1.223631 |
| w15 | 0.611394+j1.056554 | 0.511520+j1.208224 | 0.300853+j1.452789 | 0.292085+j1.486685 | 0.289603+j1.462746 | 0.230654+j1.362814 |

FIG. 50

| w/CR | 2/16 | 4/16 | 6/16 | 8/16 | 10/16 | 12/16 | 14/16 |
|---|---|---|---|---|---|---|---|
| w0 | 0.690825+j0.585349 | 0.457029+j0.264235 | 0.585830+j0.319830 | 0.581805+j0.334983 | 0.550392+j0.290156 | 0.576370+j0.308447 | 0.556205+j0.306313 |
| w1 | 0.690825+j0.585350 | 0.457029+j0.264235 | 0.579831+j0.315654 | 0.585835+j0.330983 | 0.681112+j0.358142 | 0.721702+j0.388496 | 0.698107+j0.361975 |
| w2 | 0.690827+j0.585349 | 0.457029+j0.264235 | 0.629024+j0.217617 | 0.638661+j0.165525 | 0.601303+j0.116763 | 0.660123+j0.174104 | 0.603112+j0.168592 |
| w3 | 0.690826+j0.585349 | 0.457029+j0.264235 | 0.621593+j0.216858 | 0.643156+j0.166653 | 0.768180+j0.154657 | 0.798367+j0.241027 | 0.740611+j0.219107 |
| w4 | 0.690826+j0.585350 | 0.457029+j0.264235 | 0.579831+j0.315654 | 0.582963+j0.340165 | 0.544087+j0.309193 | 0.526085+j0.368822 | 0.487423+j0.421234 |
| w5 | 0.690825+j0.585350 | 0.457029+j0.264235 | 0.574244+j0.311784 | 0.586528+j0.335691 | 0.648801+j0.400611 | 0.630503+j0.500103 | 0.632312+j0.499021 |
| w6 | 0.690827+j0.585349 | 0.457029+j0.264235 | 0.621593+j0.216868 | 0.641671+j0.164211 | 0.602332+j0.108488 | 0.886472+j0.083824 | 0.605378+j0.061678 |
| w7 | 0.690827+j0.585350 | 0.457029+j0.264235 | 0.614600+j0.216139 | 0.645988+j0.165213 | 0.779701+j0.111826 | 0.836826+j0.086747 | 0.761043+j0.074016 |
| w8 | 0.690824+j0.585350 | 0.457029+j0.264235 | 0.313766+j0.177294 | 0.256324+j0.154712 | 0.353568+j0.173848 | 0.421081+j0.189168 | 0.372292+j0.238687 |
| w9 | 0.690824+j0.585350 | 0.457029+j0.264235 | 0.314209+j0.177479 | 0.257740+j0.156093 | 0.142216+j0.108587 | 0.254856+j0.391406 | 0.234548+j0.177704 |
| w10 | 0.690826+j0.585350 | 0.457029+j0.264235 | 0.314479+j0.163373 | 0.253906+j0.133141 | 0.383183+j0.095256 | 0.506228+j0.088452 | 0.438984+j0.152224 |
| w11 | 0.690825+j0.585350 | 0.457029+j0.264235 | 0.314893+j0.163511 | 0.255481+j0.133223 | 0.131151-j0.092101 | 0.088721+j0.072310 | 0.071834+j0.148278 |
| w12 | 0.690825+j0.585350 | 0.457029+j0.264235 | 0.314209+j0.177479 | 0.257989+j0.155663 | 0.353498+j0.175658 | 0.411013+j0.203490 | 0.376135+j0.364399 |
| w13 | 0.690824+j0.585350 | 0.457029+j0.264235 | 0.314645+j0.177662 | 0.259423+j0.156052 | 0.141590+j0.108762 | 0.254446+j0.394768 | 0.234014+j0.058219 |
| w14 | 0.690826+j0.585350 | 0.457029+j0.264235 | 0.314893+j0.163611 | 0.265597+j0.133615 | 0.392409+j0.085368 | 0.516558+j0.371509 | 0.440778+j0.051629 |
| w15 | 0.690826+j0.585350 | 0.457029+j0.264235 | 0.315601+j0.163646 | 0.257176+j0.133701 | 0.130510+j0.092363 | 0.086440+j0.372676 | 0.064467+j0.052338 |
| w16 | 0.585350+j0.690825 | 0.264235+j0.457029 | 0.319830+j0.585930 | 0.379008+j0.600742 | 0.389353+j0.540097 | 0.327656+j0.525982 | 0.336331+j0.660736 |
| w17 | 0.585350+j0.690826 | 0.264235+j0.457029 | 0.315654+j0.579831 | 0.376622+j0.606493 | 0.419487+j0.605548 | 0.382772+j0.575704 | 0.416845+j0.776409 |
| w18 | 0.585351+j0.690825 | 0.264235+j0.457029 | 0.217617+j0.629024 | 0.168779+j0.701232 | 0.189551+j0.653534 | 0.176886+j0.592218 | 0.206352+j0.743084 |
| w19 | 0.585351+j0.690825 | 0.264235+j0.457029 | 0.216858+j0.621593 | 0.176024+j0.703042 | 0.192719+j0.682799 | 0.231337+j0.737121 | 0.278826+j0.886705 |
| w20 | 0.585350+j0.690826 | 0.264235+j0.457029 | 0.315654+j0.579831 | 0.381824+j0.601641 | 0.420548+j0.516710 | 0.406824+j0.473386 | 0.433185+j0.545736 |
| w21 | 0.585350+j0.690826 | 0.264235+j0.457029 | 0.311784+j0.574244 | 0.377966+j0.607163 | 0.479320+j0.574186 | 0.507079+j0.502578 | 0.542835+j0.632044 |
| w22 | 0.585351+j0.690826 | 0.264235+j0.457029 | 0.216868+j0.621593 | 0.162548+j0.708623 | 0.130081+j0.671538 | 0.061174+j0.619265 | 0.066806+j0.768425 |
| w23 | 0.585351+j0.690826 | 0.264235+j0.457029 | 0.216139+j0.614800 | 0.169978+j0.709403 | 0.130631+j0.694278 | 0.083021+j0.767926 | 0.090272+j0.923832 |
| w24 | 0.585349+j0.690826 | 0.264235+j0.457029 | 0.177294+j0.313766 | 0.164033+j0.346721 | 0.264460+j0.369220 | 0.266365+j0.373217 | 0.263830+j0.654022 |
| w25 | 0.585349+j0.690826 | 0.264235+j0.457029 | 0.177479+j0.314209 | 0.164869+j0.347627 | 0.148136+j0.316492 | 0.200538+j0.250430 | 0.176737+j0.283231 |
| w26 | 0.585350+j0.690826 | 0.264235+j0.457029 | 0.163373+j0.314479 | 0.128349+j0.362615 | 0.141602+j0.435973 | 0.108676+j0.442010 | 0.156460+j0.607057 |
| w27 | 0.585350+j0.690826 | 0.264235+j0.457029 | 0.163511+j0.314893 | 0.128793+j0.363810 | 0.089783+j0.370718 | 0.075318+j0.256488 | 0.059053+j0.271040 |
| w28 | 0.585350+j0.690826 | 0.264235+j0.457029 | 0.177479+j0.314209 | 0.165196+j0.349443 | 0.258602+j0.384260 | 0.289438+j0.350712 | 0.295727+j0.448465 |
| w29 | 0.585349+j0.690827 | 0.264235+j0.457029 | 0.177662+j0.314645 | 0.166055+j0.350585 | 0.145729+j0.314338 | 0.206832+j0.245612 | 0.162567+j0.384902 |
| w30 | 0.585351+j0.690826 | 0.264235+j0.457029 | 0.163511+j0.314893 | 0.128552+j0.366253 | 0.131228+j0.437877 | 0.076874+j0.448991 | 0.068840+j0.576445 |
| w31 | 0.585350+j0.690826 | 0.264235+j0.457029 | 0.163646+j0.315601 | 0.129002+j0.367493 | 0.085984+j0.371670 | 0.072444+j0.254684 | 0.061187+j0.420342 |
| w32 | 0.837920+j0.682111 | 1.210202+j0.508671 | 0.915494+j0.682969 | 0.876123+j0.641294 | 1.015875+j0.544514 | 1.010495+j0.566385 | 1.003447+j0.483698 |

FIG. 51

| | | | | | | | |
|---|---|---|---|---|---|---|---|
| w33 | 0.837320+j0.692111 | 1.210202+j0.508671 | 0.899840+j0.548599 | 0.867263+j0.483460 | 0.865222+j0.447394 | 0.861166+j0.469956 | 0.845525+j0.420972 |
| w34 | 0.837322+j0.692111 | 1.210202+j0.508671 | 1.041461+j0.244937 | 1.005452+j0.182113 | 1.128584+j0.334833 | 1.106160+j0.348451 | 1.062454+j0.293134 |
| w35 | 0.837322+j0.692111 | 1.210202+j0.508671 | 1.020188+j0.244325 | 0.969325+j0.208138 | 0.968828+j0.243315 | 0.944992+j0.295083 | 0.995494+j0.255193 |
| w36 | 0.837321+j0.692112 | 1.210202+j0.508671 | 0.899840+j0.548599 | 0.896873+j0.548648 | 0.880520+j0.680980 | 0.875484+j0.737255 | 0.910205+j0.665202 |
| w37 | 0.837320+j0.692112 | 1.210202+j0.508671 | 0.883121+j0.533505 | 0.820382+j0.497932 | 0.787015+j0.545425 | 0.745110+j0.618549 | 0.767362+j0.579003 |
| w38 | 0.837323+j0.692111 | 1.210202+j0.508671 | 1.020188+j0.244325 | 0.978090+j0.164900 | 1.176544+j0.122217 | 1.158123+j0.117957 | 1.090971+j0.088120 |
| w39 | 0.837322+j0.692112 | 1.210202+j0.508671 | 0.987866+j0.243471 | 0.934838+j0.182858 | 0.984849+j0.117137 | 0.989858+j0.099889 | 0.921093+j0.085363 |
| w40 | 0.837319+j0.692112 | 1.210202+j0.508671 | 1.151606+j0.765652 | 1.146306+j0.718300 | 1.215599+j0.699359 | 1.191952+j0.656926 | 1.187342+j0.536796 |
| w41 | 0.837318+j0.692112 | 1.210202+j0.508671 | 1.215021+j0.808778 | 1.291524+j0.653771 | 1.470603+j0.909385 | 1.426402+j0.781680 | 1.372857+j0.669123 |
| w42 | 0.837321+j0.692111 | 1.210202+j0.508671 | 1.352892+j0.288569 | 1.334471+j0.242989 | 1.345613+j0.437140 | 1.302908+j0.407617 | 1.261173+j0.323729 |
| w43 | 0.837320+j0.692112 | 1.210202+j0.508671 | 1.427958+j0.282998 | 1.395846+j0.389207 | 1.641491+j0.582622 | 1.558455+j0.483525 | 1.461132+j0.407370 |
| w44 | 0.837320+j0.692112 | 1.210202+j0.508671 | 1.215021+j0.808778 | 1.124883+j0.844081 | 1.038455+j0.904332 | 1.034030+j0.874552 | 1.085040+j0.742804 |
| w45 | 0.837319+j0.692110 | 1.210202+j0.508671 | 1.479922+j0.988010 | 1.504900+j0.961645 | 1.216171+j1.212947 | 1.241676+j1.044828 | 1.209054+j0.918096 |
| w46 | 0.837322+j0.692112 | 1.210202+j0.508671 | 1.427958+j0.282998 | 1.404319+j0.139223 | 1.412229+j0.146603 | 1.360209+j0.138162 | 1.281447+j0.108014 |
| w47 | 0.837321+j0.692112 | 1.210202+j0.508671 | 1.747630+j0.343683 | 1.764855+j0.324115 | 1.729269+j0.190765 | 1.625172+j0.163628 | 1.504307+j0.136707 |
| w48 | 0.692112+j0.837321 | 0.508671+j1.210202 | 0.562869+j0.915484 | 0.608985+j0.850637 | 0.520270+j0.894599 | 0.523810+j0.983510 | 0.639837+j0.977245 |
| w49 | 0.692111+j0.837321 | 0.508671+j1.210202 | 0.548599+j0.899840 | 0.561777+j0.870692 | 0.483940+j0.845621 | 0.448217+j0.829659 | 0.537002+j0.862344 |
| w50 | 0.692113+j0.837320 | 0.508671+j1.210202 | 0.244937+j1.041461 | 0.190487+j1.082774 | 0.232928+j0.985823 | 0.321208+j1.067223 | 0.455568+j1.065457 |
| w51 | 0.692113+j0.837321 | 0.508671+j1.210202 | 0.244325+j1.020188 | 0.244881+j1.048792 | 0.257181+j0.986383 | 0.276744+j0.993625 | 0.261384+j1.059541 |
| w52 | 0.692112+j0.837321 | 0.508671+j1.210202 | 0.548599+j0.899640 | 0.610952+j0.803882 | 0.694953+j0.796701 | 0.710545+j0.883481 | 0.752733+j0.832232 |
| w53 | 0.692112+j0.837322 | 0.508671+j1.210202 | 0.533506+j0.883121 | 0.556010+j0.811974 | 0.823283+j0.720032 | 0.605159+j0.738080 | 0.662410+j0.724592 |
| w54 | 0.692114+j0.837321 | 0.508671+j1.210202 | 0.244325+j1.020188 | 0.166637+j1.002744 | 0.107976+j0.948083 | 0.108346+j1.104517 | 0.105874+j1.274300 |
| w55 | 0.692113+j0.837321 | 0.508671+j1.210202 | 0.243471+j0.987866 | 0.205501+j0.980310 | 0.122236+j0.924613 | 0.093597+j0.927820 | 0.098152+j1.088642 |
| w56 | 0.692111+j0.837322 | 0.508671+j1.210202 | 0.765652+j1.151606 | 0.811871+j1.077059 | 0.834215+j1.095182 | 0.818510+j1.185738 | 0.775759+j1.106874 |
| w57 | 0.692110+j0.837322 | 0.508671+j1.210202 | 0.808778+j1.215021 | 0.708577+j1.212442 | 0.555938+j1.212930 | 0.741498+j1.425730 | 0.816189+j1.333815 |
| w58 | 0.692112+j0.837321 | 0.508671+j1.210202 | 0.288569+j1.352892 | 0.232238+j1.416900 | 0.134887+j1.326793 | 0.376428+j1.273987 | 0.549851+j1.233599 |
| w59 | 0.692112+j0.837321 | 0.508671+j1.210202 | 0.282998+j1.427958 | 0.447381+j1.388136 | 0.343747+j1.293003 | 0.452464+j1.534369 | 0.548193+j1.472735 |
| w60 | 0.692111+j0.837322 | 0.508671+j1.210202 | 0.808778+j1.215021 | 0.846797+j1.067632 | 0.842609+j1.029273 | 0.838816+j1.052224 | 0.862209+j0.938192 |
| w61 | 0.692111+j0.837322 | 0.508671+j1.210202 | 0.988012+j1.479922 | 1.098653+j1.408274 | 0.867471+j1.386566 | 1.008623+j1.261587 | 1.058456+j1.143504 |
| w62 | 0.692113+j0.837322 | 0.508671+j1.210202 | 0.282998+j1.427958 | 0.188583+j1.727023 | 0.174737+j1.671315 | 0.128520+j1.317868 | 0.318114+j1.324413 |
| w63 | 0.692113+j0.837322 | 0.508671+j1.210202 | 0.343683+j1.747630 | 0.657638+j1.731517 | 0.546701+j1.623153 | 0.151986+j1.588069 | 0.151901+j1.531081 |

*FIG. 52*

| u/CR | 3/16 | 5/16 | 7/16 | 9/16 | 11/16 | 13/16 |
|---|---|---|---|---|---|---|
| u0 | 0.964850 | 0.746358 | 0.682758 | 0.720492 | 0.718420 | 0.741203 |
| u1 | 0.964851 | 0.724327 | 0.689494 | 0.745635 | 0.785950 | 0.837561 |
| u2 | 0.964850 | 0.701244 | 0.614079 | 0.578601 | 0.566863 | 0.571567 |
| u3 | 0.964851 | 0.724852 | 0.608604 | 0.578878 | 0.591711 | 0.652725 |
| u4 | 0.964851 | 1.089143 | 1.229555 | 1.234916 | 1.228615 | 1.196834 |
| u5 | 0.964851 | 1.487807 | 1.519290 | 1.511816 | 1.446265 | 1.354509 |
| u6 | 0.964851 | 1.016430 | 0.952184 | 0.929933 | 0.919117 | 0.944049 |
| u7 | 0.964851 | 0.981269 | 1.010198 | 1.008385 | 1.055715 | 1.062656 |
| u8 | 0.262799 | 0.188668 | 0.119570 | 0.131917 | 0.179189 | 0.158838 |
| u9 | 0.262799 | 0.187756 | 0.119309 | 0.132245 | 0.179229 | 0.216557 |
| u10 | 0.262799 | 0.183302 | 0.122704 | 0.095129 | 0.060071 | 0.034740 |
| u11 | 0.262799 | 0.184133 | 0.122986 | 0.094858 | 0.060040 | 0.089245 |
| u12 | 0.262799 | 0.299163 | 0.361306 | 0.393581 | 0.431407 | 0.422770 |
| u13 | 0.262799 | 0.295502 | 0.360929 | 0.392102 | 0.437930 | 0.493766 |
| u14 | 0.262799 | 0.306233 | 0.349187 | 0.316988 | 0.303511 | 0.286845 |
| u15 | 0.262799 | 0.310441 | 0.349698 | 0.317410 | 0.304552 | 0.350258 |

FIG. 53A

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 53B

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 54

| u/CR | 2/16 | 4/16 | 6/16 | 8/16 | 10/16 | 12/16 | 14/16 |
|---|---|---|---|---|---|---|---|
| u0 | 0.951821 | 0.772242 | 0.670816 | 0.720040 | 0.687860 | 0.725026 | 0.776914 |
| u1 | 0.951821 | 0.755105 | 0.671187 | 0.717092 | 0.687453 | 0.682522 | 0.731844 |
| u2 | 0.951821 | 0.733323 | 0.684394 | 0.742371 | 0.784311 | 0.833407 | 0.872060 |
| u3 | 0.951821 | 0.748492 | 0.683930 | 0.746130 | 0.778844 | 0.779595 | 0.823606 |
| u4 | 0.951821 | 0.762565 | 0.601258 | 0.568017 | 0.529234 | 0.542187 | 0.605096 |
| u5 | 0.951821 | 0.741006 | 0.601273 | 0.568434 | 0.529245 | 0.530376 | 0.565319 |
| u6 | 0.951821 | 0.771170 | 0.594244 | 0.571550 | 0.587945 | 0.627093 | 0.688258 |
| u7 | 0.951821 | 0.797312 | 0.594239 | 0.571162 | 0.588065 | 0.601059 | 0.646057 |
| u8 | 0.951821 | 1.144458 | 1.253351 | 1.234492 | 1.288591 | 1.273237 | 1.213263 |
| u9 | 0.951821 | 1.153922 | 1.197825 | 1.174495 | 1.172818 | 1.182640 | 1.148415 |
| u10 | 0.951821 | 1.658369 | 1.695168 | 1.675628 | 1.610570 | 1.491684 | 1.361829 |
| u11 | 0.951821 | 1.306308 | 1.431932 | 1.433385 | 1.432017 | 1.374447 | 1.283388 |
| u12 | 0.951821 | 0.910861 | 0.932278 | 0.907903 | 0.905961 | 0.956192 | 0.974968 |
| u13 | 0.951821 | 0.864684 | 0.935172 | 0.914425 | 0.885027 | 0.892801 | 0.922447 |
| u14 | 0.951821 | 0.903549 | 0.990523 | 1.005079 | 1.064442 | 1.100380 | 1.087536 |
| u15 | 0.951821 | 0.940034 | 0.989938 | 0.980523 | 1.006622 | 1.025215 | 1.029882 |
| u16 | 0.306654 | 0.215961 | 0.115733 | 0.153556 | 0.169392 | 0.148680 | 0.177357 |
| u17 | 0.306654 | 0.220732 | 0.115734 | 0.153554 | 0.169393 | 0.148677 | 0.145054 |
| u18 | 0.306654 | 0.224176 | 0.115606 | 0.153573 | 0.172311 | 0.209035 | 0.243373 |
| u19 | 0.306654 | 0.219360 | 0.115605 | 0.153576 | 0.172310 | 0.209018 | 0.210474 |
| u20 | 0.306654 | 0.196638 | 0.116628 | 0.075094 | 0.056177 | 0.029660 | 0.047926 |
| u21 | 0.306654 | 0.200750 | 0.116629 | 0.075095 | 0.056177 | 0.029660 | 0.016211 |
| u22 | 0.306654 | 0.197697 | 0.116766 | 0.075098 | 0.057134 | 0.088798 | 0.112331 |
| u23 | 0.306654 | 0.193649 | 0.116765 | 0.075098 | 0.057134 | 0.088798 | 0.080421 |
| u24 | 0.306654 | 0.263498 | 0.361114 | 0.411488 | 0.400665 | 0.399082 | 0.451783 |
| u25 | 0.306654 | 0.268956 | 0.361058 | 0.411542 | 0.400670 | 0.397734 | 0.415679 |
| u26 | 0.306654 | 0.272340 | 0.359367 | 0.411127 | 0.427709 | 0.467702 | 0.526543 |
| u27 | 0.306654 | 0.266958 | 0.359424 | 0.411075 | 0.427698 | 0.463378 | 0.488786 |
| u28 | 0.306654 | 0.299845 | 0.342823 | 0.304005 | 0.283846 | 0.270711 | 0.310792 |
| u29 | 0.306654 | 0.305269 | 0.342769 | 0.303985 | 0.283843 | 0.270625 | 0.277078 |
| u30 | 0.306654 | 0.302366 | 0.344552 | 0.303827 | 0.293434 | 0.333743 | 0.380080 |
| u31 | 0.306654 | 0.296777 | 0.344606 | 0.303847 | 0.293437 | 0.333375 | 0.345309 |

FIG. 55

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 56

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 58

| Modulation | Rows in Part 1 $N_{part1}$ | Rows in Part 2 $N_{part2}$ | Columns m |
|---|---|---|---|
| QPSK | 69120 | 0 | 2 |
| 16QAM | 69120 | 0 | 4 |
| 64QAM | 69120 | 0 | 6 |
| 256QAM | 69120 | 0 | 8 |
| 1024QAM | 68400 | 720 | 10 |
| 4096QAM | 69120 | 0 | 12 |

FIG. 60

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 12 | 8 | 132 | 26 | 3 | 18 | 19 | 98 | 37 | 190 | 123 | 81 | 95 | 167 | 76 | 66 | 27 | 46 | 105 | 28 | 29 | 170 |
| 20 | 96 | 35 | 177 | 24 | 86 | 114 | 63 | 52 | 80 | 119 | 153 | 121 | 107 | 97 | 129 | 57 | 38 | 15 | 91 | 122 | 14 |
| 104 | 175 | 150 | 1 | 124 | 72 | 90 | 32 | 161 | 78 | 44 | 73 | 134 | 162 | 5 | 11 | 179 | 93 | 6 | 152 | 180 | 68 |
| 36 | 103 | 160 | 100 | 138 | 146 | 9 | 82 | 187 | 147 | 7 | 87 | 17 | 102 | 69 | 110 | 130 | 42 | 16 | 71 | 2 | 169 |
| 58 | 33 | 136 | 106 | 140 | 84 | 79 | 143 | 156 | 139 | 55 | 116 | 4 | 21 | 144 | 64 | 70 | 158 | 48 | 118 | 184 | 50 |
| 181 | 120 | 174 | 133 | 115 | 53 | 127 | 74 | 25 | 49 | 88 | 22 | 89 | 34 | 126 | 61 | 94 | 172 | 131 | 39 | 99 | 183 |
| 163 | 111 | 155 | 51 | 191 | 31 | 128 | 149 | 56 | 85 | 109 | 10 | 151 | 188 | 40 | 83 | 41 | 47 | 178 | 186 | 43 | 54 |
| 164 | 13 | 142 | 117 | 92 | 113 | 182 | 168 | 165 | 101 | 171 | 159 | 60 | 166 | 77 | 30 | 67 | 23 | 0 | 65 | 141 | 185 |
| 112 | 145 | 135 | 108 | 176 | 45 | 148 | 137 | 125 | 62 | 75 | 189 | 59 | 173 | 154 | 157 | | | | | | |

FIG. 79

Rate 2/16 69k CODE TABLE (PUNCTURE LENGTH 0):

Rate 3/16 69k CODE TABLE (PUNCTURE LENGTH 0):

Rate 4/16 69k CODE TABLE (PUNCTURE LENGTH 0):

Rate 5/16 69k CODE TABLE (PUNCTURE LENGTH 1800):

Rate 6/16 69k CODE TABLE (PUNCTURE LENGTH 1800):

Rate 7/16 69k CODE TABLE (PUNCTURE LENGTH 2160):

Rate 8/16 69k CODE TABLE (PUNCTURE LENGTH 2520):

Rate 9/16 69k CODE TABLE (PUNCTURE LENGTH 1800):

Rate 9/16 69k CODE TABLE (PUNCTURE LENGTH 1080):

Rate 10/16 69k CODE TABLE (PUNCTURE LENGTH 360):

Rate 11/16 69k CODE TABLE (PUNCTURE LENGTH 1440):

Rate 12/16 69k CODE TABLE (PUNCTURE LENGTH 1440):

Rate 13/16 69k CODE TABLE (PUNCTURE LENGTH 720):

Rate 14/16 69k CODE TABLE (PUNCTURE LENGTH 720):

| Rate | INFORMATION LENGTH K | PUNCTURE LENGTH L | (X1, K1) | (X2, K2) | (X3, K3) | (X4, K4) | (X5, K5) | XM1 | M1 | M2 |
|---|---|---|---|---|---|---|---|---|---|---|
| 2/16 | 8640 | 0 | (21, 1440) | (20, 7200) | (0, 0) | (0, 0) | (0, 0) | 16 | 1800 | 58680 |
| 3/16 | 12960 | 0 | (16, 11520) | (15, 1440) | (0, 0) | (0, 0) | (0, 0) | 11 | 1800 | 54360 |
| 4/16 | 17280 | 0 | (13, 16200) | (12, 720) | (45, 360) | (0, 0) | (0, 0) | 9 | 1800 | 50040 |
| 5/16 | 21600 | 1800 | (28, 720) | (27, 1080) | (9, 7560) | (8, 3960) | (10, 8280) | 4 | 3600 | 45720 |
| 6/16 | 25920 | 1800 | (25, 1800) | (9, 13680) | (8, 8640) | (10, 1800) | (0, 0) | 2 | 3600 | 41400 |
| 7/16 | 30240 | 2160 | (19, 2160) | (8, 26280) | (7, 360) | (3, 1440) | (0, 0) | 2 | 3960 | 37080 |
| 8/16 | 34560 | 2520 | (15, 1800) | (14, 720) | (8, 20880) | (7, 5040) | (4, 6120) | 1 | 5040 | 32040 |
| 9/16 | 38880 | 1800 | (18, 1440) | (17, 360) | (10, 3240) | (9, 12240) | (4, 21600) | 1 | 9000 | 23040 |

FIG. 125

| Rate | INFORMATION LENGTH K | PUNCTURE LENGTH L | X1 | KX1 | X2 | KX2 | X3 | KX3 | Y1 | KY1 | M |
|---|---|---|---|---|---|---|---|---|---|---|---|
| 9/16 | 38880 | 1080 | 29 | 1080 | 17 | 3240 | 12 | 3240 | 3 | 31320 | 31320 |
| 10/16 | 43200 | 360 | 73 | 360 | 38 | 360 | 14 | 8280 | 3 | 34200 | 26280 |
| 11/16 | 47520 | 1440 | 29 | 1440 | 8 | 1800 | 9 | 5760 | 3 | 38520 | 23040 |
| 12/16 | 51840 | 1440 | 24 | 1440 | 9 | 4680 | 8 | 1440 | 3 | 44280 | 18720 |
| 13/16 | 56160 | 720 | 34 | 720 | 10 | 3600 | 11 | 4320 | 3 | 47520 | 13680 |
| 14/16 | 60480 | 720 | 24 | 720 | 12 | 1080 | 10 | 4680 | 3 | 54000 | 9360 |

TRANSMISSION DEVICE, TRANSMISSION METHOD, RECEPTION DEVICE, AND RECEPTION METHOD

CROSS REFERENCE TO RELATED APPLICATIONS

This application is a U.S. National Phase of International Patent Application No. PCT/JP2018/019107 filed on May 17, 2018, which claims priority benefit of Japanese Patent Application No. JP 2017-107534 filed in the Japan Patent Office on May 31, 2017. Each of the above-referenced applications is hereby incorporated herein by reference in its entirety.

TECHNICAL FIELD

The present technology relates to a transmission device, a transmission method, a reception device, and a reception method, and more particularly to, for example, a transmission device, a transmission method, a reception device, and a reception method for securing favorable communication quality in data transmission using an LDPC code.

BACKGROUND ART

Low density parity check (LDPC) codes have high error correction capability and are in recent years widely adopted in transmission systems for digital broadcasting, such as the digital video broadcasting (DVB)-S.2 in Europe and the like, DVB-T.2, DVB-C2, and the advanced television systems committee (ATSC) 3.0 in the United States, and the like, for example (see, for example, Non-Patent Document 1).

With recent researches, it has been found that the LDPC codes are able to obtain performance close to the Shannon limit as the code length is increased, similar to turbo codes and the like. Furthermore, the LDPC codes have a property that the minimum distance is proportional to the code length and thus have a good block error probability characteristic, as characteristics. Moreover, a so-called error floor phenomenon observed in decoding characteristics of turbo codes and the like hardly occur, which is also an advantage.

CITATION LIST

Non-Patent Document

Non-Patent Document 1: ATSC Standard: Physical Layer Protocol (A/322), 7 Sep. 2016

SUMMARY OF THE INVENTION

Problems to be Solved by the Invention

In data transmission using an LDPC code, for example, the LDPC code is symbols (symbolized) of quadrature modulation (digital modulation) such as quadrature phase shift keying (QPSK), and the symbols are mapped at signal points of the quadrature modulation and are sent.

The data transmission using an LDPC code is spreading worldwide and is required to secure favorable communication (transmission) quality.

The present technology has been made in view of such a situation, and aims to secure favorable communication quality in data transmission using an LDPC code.

Solutions to Problems

A first transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 9/16, and puncture a head of the information bits of the extended LDPC code by the puncture length L to generate a punctured LDPC code with the code length N of 69120 bits and the coding rate r of 9/16, in which the puncture length L is 1080, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309

1620 1897 3433 6033 6981 7135 9050 9376 10666 13610 14319 15116 17381 17760 20227 21874 23357 24234 24522 25925 26353 26967 28227 28506 29251 29441 30060 30986 31091

1697 2272 3024 5561 6589 7986 8685 9396 10573 12011 14098 16126 16759 16804 18059 18547 20087 20914 21286 21538 22540 24458 26648 27340 28792 28826 29864 30528 31295

89 454 483 695 2280 2835 3144 4970 6829 9853 12615 15904 16729 20640 23848 27573 29312

4591 6748 11640 13018 14778 15843 17885 18377 20224 21833 22954 23726 25488 27761 28222 29259 29778

242 710 1570 2623 3133 3257 4453 7853 16055 16408 17180 20157 20277 21448 22859 25006 31218

2004 5038 5159 8471 10803 11018 15651 17765 20995 24165 24257 24306 26164 27463 28488 28826 29380

755 3621 4468 6694 6756 14092 14129 14400 15017 20052 22490 23042 24698 28425 28541 30045 30486

7 621 1211 4098 11752 12080 13227 15004 17359 18687 23170 23479 24501 27042 27466 28238 29909

553 6987 8440 9596 11059 11853 12271 14413 14912 16736 16982 17615 20918 22586 25528 29158 29838

6199 6384 7031 7628 19831 20096 22240 22968 23198 23811 24453 24846 24971 26366 27747 29215 30861

396 2135 2913 5364 8082 9967 13434 17293 19440 19687 23273 27397 28840 29333 29392 29683 30223

586 5373 11840 14118 14170 15300 18550 20804 22553 27032 27283 28385

217 2802 5004 12123 13048 15986 19677 21659 22175 22394 23718 24128

648 1958 3508 5127 9238 11939 13886 18348 19773 23638 26227 30729

3893 8133 8600 10046 12651 18576 18665 19209 20689 25078 28352 28524

3026 5164 13169 14079 15656 16754 17794 20083 20246 23872 26005 30450

4851 4882 5925 8452 10057 11070 11725 21083 23252 29070 30608 31252

6688 8303 8582 8764 15723 16277 17054 18883 22842 22940 23539 28970

9607 11750 15772 16971 17190 20592 23323 26419 26898 27490 29091 29399

1012 2607 7224 8102 8817 9674 9770 17979 18893 24996 29668 31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

A first reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 9/16, and puncturing a head of the information bits of the extended LDPC code by the puncture length L to generate a punctured LDPC code with the code length N of 69120 bits and the coding rate r of 9/16, in which the puncture length L is 1080, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309
1620 1897 3433 6033 6981 7135 9050 9376 10666 13610 14319 15116 17381 17760 20227 21874 23357 24234 24522 25925 26353 26967 28227 28506 29251 29441 30060 30986 31091
1697 2272 3024 5561 6589 7986 8685 9396 10573 12011 14098 16126 16759 16804 18059 18547 20087 20914 21286 21538 22540 24458 26648 27340 28792 28826 29864 30528 31295
89 454 483 695 2280 2835 3144 4970 6829 9853 12615 15904 16729 20640 23848 27573 29312
4591 6748 11640 13018 14778 15843 17885 18377 20224 21833 22954 23726 25488 27761 28222 29259 29778
242 710 1570 2623 3133 3257 4453 7853 16055 16408 17180 20157 20277 21448 22859 25006 31218
2004 5038 5159 8471 10803 11018 15651 17765 20995 24165 24257 24306 26164 27463 28488 28826 29380

755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524
3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668 31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

A second transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 10/16, and puncture a head of the information bits of the extended LDPC code by the puncture length L to generate a punctured LDPC code with the code length N of 69120 bits and the coding rate r of 10/16, in which the puncture length L is 360, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128

81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208

2719 3861 6596 12408 13668 15486 16885 16977 18274 19208 19890 21346 23207 24566

169 623 1360 1514 2215 3773 13467 14433 17011 17642 17974 19056 21002 26082

1809 4208 4378 7127 8992 9253 13095 14428 20298 20434 20780 22453 23987 24226 3750 5548 5627 11806 12055 12600 16367 19283 20279 23674 23859 24746 25047 25557

626 989 3029 3501 9868 11097 11829 14550 18865 19686 20277 20679 22667 23024

66 468 9319 10107 12086 12575 14287 15673 17399 19430 21403 23712 25071 26139 5890 7144 8092 9954 10405 12492 14034 14770 16442 18975 19293 19963 24493 25001

5242 5386 5857 6353 16616 18682 19482 20494 20865 21691 22128 23279 24524 25858

313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773

7180 8463 10630 11065 13125 15606 15615 16108 16806 17007 21027 23775 23872 25603

2544 4045 4102 4379 4977 9300 9816 11806 14082 14953 20047 21810 24398 26233

5608 6955 7100 7354 8443 13176 13715 14311 17707 19197 19199 19549 19778 25688 7204 8079 9865 13251 14247 14416 15848 17260 19621 22165 22584 24251 24445 24668

812 2157 6111 6800 7428 8121 8209 10540 15043 15915 20957 23054 24932 26228

738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953

884 1173 5946 6802 7126 8073 9725 12993 13284 14460 18413 19355 20788 22183

1523 2486 2507 2513 2887 3775 4748 4983 8397 10526 15292 20542 24554 26120

415 920 1483 2585 7547 9312 9463 9762 10763 11681 12495 13553 16626 20550

8510 14430 18465

8516 11383 15056

5788 8873 12241

3576 4705 13247

7913 15707 20264

4994 16076 24518

3118 14498 26083

13530 19421 22760

1268 9435 12503

5430 6784 9179

19982 22263 25877

4800 9769 20997

3614 4723 10452

10818 17002 18966

20536 22129 25754

4386 11862 21876

8556 12401 20631

625 3186 20530

213 1157 11180

20874 20939 23730

7210 7835 20578

1688 8640 17771

10436 10992 19787

9947 11250 15184

5660 10592 21566

1096 11572 24822

7144 19336 24754

862 15406 22500

2671 16002 17029

3960 7516 14638

16601 17840 21707

3795 5088 22317

12646 13728 22927

5142 5473 20644

15959 16640 21629

884 4142 14642

8025 9929 19307

12368 13927 21189

1874 8772 12530

4188 10407 22338

1754 17998 18329

9307 17615 20181

3017 3095 24365

1812 11208 21889

4866 16991 19462

11251 14300 20871

7825 13396 21596

7895 10014 13628

1835 6842 8973

536 2005 14500

11035 14258 16465

10330 17828 23837

2215 14775 17613

13464 16717 18077

21737 24089 25823

12163 16025 22009

10733 11651 14422

1397 10954 11495

12972 13143 14664

3125 6046 18565

615 21505 21948

3758 11341 22714

17956 25056 25311

3113 17145 22344

15975 20969 21484

13465 14838 17582

7220 8973 13474

881 3386 22042

12855 20216 26257

941 1363 19432

2344 16404 21337

216 5137 9491

8273 9255 17237

3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

A second reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 10/16, and puncturing a head of the information bits of the extended LDPC code by the puncture length L to generate a punctured LDPC code with the code length N of 69120 bits and the coding rate r of 10/16, in which the puncture length L is 360, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128

81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208

2719 3861 6596 12408 13668 15486 16885 16977 18274 19208 19890 21346 23207 24566

169 623 1360 1514 2215 3773 13467 14433 17011 17642 17974 19056 21002 26082

1809 4208 4378 7127 8992 9253 13095 14428 20298 20434 20780 22453 23987 24226 3750 5548 5627 11806 12055 12600 16367 19283 20279 23674 23859 24746 25047 25557

626 989 3029 3501 9868 11097 11829 14550 18865 19686 20277 20679 22667 23024

66 468 9319 10107 12086 12575 14287 15673 17399 19430 21403 23712 25071 26139 5890 7144 8092 9954 10405 12492 14034 14770 16442 18975 19293 19963 24493 25001

5242 5386 5857 6353 16616 18682 19482 20494 20865 21691 22128 23279 24524 25858

313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773

7180 8463 10630 11065 13125 15606 15615 16108 16806 17007 21027 23775 23872 25603

2544 4045 4102 4379 4977 9300 9816 11806 14082 14953 20047 21810 24398 26233

5608 6955 7100 7354 8443 13176 13715 14311 17707 19197 19199 19549 19778 25688 7204 8079 9865 13251 14247 14416 15848 17260 19621 22165 22584 24251 24445 24668

812 2157 6111 6800 7428 8121 8209 10540 15043 15915 20957 23054 24932 26228

738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953

884 1173 5946 6802 7126 8073 9725 12993 13284 14460 18413 19355 20788 22183

1523 2486 2507 2513 2887 3775 4748 4983 8397 10526 15292 20542 24554 26120

415 920 1483 2585 7547 9312 9463 9762 10763 11681 12495

13553 16626 20550
8510 14430 18465
8516 11383 15056
5788 8873 12241
3576 4705 13247
7913 15707 20264
4994 16076 24518
3118 14498 26083
13530 19421 22760
1268 9435 12503
5430 6784 9179
19982 22263 25877
4800 9769 20997
3614 4723 10452
10818 17002 18966
20536 22129 25754
4386 11862 21876
8556 12401 20631
625 3186 20530
213 1157 11180
20874 20939 23730
7210 7835 20578
1688 8640 17771
10436 10992 19787
9947 11250 15184
5660 10592 21566
1096 11572 24822

7144 19336 24754
862 15406 22500
2671 16002 17029
3960 7516 14638
16601 17840 21707
3795 5088 22317
12646 13728 22927
5142 5473 20644
15959 16640 21629
884 4142 14642
8025 9929 19307
12368 13927 21189
1874 8772 12530
4188 10407 22338
1754 17998 18329
9307 17615 20181
3017 3095 24365
1812 11208 21889
4866 16991 19462
11251 14300 20871
7825 13396 21596
7895 10014 13628
1835 6842 8973
536 2005 14500
11035 14258 16465
10330 17828 23837
2215 14775 17613
13464 16717 18077
21737 24089 25823
12163 16025 22009
10733 11651 14422
1397 10954 11495
12972 13143 14664
3125 6046 18565
615 21505 21948
3758 11341 22714
17956 25056 25311
3113 17145 22344
15975 20969 21484
13465 14838 17582
7220 8973 13474
881 3386 22042
12855 20216 26257
941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

A third transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 11/16, and puncture a head of the information bits of the extended LDPC code by the puncture length L to generate a punctured LDPC code with the code length N of 69120 bits and the coding rate r of 11/16, in which the puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104

1223 1343 1582 2389 2457 2524 4278 5155 5309 6801 6848 6856 7504 9555 10582 11127 12596 14665 16067 17209 18124 18945 19359 19836 20717 21026 21042 21752 22822 1252 2410 4061 4847 6319 6912 8847 9724 11029 12296 13360 13534 14120 14581 15402 15619 15988 16861 17114 17389 18708 19641 20523 21198 21857 21989 22282 22364 22982

509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713

152 1158 1338 1983 3287 5798 11794 16716

156 532 1476 12617 14920 15466 15781 18998

3677 7934 11473 17794 18208 18276 19678 21229

3820 4864 6235 8097 12654 17762 20954 21584

3342 10355 10565 11032 14395 16956 20922 20989 22452

531 2662 4931 8679 10369 16527 17238 18168 21983

880 3029 9775 11071 12791 17778 19893 20173 22001

41 427 8138 8867 10585 13703 17145 20968 22923

5145 7064 9028 12496 12966 15267 18786 21580 21897

4722 6208 8851 11104 12317 14426 16624 16947 17527

4564 5622 14577 16348 17025 17965 20354 21467 22693

5128 9887 17989 18286 19896 21227 21578 21627 22241

309 3372 3979 5902 7332 12724 14632 17135 21837

1578 3964 10409 10809 14398 16615 19847 20157 20927

405 3665 8722 10438 13662 14486 15354 17359 20035

156 2071 8916 9572 11757 15911 16290 16471 17445

473 1437 2579 6794 8780 13490 14544 17384 22603

2878 3729 6006 10209 13658 13688 15210 19288 20814

6303 7417 9343 14115 14763 14866 18480 20937 22400

2222 3789 9713 10357 11478 12332 13077 17563 19102

7108 7496 7815

1001 3587 4275

1632 7412 10427

6519 17926 22479

1858 14652 15718
12029 15919 16890
16773 17303 22849
6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993
1618 9423 11897
8257 9434 14576
818 10982 21831
6716 10597 22631
13476 18975 22617
3382 3550 3616
4401 12899 16087
10381 11637 21054
4874 12524 22481
7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786
401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

A third reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 11/16, and puncturing a head of the information bits of the extended LDPC code by the puncture length L to generate a punctured LDPC code with the code length N of 69120 bits and the coding rate r of 11/16, in which the puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104

1223 1343 1582 2389 2457 2524 4278 5155 5309 6801 6848 6856 7504 9555 10582 11127 12596 14665 16067 17209 18124 18945 19359 19836 20717 21026 21042 21752 22822

1252 2410 4061 4847 6319 6912 8847 9724 11029 12296 13360 13534 14120 14581 15402 15619 15988 16861 17114 17389 18708 19641 20523 21198 21857 21989 22282 22364 22982

509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713

152 1158 1338 1983 3287 5798 11794 16716

156 532 1476 12617 14920 15466 15781 18998

3677 7934 11473 17794 18208 18276 19678 21229

3820 4864 6235 8097 12654 17762 20954 21584

3342 10355 10565 11032 14395 16956 20922 20989 22452

531 2662 4931 8679 10369 16527 17238 18168 21983

880 3029 9775 11071 12791 17778 19893 20173 22001

41 427 8138 8867 10585 13703 17145 20968 22923

5145 7064 9028 12496 12966 15267 18786 21580 21897

4722 6208 8851 11104 12317 14426 16624 16947 17527

4564 5622 14577 16348 17025 17965 20354 21467 22693

5128 9887 17989 18286 19896 21227 21578 21627 22241

309 3372 3979 5902 7332 12724 14632 17135 21837

1578 3964 10409 10809 14398 16615 19847 20157 20927

405 3665 8722 10438 13662 14486 15354 17359 20035

156 2071 8916 9572 11757 15911 16290 16471 17445

473 1437 2579 6794 8780 13490 14544 17384 22603

2878 3729 6006 10209 13658 13688 15210 19288 20814

6303 7417 9343 14115 14763 14866 18480 20937 22400

2222 3789 9713 10357 11478 12332 13077 17563 19102

7108 7496 7815

1001 3587 4275

1632 7412 10427

6519 17926 22479

1858 14652 15718

12029 15919 16890

16773 17303 22849

6685 13898 21270

8654 17902 19817

1132 8820 12498

12628 17215 22138

11600 20211 21633

1882 13193 15136

5366 6007 20235

445 721 5052

7141 13800 14466

2630 10410 22797

8623 12644 18354

4711 13411 14398

1840 2393 14235

11036 12167 13764

6645 14543 16056

6796 9875 20601

3267 10865 22488

3669 7936 23010

9339 14110 20104

20710 20895 22725

33 14635 18029

11691 12078 22200

4107 4975 12925

10758 15566 19392

5225 16150 18508

6263 7778 8532

5179 15850 18204

4744 6609 18715

2209 2280 13101

4164 7362 13011

2181 3775 22906

7261 16280 21555

2292 3280 18005

8131 8172 17993

1618 9423 11897

8257 9434 14576

818 10982 21831

6716 10597 22631

13476 18975 22617

3382 3550 3616

4401 12899 16087

10381 11637 21054

4874 12524 22481

7646 12589 13207

11508 13081 16437

539 10709 17795

4381 7927 8274

5922 17172 22500

8346 18095 19510

4115 8461 8543

3174 9486 13873

16636 17880 22075

6437 7026 19403

2895 3846 7504

17850 18094 22504

39 1023 4016

9827 18301 20741

6284 17898 18281

6880 7161 14561

4267 4489 17400

8732 9098 9918

3571 13312 21831

9288 18244 21910

962 6209 21638

757 13506 16953

7013 14029 19726

3471 4856 14929

12833 15640 18135

4460 14554 19565

3319 10819 20100

4507 11131 18073

4799 13990 14574

12834 16423 18991

775 6998 16156

8705 10867 12208

7689 10301 18614

1129 3669 19584

1572 15210 15776

8188 16113 17683

2676 2718 15453

1554 9803 21328

11326 14891 19148

12538 17074 17620

9891 11688 18890

6917 7432 11935

1655 6011 8786

401 4841 7862

9673 12687 12996

8926 9052 15628

12950 15481 20893

1983 11799 14656

15841 19048 22631
10656 14043 21118
9409 12661 19289
1223 10236 11907
5166 11334 12207
2722 5274 13250
16270 18853 22099
3284 3551 19928
4221 5197 21994.

A fourth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 12/16, and puncture a head of the information bits of the extended LDPC code by the puncture length L to generate a punctured LDPC code with the code length N of 69120 bits and the coding rate r of 12/16, in which the puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984

14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

A fourth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 12/16, and puncturing a head of the information bits of the extended LDPC code by the puncture length L to generate a punctured LDPC code with the code length N of 69120 bits and the coding rate r of 12/16, in which the puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801

5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

A fifth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 13/16, and puncture a head of the information bits of the extended LDPC code by the puncture length L to generate a punctured LDPC code with the code length N of 69120 bits and the coding rate r of 13/16, in which the puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797

619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221

1019 4104 5268 6216 7349 8114 9859 10301 13243 13280

530 2246 2414 4631 7301 9274 11647 11955 12663 13059

225 1018 1227 1386 2976 5536 7036 9033 10482 11576

155 288 2183 5745 6947 7659 8563 12346 12776 13071

2936 4854 5083 6930 8031 8840 9501 10569 12062 12785

761 1147 1428 3452 6428 7136 8806 11070 11132 13593

105 327 686 1946 7023 7505 8874 9358 10188 11019

900 2187 4699 4709 6856 9172 10564 10620 10807 12587
814 2253 2888 3712 4821 6146 7520 8520 10634 12429
1951 2950 6379 6558 9818 10037 12323 12395 13215 13303
321 509 1740 1805 5535 6157 7599 10242 10789 10842 11807
4844 6162 6540 7013 8168 8964 10131 12001 12314 13272 13613
3069 4192 5360 6248 6300 7571 7696 9078 11191 12736 13000
3067 3686 6457 6513 7575 8865 9865 10057 10384 12313 13466
3214 3337 4170 9141 9774 10144 10677 10695 10835 11540 12763
1020 1255 2334 3516 4343 5855 7543 12602 12813 12824 12976
164 912 2118 2333 6185 6388 8618 9845 10148 12053 12814
455 1237 2193 5199 6165 8111 8601 9106 10342 11794 11916
109 340 861 1533 5419 5672 7900 9716 9801 10558 12811
568 1697 2215 4035 5214 6064 8014 8636 9041 10325 11454
3549 3748 4382 5543 8120 8263 8379 10975 12382 12431 13300
2245 2385 5775 6138 6820 7317 7766 8784 8825 10630 11347
1 764 1246
8416 9350 12397
4398 8000 13020
1759 10963 13372
1727 3642 8661
5775 7113 11020
8133 9981 10268
3836 8363 12622
5134 9058 11769
4193 7425 13240
7688 10194 12725
7184 11537 12001
1132 3867 7888
3349 3560 11041
433 4314 12967
1325 8438 13658
1564 5528 13539
7513 7780 10869
2809 7959 8955
627 973 10661
5784 7363 8211
1399 8638 10768
4052 5964 12722
6122 6568 13381
2363 7714 13655
3978 6190 11156
5205 9738 13515
3776 8673 12354
7177 7281 8465
2114 2703 7660
611 5174 11514
5376 10178 11815
3688 5062 6739
2048 4347 10802
3789 6898 7545
1304 2603 8694
2676 4586 5579
1483 3524 13577
4179 9669 12851
1974 2005 7057
4837 8554 10690
2608 5607 7049
3985 4904 8642
457 3834 6501
919 3965 13431
7608 11280 12007
2125 2272 4433
2604 7647 9544
4816 6187 6900
7415 10693 13516
3696 7466 7842
6825 9764 11248
2944 6360 10110
2603 4914 7295
3518 10197 13369
2485 11345 11582
2480 5024 10865
6315 8241 10363
9876 10783 13097
3823 4143 11519
2283 4680 6439
10575 10854 13354
294 3722 13646
5846 11230 12312
3733 10629 10856
5999 8633 13366
897 2524 10312
5189 5888 6414
602 3574 7904
5547 6009 12900
594 4594 12908
487 8047 10049
6469 8337 11707
2063 2892 4231
7606 9280 10764
2505 2634 11612
1939 6442 11951
2683 6599 10738
3045 4592 7602
2169 7629 11263
2125 4160 9613
5168 6441 7231
4567 6151 11032
2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114
1605 3147 6804
7176 9669 13133

2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

A fifth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 13/16, and puncturing a head of the information bits of the extended LDPC code by the puncture length L to generate a punctured LDPC code with the code length N of 69120 bits and the coding rate r of 13/16, in which the puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797

619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221

1019 4104 5268 6216 7349 8114 9859 10301 13243 13280

530 2246 2414 4631 7301 9274 11647 11955 12663 13059

225 1018 1227 1386 2976 5536 7036 9033 10482 11576

155 288 2183 5745 6947 7659 8563 12346 12776 13071

2936 4854 5083 6930 8031 8840 9501 10569 12062 12785

761 1147 1428 3452 6428 7136 8806 11070 11132 13593

105 327 686 1946 7023 7505 8874 9358 10188 11019

900 2187 4699 4709 6856 9172 10564 10620 10807 12587

814 2253 2888 3712 4821 6146 7520 8520 10634 12429

1951 2950 6379 6558 9818 10037 12323 12395 13215 13303

321 509 1740 1805 5535 6157 7599 10242 10789 10842 11807

4844 6162 6540 7013 8168 8964 10131 12001 12314 13272 13613

3069 4192 5360 6248 6300 7571 7696 9078 11191 12736 13000

3067 3686 6457 6513 7575 8865 9865 10057 10384 12313 13466

3214 3337 4170 9141 9774 10144 10677 10695 10835 11540 12763

1020 1255 2334 3516 4343 5855 7543 12602 12813 12824 12976

164 912 2118 2333 6185 6388 8618 9845 10148 12053 12814

455 1237 2193 5199 6165 8111 8601 9106 10342 11794 11916

109 340 861 1533 5419 5672 7900 9716 9801 10558 12811

568 1697 2215 4035 5214 6064 8014 8636 9041 10325 11454

3549 3748 4382 5543 8120 8263 8379 10975 12382 12431 13300

2245 2385 5775 6138 6820 7317 7766 8784 8825 10630 11347

1 764 1246
8416 9350 12397
4398 8000 13020
1759 10963 13372
1727 3642 8661
5775 7113 11020
8133 9981 10268
3836 8363 12622
5134 9058 11769
4193 7425 13240
7688 10194 12725
7184 11537 12001
1132 3867 7888
3349 3560 11041
433 4314 12967
1325 8438 13658
1564 5528 13539
7513 7780 10869
2809 7959 8955
627 973 10661
5784 7363 8211
1399 8638 10768
4052 5964 12722
6122 6568 13381
2363 7714 13655
3978 6190 11156
5205 9738 13515
3776 8673 12354
7177 7281 8465
2114 2703 7660
611 5174 11514
5376 10178 11815
3688 5062 6739
2048 4347 10802
3789 6898 7545
1304 2603 8694

2676 4586 5579
1483 3524 13577
4179 9669 12851
1974 2005 7057
4837 8554 10690
2608 5607 7049
3985 4904 8642
457 3834 6501
919 3965 13431
7608 11280 12007
2125 2272 4433
2604 7647 9544
4816 6187 6900
7415 10693 13516
3696 7466 7842
6825 9764 11248
2944 6360 10110
2603 4914 7295
3518 10197 13369
2485 11345 11582
2480 5024 10865
6315 8241 10363
9876 10783 13097
3823 4143 11519
2283 4680 6439
10575 10854 13354
294 3722 13646
5846 11230 12312
3733 10629 10856
5999 8633 13366
897 2524 10312
5189 5888 6414
602 3574 7904
5547 6009 12900
594 4594 12908
487 8047 10049
6469 8337 11707
2063 2892 4231
7606 9280 10764
2505 2634 11612
1939 6442 11951
2683 6599 10738
3045 4592 7602
2169 7629 11263
2125 4160 9613
5168 6441 7231
4567 6151 11032
2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114

1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

A sixth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 14/16, and puncture a head of the information bits of the extended LDPC code by the puncture length L to generate a punctured LDPC code with the code length N of 69120 bits and the coding rate r of 14/16, in which the puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883

56 401 889 1349 1743 1948 2417 3161 4011 4152 4290 4494 4842 4968 5004 5578 5892 6019 6614 7808 8459 8817 8861 9221

862 1893 2282 3900 4835 6050 6137 6710 6817 7325 8486 9343

2003 2378 2588 2858 3621 5612 5635 6341 6997 7598 8627 9143

554 848 2015 3093 5018 5064 5618 5698 6489 7467 7629 8434

525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636

1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250
702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615

1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

A sixth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 14/16, and puncturing a head of the information bits of the extended LDPC code by the puncture length L to generate a punctured LDPC code with the code length N of 69120 bits and the coding rate r of 14/16, in which the puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494 4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250
702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074

909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

In the first transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 9/16. Moreover, the head of the information bits of the extended LDPC code is punctured by the puncture length L, and the punctured LDPC code with the code length N of 69120 bits and the coding rate r of 9/16 is generated. The puncture length L is 1080, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309

1620 1897 3433 6033 6981 7135 9050 9376 10666 13610 14319 15116 17381 17760 20227 21874 23357 24234 24522 25925 26353 26967 28227 28506 29251 29441 30060 30986 31091

1697 2272 3024 5561 6589 7986 8685 9396 10573 12011 14098 16126 16759 16804 18059 18547 20087 20914 21286 21538 22540 24458 26648 27340 28792 28826 29864 30528 31295

89 454 483 695 2280 2835 3144 4970 6829 9853 12615 15904 16729 20640 23848 27573 29312

4591 6748 11640 13018 14778 15843 17885 18377 20224 21833 22954 23726 25488 27761 28222 29259 29778

242 710 1570 2623 3133 3257 4453 7853 16055 16408 17180 20157 20277 21448 22859 25006 31218

2004 5038 5159 8471 10803 11018 15651 17765 20995 24165 24257 24306 26164 27463 28488 28826 29380

755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524
3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668 31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

In the first reception device/method according to the present technology, the punctured LDPC code obtained from the data transmitted by the first transmission method is decoded.

In the second transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 10/16. Moreover, the head of the information bits of the extended LDPC code is punctured by the puncture length L, and the punctured LDPC code with the code length N of 69120 bits and the coding rate r of 10/16 is generated. The puncture length L is 360, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128

81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208

2719 3861 6596 12408 13668 15486 16885 16977 18274 19208 19890 21346 23207 24566

169 623 1360 1514 2215 3773 13467 14433 17011 17642 17974 19056 21002 26082

1809 4208 4378 7127 8992 9253 13095 14428 20298 20434 20780 22453 23987 24226 3750 5548 5627 11806 12055 12600 16367 19283 20279 23674 23859 24746 25047 25557

626 989 3029 3501 9868 11097 11829 14550 18865 19686 20277 20679 22667 23024

66 468 9319 10107 12086 12575 14287 15673 17399 19430 21403 23712 25071 26139 5890 7144 8092 9954 10405 12492 14034 14770 16442 18975 19293 19963 24493 25001

5242 5386 5857 6353 16616 18682 19482 20494 20865 21691 22128 23279 24524 25858

313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773

7180 8463 10630 11065 13125 15606 15615 16108 16806 17007 21027 23775 23872 25603

2544 4045 4102 4379 4977 9300 9816 11806 14082 14953 20047 21810 24398 26233

5608 6955 7100 7354 8443 13176 13715 14311 17707 19197 19199 19549 19778 25688 7204 8079 9865 13251 14247 14416 15848 17260 19621 22165 22584 24251 24445 24668

812 2157 6111 6800 7428 8121 8209 10540 15043 15915 20957 23054 24932 26228

738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953

884 1173 5946 6802 7126 8073 9725 12993 13284 14460 18413 19355 20788 22183

1523 2486 2507 2513 2887 3775 4748 4983 8397 10526 15292 20542 24554 26120

415 920 1483 2585 7547 9312 9463 9762 10763 11681 12495 13553 16626 20550

8510 14430 18465

8516 11383 15056

5788 8873 12241

3576 4705 13247

7913 15707 20264

4994 16076 24518

3118 14498 26083

13530 19421 22760

1268 9435 12503

5430 6784 9179

19982 22263 25877

4800 9769 20997

3614 4723 10452

10818 17002 18966

20536 22129 25754

4386 11862 21876

8556 12401 20631

625 3186 20530

213 1157 11180

20874 20939 23730

7210 7835 20578

1688 8640 17771

10436 10992 19787

9947 11250 15184

5660 10592 21566

1096 11572 24822

7144 19336 24754

862 15406 22500

2671 16002 17029

3960 7516 14638

16601 17840 21707

3795 5088 22317

12646 13728 22927

5142 5473 20644

15959 16640 21629

884 4142 14642

8025 9929 19307

12368 13927 21189

1874 8772 12530

4188 10407 22338

1754 17998 18329

9307 17615 20181

3017 3095 24365

1812 11208 21889

4866 16991 19462

11251 14300 20871

7825 13396 21596

7895 10014 13628

1835 6842 8973

536 2005 14500

11035 14258 16465

10330 17828 23837

2215 14775 17613

13464 16717 18077

21737 24089 25823

12163 16025 22009

10733 11651 14422

1397 10954 11495

12972 13143 14664

3125 6046 18565

615 21505 21948

3758 11341 22714

17956 25056 25311

3113 17145 22344

15975 20969 21484

13465 14838 17582

7220 8973 13474

881 3386 22042

12855 20216 26257

941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

In the second reception device/method according to the present technology, the punctured LDPC code obtained from the data transmitted by the second transmission method is decoded.

In the third transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 11/16. Moreover, the head of the information bits of the extended LDPC code is punctured by the puncture length L, and the punctured LDPC code with the code length N of 69120 bits and the coding rate r of 11/16 is generated. The puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104
1223 1343 1582 2389 2457 2524 4278 5155 5309 6801 6848 6856 7504 9555 10582 11127 12596 14665 16067 17209 18124 18945 19359 19836 20717 21026 21042 21752 22822
1252 2410 4061 4847 6319 6912 8847 9724 11029 12296 13360 13534 14120 14581 15402 15619 15988 16861 17114 17389 18708 19641 20523 21198 21857 21989 22282 22364 22982
509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713
152 1158 1338 1983 3287 5798 11794 16716
156 532 1476 12617 14920 15466 15781 18998
3677 7934 11473 17794 18208 18276 19678 21229
3820 4864 6235 8097 12654 17762 20954 21584
3342 10355 10565 11032 14395 16956 20922 20989 22452
531 2662 4931 8679 10369 16527 17238 18168 21983
880 3029 9775 11071 12791 17778 19893 20173 22001
41 427 8138 8867 10585 13703 17145 20968 22923
5145 7064 9028 12496 12966 15267 18786 21580 21897
4722 6208 8851 11104 12317 14426 16624 16947 17527
4564 5622 14577 16348 17025 17965 20354 21467 22693
5128 9887 17989 18286 19896 21227 21578 21627 22241
309 3372 3979 5902 7332 12724 14632 17135 21837
1578 3964 10409 10809 14398 16615 19847 20157 20927
405 3665 8722 10438 13662 14486 15354 17359 20035
156 2071 8916 9572 11757 15911 16290 16471 17445
473 1437 2579 6794 8780 13490 14544 17384 22603
2878 3729 6006 10209 13658 13688 15210 19288 20814
6303 7417 9343 14115 14763 14866 18480 20937 22400
2222 3789 9713 10357 11478 12332 13077 17563 19102
7108 7496 7815
1001 3587 4275
1632 7412 10427
6519 17926 22479
1858 14652 15718
12029 15919 16890
16773 17303 22849
6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993

1618 9423 11897
8257 9434 14576
818 10982 21831
6716 10597 22631
13476 18975 22617
3382 3550 3616
4401 12899 16087
10381 11637 21054
4874 12524 22481
7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786
401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

In the third reception device/method according to the present technology, the punctured LDPC code obtained from the data transmitted by the third transmission method is decoded.

In the fourth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 12/16. Moreover, the head of the information bits of the extended LDPC code is punctured by the puncture length L, and the punctured LDPC code with the code length N of 69120 bits and the coding rate r of 12/16 is generated. The puncture length L is 1440, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961

11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

In the fourth reception device/method according to the present technology, the punctured LDPC code obtained from the data transmitted by the fourth transmission method is decoded.

In the fifth transmission device/method according to the present technology, the LDPC coding for information bits with an information length $K=N\times r$ is performed and the extended LDPC code having parity bits with a parity length $M=N+L-K$ is generated on the basis of an extended parity check matrix having rows and columns each extended by a predetermined puncture length L with respect to a parity check matrix of an LDPC code with a code length N of 69120 bits and a coding rate r of 13/16. Moreover, the head of the information bits of the extended LDPC code is punctured by the puncture length L, and the punctured LDPC code with the code length N of 69120 bits and the coding rate r of 13/16 is generated. The puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797

619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221

1019 4104 5268 6216 7349 8114 9859 10301 13243 13280

530 2246 2414 4631 7301 9274 11647 11955 12663 13059

225 1018 1227 1386 2976 5536 7036 9033 10482 11576

155 288 2183 5745 6947 7659 8563 12346 12776 13071

2936 4854 5083 6930 8031 8840 9501 10569 12062 12785

761 1147 1428 3452 6428 7136 8806 11070 11132 13593

105 327 686 1946 7023 7505 8874 9358 10188 11019

900 2187 4699 4709 6856 9172 10564 10620 10807 12587

814 2253 2888 3712 4821 6146 7520 8520 10634 12429

1951 2950 6379 6558 9818 10037 12323 12395 13215 13303

321 509 1740 1805 5535 6157 7599 10242 10789 10842 11807

4844 6162 6540 7013 8168 8964 10131 12001 12314 13272 13613

3069 4192 5360 6248 6300 7571 7696 9078 11191 12736 13000

3067 3686 6457 6513 7575 8865 9865 10057 10384 12313 13466

3214 3337 4170 9141 9774 10144 10677 10695 10835 11540 12763

1020 1255 2334 3516 4343 5855 7543 12602 12813 12824 12976

164 912 2118 2333 6185 6388 8618 9845 10148 12053 12814

455 1237 2193 5199 6165 8111 8601 9106 10342 11794 11916

109 340 861 1533 5419 5672 7900 9716 9801 10558 12811

568 1697 2215 4035 5214 6064 8014 8636 9041 10325 11454

3549 3748 4382 5543 8120 8263 8379 10975 12382 12431 13300

2245 2385 5775 6138 6820 7317 7766 8784 8825 10630 11347

1 764 1246

8416 9350 12397

4398 8000 13020

1759 10963 13372

1727 3642 8661

5775 7113 11020

8133 9981 10268

3836 8363 12622

5134 9058 11769

4193 7425 13240

7688 10194 12725

7184 11537 12001

1132 3867 7888

3349 3560 11041

433 4314 12967

1325 8438 13658

1564 5528 13539

7513 7780 10869

2809 7959 8955

627 973 10661

5784 7363 8211

1399 8638 10768

4052 5964 12722

6122 6568 13381

2363 7714 13655

3978 6190 11156

5205 9738 13515

3776 8673 12354

7177 7281 8465

2114 2703 7660

611 5174 11514

5376 10178 11815

3688 5062 6739

2048 4347 10802

3789 6898 7545

1304 2603 8694

2676 4586 5579

1483 3524 13577

4179 9669 12851

1974 2005 7057

4837 8554 10690

2608 5607 7049

3985 4904 8642

457 3834 6501

919 3965 13431

7608 11280 12007

2125 2272 4433

2604 7647 9544

4816 6187 6900

7415 10693 13516

3696 7466 7842

6825 9764 11248

2944 6360 10110

2603 4914 7295

3518 10197 13369

2485 11345 11582

2480 5024 10865

6315 8241 10363

9876 10783 13097

3823 4143 11519

2283 4680 6439

10575 10854 13354

294 3722 13646

5846 11230 12312

3733 10629 10856

5999 8633 13366

897 2524 10312

5189 5888 6414

602 3574 7904

5547 6009 12900

594 4594 12908

487 8047 10049

6469 8337 11707

2063 2892 4231

7606 9280 10764

2505 2634 11612

1939 6442 11951

2683 6599 10738

3045 4592 7602

2169 7629 11263

2125 4160 9613

5168 6441 7231

4567 6151 11032

2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114
1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

In the fifth reception device/method according to the present technology, the punctured LDPC code obtained from the data transmitted by the fifth transmission method is decoded.

In the sixth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 14/16. Moreover, the head of the information bits of the extended LDPC code is punctured by the puncture length L, and the punctured LDPC code with the code length N of 69120 bits and the coding rate r of 14/16 is generated. The puncture length L is 720, the LDPC code includes information bits and parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494 4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250
702 1008 1594

265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

In the sixth reception device/method according to the present technology, the punctured LDPC code obtained from the data transmitted by the sixth transmission method is decoded.

Note that the transmission device and the reception device may be independent devices or may be internal blocks configuring one device.

Effects of the Invention

According to the present technology, good communication quality can be secured in data transmission using an LDPC code.

Note that effects described here are not necessarily limited, and any of effects described in the present disclosure may be exhibited.

BRIEF DESCRIPTION OF DRAWINGS

FIG. 3 is a diagram illustrating an example of a parity check matrix of an LDPC code.

FIG. 13 is a diagram for describing a parity check matrix of an LDPC code defined in the standard of DVB-T.2.

FIG. 21 is a diagram for describing a method of obtaining the parity check matrix H from the parity check matrix initial value table.

FIG. 32 is a diagram illustrating examples of a coordinate of a signal point of UC in a case where a modulation method is QPSK.

FIG. 33 is a diagram illustrating examples of a coordinate of a signal point of 2D-NUC in a case where the modulation method is 16QAM.

FIG. 34 is a diagram illustrating examples of a coordinate of a signal point of 1 D-NUC in a case where the modulation method is 1024QAM.

FIGS. 35A and 35B are diagrams illustrating a relationship between a symbol y of 1024QAM and a position vector u.

FIG. 36 is a diagram illustrating examples of a coordinate zq of a signal point of QPSK-UC.

FIG. 37 is a diagram illustrating examples of a coordinate zq of a signal point of QPSK-UC.

FIG. 38 is a diagram illustrating examples of a coordinate zq of a signal point of 16QAM-UC.

FIG. 39 is a diagram illustrating examples of a coordinate zq of a signal point of 16QAM-UC.

FIG. 40 is a diagram illustrating examples of a coordinate zq of a signal point of 64QAM-UC.

FIG. 41 is a diagram illustrating examples of a coordinate zq of a signal point of 64QAM-UC.

FIG. 42 is a diagram illustrating examples of a coordinate zq of a signal point of 256QAM-UC.

FIG. 43 is a diagram illustrating examples of a coordinate zq of a signal point of 256QAM-UC.

FIG. 44 is a diagram illustrating examples of a coordinate zq of a signal point of 1024QAM-UC.

FIG. 45 is a diagram illustrating examples of a coordinate zq of a signal point of 1024QAM-UC.

FIG. 46 is a diagram illustrating examples of a coordinate zq of a signal point of 4096QAM-UC.

FIG. 47 is a diagram illustrating examples of a coordinate zq of a signal point of 4096QAM-UC.

FIG. 48 is a diagram illustrating examples of a coordinate zs of a signal point of 16QAM-2D-NUC.

FIG. 49 is a diagram illustrating examples of a coordinate zs of a signal point of 64QAM-2D-NUC.

FIG. 50 is a diagram illustrating examples of a coordinate zs of a signal point of 256QAM-2D-NUC.

FIG. 51 is a diagram illustrating examples of a coordinate zs of a signal point of 256QAM-2D-NUC.

FIG. 52 is a diagram illustrating examples of a coordinate zs of a signal point of 1024QAM-1D-NUC.

FIGS. 53A and 53B are diagrams illustrating a relationship between a symbol y of 1024QAM and a position vector u.

FIG. 54 is a diagram illustrating examples of a coordinate zs of a signal point of 4096QAM-1D-NUC.

FIG. 55 is a diagram illustrating a relationship between a symbol y of 4096QAM and a position vector u.

FIG. 56 is a diagram illustrating a relationship between a symbol y of 4096QAM and a position vector u.

FIG. 58 is a diagram for describing the block interleaving performed by the block interleaver 25.

FIG. 60 is a diagram illustrating an example of a GW pattern for an LDPC code with a code length N of 69120 bits.

FIG. 79 is a diagram illustrating an example of a parity check matrix initial value table representing a type A extended parity check matrix of a type A extended LDPC code for (69k, 2/16).

FIG. 80 is a diagram illustrating an example of a parity check matrix initial value table representing a type A extended parity check matrix of a type A extended LDPC code for (69k, 2/16).

FIG. 81 is a diagram illustrating an example of a parity check matrix initial value table representing a type A extended parity check matrix of a type A extended LDPC code for (69k, 3/16).

FIG. 82 is a diagram illustrating an example of a parity check matrix initial value table representing a type A extended parity check matrix of a type A extended LDPC code for (69k, 3/16).

FIG. 83 is a diagram illustrating an example of a parity check matrix initial value table representing a type A extended parity check matrix of a type A extended LDPC code for (69k, 4/16).

FIG. 84 is a diagram illustrating an example of a parity check matrix initial value table representing a type A extended parity check matrix of a type A extended LDPC code for (69k, 4/16).

FIG. 85 is a diagram illustrating an example of a parity check matrix initial value table representing a type A extended parity check matrix of a type A extended LDPC code for (69k, 5/16).

FIG. 86 is a diagram illustrating an example of a parity check matrix initial value table representing a type A extended parity check matrix of a type A extended LDPC code for (69k, 5/16).

FIG. 87 is a diagram illustrating an example of a parity check matrix initial value table representing a type A extended parity check matrix of a type A extended LDPC code for (69k, 6/16).

FIG. 88 is a diagram illustrating an example of a parity check matrix initial value table representing a type A extended parity check matrix of a type A extended LDPC code for (69k, 6/16).

FIG. 89 is a diagram illustrating an example of a parity check matrix initial value table representing a type A extended parity check matrix of a type A extended LDPC code for (69k, 7/16).

FIG. 90 is a diagram illustrating an example of a parity check matrix initial value table representing a type A extended parity check matrix of a type A extended LDPC code for (69k, 7/16).

FIG. 91 is a diagram illustrating an example of a parity check matrix initial value table representing a type A extended parity check matrix of a type A extended LDPC code for (69k, 7/16).

FIG. 92 is a diagram illustrating an example of a parity check matrix initial value table representing a type A extended parity check matrix of a type A extended LDPC code for (69k, 8/16).

FIG. 93 is a diagram illustrating an example of a parity check matrix initial value table representing a type A extended parity check matrix of a type A extended LDPC code for (69k, 8/16).

FIG. 94 is a diagram illustrating an example of a parity check matrix initial value table representing a type A extended parity check matrix of a type A extended LDPC code for (69k, 8/16).

FIG. 95 is a diagram illustrating an example of a parity check matrix initial value table representing a type A extended parity check matrix of a type A extended LDPC code for (69k, 9/16).

FIG. 96 is a diagram illustrating an example of a parity check matrix initial value table representing a type A extended parity check matrix of a type A extended LDPC code for (69k, 9/16).

FIG. 97 is a diagram illustrating an example of a parity check matrix initial value table representing a type A extended parity check matrix of a type A extended LDPC code for (69k, 9/16).

FIG. 99 is a diagram illustrating an example of a parity check matrix initial value table representing a type B extended parity check matrix of a type B extended LDPC code for (69k, 9/16).

FIG. 100 is a diagram illustrating an example of a parity check matrix initial value table representing a type B extended parity check matrix of a type B extended LDPC code for (69k, 9/16).

FIG. 101 is a diagram illustrating an example of a parity check matrix initial value table representing a type B extended parity check matrix of a type B extended LDPC code for (69k, 9/16).

FIG. 102 is a diagram illustrating an example of a parity check matrix initial value table representing a type B extended parity check matrix of a type B extended LDPC code for (69k, 10/16).

FIG. 103 is a diagram illustrating an example of a parity check matrix initial value table representing a type B extended parity check matrix of a type B extended LDPC code for (69k, 10/16).

FIG. 104 is a diagram illustrating an example of a parity check matrix initial value table representing a type B extended parity check matrix of a type B extended LDPC code for (69k, 10/16).

FIG. 105 is a diagram illustrating an example of a parity check matrix initial value table representing a type B extended parity check matrix of a type B extended LDPC code for (69k, 10/16).

FIG. 106 is a diagram illustrating an example of a parity check matrix initial value table representing a type B extended parity check matrix of a type B extended LDPC code for (69k, 11/16).

FIG. 107 is a diagram illustrating an example of a parity check matrix initial value table representing a type B extended parity check matrix of a type B extended LDPC code for (69k, 11/16).

FIG. 108 is a diagram illustrating an example of a parity check matrix initial value table representing a type B extended parity check matrix of a type B extended LDPC code for (69k, 11/16).

FIG. 109 is a diagram illustrating an example of a parity check matrix initial value table representing a type B extended parity check matrix of a type B extended LDPC code for (69k, 11/16).

FIG. 110 is a diagram illustrating an example of a parity check matrix initial value table representing a type B extended parity check matrix of a type B extended LDPC code for (69k, 12/16).

FIG. 111 is a diagram illustrating an example of a parity check matrix initial value table representing a type B extended parity check matrix of a type B extended LDPC code for (69k, 12/16).

FIG. 112 is a diagram illustrating an example of a parity check matrix initial value table representing a type B extended parity check matrix of a type B extended LDPC code for (69k, 12/16).

FIG. 113 is a diagram illustrating an example of a parity check matrix initial value table representing a type B extended parity check matrix of a type B extended LDPC code for (69k, 12/16).

FIG. 114 is a diagram illustrating an example of a parity check matrix initial value table representing a type B extended parity check matrix of a type B extended LDPC code for (69k, 13/16).

FIG. 115 is a diagram illustrating an example of a parity check matrix initial value table representing a type B extended parity check matrix of a type B extended LDPC code for (69k, 13/16).

FIG. 116 is a diagram illustrating an example of a parity check matrix initial value table representing a type B extended parity check matrix of a type B extended LDPC code for (69k, 13/16).

FIG. 117 is a diagram illustrating an example of a parity check matrix initial value table representing a type B extended parity check matrix of a type B extended LDPC code for (69k, 13/16).

FIG. 118 is a diagram illustrating an example of a parity check matrix initial value table representing a type B extended parity check matrix of a type B extended LDPC code for (69k, 14/16).

FIG. 119 is a diagram illustrating an example of a parity check matrix initial value table representing a type B extended parity check matrix of a type B extended LDPC code for (69k, 14/16).

FIG. 120 is a diagram illustrating an example of a parity check matrix initial value table representing a type B extended parity check matrix of a type B extended LDPC code for (69k, 14/16).

FIG. 121 is a diagram illustrating an example of a parity check matrix initial value table representing a type B extended parity check matrix of a type B extended LDPC code for (69k, 14/16).

FIG. 122 is a diagram for describing column weights of a type A extended parity check matrix represented by a parity check matrix initial value table of the type A method.

FIG. 123 is a diagram for describing parameters of the type A extended parity check matrix represented by the parity check matrix initial value table of the type A method.

FIG. 124 is a diagram for describing a column weight of a type B extended parity check matrix represented by a parity check matrix initial value table of the type B method.

FIG. 125 is a diagram for describing parameters of the type B extended parity check matrix represented by the parity check matrix initial value table of the type B method.

FIG. 126 is a block diagram illustrating a configuration example of an embodiment of a computer to which the present technology is applied.

MODE FOR CARRYING OUT THE INVENTION

Hereinafter, an embodiment of the present technology will be described. Before the description of the embodiment, an LDPC code will be described.

<LDPC Code>

Note that the LDPC code is a linear code and is not necessarily binary. However, description will be given on the assumption that the LDPC code is binary.

An LDPC code is most characterized in that a parity check matrix defining the LDPC code is sparse. Here, a sparse matrix is a matrix in which the number of "1"s of matrix elements is very small (a matrix in which most elements are 0).

Figure 1:
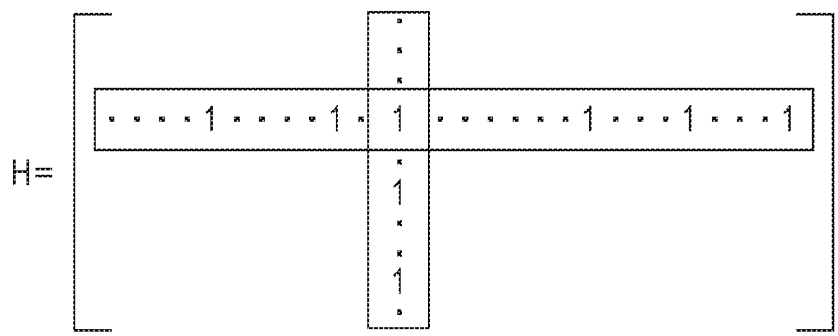
FIG. 1 is a diagram for describing a parity check matrix H of an LDPC code.

FIG. 1 is a diagram illustrating a parity check matrix H of the LDPC code.

In the parity check matrix H in FIG. 1, a weight of each column (column weight) (the number of "1"s) (weight) is "3", and a weight of each row (row weight) is "6".

In coding with an LDPC code (LDPC coding), a codeword (LDPC code) is generated by generating a generator matrix G on the basis of the parity check matrix H and multiplying binary information bits by the generator matrix G.

Specifically, a coding device for performing the LDPC coding first calculates the generator matrix G that holds an expression $GH^T=0$ with a transposed matrix $H^T$ of the parity check matrix H. Here, in a case where the generator matrix G is a K×N matrix, the coding device multiplies the generator matrix G by a bit string (vector u) of information bits including K bits and generates a codeword c (=uG) including N bits. The codeword (LDPC code) generated by the coding device is received at a reception side via a predetermined communication path.

Decoding of the LDPC code can be performed by an algorithm called probabilistic decoding proposed by Gallager, which is a message passing algorithm according to belief propagation on a so-called Tanner graph including a variable node (also called message node) and a check node. Here, as appropriate, the variable node and the check node are hereinafter also simply referred to as nodes.

Figure 2:
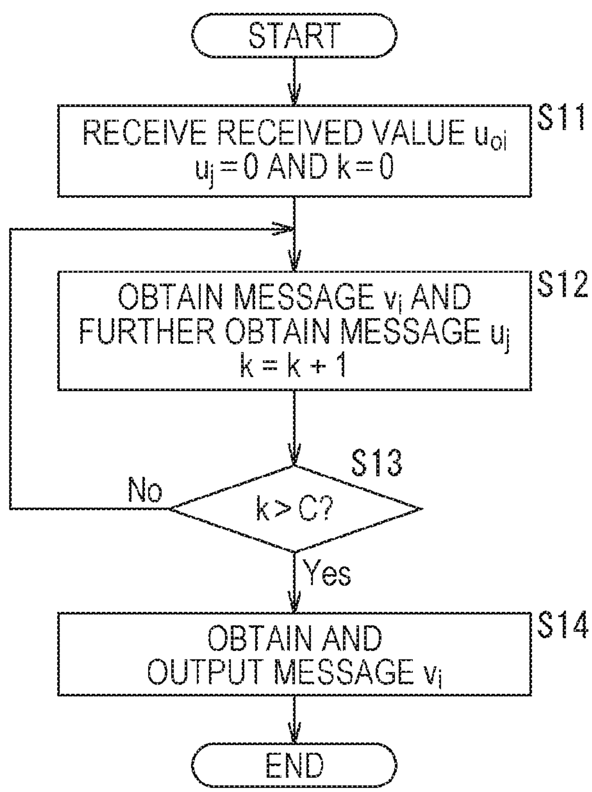
FIG. 2 is a flowchart for describing a procedure of decoding an LDPC code.

FIG. 2 is a flowchart illustrating a procedure of decoding an LDPC code.

Note that, hereinafter, a real value (received LLR) expressing "0" likeliness of a value of an i-th code bit of the LDPC code (1 codeword) received on the reception side, using a log likelihood ratio, is also referred to as a received value $u_{0i}$ as appropriate. Furthermore, a message output from the check node is $u_j$ and a message output from the variable node is $v_i$.

First, in decoding the LDPC code, as illustrated in FIG. 2, in step S11, the LDPC code is received, a message (check node message) $u_j$ is initialized to "0", a variable k that is an integer as a counter for repeated processing is initialized to "0", and the processing proceeds to step S12. In step S12, a message (variable node message) $v_i$ is obtained by performing an operation (variable node operation) illustrated in the expression (1) on the basis of the received value $u_{0i}$ obtained by receiving the LDPC code, and moreover, the message $u_j$ is obtained by performing an operation (check node operation) illustrated in the expression (2) on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in the expressions (1) and (2) are arbitrarily selectable parameters respectively indicating the numbers of "1"s in a vertical direction (column) and a cross direction (row) of the parity check matrix H. For example, in the case of the LDPC code ((3, 6) LDPC code) for the parity check matrix H with the column weight of 3 and the row weight of 6 as illustrated in FIG. 1, $d_v=3$ and $d_c=6$.

Note that, in each of the variable node operation in the expression (1) and the check node operation in the expression (2), a message input from an edge (a line connecting the variable node and the check node) that is about to output a message is not an object for the operation. Therefore, an operation range is 1 to $d_v-1$ or 1 to $d_c-1$. Furthermore, the check node operation in the expression (2) is performed by, in practice, creating a table of a function R $(v_1, v_2)$ illustrated in the expression (3) defined by one output for two inputs $v_1$ and $v_2$, in advance, and continuously (recursively) using the table as illustrated in the expression (4).

[Math. 3]

$$x=2\tan h^{-1}\{\tan h(v_1/2)\tan h(v_2/2)\}=R(v_1,v_2) \tag{3}$$

[Math. 4]

$$u_j=R(v_1,R(v_2,R(v_3, \ldots R(v_{d_c-2},v_{d_c-1})))).$$

In step S12, the variable k is further incremented by "1", and the processing proceeds to step S13. In step S13, whether or not the variable k is larger than a predetermined number of repetitive decoding times C is determined. In a case where the variable k is determined not to be larger than C in step S13, the processing returns to step S12 and hereinafter similar processing is repeated.

Furthermore, in a case where the variable k is determined to be larger than C in step S13, the processing proceeds to step S14, the operation illustrated in the expression (5) is performed to obtain the message $v_i$ as a decoding result to be finally output and the message $v_i$ is output, and the decoding processing for the LDPC code is terminated.

[Math. 5]

$$v_i = u_{0i} + \sum_{j=1}^{d_v} u_j \tag{5}$$

Here, the operation in the expression (5) is performed using messages $u_j$ from all the edges connected to the variable node, different from the variable node operation in the expression (1).

FIG. 3 is a diagram illustrating an example of the parity check matrix H of a (3, 6) LDPC code (a coding rate of 1/2 and a code length of 12).

In the parity check matrix H in FIG. 3, as in FIG. 1, the column weight is 3 and the row weight is 6.

Figure 4:
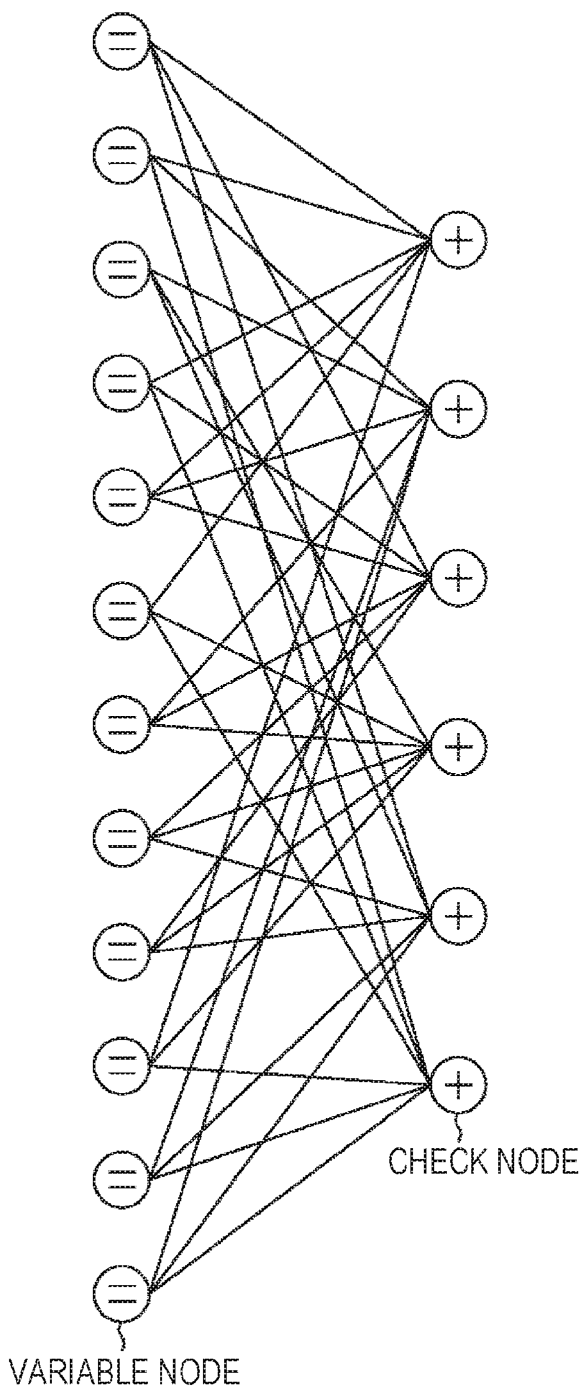
FIG. 4 is a diagram illustrating an example of a Tanner graph of the parity check matrix H.

FIG. 4 is a diagram illustrating a Tanner graph of the parity check matrix H in FIG. 3.

Here, in FIG. 4, the check node is represented by plus "+", and the variable node is represented by equal "=". The check node and variable node correspond to a row and a column of the parity check matrix H, respectively. A connection between the check node and the variable node is an edge and corresponds to "1" of an element of the parity check matrix.

In other words, in a case where an element of the j-th row and the i-th column of the parity check matrix is 1, the i-th variable node from the top ("=" node) and the j-th check node from the top ("+" node) are connected by an edge in FIG. 4. The edge indicates that a code bit corresponding to the variable node has a constraint corresponding to the check node.

In a sum product algorithm that is a decoding method of an LDPC code, the variable node operation and the check node operation are repeatedly performed.

Figure 5:
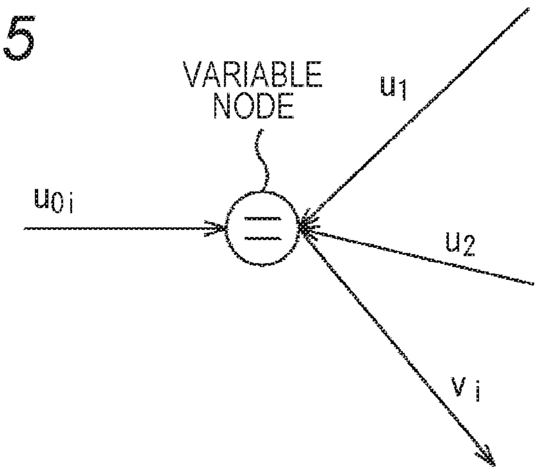
FIG. 5 is a diagram illustrating an example of a variable node.

FIG. 5 is a diagram illustrating the variable node operation performed in the variable node.

In the variable node, the message $v_i$ corresponding to the edge to be calculated is obtained by the variable node operation in the expression (1) using messages $u_1$ and $u_2$ from the remaining edges connected to the variable node and the received value $u_{0i}$. Messages corresponding to other edges are similarly obtained.

Figure 6:
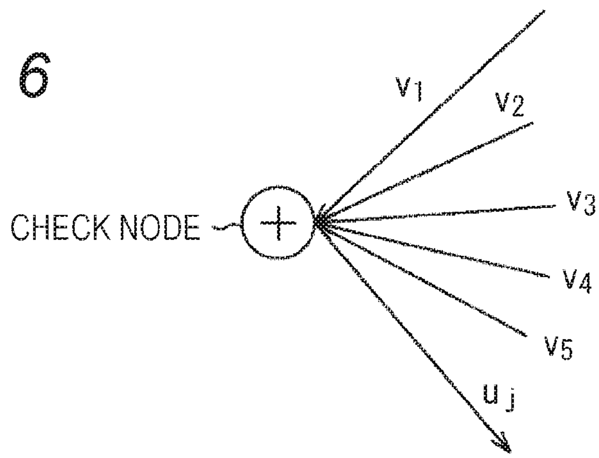
FIG. 6 is a diagram illustrating an example of a check node.

FIG. 6 is a diagram illustrating the check node operation performed in the check node.

Here, the check node operation in the expression (2) can be rewritten to the expression (6), using a relationship of an expression a×b=exp {ln(|a|)+ln(|b|)}×sign (a)×sign (b). Note that sign (x) is 1 when x≥0 and −1 when x<0.

[Math. 6]

$$u_j = 2\tanh^{-1}\left(\prod_{i=1}^{d_c-1}\tanh\left(\frac{v_i}{2}\right)\right) = 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\mathrm{sign}\left(\tanh\left(\frac{v_i}{2}\right)\right)\right] = 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\mathrm{sign}(v_i) \quad (6)$$

When the function φ(x) is defined as an expression φ(x)=ln(tan h(x/2)) when x≥0, an expression $\varphi^{-1}(x)$=2 tan $h^{-1}(e^{-x})$ holds and thus the expression (6) can be deformed into the expression (7).

[Math. 7]

$$u_j = \phi^{-1}\left(\sum_{i=1}^{d_c-1}\phi(|v_i|)\right)\times\prod_{i=1}^{d_c-1}\mathrm{sign}(v_i) \quad (7)$$

In the check node, the check node operation in the expression (2) is performed according to the expression (7).

In other words, in the check node, the message $u_j$ corresponding to the edge to be calculated is obtained by the check node operation in the expression (7) using messages $v_1$, $v_2$, $v_3$, $v_4$, and $v_5$ from the remaining edges connected to the check node, as illustrated in FIG. 6. Messages corresponding to other edges are similarly obtained.

Note that the function φ(x) in the expression (7) can be expressed by the expression $\varphi(x)=\ln((e^x+1)/(e^x-1))$, and $\varphi(x)=\varphi^{-1}(x)$ holds when x>0. When the functions φ(x) and $\varphi^{-1}$ (x) are implemented in hardware, the functions may be implemented using look up tables (LUTs), and the LUTs are the same.

<Configuration Example of Transmission System to which Present Technology is Applied>

Figure 7:
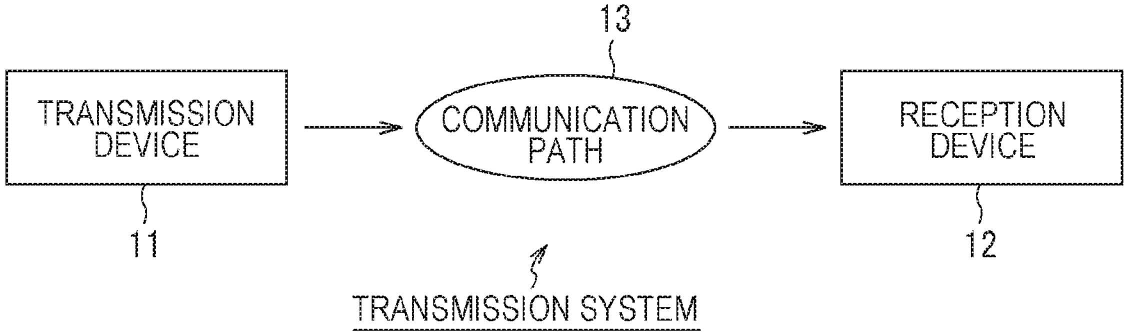
FIG. 7 is a diagram illustrating a configuration example of an embodiment of a transmission system to which the present technology is applied.

FIG. 7 is a diagram illustrating a configuration example of an embodiment of a transmission system (a system refers to a group of a plurality of logically gathered devices, and whether or not the devices of configurations are in the same casing is irrelevant) to which the present technology is applied.

The transmission system in FIG. 7 is configured by a transmission device 11 and a reception device 12.

The transmission device 11 performs transmission (broadcasting) of, for example, a television broadcast program or the like. In other words, the transmission device 11 encodes target data to be transmitted, such as image data and audio data as a program, into an LDPC code, and transmits the LDPC code via a communication path 13 such as a satellite line, a ground wave, or a cable (wired line), for example.

The reception device 12 receives the LDPC code transmitted from the transmission device 11 via the communication path 13, decodes the LDPC code to the target data, and outputs the target data.

Here, it is known that the LDPC code used in the transmission system in FIG. 7 exhibits extremely high capability in an additive white Gaussian noise (AWGN) communication path.

Meanwhile, in the communication path 13, burst errors and erasures may occur. For example, in particular, in a case where the communication path 13 is a ground wave, power of a certain symbol becomes zero (erasure) in some cases according to a delay of an echo (a path other than a main path) in a multipath environment where a desired to undesired ratio (D/U) is 0 dB (power of undesired=echo is equal to power of desired=main path) in an orthogonal frequency division multiplexing (OFDM) system.

Furthermore, power of the entire symbols of OFDM at a specific time may become zero (erasure) due to a Doppler frequency in the case where D/U is 0 db even in a flutter (a communication path in which a delay is 0 and to which an echo with Doppler frequency is added).

Moreover, a burst error may occur due to a wiring condition from a receiving unit (not illustrated) on the reception device 12 side such as an antenna that receives a signal from the transmission device 11 to the reception device 12, or power supply instability of the reception device 12.

Meanwhile, in decoding the LDPC code, the variable node operation in the expression (1) with addition of (the received value $u_{0i}$) of the code bit of the LDPC code is performed, as illustrated in FIG. 5, at a column of the parity check matrix H and thus at the variable node corresponding to the code bit of the LDPC code. Therefore, if an error occurs in the code bit used in the variable node operation, the accuracy of an obtained message decreases.

Then, in decoding the LDPC code, the check node operation in the expression (7) is performed in the check node using the messages obtained at the variable nodes connected to the check node. Therefore, if the number of check nodes in which (the code bits of the LDPC codes corresponding to) a plurality of connected variable nodes become error (including erasure) at the same time is large, the performance of the decoding deteriorates.

In other words, for example, if two or more of the variable nodes connected to the check node become erasures at the same time, for example, the check node returns a message informing that a probability of a value being 0 and a probability of a value being 1 are equal to all the variable nodes. In this case, the check node returning the equal probability message will not contribute to one decoding processing (a set of the variable node operation and the check node operation). As a result, a large number of repetitions of the decoding processing is required, resulting in deterioration of the performance of the decoding and an increase in the power consumption of the reception device 12 for decoding the LDPC code.

Therefore, in the transmission system in FIG. 7, improvement of resistance to burst errors and erasure is possible while maintaining the performance in the AWGN communication path (AWGN channel).

<Configuration Example of Transmission Device 11>

Figure 8:
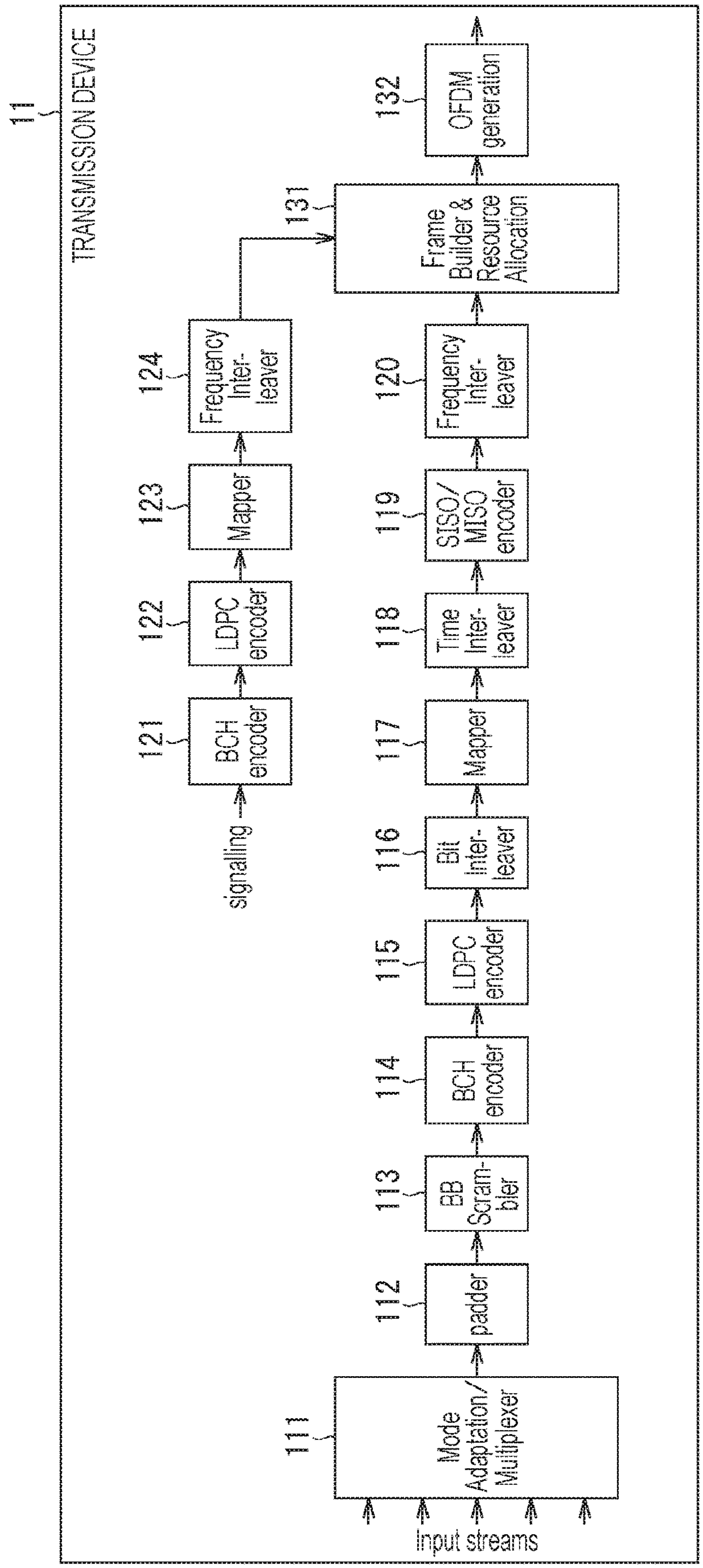
FIG. 8 is a block diagram illustrating a configuration example of a transmission device 11.

FIG. 8 is a block diagram illustrating a configuration example of the transmission device 11 in FIG. 7.

In the transmission device 11, one or more input streams as the target data are supplied to a mode adaptation/multiplexer 111.

The mode adaptation/multiplexer 111 performs processing such as mode selection and multiplexing of the one or more input streams supplied thereto as necessary, and supplies resulting data to a padder 112.

The padder 112 performs necessary zero padding (insertion of null) to the data from the mode adaptation/multiplexer 111, and supplies resulting data to a base band (BB) scrambler 113.

The BB scrambler 113 applies BB scramble to the data from the padder 112, and supplies resulting data to a BCH encoder 114.

The BCH encoder 114 performs BCH coding for the data from the BB scrambler 113, and supplies resultant data to an LDPC encoder 115 as LDPC target data to be LDPC encoded.

The LDPC encoder 115 performs, for the LDPC target data from the BCH encoder 114, LDPC coding according to a parity check matrix in which a parity matrix that is a portion corresponding to a parity bit of the LDPC code has a step (dual diagonal) structure, and outputs an LDPC code having the LDPC target data as information bits.

In other words, the LDPC encoder 115 performs LDPC coding for coding the LDPC target data to an LDPC code (corresponding to the parity check matrix) defined in a predetermined standard such as DVB-S.2, DVB-T.2, DVB-C.2, or ATSC 3.0 or to another LDPC code, and outputs a resulting LDPC code.

Here, the LDPC code defined in the standard of DVB-S.2 or ATSC 3.0 and the LDPC code to be adopted in ASC 3.0 is an irregular repeat accumulate (IRA) code, and (a part or all of) the parity matrix in the parity check matrix of the LDPC code has a step structure. The parity matrix and the step structure will be described below. Furthermore, the IRA code is described in, for example, "Irregular Repeat-Accumulate Codes", H. Jin, A. Khandekar, and R. J. McEliece, in Proceedings of 2nd International Symposium on Turbo codes and Related Topics, pp. 1-8, September 2000.

The LDPC code output by the LDPC encoder 115 is supplied to a bit interleaver 116.

The bit interleaver 116 performs bit interleaving described below for the LDPC code from the LDPC encoder 115, and supplies the LDPC code after the bit interleaving to a mapper (Mapper) 117.

The mapper 117 maps the LDPC code from the bit interleaver 116 to a signal point representing one symbol of quadrature modulation in units of code bits of one bit or more (in units of symbols) of the LDPC code and performs quadrature modulation (multiple value modulation).

In other words, the mapper 117 maps the LDPC code from the bit interleaver 116 into signal points determined by a modulation method for performing the quadrature modulation of an LDPC code, on a constellation that is an IQ plane defined with an I axis representing an I component in phase with a carrier and a Q axis representing a Q component orthogonal to the carrier, and performs the quadrature modulation.

In a case where the number of constellation signal points used in the modulation method of the quadrature modulation performed by the mapper 117 is $2^m$, the mapper 117 maps the LDPC code from the bit interleaver 116 into signal points representing symbols, of $2^m$ signal points, in units of symbols, where m-bit code bits of the LDPC code are a symbol (one symbol).

Here, examples of the modulation method of the quadrature modulation performed by the mapper 117 include the modulation method defined in the standard such as DVB-S.2 or ATSC 3.0, and other modulation methods, in other words, for example, binary phase shift keying (BPSK), quadrature phase shift keying (QPSK), phase-shift keying (8PSK), amplitude phase-shift keying (16APSK), 32APSK, quadrature amplitude modulation (16QAM), 16QAM, 64QAM, 256QAM, 1024QAM, 4096QAM, and pulse amplitude modulation (4PAM). Which modulation method of the quadrature modulation is used in the mapper 117 is set in advance according to an operation of an operator of the transmission device 11, for example.

Data obtained by the processing in the mapper 117 (the mapping result of mapped symbols at the signal points) is supplied to a time interleaver 118.

The time interleaver 118 performs time interleaving (interleaving in a time direction) in units of symbols, for the data from the mapper 117, and supplies resulting data to a single input single output/multiple input single output encoder (SISO/MISO encoder) 119.

The SISO/MISO encoder 119 applies space-time coding to the data from the time interleaver 118, and supplies the data to a frequency interleaver 120.

The frequency interleaver 120 performs frequency interleaving (interleaving in a frequency direction) in units of symbols, for the data from the SISO/MISO encoder 119, and supplies the data to a frame builder/resource allocation unit 131.

Meanwhile, control data (signalling) for transmission control such as base band (BB) signaling (BB header) is supplied to a BCH encoder 121, for example.

The BCH encoder 121 performs BCH coding for the control data supplied thereto, similarly to the BCH encoder 114, and supplies resulting data to an LDPC encoder 122.

The LDPC encoder 122 performs LDPC coding for the data from the BCH encoder 121 as LDPC target data, similarly to the LDPC encoder 115, and supplies a resulting LDPC code to a mapper 123.

The mapper 123 maps the LDPC code from the LDPC encoder 122 to a signal point representing one symbol of quadrature modulation in units of code bits of one bit or more (in units of symbols) of the LDPC code and performs quadrature modulation, similarly to the mapper 117, and supplies resulting data to a frequency interleaver 124.

The frequency interleaver 124 performs frequency interleaving in in units of symbols, for the data from the mapper 123, similarly to the frequency interleaver 120, and supplies resulting data to a frame builder/resource allocation unit 131.

The frame builder/resource allocation unit 131 inserts pilot symbols into necessary positions of the data (symbols) from the frequency interleavers 120 and 124, and configures a frame by a predetermined number of symbols (for example, a physical layer (PL) frame, a T2 frame, a C2 frame, or the like) from resulting data (symbols), and supplies the frame to an OFDM generation unit 132.

The OFDM generation unit 132 generates an OFDM signal corresponding to the frame from the frame builder/resource allocation unit 131, and transmits the OFDM signal via the communication path 13 (FIG. 7).

Note that the transmission device 11 can be configured without including part of the blocks illustrated in FIG. 8, such as the time interleaver 118, the SISO/MISO encoder 119, the frequency interleaver 120, and the frequency interleaver 124.

<Configuration Example of Bit Interleaver 116>

Figure 9:
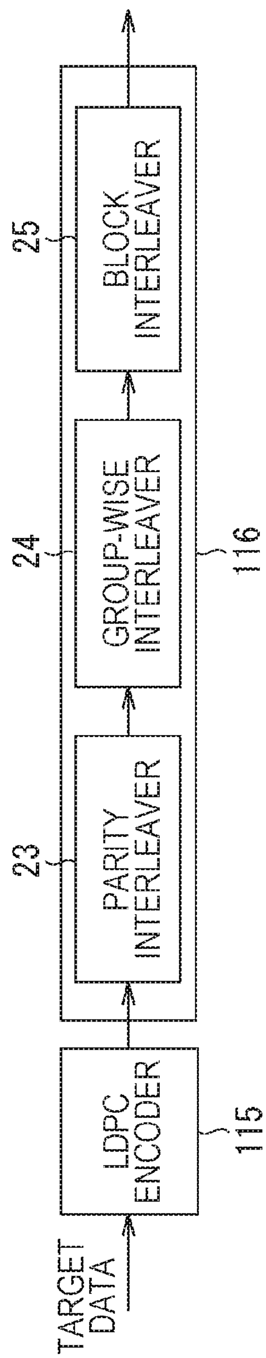
FIG. 9 is a block diagram illustrating a configuration example of a bit interleaver 116.

FIG. 9 is a block diagram illustrating a configuration example of the bit interleaver 116 in FIG. 8.

The bit interleaver 116 has a function to interleave data, and is configured by a parity interleaver 23, a group-wise interleaver 24, and a block interleaver 25.

The parity interleaver 23 performs parity interleaving to interleave the position of another parity bit with the parity bit of the LDPC code from the LDPC encoder 115, and supplies the LDPC code after the parity interleaving to the group-wise interleaver 24.

The group-wise interleaver 24 performs group-wise interleaving for the LDPC code from the parity interleaver 23, and supplies the LDPC code after the group-wise interleaving to the block interleaver 25.

Here, in the group-wise interleaving, the LDPC code from the parity interleaver 23 is interleaved in units of bit groups, where 360 bits of one section is set as a bit group, the one section being obtained by dividing the LDPC code of one code from the head of the LDPC code into sections in units of 360 bits, the unit being equal to a parallel factor P to be described below, and taking one of the divided sections as the one section.

In a case of performing the group-wise interleaving, an error rate can be improved as compared with a case of not performing the group-wise interleaving. As a result, favorable communication quality can be secured in data transmission.

The block interleaver 25 performs block interleaving for demultiplexing the LDPC code from the group-wise interleaver 24 to symbolize the LDPC code of one code into an m-bit symbol that is a unit of mapping, and supplies the symbol to the mapper 117 (FIG. 8).

Here, in the block interleaving, for example, the LDPC code from the group-wise interleaver 24 is written in a column (vertical) direction and is read in a row (cross) direction with respect to a storage region in which columns as storage regions each storing a predetermined bit length in the column direction are arranged in the row direction by the number of bit length m of the symbol, whereby the LDPC code is symbolized into the m-bit symbol.

<Parity Check Matrix of LDPC Code>

Figure 10:
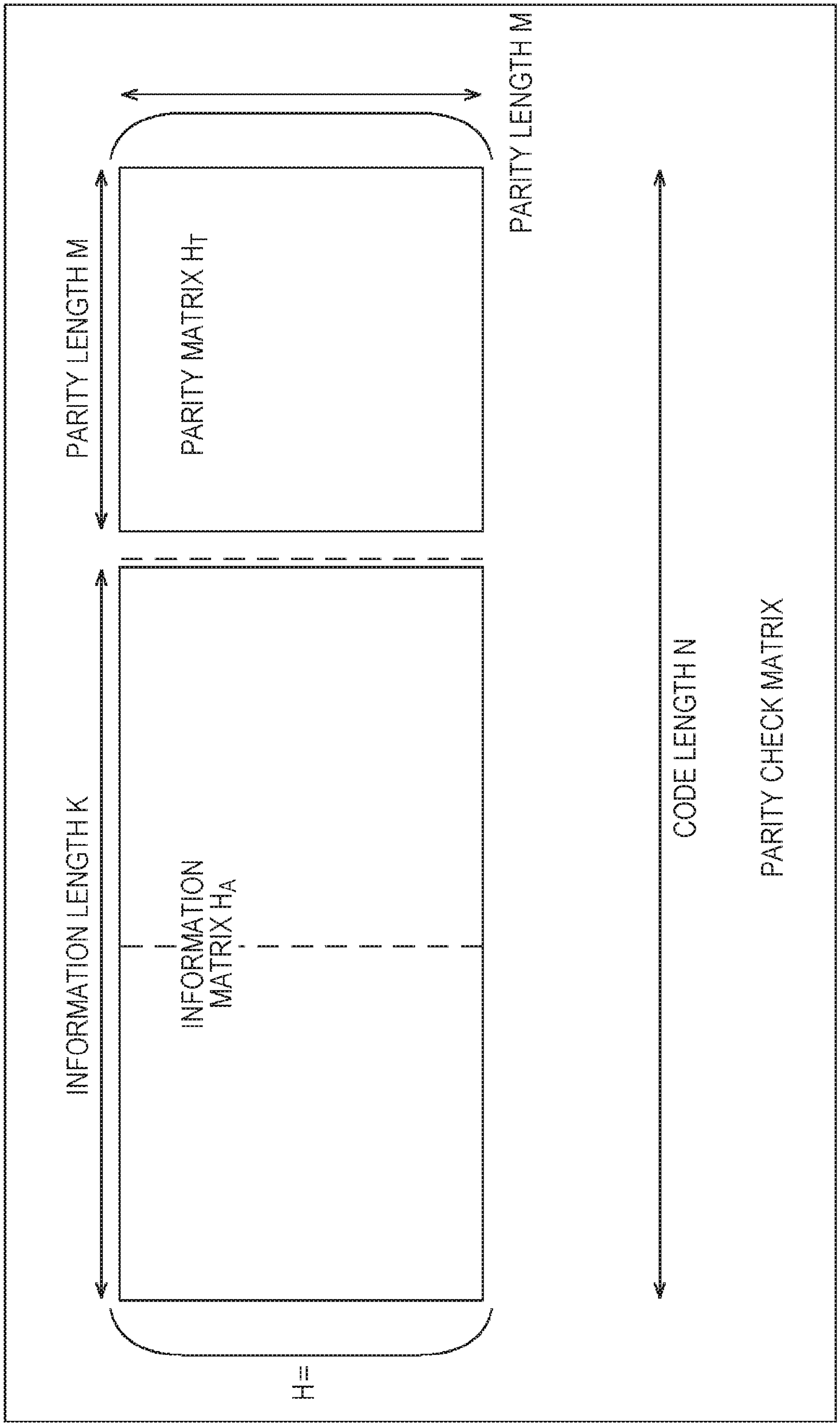
FIG. 10 is a diagram illustrating an example of a parity check matrix.

FIG. 10 is a diagram illustrating an example of the parity check matrix H used for LDPC coding in the LDPC encoder 115.

The parity check matrix H has a low-density generation matrix (LDGM) structure and can be expressed as an expression $H=[H_A|H_T]$ (elements of the information matrix $H_A$ are on the left side and elements of the parity check matrix $H_T$ are on the right side) using an information matrix $H_A$ of a portion corresponding to the information bits and a parity matrix $H_T$ corresponding to the parity bits, of the code bits of the LDPC code.

Here, the bit length of the information bits and the bit length of the parity bits, of the code bits of the LDPC code of one code (one codeword), are respectively referred to as an information length K and a parity length M, and the bit length of the code bits of one (one codeword) LDPC code is referred to as code length N(=K+M).

The information length K and the parity length M of the LDPC code of a given code length N are determined by a coding rate. Furthermore, the parity check matrix H is a matrix of M×N in rows×columns (M-row N-column matrix). Then, the information matrix $H_A$ is an M×K matrix, and the parity matrix $H_T$ is an M×M matrix.

Figure 11:
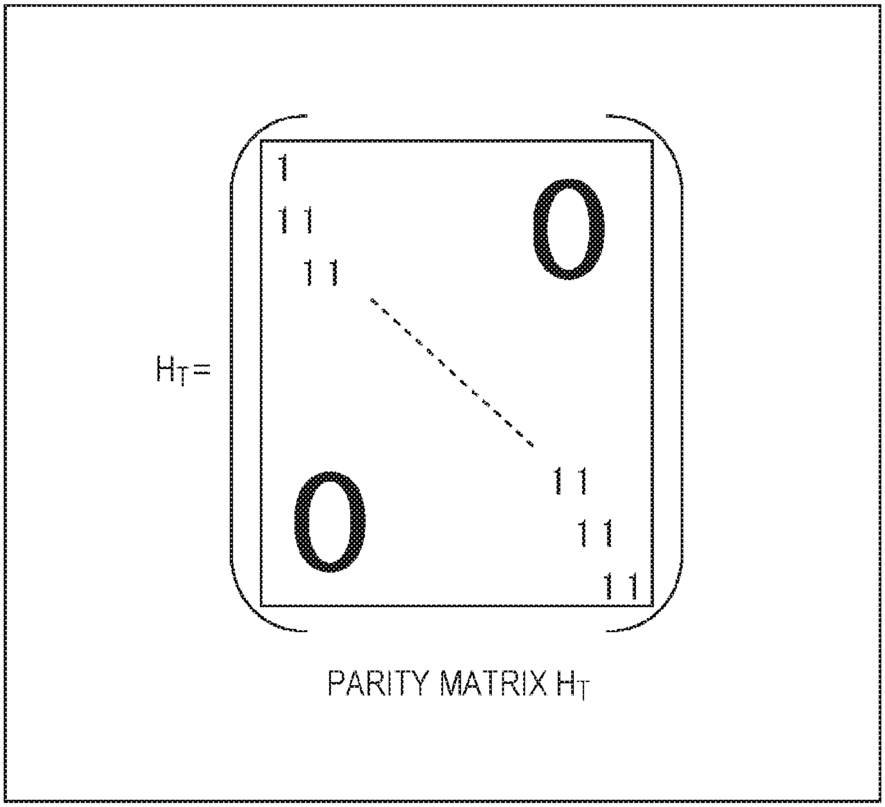
FIG. 11 is a diagram illustrating an example of a parity matrix.

FIG. 11 is a diagram illustrating an example of the parity matrix $H_T$ of the parity check matrix H used for LDPC coding in the LDPC encoder 115 in FIG. 8.

As the parity matrix $H_T$ of the parity check matrix H used for LDPC coding in the LDPC encoder 115, a parity matrix $H_T$ similar to the parity check matrix H of the LDPC code defined in the standard such as DVB-T.2 can be adopted, for example.

The parity matrix $H_T$ of the parity check matrix H of the LDPC code defined in the standard such as DVB-T.2 is a matrix having a step structure (lower bidiagonal matrix) in which elements of 1 are arranged in a step-like manner, as illustrated in FIG. 11. The row weight of the parity matrix $H_T$ is 1 in the 1st row and 2 in all the remaining rows. Furthermore, the column weight is 1 in the last one column and 2 in all the remaining columns.

As described above, the LDPC code of the parity check matrix H in which the parity matrix $H_T$ has the step structure can be easily generated using the parity matrix H.

In other words, the LDPC code (one codeword) is expressed with a row vector c, and a column vector obtained by transposing the row vector thereof is represented as $c^T$. Furthermore, a portion of the information bits, of the row vector c that is the LDPC code, is expressed with a row vector A, and a portion of the parity bits, of the row vector c, is expressed with a row vector T.

In this case, the row vector c can be expressed as an expression $c=[A|T]$ (elements of the row vector A are on the left side and elements of the row vector T are on the right side) using the row vector A as the information bits and the row vector T as the parity bits.

The parity check matrix H and the row vector $c=[A|T]$ as the LDPC code need to satisfy an expression $Hc^T=0$, and the row vector T as the parity bits constituting the row vector $c=[A|T]$ satisfying the expression $Hc^T=0$ can be sequentially obtained (in order) by sequentially setting the element of each row to 0 from the element in the 1st row of the column vector $Hc^T$ in the expression $Hc^T=0$ in a case where the parity matrix $H_T$ of the parity check matrix $H=[H_A|H_T]$ has the step structure illustrated in FIG. 11.

Figure 12:
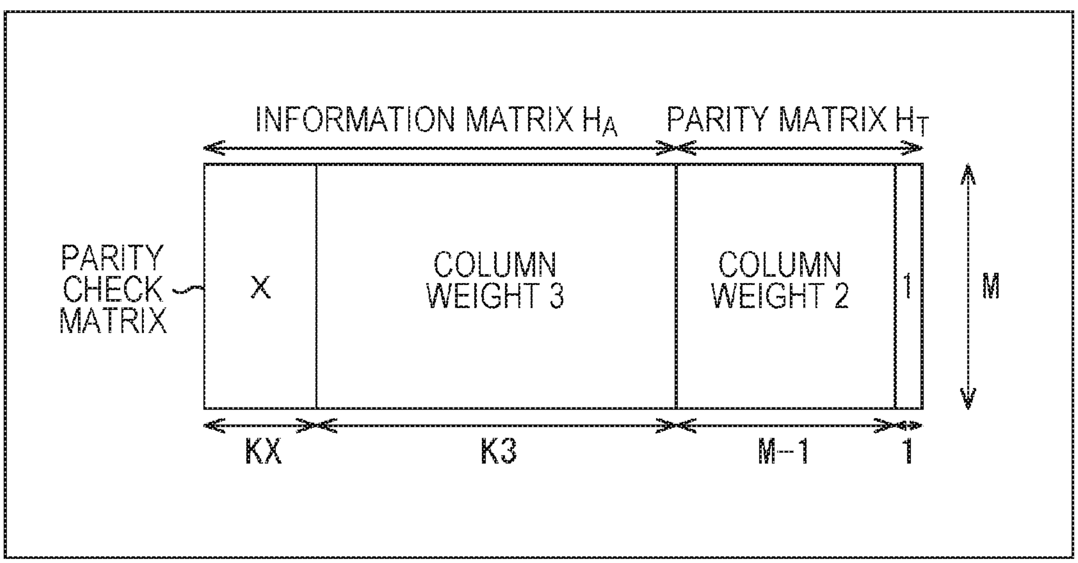
FIG. 12 is a diagram for describing a parity check matrix of an LDPC code defined in the standard of DVB-T.2.

FIG. 12 is a diagram for describing the parity check matrix H of the LDPC code defined in the standard such as DVB-T.2.

In the parity check matrix H of the LDPC code defined in the standard such as DVB-T.2, the column weight is X in KX columns from the 1st column, 3 in following K3 columns, 2 in following M−1 columns, and 1 in the last one column.

Here, KX+K3+M−1+1 is equal to the code length N.

FIG. 13 is a diagram illustrating the numbers of columns KX, K3, and M, and the column weight X for each coding rate r of the LDPC code defined in the standard such as DVB-T.2.

In the standard such as DVB-T.2, LDPC codes having code lengths N of 64800 bits and 16200 bits are defined.

Then, eleven coding rates (nominal rates) of 1/4, 1/3, 2/5, 1/2, 3/5, 2/3, 3/4, 4/5, 5/6, 8/9, and 9/10 are defined for the LDPC code with the code length N of 64800 bits. Ten coding rates of 1/4, 1/3, 2/5, 1/2, 3/5, 2/3, 3/4, 4/5, 5/6, and 8/9 are defined for the LDPC code with the code length N of 16200 bits.

Here, the code length N of 64800 bits is also referred to as 64 k bits and the code length N of 16200 bits is also referred to as 16 k bits.

In regard to the LDPC code, code bits corresponding to a column having a larger column weight of the parity check matrix H tend to have a lower error rate.

In the parity check matrix H defined in the standard such as DVB-T.2 illustrated in FIGS. 12 and 13, the column weight tends to be larger in columns on the head side (left side), and therefore the code bits on the head side are more resistant to errors and end code bits are more susceptible to errors in the LDPC code corresponding to the parity check matrix H.

<Parity Interleaving>

The parity interleaving by the parity interleaver 23 in FIG. 9 will be described with reference to FIGS. 14, 15A, 15B, and 16.

Figure 14:
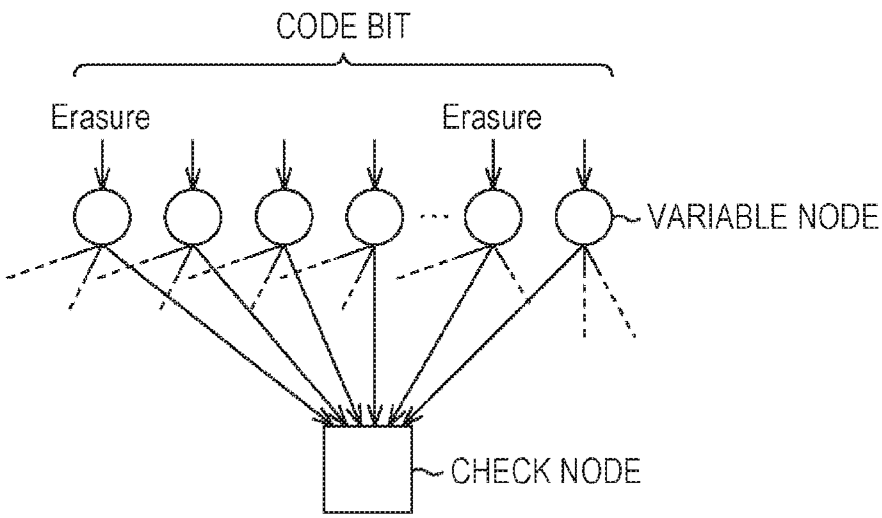
FIG. 14 is a diagram illustrating an example of a Tanner graph regarding decoding of an LDPC code.

FIG. 14 is a diagram illustrating an example of (a part of) a Tanner graph of the parity check matrix of the LDPC code.

As illustrated in FIG. 14, when two or more of (the code bits corresponding to) the variable nodes connected to the check node become errors such as erasures at the same time, the check node returns a message informing that a probability of a value being 0 and a probability of a value being 1 are equal to all the variable nodes connected to the check node. Therefore, if a plurality of variable nodes connected to the same check node become erasures or the like at the same time, the performance of the decoding will deteriorate.

By the way, the LDPC code output from the LDPC encoder 115 in FIG. 8 is an IRA code, similar to the LDPC code defined in the standard such as DVB-T.2, for example, and the parity matrix $H_T$ of the parity check matrix H has a step structure, as illustrated in FIG. 11.

Figure 15A:
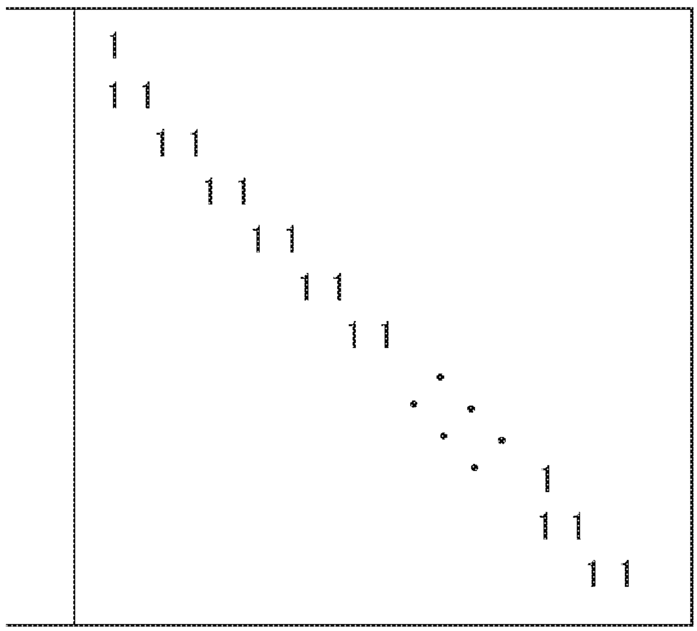
FIGS. 15A and 15B is a are diagrams illustrating examples of a parity matrix HT having a step structure and a Tanner graph corresponding to the parity matrix HT.
Figure 15B:
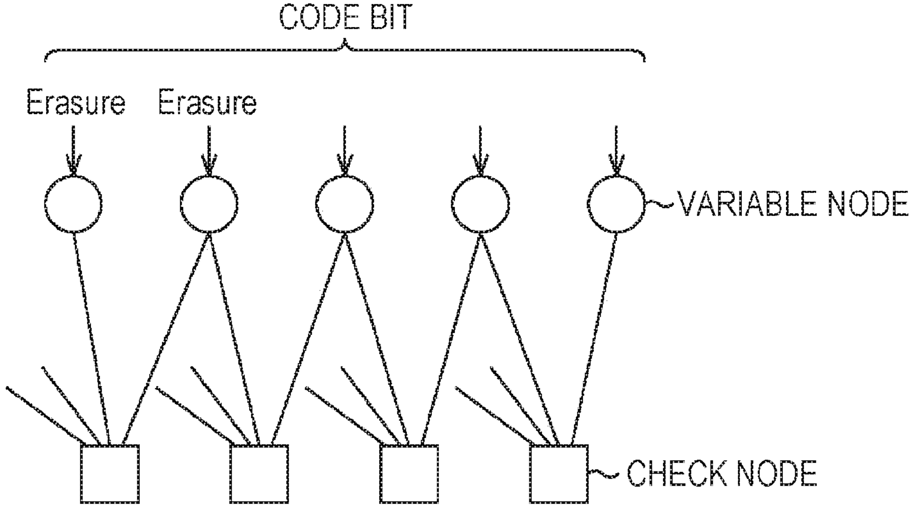

FIGS. 15A and 15B are diagrams illustrating examples of the parity matrix HT having the step structure, as illustrated in FIG. 11, and a Tanner graph corresponding to the parity matrix HT.

FIG. 15A illustrates an example of the parity matrix HT having a step structure, and FIG. 15B illustrates a Tanner graph corresponding to the parity matrix HT in FIG. 15A.

In the parity matrix $H_T$ having a step structure, elements of 1 are adjacent (except the 1st row) in rows. Therefore, in the Tanner graph of the parity matrix $H_T$, two adjacent variable nodes corresponding to columns of the two adjacent elements where values of the parity matrix $H_T$ are 1 are connected to the same check node.

Therefore, when the parity bits corresponding to the above two adjacent variable nodes become errors at the same time due to burst errors, erasures, or the like, the check node connected to the two variable nodes corresponding to the two error parity bits (variable nodes seeking a message using the parity bits) returns the message informing that a probability of a value being 0 and a probability of a value being 1 are equal to the variable nodes connected to the check node. Therefore, the performance of the decoding deteriorates. Then, when a burst length (the bit length of the parity bits errored in succession) becomes large, the number of check nodes returning the message of equal probability increases, and the performance of the decoding further deteriorates.

Therefore, the parity interleaver 23 (FIG. 9) performs parity interleaving to interleave the positions of other parity bits with the parity bits of the LDPC code from the LDPC encoder 115 in order to prevent deterioration of the performance of the decoding.

Figure 16:
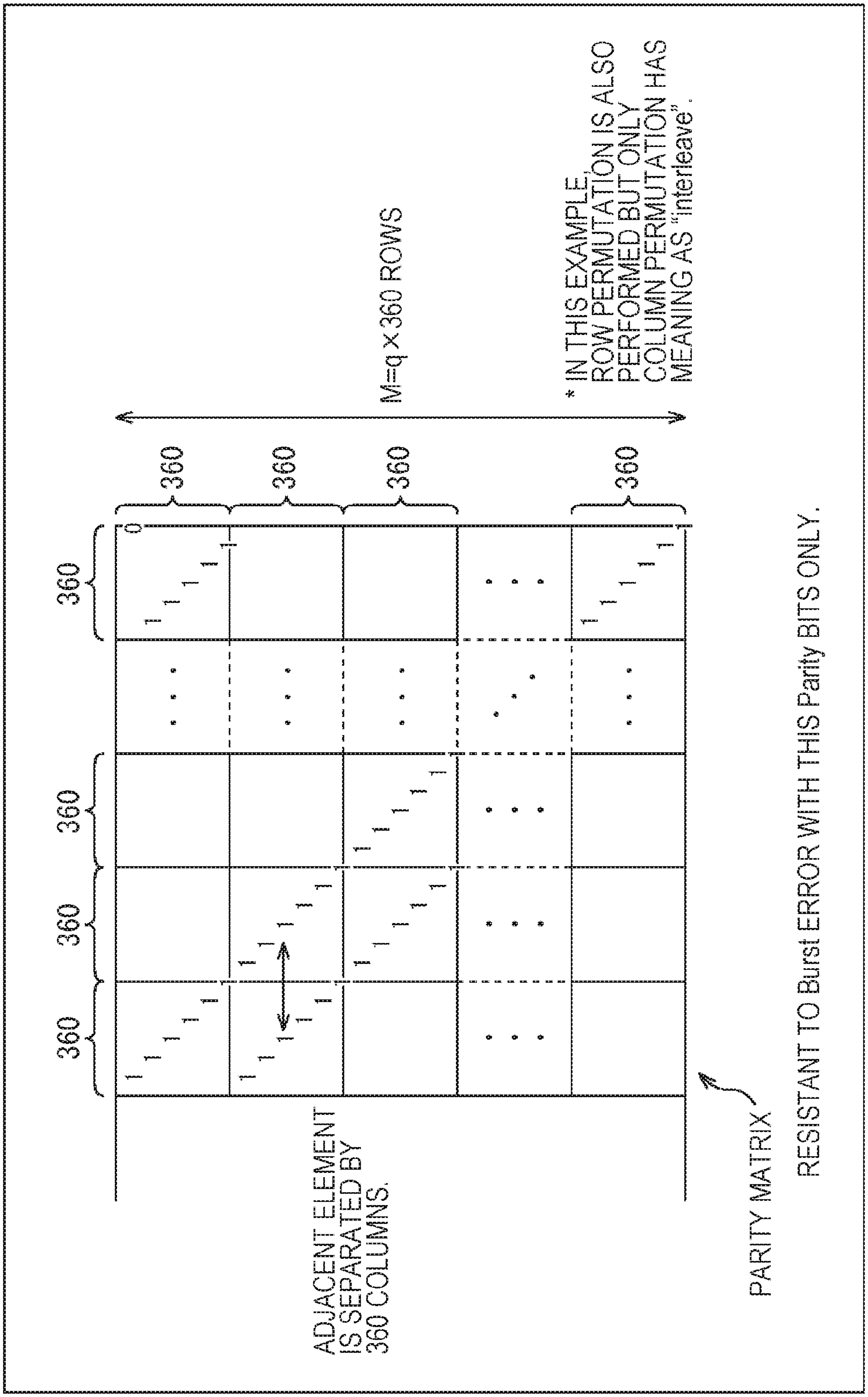
FIG. 16 is a diagram illustrating the parity matrix HT of the parity check matrix H corresponding to the LDPC code after parity interleaving.

FIG. 16 is a diagram illustrating the parity matrix $H_T$ of the parity check matrix H corresponding to the LDPC code after the parity interleaving performed by the parity interleaver 23 in FIG. 9.

Here, the information matrix $H_A$ of the parity check matrix H corresponding to the LDPC code output by the LDPC encoder 115 has a cyclic structure, similarly to the information matrix of the parity check matrix H corresponding to the LDPC code defined in the standard such as DVB-T.2.

The cyclic structure is a structure in which a certain column matches a cyclically shifted another column, and includes, for example, a structure in which, for each P columns, positions of 1 of rows of the P columns become positions cyclically shifted in the column direction by a predetermined value such as a value proportional to a value q obtained by dividing the first column of the P columns by the parity length M. Hereinafter, the P columns in the cyclic structure is referred to as a parallel factor, as appropriate.

As the LDPC code defined in the standard such as DVB-T.2, there are two types of LDPC codes with the code lengths N of 64800 bits and 16200 bits as described in FIGS. 12 and 13. For both the two types of LDPC codes, the parallel factor P is defined as 360, which is one of divisors of the parity length M except 1 and M.

Furthermore, the parity length M is a value other than a prime number represented by an expression $M=q\times P=q\times 360$, using a value q that varies depending on the coding rate.

Therefore, similarly to the parallel factor P, the value q is also another one of the divisors of the parity length M except 1 and M, and is obtained by dividing the parity length M by the parallel factor P (a product of P and q, which are the divisors of the parity length M, becomes the parity length M).

As described above, the parity interleaver 23 interleaves the position of (K+Py+x+1)th code bit with (K+qx+y+1)th code bit of code bits of an N-bit LDPC code, as the parity interleaving, where the information length is K, an integer from 0 to P, exclusive of P, is x, and an integer from 0 to q, exclusive of q, is y.

Since both the (K+qx+y+1)th code bit and the (K+Py+x+1)th code bit are subsequent code bits of (K+1)th code bit and thus are parity bits, the positions of the parity bits of the LDPC code are moved according to the parity interleaving.

According to such parity interleaving, (the parity bits corresponding to) the variable nodes connected to the same check node are separated by the parallel factor P, in other words, 360 bits. Therefore, in a case where the burst length is less than 360 bits, a situation where a plurality of variable nodes connected to the same check node becomes error at the same time can be avoided, and as a result, the resistance to the burst errors can be improved.

Note that the LDPC code after the parity interleaving to interleave the position of the (K+Py+x+1)th code bit with the (K+qx+y+1)th code bit matches the LDPC code of the parity check matrix (hereinafter also referred to as a transformed parity check matrix) that is obtained by performing column permutation to permutate the (K+qx+y+1)th column of the original parity check matrix H with the (K+Py+x+1)th column.

Furthermore, a pseudo cyclic structure having P columns (360 columns in FIG. 16) as a unit appears in the parity matrix of the transformed parity check matrix, as illustrated in FIG. 16.

Here, the pseudo cyclic structure means a structure having a cyclic structure excluding a part.

A transformed parity check matrix obtained by applying column permutation corresponding to the parity interleaving to the parity check matrix of the LDPC code defined in the standard such as DVB-T.2 lacks one element of 1 (has an element of 0) in a portion (a shift matrix to be described below) of 360 rows×360 columns in an upper right corner portion of the transformed parity check matrix, and thus has a so-called pseudo cyclic structure, rather than a (complete) cyclic structure on that regard.

A transformed parity check matrix for the parity check matrix of the LDPC code output by the LDPC encoder 115 has a pseudo cyclic structure, similarly to the transformed parity check matrix for the parity check matrix of the LDPC code defined in the standard such as DVB-T.2.

Note that the transformed parity check matrix in FIG. 16 is a matrix obtained by applying the column permutation corresponding to the parity interleaving to the original parity check matrix H, and applying permutation for rows (row permutation) so as to configure the transformed parity check with configuration matrices to be describe below.

Figure 17:
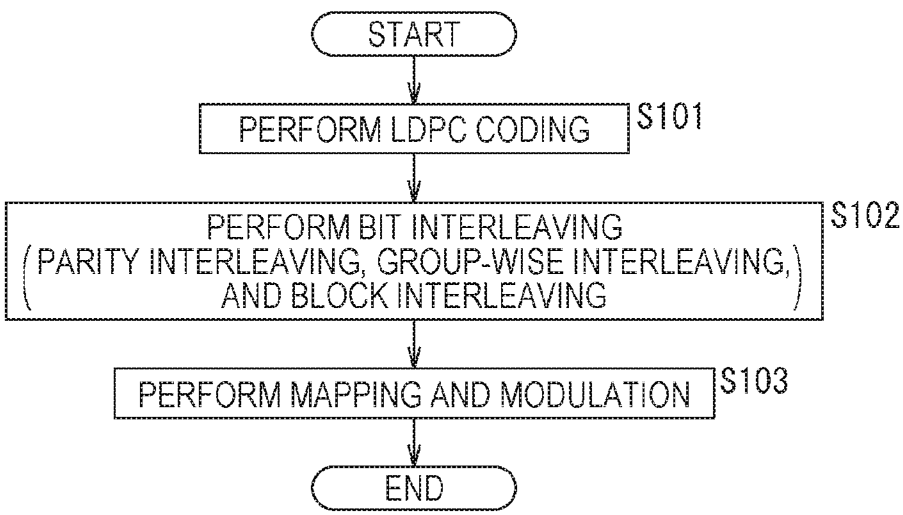
FIG. 17 is a flowchart for describing processing performed by a bit interleaver 116 and a mapper 117.

FIG. 17 is a flowchart for describing processing performed by the LDPC encoder 115, the bit interleaver 116, and the mapper 117 in FIG. 8.

The LDPC encoder 115 waits for supply of the LDPC target data from the BCH encoder 114. In step S101, the LDPC encoder 115 encodes the LDPC target data into the LDPC code, and supplies the LDPC code to the bit interleaver 116. The processing proceeds to step S102.

In step S102, the bit interleaver 116 performs the bit interleaving for the LDPC code from the LDPC encoder 115, and supplies the symbol obtained by the bit interleaving to the mapper 117. The processing proceeds to step S103.

In other words, in step S102, in the bit interleaver 116 (FIG. 9), the parity interleaver 23 performs the parity interleaving for the LDPC code from the LDPC encoder 115, and supplies the LDPC code after the parity interleaving to the group-wise interleaver 24.

The group-wise interleaver 24 performs the group-wise interleaving for the LDPC code from the parity interleaver 23, and supplies the LDPC code to the block interleaver 25.

The block interleaver 25 performs the block interleaving for the LDPC code after the group-wise interleaving by the group-wise interleaver 24, and supplies a resulting m-bit symbol to the mapper 117.

In step S103, the mapper 117 maps the symbol from the block interleaver 25 to any of $2^m$ signal points determined by the modulation method of the quadrature modulation performed by the mapper 117 and performs the quadrature modulation, and supplies resulting data to the time interleaver 118.

As described above, by performing the parity interleaving and the group-wise interleaving, the error rate of the case where a plurality of code bits of the LDPC code is transmitted as one symbol can be improved.

Here, in FIG. 9, for convenience of description, the parity interleaver 23 as a block for performing the parity interleaving and the group-wise interleaver 24 as a block for performing the group-wise interleaving are separately configured. However, the parity interleaver 23 and the group-wise interleaver 24 can be integrally configured.

In other words, both the parity interleaving and the group-wise interleaving can be performed by writing and reading code bits with respect to a memory, and can be expressed by a matrix for converting an address for writing code bits (write address) into an address for reading code bits (read address).

Therefore, by obtaining a matrix obtained by multiplying a matrix expressing the parity interleaving and a matrix expressing the group-wise interleaving, the parity interleaving is performed by converting code bits by these matrices, and further the group-wise interleaving is performed for the LDPC code after the parity interleaving, whereby a result can be obtained.

Furthermore, the block interleaver 25 can also be integrally configured in addition to the parity interleaver 23 and the group-wise interleaver 24

In other words, the block interleaving performed by the block interleaver 25 can also be expressed by the matrix converting the write address of the memory for storing the LDPC code into the read address.

Therefore, by obtaining a matrix obtained by multiplying the matrix expressing the parity interleaving, the matrix expressing the group-wise interleaving, and the matrix expressing the block interleaving, the parity interleaving, the group-wise interleaving, and the block interleaving can be collectively performed by the matrices.

Note that one or the amount of the parity interleaving and the group-wise interleaving may not be performed.

<Configuration Example of LDPC Encoder 115>

Figure 18:
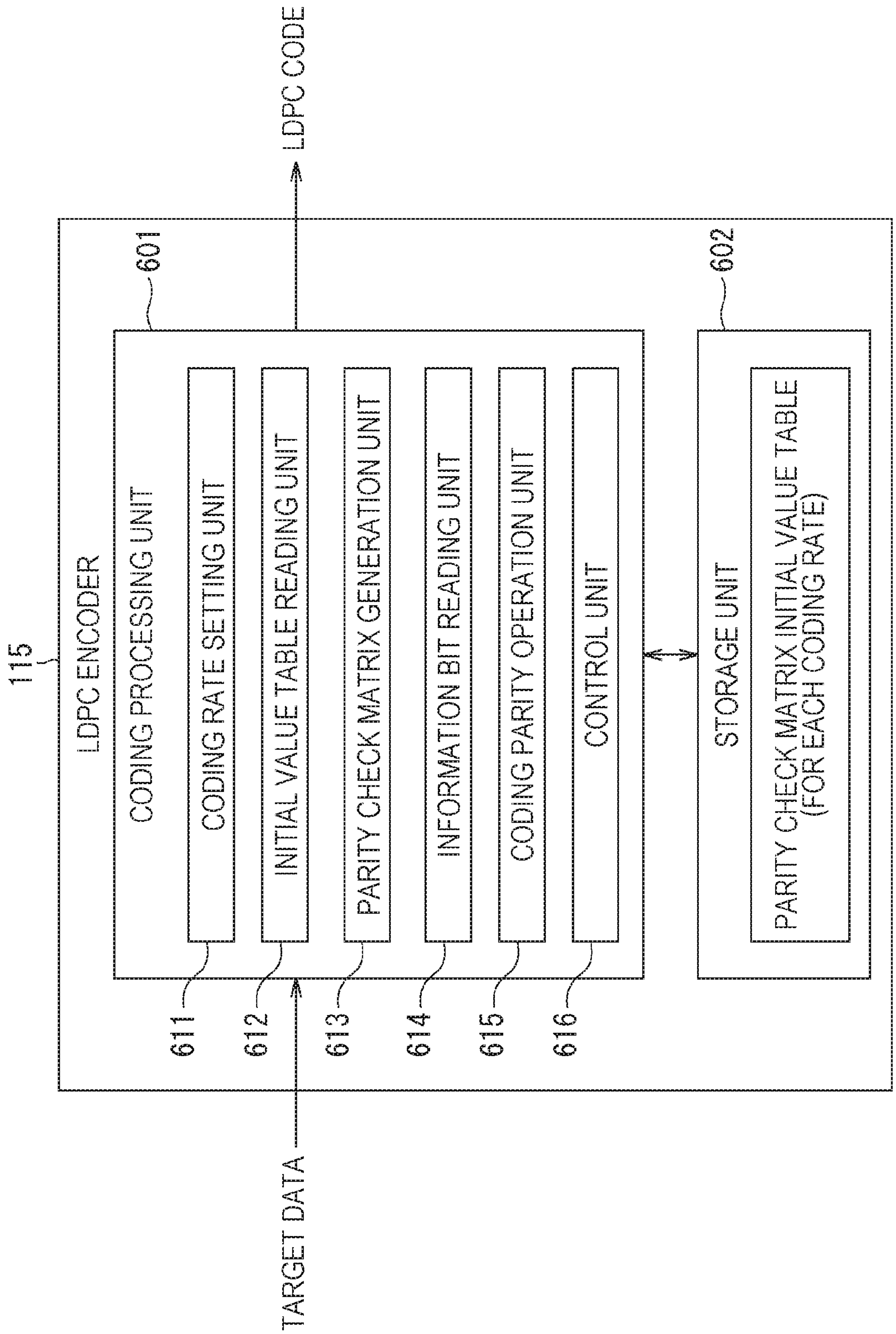
FIG. 18 is a block diagram illustrating a configuration example of an LDPC encoder 115.

FIG. 18 is a block diagram illustrating a configuration example of the LDPC encoder 115 in FIG. 8.

Note that the LDPC encoder 122 in FIG. 8 is similarly configured.

As described in FIGS. 12 and 13, in the standard such as DVB-T.2, LDPC codes having two types of code lengths N of 64800 bits and 16200 bits are defined.

Then, the eleven coding rates of 1/4, 1/3, 2/5, 1/2, 3/5, 2/3, 3/4, 4/5, 5/6, 8/9, and 9/10 are defined for the LDPC code with the code length N of 64800 bits. The ten coding rates of 1/4, 1/3, 2/5, 1/2, 3/5, 2/3, 3/4, 4/5, 5/6, and 8/9 are defined for the LDPC code with the code length N of 16200 bits (FIGS. 12 and 13).

The LDPC encoder 115 can perform, for example, such coding (error correction coding) with the LDPC codes with the coding rates of the code lengths N of 64800 bits and 16200 bits according to the parity check matrix H prepared for each code length N and each coding rate.

Besides, the LDPC encoder 115 can perform LDPC coding according to the parity check matrix H of the LDPC code with an arbitrary code length N and an arbitrary coding rate r.

The LDPC encoder 115 is configured by a coding processing unit 601 and a storage unit 602.

The coding processing unit 601 is configured by a coding rate setting unit 611, an initial value table reading unit 612, a parity check matrix generation unit 613, an information bit reading unit 614, a coding parity operation unit 615, and a control unit 616. The coding processing unit 601 performs the LDPC coding for the LDPC target data supplied to the LDPC encoder 115, and supplies a resulting LDPC code to the bit interleaver 116 (FIG. 8).

In other words, the coding rate setting unit 611 sets the code length N and the coding rate r of the LDPC code, and in addition, specific information specifying the LDPC code, according to the operation of the operator, for example.

The initial value table reading unit 612 reads, from the storage unit 602, a parity check matrix initial value table to be described below, expressing the parity check matrix of the LDPC code specified with the specific information set by the coding rate setting unit 611.

The parity check matrix generation unit 613 generates the parity check matrix H on the basis of the parity check matrix initial value table read by the initial value table reading unit 612, and stores the parity check matrix H in the storage unit 602. For example, the parity check matrix generation unit 613 arranges the elements of 1 of the information matrix $H_A$ corresponding to the information length K (=the code length N−the parity length M) according to the code length N and the coding rate r set by the coding rate setting unit 611 with a period of every 360 columns (parallel factor P) in the column direction to generate the parity check matrix H, and stores the parity check matrix H in the storage unit 602.

The information bit reading unit 614 reads (extracts) the information bits of the information length K from the LDPC target data supplied to the LDPC encoder 115.

The coding parity operation unit 615 reads the parity check matrix H generated by the parity check matrix generation unit 613 from the storage unit 602, and calculates the parity bits for the information bits read by the information bit reading unit 614 on the basis of a predetermined expression using the parity check matrix H, thereby generating the codeword (LDPC code).

The control unit 616 controls the blocks constituting the coding processing unit 601.

The storage unit 602 stores a plurality of parity check matrix initial value tables respectively corresponding to the plurality of coding rates illustrated in FIGS. 12 and 13 for the code lengths N of 64800 bits and 16200 bits, and the like, for example. Furthermore, the storage unit 602 temporarily stores data necessary for the processing of the coding processing unit 601.

Figures 19, 20:
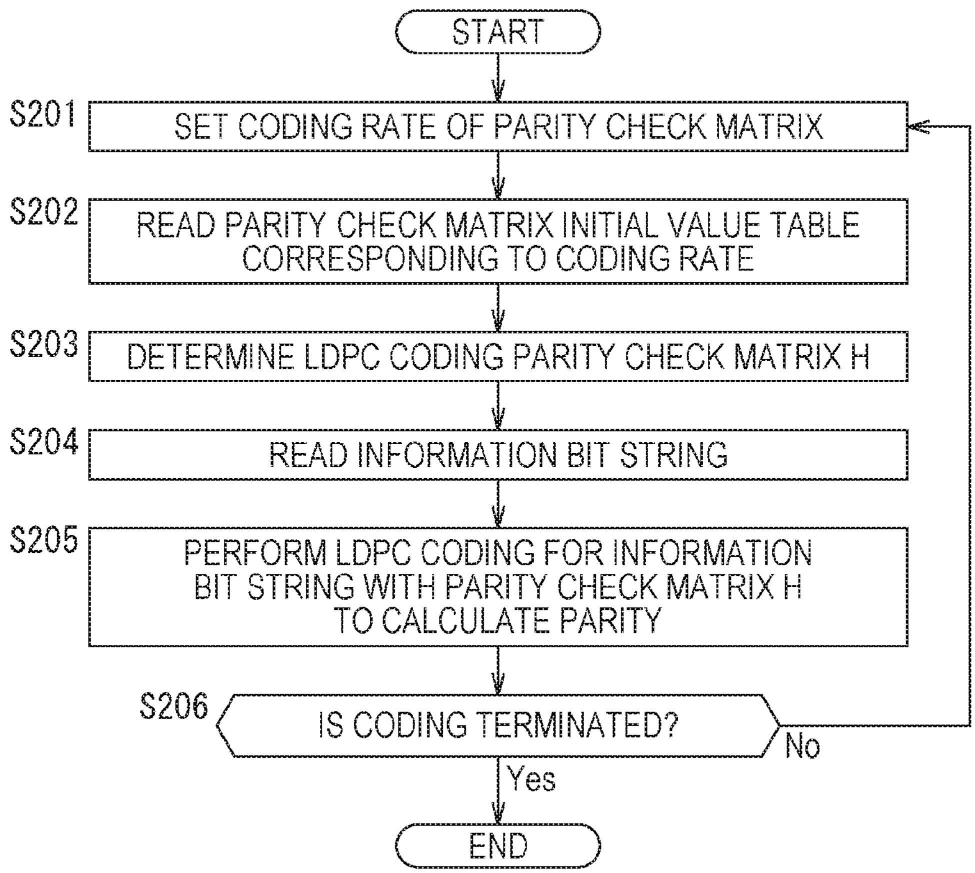
FIG. 19 is a flowchart for describing an example of processing of the LDPC encoder 115.
FIG. 20 is a diagram illustrating an example of a parity check matrix initial value table with a coding rate of 1/4 and a code length of 16200.

FIG. 19 is a flowchart for describing an example of the processing of the LDPC encoder 115 in FIG. 18.

In step S201, the coding rate setting unit 611 sets the code length N and the coding rate r for performing the LDPC coding, and in addition, the specific information specifying the LDPC code.

In step S202, the initial value table reading unit 612 reads, from the storage unit 602, the predetermined parity check matrix initial value table specified with the code length N, the coding rate r, and the like as the specific information set by the coding rate setting unit 611.

In step S203, the parity check matrix generation unit 613 obtains (generates) the parity check matrix H of the LDPC code with the code length N and the coding rate r set by the coding rate setting unit 611, using the parity check matrix initial value table read from the storage unit 602 by the initial value table reading unit 612, and supplies and stores the parity check matrix H in the storage unit 602.

In step S204, the information bit reading unit 614 reads the information bits of the information length K (=N×r) corresponding to the code length N and the coding rate r set by the coding rate setting unit 611 from the LDPC target data supplied to the LDPC encoder 115, and reads the parity check matrix H obtained by the parity check matrix generation unit 613 from the storage unit 602, and supplies the information bits and the parity check matrix H to the coding parity operation unit 615.

In step S205, the coding parity operation unit 615 sequentially operates the parity bit of the codeword c that satisfies the expression (8), using the information bits and the parity check matrix H from the information bit reading unit 614.

$$Hc^T=0 \quad (8)$$

In the expression (8), c represents the row vector as the codeword (LDPC code), and $c^T$ represents transposition of the row vector c.

Here, as described above, in the case of expressing the portion of the information bits, of the row vector c as the LDPC code (one codeword), with the row vector A, and the portion of the parity bits, of the row vector c, with the row vector T, the row vector c can be expressed as the expression c=[A|T] using the row vector A as the information bits and the row vector T as the parity bits.

The parity check matrix H and the row vector c=[A|T] as the LDPC code need to satisfy the expression $Hc^T=0$, and the row vector T as the parity bits constituting the row vector c=[A|T] satisfying the expression $Hc^T=0$ can be sequentially obtained by sequentially setting the element of each row to 0 from the element in the 1st row of the column vector $Hc^T$ in the expression $Hc^T=0$ in the case where the parity matrix $H_T$ of the parity check matrix $H=[H_A|H_T]$ has the step structure illustrated in FIG. 11.

The coding parity operation unit 615 obtains the parity bits T for the information bits A from the information bit reading unit 614, and outputs the codeword c=[A|T] expressed with the information bits A and the parity bits T as an LDPC coding result of the information bits A.

Thereafter, in step S206, the control unit 616 determines whether or not to terminate the LDPC coding. In a case where it is determined that the LDPC coding is not terminated in step S206, in other words, in a case where there is still LDPC target data to be LDPC-encoded, the processing returns to step S201 (or step S204), and hereinafter the processing from step S201 (or step S204) to step S206 is repeated.

Furthermore, in step S206, in a case where it is determined that the LDPC coding is terminated, in other words, for example, in a case where there is no LDPC target data to be LDPC-encoded, the LDPC encoder 115 terminates the processing.

In regard to the LDPC encoder 115, the parity check matrix initial value table (expressing the parity check matrix) of the LDPC codes of various code lengths N and coding rates r can be prepared in advance. The LDPC encoder 115 can perform the LDPC coding for the LDPC codes of various code lengths N and coding rates r, using the parity check matrix H generated from the parity check matrix initial value table prepared in advance. Note that, since the parity check matrix H can be generated from the parity check matrix initial value table, the parity check matrix H and the parity check matrix initial value table are equivalent information. In the implementation of the LDPC encoder 115, the parity check matrix H is generated from the parity check matrix initial value table, and the LDPC coding is performed using the parity check matrix H. In addition, the LDPC coding can be performed using the parity check matrix initial value table as it is.

<Example of Parity Check Matrix Initial Value Table>

The parity check matrix initial value table is a table representing the positions of the elements of 1 of the information matrix $H_A$ (FIG. 10) corresponding to the information length K according to the code length N and the coding rate r of the LDPC code (the LDPC code defined by the parity check matrix H) of the parity check matrix H in every 360 columns (parallel factor P), and is created in advance for each parity check matrix H of each code length N and each coding rate r.

In other words, the parity check matrix initial value table represents at least the positions of the elements of 1 of the information matrix $H_A$ in every 360 columns (parallel factor P).

Furthermore, as the parity check matrix H, there are a parity check matrix in which the entire parity matrix $H_T$ has a step structure, and a parity check matrix in which a part of the parity matrix $H_T$ has a step structure and the remaining part is a diagonal matrix (identity matrix).

Hereinafter, an expression method for the parity check matrix initial value table representing the parity check matrix in which a part of the parity matrix $H_T$ has a step structure and the remaining part is a diagonal matrix is also referred to as type A method. Furthermore, an expression method for the parity check matrix initial value table indicating the parity check matrix in which the entire parity matrix $H_T$ has a step structure is also referred to as type B method.

Furthermore, the LDPC code for the parity check matrix represented by the parity check matrix initial value table by the type A method is also referred to as type A code, and the LDPC code for the parity check matrix represented by the parity check matrix initial value table by the type B method is also referred to as type B code.

The designations "type A" and "type B" are designations in accordance with the standard of ATSC 3.0. For example, in ATSC 3.0, both the type A code and type B code are adopted.

Note that, in DVB-T.2 and the like, the type B code is adopted.

FIG. 20 is a diagram illustrating an example of the parity check matrix initial value table by the type B method.

In other words, FIG. 20 illustrates the parity check matrix initial value table (representing the parity check matrix H) of the type B code with the code length N of 16200 bits and the coding rate r (coding rate on the notation of DVB-T.2) of 1/4 defined in the standard of DVB-T.2.

The parity check matrix generation unit 613 (FIG. 18) obtains the parity check matrix H as follows using the parity check matrix initial value table by the type B method.

FIG. 21 is a diagram for describing a method of obtaining the parity check matrix H from the parity check matrix initial value table by the type B method.

In other words, FIG. 21 illustrates the parity check matrix initial value table of the type B code with the code length N of 16200 bits and the coding rate r of 2/3 defined in the standard of DVB-T.2.

The parity check matrix initial value table by the type B method is a table representing the positions of the elements of 1 of the entire information matrix $H_A$ corresponding to the information length K according to the code length N and the coding rate r of the LDPC code in every 360 columns (parallel factor P). In the i-th row, row numbers of the elements of 1 of the (1+360×(i−1))th column of the parity check matrix H (row numbers of when the row number of the 1st row of the parity check matrix H is counted as 0) are arranged by the number of the column weights of the (1+360×(i−1))th column.

Here, since the parity matrix HT (FIG. 10) corresponding to the parity length M of the parity check matrix H by the type B method has the step structure as illustrated in FIGS. 15A and 15B, the parity check matrix H can be obtained if the information matrix HA (FIG. 10) corresponding to the information length K can be obtained according to the parity check matrix initial value table.

The number of rows k+1 of the parity check matrix initial value table by the type B method differs depending on the information length K.

The relationship of the expression (9) holds between the information length K and the number of rows k+1 of the parity check matrix initial value table.

$$K=(k+1)\times 360 \tag{9}$$

Here, 360 in the expression (9) is the parallel factor P described in FIG. 16.

In the parity check matrix initial value table in FIG. 21, thirteen numerical values are arranged in the 1st to 3rd rows, and three numerical values are arranged in the 4th to (k+1)th rows (30th row in FIG. 21).

Therefore, the column weight of the parity check matrix H obtained from the parity check matrix initial value table in FIG. 21 is 13 from the 1st to (1+360×(3−1)−1)th columns, and 3 from the (1+360×(3−1))th to K-th columns.

The 1st row of the parity check matrix initial value table in FIG. 21 is 0, 2084, 1613, 1548, 1286, 1460, 3196, 4297, 2481, 3369, 3451, 4620, and 2622, which indicates that, in the 1st column of the parity check matrix H, the elements of the rows with the row numbers of 0, 2084, 1613, 1548, 1286, 1460, 3196, 4297, 2481, 3369, 3451, 4620, and 2622 are 1 (and the other elements are 0).

Furthermore, the 2nd row of the parity check matrix initial value table in FIG. 21 is 1, 122, 1516, 3448, 2880, 1407, 1847, 3799, 3529, 373, 971, 4358, and 3108, which indicates that, in the 361st (=1+360×(2−1))th column of the parity check matrix H, the elements of the rows with the row numbers of 1, 122, 1516, 3448, 2880, 1407, 1847, 3799, 3529, 373, 971, 4358, and 3108 are 1.

As described above, the parity check matrix initial value table represents the positions of the elements of 1 of the information matrix $H_A$ of the parity check matrix H in every 360 columns.

The columns other than the (1+360×(i−1))th column of the parity check matrix H, in other words, the (2+360×(i−1)th to (360×i)th columns are obtained by cyclically shifting and arranging the elements of 1 of the (1+360×(i−1))th column determined by the parity check matrix initial value table downward (downward of the columns) according to the parity length M.

In other words, for example, the (2+360×(i−1))th column is obtained by cyclically shifting the (1+360×(i−1))th column downward by M/360 (=q). The next (3+360×(i−1))th column is obtained by cyclically shifting the (1+360×(i−1))th column downward by 2×M/360 (=2×q) (by cyclically shifting the (2+360×(i−1))th column downward by M/360 (=q)).

Now, in a case where the numerical value of the j-th column (j-th from the left) in the i-th row (i-th from the top) of the parity check matrix initial value table is represented as $h_{i,j}$ and the row number of the element of j-th 1 of the w-th column of the parity check matrix H is represented as $H_{w-j}$, the row number $H_{w-j}$ of the element of 1 of the w-th column that is a column other than the (1+360×(i−1))th column of the parity check matrix H can be obtained by the expression (10).

$$H_{w-j}=\mathrm{mod}\{h_{i,j}+\mathrm{mod}((w-1),P)\times q,M) \tag{10}$$

Here, mod (x, y) means the remainder of dividing x by y.

Furthermore, P is the above-described parallel factor, and in the present embodiment, P is 360 as in DVB-T.2 or the like and the standard of ATSC 3.0, for example. Moreover, q is a value M/360 obtained by dividing the parity length M by the parallel factor P (=360).

The parity check matrix generation unit 613 (FIG. 18) specifies the row number of the element of 1 in the (1+360×(i−1))th column of the parity check matrix H using the parity check matrix initial value table.

Moreover, the parity check matrix generation unit 613 (FIG. 18) calculates the row number H-j of the element of 1 in the w-th column that is a column other than the (1+360×(i−1))th column of the parity check matrix H according to the expression (10), and generates the parity check matrix H in which the elements of the row numbers obtained as described above are 1.

Figures 22, 23:
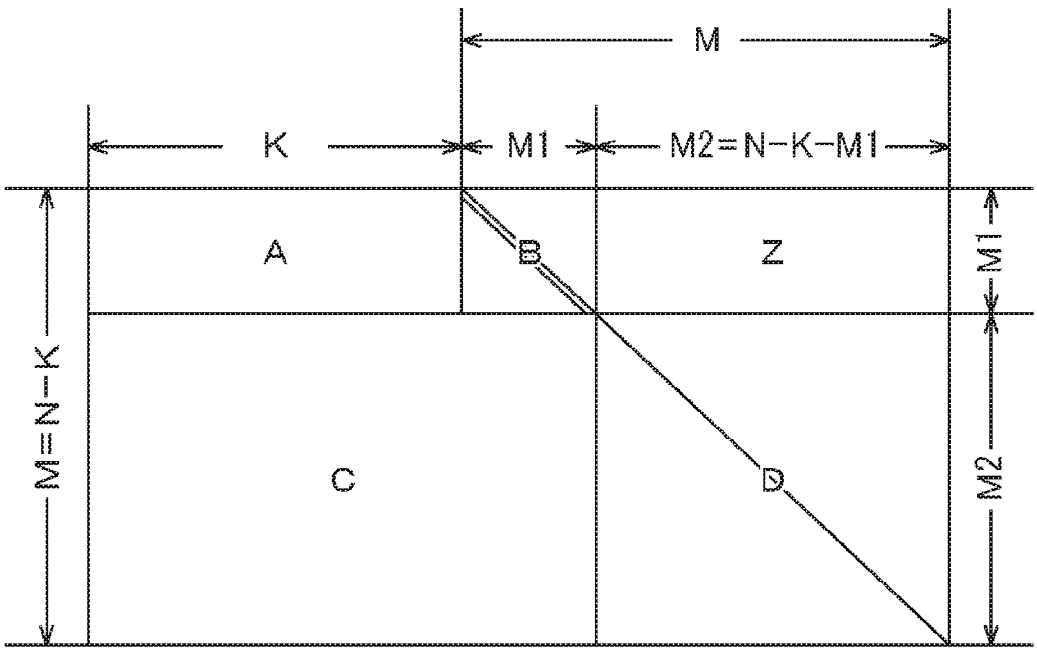
FIG. 22 is a diagram illustrating a structure of a parity check matrix.
FIG. 23 is a diagram illustrating an example of a parity check matrix initial value table.

FIG. 22 is a diagram illustrating a structure of the parity check matrix H by the type A method.

The parity check matrix by the type A method is configured by an A matrix, a B matrix, a C matrix, a D matrix, and a Z matrix.

The A matrix is an upper left matrix in the parity check matrix H, of M1 rows and K columns expressed by a predetermined value M1 and the information length K=the code length N×the coding rate r of the LDPC code.

The B matrix is a matrix of M1 rows and M1 columns having a step structure adjacent to the right of the A matrix.

The C matrix is a matrix of N−K−M1 rows and K+M1 columns adjacent to below the A matrix and the B matrix.

The D matrix is an identity matrix of N−K−M1 rows and N−K−M1 columns adjacent to the right of the C matrix.

The Z matrix is a zero matrix (0 matrix) of M1 rows and N−K−M1 columns adjacent to the right of the B matrix.

In the parity check matrix H by the type A method configured by the above A matrix to D matrix and Z matrix, the A matrix and a part of the C matrix constitute the information matrix, and the B matrix, the rest of the C matrix, the D matrix, and the Z matrix constitute the parity matrix.

Note that, since the B matrix is a matrix with a step structure and the D matrix is an identity matrix, a part (the part of the B matrix) of the parity matrix of the parity check matrix H by the type A method has the step structure and the remaining part (the part of the D matrix) is a diagonal matrix (identity matrix).

The A matrix and the C matrix have a cyclic structure of every parallel factor P columns (for example, 360 columns), similarly to the information matrix of the parity check matrix H by type B method, and the parity check matrix initial value table by the type A method represents the positions of the elements of 1 of the A matrix and the C matrix in every 360 columns.

Here, as described above, since the A matrix and a part of the C matrix constitute the information matrix, the parity check matrix initial value table by the type A method representing the positions of the elements of 1 of the A matrix and the C matrix in every 360 columns can be said to represent at least the positions of the elements of 1 of the information matrix in every 360 columns.

Note that, since the parity check matrix initial value table by the type A method represents the positions of the elements of 1 of the A matrix and the C matrix in every 360 columns, the parity check matrix initial value table can also be said to represent the positions of the elements of 1 of a part (the remaining part of the C matrix) of the parity check matrix in every 360 columns.

FIG. 23 is a diagram illustrating an example of the parity check matrix initial value table by the type A method.

In other words, FIG. 23 illustrates an example of the parity check matrix initial value table representing the parity check matrix H with the code length N of 35 bits and the coding rate r of 2/7.

The parity check matrix initial value table by the type A method is a table representing the positions of the elements of 1 of the A matrix and the C matrix in every parallel factor P. In the i-th row, row numbers of the elements of 1 of the (1+P×(i−1))th column of the parity check matrix H (the row numbers of when the row number of the 1st row of the parity check matrix H is counted as 0) are arranged by the number of the column weight of the (1+P×(i−1))th column.

Note that, here, for simplify the description, the parallel factor P is 5, for example.

The parity check matrix H by the type A method has M1, M2, Q1, and Q2 as parameters.

M1 (FIG. 22) is a parameter for determining the size of the B matrix, and takes a value that is a multiple of the parallel factor P. By adjusting M1, the performance of the LDPC code changes, and M1 is adjusted to a predetermined value when determining the parity check matrix H. Here, it is assumed that 15 is adopted as M1, which is three times the parallel factor P=5.

M2 (FIG. 22) takes a value M−M1 obtained by subtracting M1 from the parity length M.

Here, since the information length K is N×r=35×2/7=10 and the parity length M is N−K=35−10=25, M2 is M−M1=25−15=10.

Q1 is obtained according to an expression Q1=M1/P, and represents the number of shifts (the number of rows) of cyclic shift in the A matrix.

In other words, the columns other than the (1+P×(i−1))th column of the A matrix of the parity check matrix H by the type A method, in other words, the (2+P×(i−1))th to (P×i)th columns are obtained by cyclically shifting and arranging the elements of 1 of the (1+P×(i−1))th column determined by the parity check matrix initial value table downward (downward of the columns), and Q1 represents the number of shifts of the cyclic shift in the A matrix.

Q2 is obtained according to an expression Q2=M2/P, and represents the number of shifts (the number of rows) of cyclic shift in the C matrix.

In other words, the columns other than the (1+P×(i−1))th column of the C matrix of the parity check matrix H by the type A method, in other words, the (2+P×(i−1))th to (P×i)th columns are obtained by cyclically shifting and arranging the elements of 1 of the (1+P×(i−1))th column determined by the parity check matrix initial value table downward (downward of the columns), and Q2 represents the number of shifts of the cyclic shift in the C matrix.

Here, Q1 is M1/P=15/5=3, and Q2 is M2/P=10/5=2.

In the parity check matrix initial value table in FIG. 23, three numerical values are arranged in the 1st and 2nd rows, and one numerical value is arranged in the 3rd to 5th rows. According to the arrangement of the numerical values, the column weights of the A matrix and the C matrix of the parity check matrix H obtained from the parity check matrix initial value table in FIG. 23 are 3 from 1st=(1+5×(1−1))th column to 10th=(5×2)th column, and 1 from the 11th=(1+5×(3−1))th column to 25th=(5×5)th column.

In other words, the 1st row of the parity check matrix initial value table in FIG. 23 is 2, 6, and 18, which represents that, in the 1st column of the parity check matrix H, the elements of the rows with the row numbers of 2, 6, and 18 are 1 (and the other elements are 0).

Here, in this case, since the A matrix (FIG. 22) is a matrix of 15 rows and 10 columns (M1 rows and K columns), and the C matrix (FIG. 22) is a matrix of 10 rows and 25 columns (N−K−M1 rows and K+M1 columns), the rows with the row numbers 0 to 14 of the parity check matrix H are rows of the A matrix, and the rows with the row numbers 15 to 24 of the parity check matrix H are rows of the C matrix.

Therefore, rows #2 and #6 of the rows with the row numbers 2, 6, and 18 (hereinafter described as rows #2, #6, and #18) are rows of the A matrix, and the row #18 is a row of the C matrix.

The 2nd row of the parity check matrix initial value table in FIG. 23 is 2, 10, and 19, which represents that, in the 6th (=(1+5×(2−1))th) column of the parity check matrix H, the elements of the rows #2, #10, and #19 are 1.

Here, in the 6th (=(1+5×(2−1))th) column of the parity check matrix H, the rows #2 and #10 of the rows #2, #10, and #19 are rows of the A matrix, and the row #19 is a row of the C matrix.

The 3rd row of the parity check matrix initial value table in FIG. 23 is 22, which represents that, in the 11th (=(1+5×(3−1))th) column of the parity check matrix H, the element of the row #22 is 1.

Here, the row #22 is a row of the C matrix in the 11th (=(1+5×(3−1))th) column of the parity check matrix H.

Similarly, 19 in the 4th row of the parity check matrix initial value table in FIG. 23 represents that the element of the row #19 is 1 in the 16th (=(1+5×(4−1))th) column of the parity check matrix H. 15 in the fifth row of the parity check matrix initial value table in FIG. 23 represents that the element of the row #15 is 1 in the 21 (=(1+5×(5−1))th) column of the parity check matrix H.

As described above, the parity check matrix initial value table represents the positions of the elements of 1 of the A matrix and the C matrix of the parity check matrix H in every parallel factor P=5 columns.

The columns other than the (1+5×(i−1))th column of the A matrix and the C matrix of the parity check matrix H, in other words, the (2+5×(i−1))th to (5×i)th columns are obtained by cyclically shifting and arranging the elements of 1 of the (1+5×(i−1))th column determined by the parity check matrix initial value table downward (downward of the columns) according to the parameters Q1 and Q2.

In other words, for example, the (2+5×(i−1))th column of the A matrix is obtained by cyclically shifting the (1+5×(i−1))th column downward by Q1 (=3). The next (3+5×(i−1))th column is obtained by cyclically shifting the (1+5×(i−1))th column downward by 2×Q1 (=2×3) (by cyclically shifting the (2+5×(i−1))th column downward by Q1).

Furthermore, for example, the (2+5×(i−1))th column of the C matrix is obtained by cyclically shifting the (1+5×(i−1))th column downward by Q2 (=2). The next (3+5×(i−1))th column is obtained by cyclically shifting the (1+5×(i−1))th column downward by 2×Q2 (=2×2) (by cyclically shifting the (2+5×(i−1))th column downward by Q2).

Figure 24:
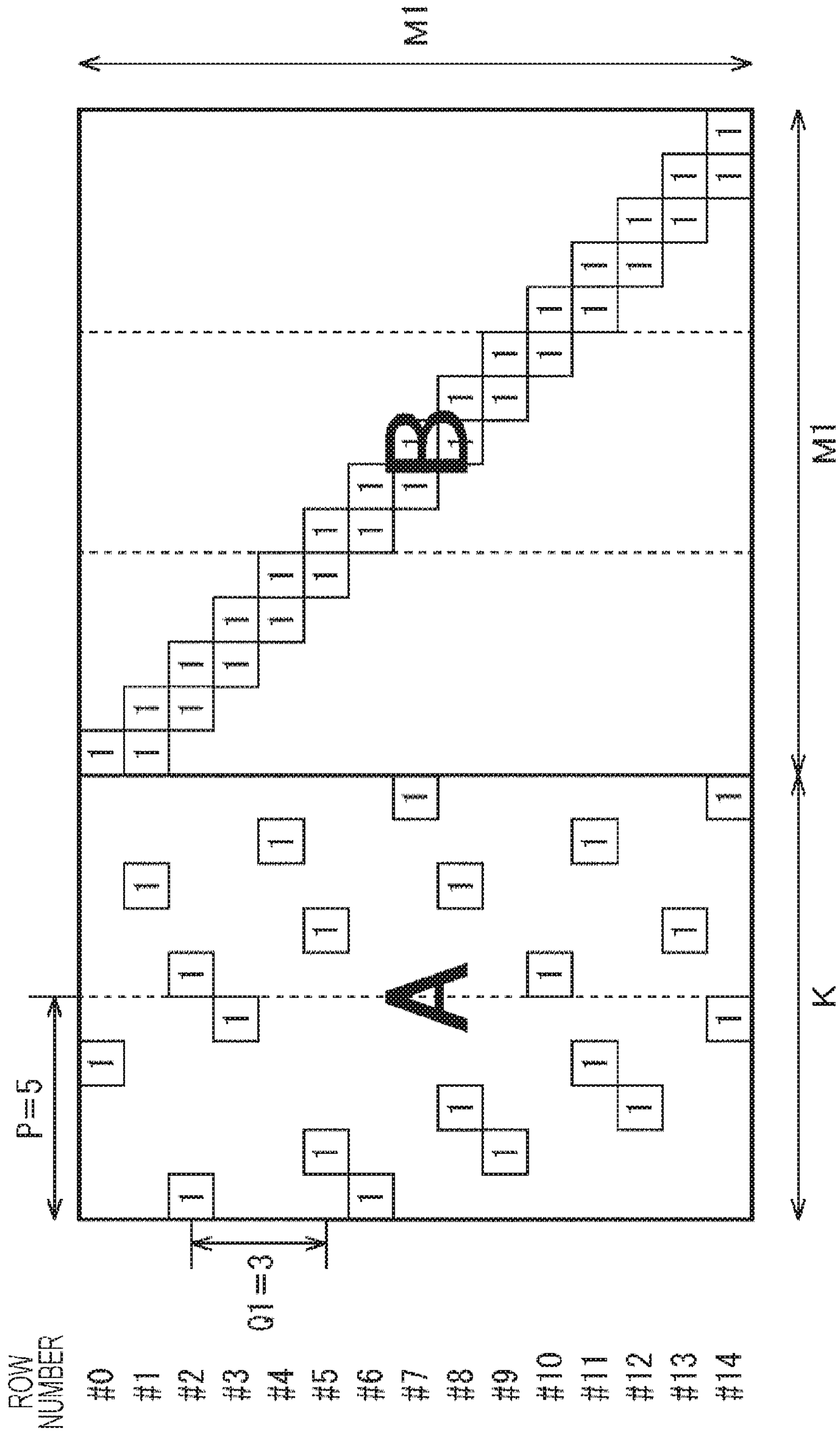
FIG. 24 is a diagram illustrating an A matrix generated from the parity check matrix initial value table.

FIG. 24 is a diagram illustrating the A matrix generated from the parity check matrix initial value table in FIG. 23.

In the A matrix in FIG. 24, the elements of the rows #2 and #6 of the 1st (=(1+5×(1−1))th) column are 1 according to the 1st row of the parity check matrix initial value table in FIG. 23.

Then, the columns from the 2nd (=(2+5×(1−1))th) to 5th (=(5+5×(1−1))th) columns are obtained by cyclically shifting the previous columns downward by Q1=3.

Moreover, in the A matrix in FIG. 24, the elements of the rows #2 and #10 of the 6th (=(1+5×(2−1))th) column are 1 according to the 2nd row of the parity check matrix initial value table in FIG. 23.

Then, the columns from the 7th (=(2+5×(2−1))th) to 10th (=(5+5×(2−1))th) columns are obtained by cyclically shifting the previous columns downward by Q1=3.

Figure 25:
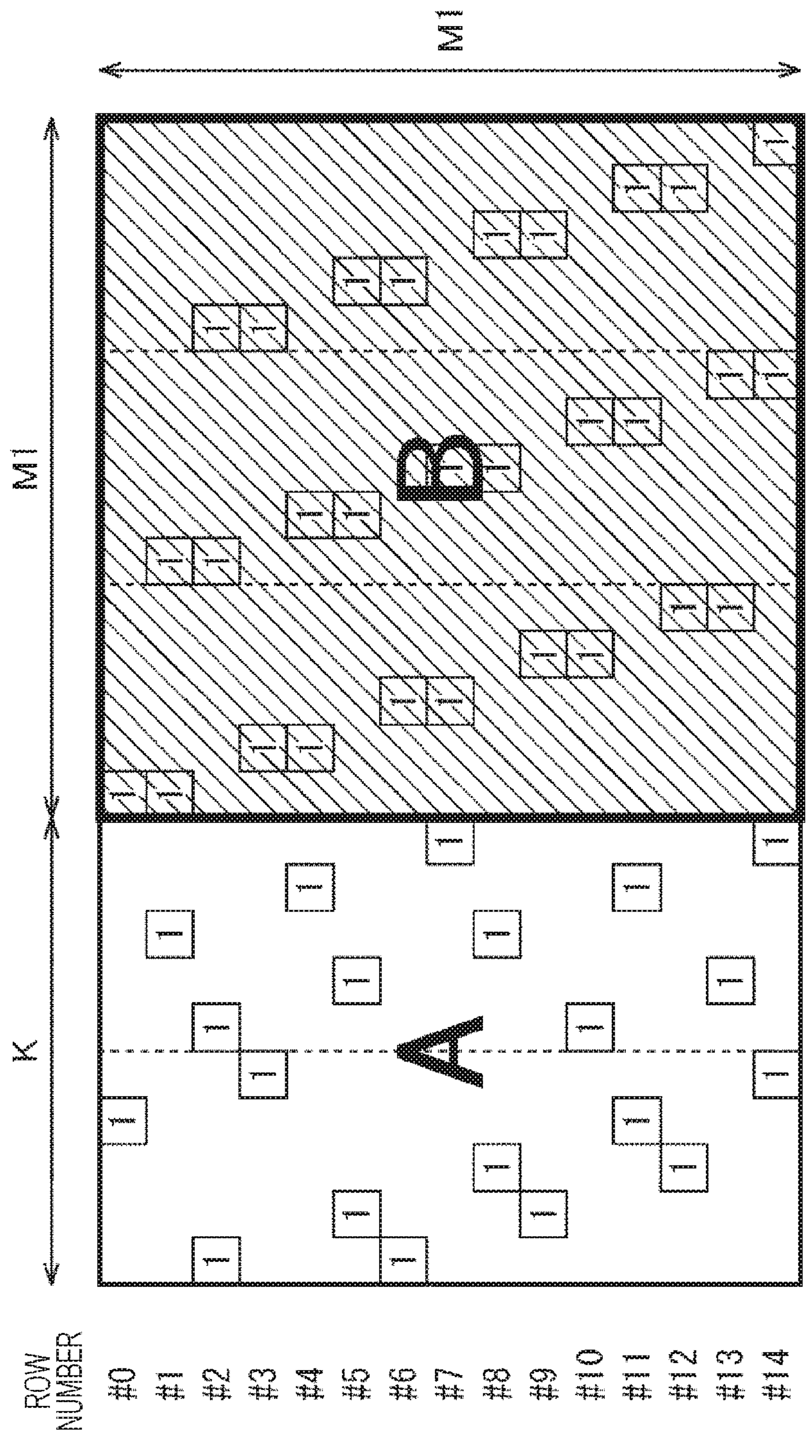
FIG. 25 is a diagram for describing parity interleaving of a B matrix.

FIG. 25 is a diagram illustrating parity interleaving of the B matrix.

The parity check matrix generation unit 613 (FIG. 18) generates the A matrix using the parity check matrix initial value table, and arranges the B matrix having a step structure adjacent to the right of the A matrix. Then, the parity check matrix generation unit 613 treats the B matrix as a parity matrix, and performs parity interleaving such that adjacent elements of 1 of the B matrix having step structure are separated in the row direction by the parallel factor P=5.

FIG. 25 illustrates the A matrix and the B matrix after the parity interleaving of the B matrix in FIG. 24.

Figure 26:
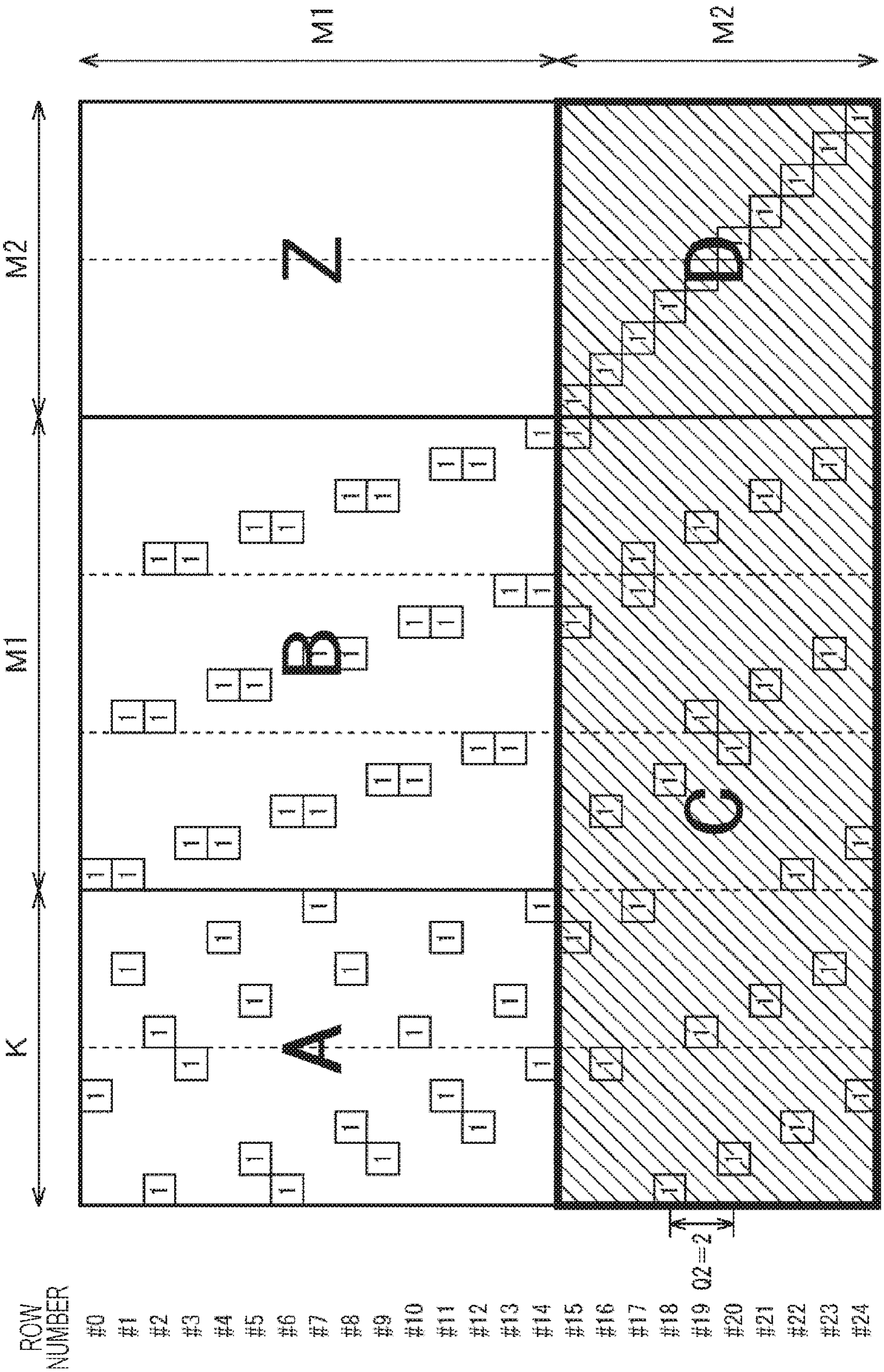
FIG. 26 is a diagram for describing a C matrix generated from the parity check matrix initial value table.

FIG. 26 is a diagram illustrating the C matrix generated from the parity check matrix initial value table in FIG. 23.

In the C matrix in FIG. 26, the element of the row #18 of the 1st (=(1+5×(1−1))th) column of the parity check matrix H is 1 according to the 1st row of the parity check matrix initial value table in FIG. 23.

Then, the columns from the 2nd (=(2+5×(1−1))th) to 5th (=(5+5×(1−1))th) columns of the C matrix are obtained by cyclically shifting the previous columns downward by Q2=2.

Moreover, in the C matrix in FIG. 26, according to the 2nd to 5th rows of the parity check matrix initial value table in FIG. 23, the elements of the row #19 of the 6th (=(1+5×(2−1))th) column, the row #22 of the 11th (=(1+5×(3−1))th) column, the row #19 of the 16th (=(1+5×(4−1))th) column, and the row #15 in the 21st (=(1+5×(5−1))th) columns, of the parity check matrix H, are 1.

Then, columns from the 7th (=2+5×(2−−1))th to the 10th (=5+5×(2−1))th columns, columns from the 12th (=2+5×(3−1))th to 15th (=5+5×(3−1))th columns, columns from the 17th (=2+5×(4−1))th to 20th (=5+5×(4−1))th columns, and columns from the 22nd (=2+5×(5−1))th to the 25th (=5+5×(5−1))th columns are obtained by cyclically shifting the previous columns downward by Q2=2.

The parity check matrix generation unit 613 (FIG. 18) generates the C matrix using the parity check matrix initial value table and arranges the C matrix below the A matrix and the B matrix (after parity interleaving).

Moreover, the parity check matrix generation unit 613 arranges the Z matrix adjacent to the right of the B matrix and arranges the D matrix adjacent to the right of the C matrix to generate the parity check matrix H illustrated in FIG. 26.

Figure 27:
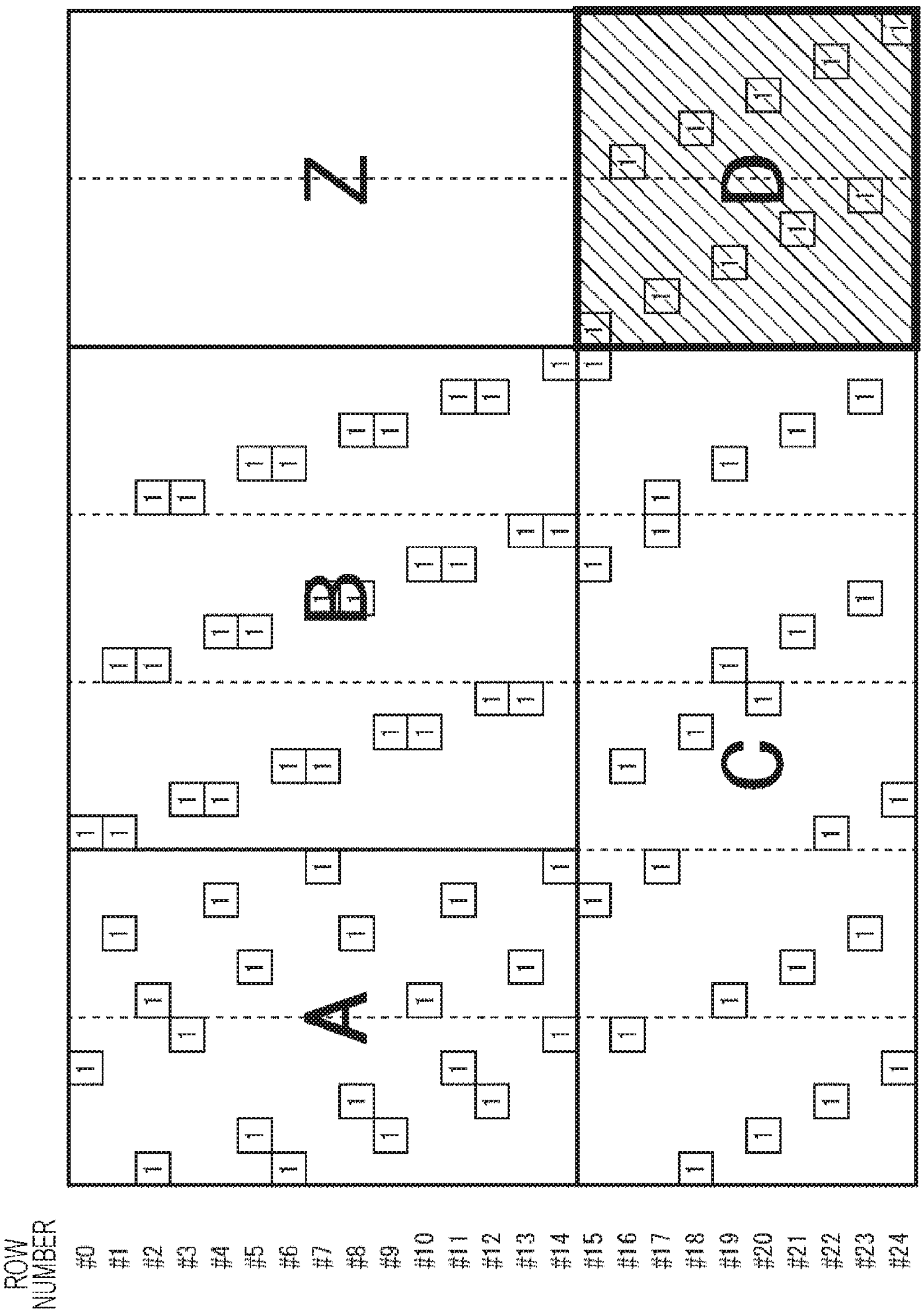
FIG. 27 is a diagram for describing parity interleaving of a D matrix.

FIG. 27 is a diagram for describing parity interleaving of the D matrix.

The parity check matrix generation unit 613 treats the D matrix after generating the parity check matrix H in FIG. 26 as a parity matrix, and performs parity interleaving (of only the D matrix) such that the elements of 1 of the odd rows and the next even rows of the D matrix as an identity matrix are separated by the parallel factor P=5 in the row direction.

FIG. 27 illustrates the parity check matrix H after performing the parity interleaving of the D matrix for the parity check matrix H in FIG. 26.

(The coding parity operation unit 615 (FIG. 18)) of the LDPC encoder 115 performs LDPC coding (generates an LDPC code) using the parity check matrix H in FIG. 27, for example.

Here, the LDPC code generated using the parity check matrix H in FIG. 27 is an LDPC code for which parity interleaving has been performed. Therefore, it is not necessary to perform the parity interleaving in the parity interleaver 23 (FIG. 9) for the LDPC code generated using the parity check matrix H in FIG. 27. In other words, the LDPC code generated using the parity check matrix H after the parity interleaving of the D matrix is performed is the LDPC code for which the parity interleaving has been performed. Therefore, the parity interleaving in the parity interleaver 23 is skipped for the LDPC code.

Figure 28:
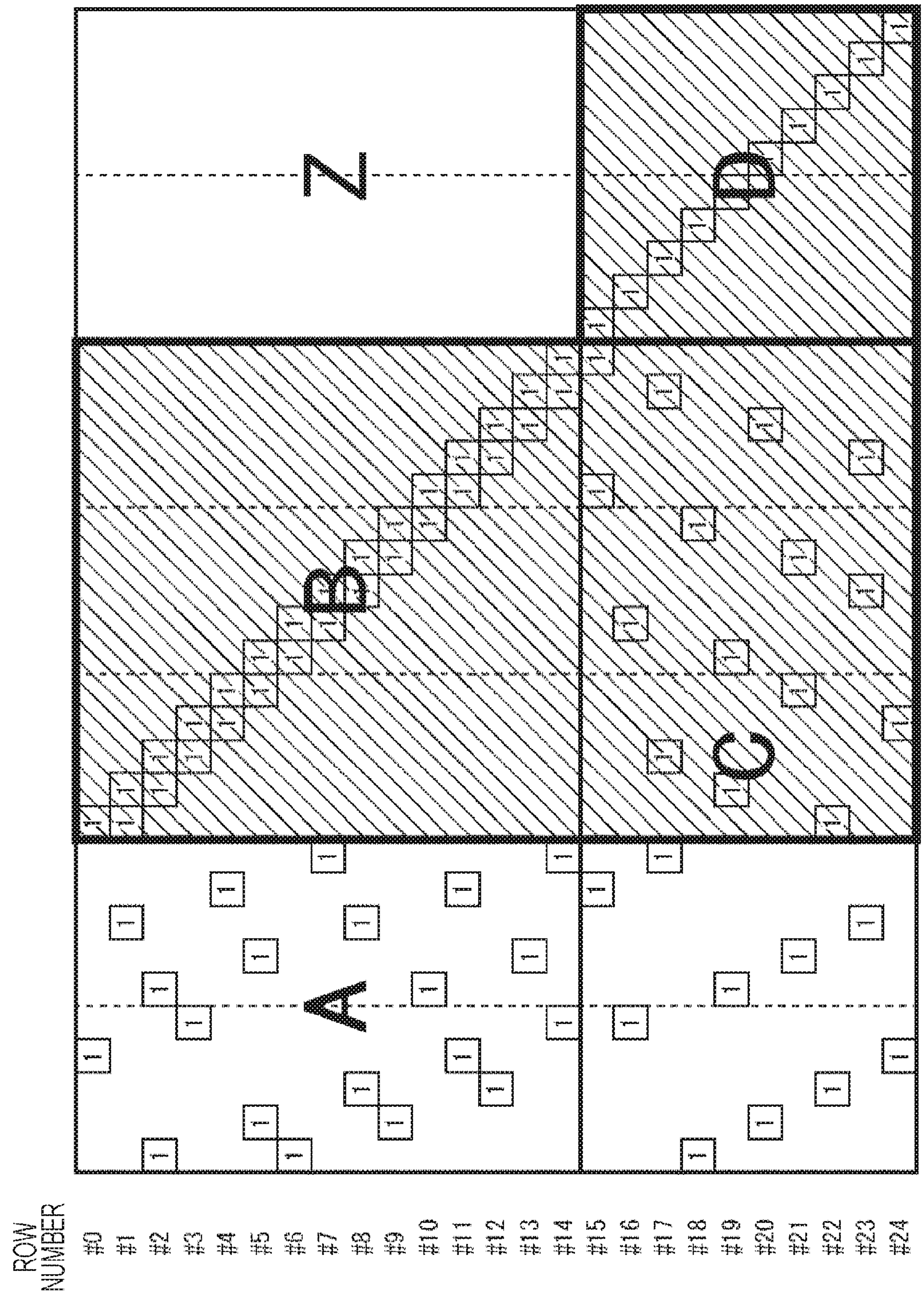
FIG. 28 is a diagram illustrating a parity check matrix in which column permutation as parity deinterleaving for restoring parity interleaving is performed.

FIG. 28 illustrates a parity check matrix H in which column permutation as parity deinterleaving for restoring the parity interleaving is performed for the B matrix, a part of the C matrix (a portion of the C matrix arranged below the B matrix), and the D matrix of the parity check matrix H in FIG. 27.

The LDPC encoder 115 can perform LDPC coding (generates an LDPC code) using the parity check matrix H in FIG. 28.

In a case of performing the LDPC coding using the parity check matrix H in FIG. 28, an LDPC code for which parity interleaving is not performed can be obtained according to the LDPC coding. Therefore, in a case of performing the LDPC coding using the parity check matrix H in FIG. 28, the parity interleaving is performed in the parity interleaver 23 (FIG. 9).

Figure 29:
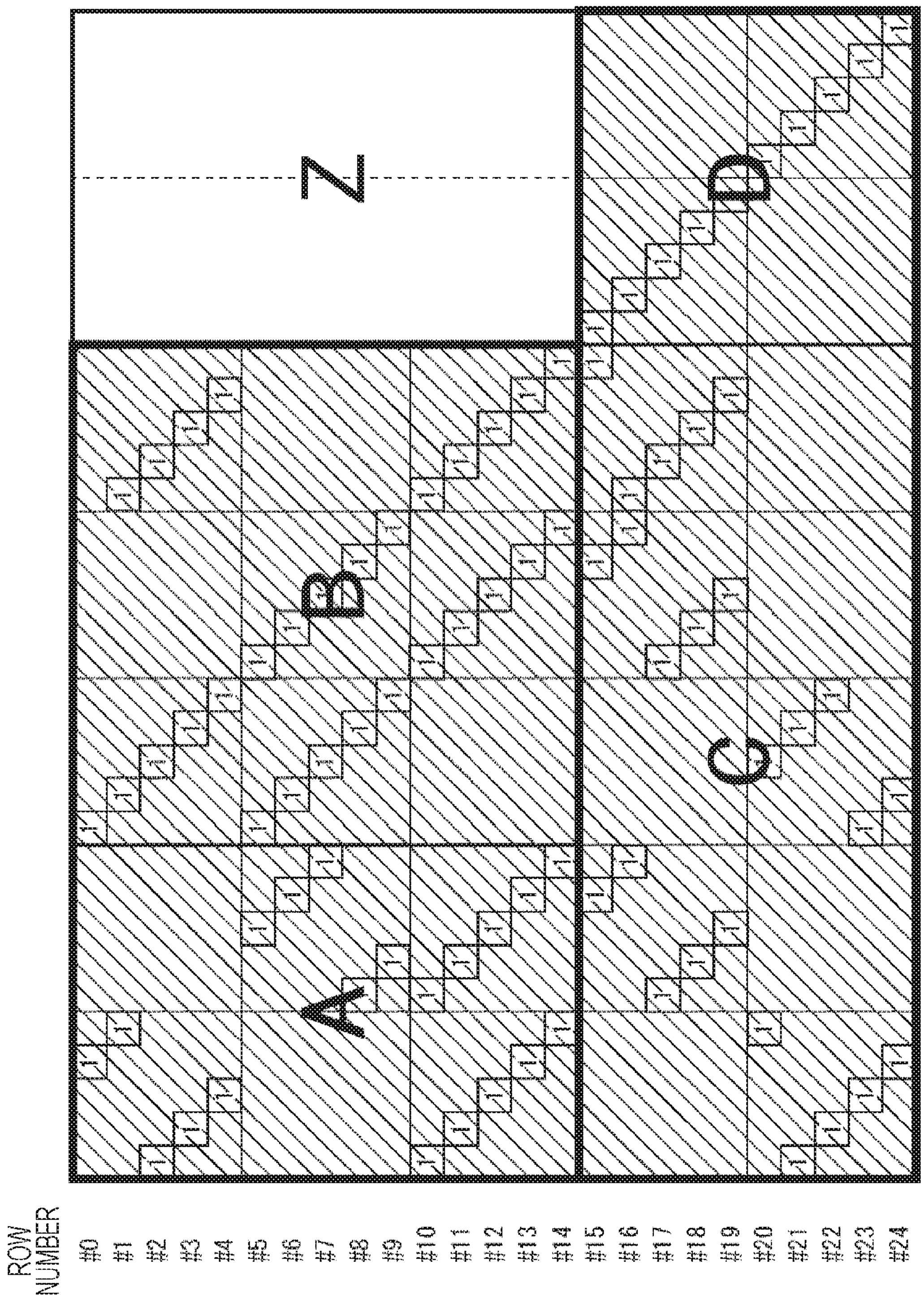
FIG. 29 is a diagram illustrating a transformed parity check matrix obtained by performing row permutation for the parity check matrix.

FIG. 29 is a diagram illustrating a transformed parity check matrix obtained by performing row permutation for the parity check matrix H in FIG. 27.

The transformed parity check matrix is, as described below, a matrix represented by a combination of a P×P identity matrix, a quasi identity matrix in which one or more of is in the identity matrix is 0, a shift matrix obtained by cyclically shifting the identity matrix or the quasi identity matrix, a sum matrix that is a sum of two or more of the identity matrix, the quasi identity matrix, and the shift matrix, and a P×P zero matrix.

By using the transformed parity check matrix for decoding the LDPC code, architecture of performing P check node operations and variable node operations at the same time can be adopted in decoding the LDPC code, as described below.

One of methods of securing favorable communication quality in data transmission using an LDPC code, there is a method using an LDPC code with high performance.

Here, the LDPC code with high performance is an LDPC code obtained from an appropriate parity check matrix H.

The appropriate parity check matrix H is, for example, a parity check matrix that satisfies a predetermined condition that makes a bit error rate (BER) (and a frame error rate (FER)) smaller when the LDPC code obtained from the parity check matrix H is transmitted at low $E_s/N_0$ or $E_b/N_o$ (signal power to noise power ratio per bit).

The appropriate parity check matrix H can be obtained by, for example, performing a simulation to measure BERs of when LDPC codes obtained from various parity check matrices satisfying the predetermined condition are transmitted at low $E_s/N_o$.

Examples of the predetermined condition to be satisfied by the appropriate parity check matrix H include a good analysis result obtained by an analysis method of performance of code called density evolution, and absence of a loop of the elements of 1, called cycle 4.

Here, it is known that the decoding performance of the LDPC code is degraded if the elements of 1 are densely packed in the information matrix $H_A$ as in the cycle 4, and therefore, absence of the cycle 4 is desirable in the parity check matrix H.

In the parity check matrix H, a minimum value of the length of a loop (loop length) configured by the elements of 1 is called girth. The absence of the cycle 4 means that the girth is greater than 4.

Note that the predetermined condition to be satisfied by the appropriate parity check matrix H can be appropriately determined from the viewpoints of improvement of the decoding performance of the LDPC code, facilitation (simplification) of the decoding processing for the LDPC code, and the like.

Figure 30:
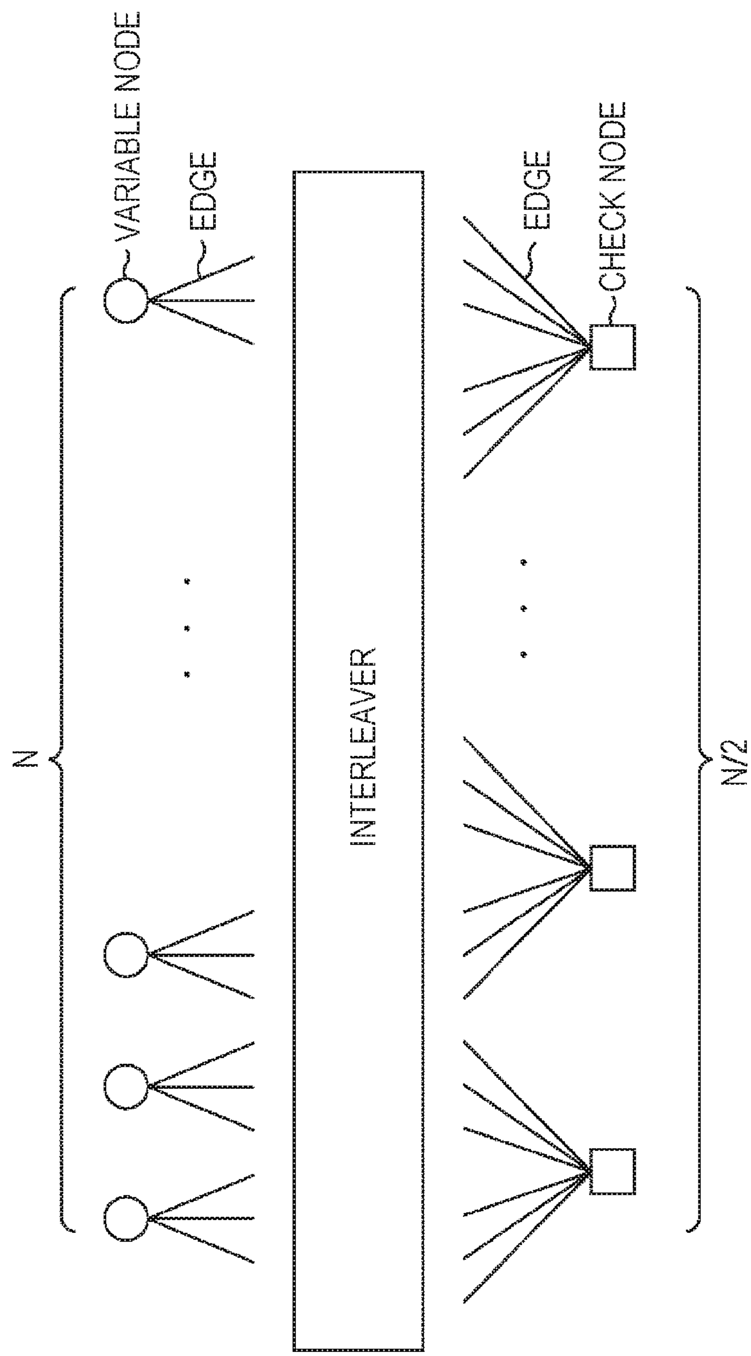
FIG. 30 is a diagram illustrating an example of a Tanner graph of an ensemble of degree sequence with a column weight of 3 and a row weight of 6.
Figure 31:
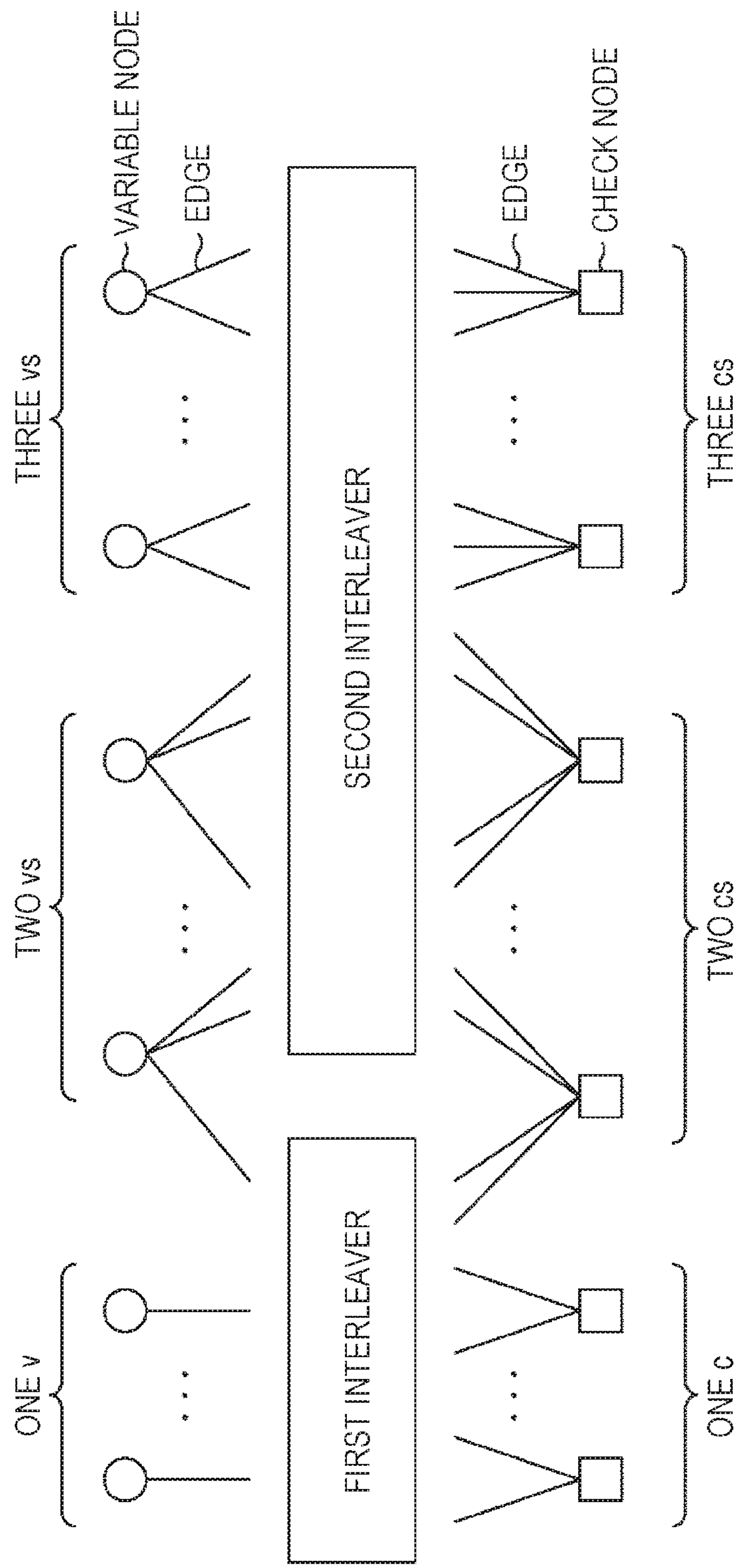
FIG. 31 is a diagram illustrating an example of a Tanner graph of a multi-edge type ensemble.

FIGS. 30 and 31 are diagrams for describing density evolution by which an analysis result as the predetermined condition to be satisfied by the appropriate parity check matrix H can be obtained.

The density evolution is a code analysis method of calculating an expected value of an error probability for the entire LDPC code (ensemble) with the code length N of characterized by a degree sequence to be described below.

For example, when increasing a variance of noise from 0 on an AWGN channel, the expected value of the error probability of an ensemble is initially 0, but the expected value becomes not 0 when the variance of noise becomes a certain threshold or greater.

According to the density evolution, good or bad of the performance of the ensemble (appropriateness of the parity check matrix) can be determined by comparing the threshold of the variance of noise (hereinafter also referred to as performance threshold) at which the expected value of the error probability becomes not 0.

Note that, for a specific LDPC code, an ensemble to which the LDPC code belongs is determined, and the density evolution is performed for the ensemble, whereby rough performance of the LDPC code can be predicted.

Therefore, if an ensemble with high performance is found, the LDPC code with high performance can be found from LDPC codes belonging to the ensemble.

Here, the above-described degree sequence indicates what ratio the variable nodes and check nodes having weights of respective values exist to the code length N of the LDPC code.

For example, a regular (3, 6) LDPC code with the coding rate of 1/2 belongs to an ensemble characterized by a degree sequence indicating that the weights (column weights) of all the variable nodes are 3 and the weights (row weights) of all the check nodes are 6.

FIG. 30 illustrates a Tanner graph of such an ensemble.

In the Tanner bluff in FIG. 30, N variable nodes illustrated by the circles (○) in FIG. 30 exist, the number N being equal to the code length N, and N/2 check nodes illustrated by the squares (□) in FIG. 30 exist, the number N/2 being equal to a multiplication value obtained by multiplying the code length N by the coding rate of 1/2.

Three edges with an equal column weight are connected to each variable node. Therefore, there are a total of 3N edges connected to the N variable nodes.

Furthermore, six edges with an equal row weight are connected to each check node. Therefore, there are a total of 3N edges connected to the N/2 check nodes.

Moreover, in the Tanner graph in FIG. 30, there is one interleaver.

The interleaver randomly rearranges the 3N edges connected to the N variable nodes and connects each edge after the rearrangement to any of the 3N edges connected to the N/2 check nodes.

The number of patterns for rearranging the 3N edges connected to the N variable nodes in the interleaver is (3N). (=(3N)×(3N−1)× . . . ×1). Therefore, the ensemble characterized by the degree sequence indicating that the weights of all the variable nodes are 3 and the weights of all the check nodes are 6 is a set of (3N). LDPC codes.

In the simulation for finding the LDPC code with high performance (appropriate parity check matrix), a multi-edge type ensemble can be used in the density evolution.

In the multi-edge type ensemble, the interleaver which the edges connected to the variable nodes and the edges connected to the check nodes go through is divided into multi edges, whereby characterization of the ensemble is more strictly performed.

FIG. 31 illustrates an example of a Tanner graph of a multi-edge type ensemble.

In the Tanner graph in FIG. 31, there are two interleavers: a first interleaver and a second interleaver.

Furthermore, in the Tanner graph in FIG. 31, v1 variable nodes each having one edge connected to the first interleaver and 0 edges connected to the second interleaver, v2 variable nodes each having one edge connected to the first interleaver and two edges connected to the second interleaver, v3 variable nodes each having 0 edges connected to the first interleaver and two edges connected to the second interleaver exist.

Moreover, in the Tanner graph in FIG. 31, c1 check nodes each having two edges connected to the first interleaver and 0 edges connected to the second interleaver, c2 check nodes each having two edges connected to the first interleaver and two edges connected to the second interleaver, and c3 check nodes each having 0 edges connected to the first interleaver and three edges connected to the second interleaver exist.

Here, the density evolution and its implementation are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In the simulation for obtaining (the parity check matrix) of the LDPC code, an ensemble in which the performance threshold that is $E_b/N_0$ (signal power to noise power ratio per bit) at which the BER starts to drop (start to become small) becomes a predetermined value or less is found by the multi-edge type density evolution, and the LDPC code that makes the BER small in a case of using one or more quadrature modulations such as QPSK is selected from among the LDPC codes belonging to the ensemble as the LDPC code with high performance.

For data transmission of the transmission system in FIG. 7, the type A code or the type B code corresponding to the parity check matrix H having a cyclic structure with the parallel factor P of 360 similar to DVB-T.2, ATSC3.0, or the like, which can be obtained by the above simulation, can be adopted.

Furthermore, for data transmission in the transmission system in FIG. 7, an LDPC code with the code length N longer than DVB-T.2 or ATSC3.0, in other words, an LDPC code with the code length N of 69120 bits and the coding rate r of 2/16, 3/16, 4/16, 5/16, 6/16, 7/16, 8/16, 9/16, 10/16, 11/16, 12/16, 13/16, or 14/16 can be adopted.

<Constellation>

FIGS. 32, 33, 34, 35A, 35B, 36, 37, 38, 39, 40, 41, 42, 43, 44, 45, 46, 47, 48, 49, 50, 51, 52, 53A, 53B, 54, 55, and 56 are diagrams illustrating examples of constellations adaptable in the transmission system in FIG. 7.

In the transmission system in FIG. 7, for example, a constellation to be used in MODCOD that is a combination of a modulation method (MODulation) and the LDPC code (CODe) can be set for the MODCOD.

One or more constellations can be set for one MODCOD.

As the constellation, there are a uniform constellation (UC) in which arrangement of signal points is uniform and a non uniform constellation (NUC) in which arrangement of signal points are not uniform.

Furthermore, as the NUC, there are a constellation called 1-dimensional ($M^2$-QAM) non-uniform constellation (1D-NUC), a constellation called 2-dimensional (QQAM) non-uniform constellation (2D-NUC), and the like.

In general, the BER is further improved in the 1D NUC than the UC, and moreover, the BER is further improved in the 2D NUC than the 1D NUC.

The UC can be adopted as the constellation for the modulation method of QPSK. For example, the UC or the 2D NUC can be adopted as a constellation for the modulation method of 16QAM, 64QAM, 256QAM, or the like. For example, the UC or the 1D NUC can be adopted as a constellation for the modulation method of 1024QAM, 4096QAM, or the like.

In the transmission system in FIG. 7, for example, constellations defined in ATSC 3.0, DVB-C.2 or the like, and various other constellations that improve the error rate can be used.

In other words, in the case where the modulation method is QPSK, for example, the same UC can be used for the coding rates r of the LDPC codes.

Furthermore, in the case where the modulation method is 16QAM, 64QAM, or 256QAM, for example, the same UC can be used for the coding rates r of the LDPC codes. Moreover, in the case where the modulation method is 16QAM, 64QAM, or 256QAM, for example, different 2D NUCs can be used for the coding rates r of the LDPC codes, respectively.

Furthermore, in the case where the modulation method is 1024QAM, or 4096QAM, for example, the same UC can be used for each coding rate r of the LDPC code. Moreover, in the case where the modulation method is 1024QAM, or 4096QAM, for example, different 1D NUCs can be used for the coding rates r of the LDPC codes, respectively.

Here, the UC of QPSK is also described as QPSK-UC, and the UC of $2^m$QAM is also described as $2^m$QAM-UC. Furthermore, the 1D NUC and 2D NUC of $2^m$QAM are also described as $2^m$QAM-1D NUC and $2^m$QAM-2D NUC, respectively.

Hereinafter, some of constellations defined in ATSC3.0 will be described.

FIG. 32 is a diagram illustrating coordinates of QPSK-UC signal points used for all the coding rates of the LDPC codes defined in ATSC 3.0 in the case where the modulation method is QPSK.

In FIG. 32, "Input Data cell y" indicates a 2-bit symbol to be mapped to QPSK-UC, and "Constellation point $z_s$" indicates a coordinate of a signal point $z_s$. Note that an index s of the signal point $z_s$ (an index q of a signal point $z_q$ as described below is similar) indicates discrete time of symbols (time interval between one symbol and a next symbol).

In FIG. 32, the coordinate of the signal point $z_s$ is expressed in the form of a complex number, and j represents an imaginary unit ($\sqrt{(-1)}$).

FIG. 33 is a diagram illustrating coordinates of signal points of 16QAM-2D-NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC3.0 in the case where the modulation method is 16QAM.

In FIG. 33, the coordinate of the signal point $z_s$ is expressed in the form of a complex number, and j represents an imaginary unit, similarly to FIG. 32.

In FIG. 33, w # k represents a coordinate of a signal point in the first quadrant of the constellation.

In the 2D-NUC, a signal point in the second quadrant of the constellation is arranged at a position obtained by symmetrically moving a signal point in the first quadrant with respect to a Q axis, and a signal point in the third quadrant of the constellation is arranged at a position obtained by symmetrically moving a signal point in the first quadrant with respect to the origin. Then, a signal point in the fourth quadrant of the constellation is arranged at a position obtained by symmetrically moving a signal point in the first quadrant with respect to an I axis.

Here, in the case where the modulation method is $2^m$QAM, m bits are regarded as one symbol, and the one symbol is mapped to a signal point corresponding to the symbol.

The m-bit symbol can be expressed by, for example, an integer value of 0 to $2^m-1$. Now, symbols y(0), y(1), . . . , $y(2^m-1)$ expressed by integer values of 0 to $2^m-1$ can be classified into four groups of symbols y(0) to y(b−1), y(b) to y(2b−1), y(2b) to y(3b−1), and y(3b) to y(4b−1), where $b=2^m/4$.

In FIG. 33, the suffix k of w # k takes an integer value in a range of 0 to b−1, and w # k represents a coordinate of a signal point corresponding to a symbol y(k) in a range of symbols y(0) to y(b−1).

Then, a coordinate of a signal point corresponding to a symbol y(k+b) in a range of symbols y(b) to y(2b−1) is represented as −conj(w # k), and a coordinate of a signal point corresponding to a symbol y(k+2b) in a range of symbols y(2b) to y(3b−1) is represented as conj(w # k). Furthermore, a coordinate of a signal point corresponding to a symbol y(k+3b) in a range of symbols y(3b) to y(4b−1) is represented by −w # k.

Here, conj(w # k) represents a complex conjugate of w # k.

For example, in a case where the modulation method is 16QAM, symbols y(0), y(1), . . . , and y(15) of m=4 bits are classified into four groups of symbols y(0) to y(3), y(4) to y(7), y(8) to y(11), and y(12) to y(15), where $b=2^4/4=4$.

Then, for example, the symbol y(12), of the symbols y(0) to y(15), is a symbol y(k+3b)=y(0+3×4) in the range of symbols y(3b) to y(4b−1)) and k=0, and therefore the coordinate of the signal point corresponding to the symbol y(12) is −w # k=−w0.

Now, assuming that the coding rate r (CR) of the LDPC code is, for example, 9/15, w0 in a case where the modulation method is 16QAM and the coding rate r is 9/15 is 0.2386+j0.5296 according to FIG. 33, and therefore the coordinate −w0 of the signal point corresponding to the symbol y(12) is −(0.2386+j0.5296).

FIG. 34 is a diagram illustrating examples of coordinates of signal points of 1024QAM-1D NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC3.0 in the case where the modulation method is 1024QAM.

In FIG. 34, u # k represents a real part $Re(z_s)$ and an imaginary part $Im(z_s)$ of the complex number as the coordinate of the signal point $z_s$ of 1D NUC, and is a component of a vector u=(u0, u1, . . . , u # V−1) called position vector. The number V of the components u # k of the position vector u is given by an expression $V=(2^m)/2$.

FIGS. 35A and 35B are diagrams illustrating a relationship between the symbol y of 1024QAM and (the component u # k of) the position vector u.

Now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

FIG. 35A illustrates a correspondence between the even-numbered 5 bits y1,s, y3,s, y5,s, y7,s, y9,s of the symbol y, and u # k representing the real part Re(zs) of (the coordinate) of the signal point zs corresponding to the symbol y.

FIG. 35B illustrates a correspondence between the odd-numbered 5 bits y0,s, y2,s, y4,s, y6,s, y8,s of the symbol y, and u # k representing the imaginary part Im(zs) of the signal point zs corresponding to the symbol y.

In a case where the 10-bit symbol $y=(y_{0,s}, y_{1,s}, y_{2,s}, y_{3,s}, y_{4,s}, y_{5,s}, y_{6,s}, y_{7,s}, y_{8,s}, y_{9,s})$ of 1024QAM is (0, 0, 1, 0, 0, 1, 1, 1, 0, 0), for example, the odd-numbered 5 bits $(y_{0,s}, y_{2,s}, y_{4,s}, y_{6,s}, y_{8,s})$ are (0, 1, 0, 1, 0) and the even-numbered 5 bits $(y_{1,s}, y_{3,s}, y_{5,s}, y_{7,s}, y_{9,s})$ are (0, 0, 1, 1, 0).

FIG. 35A, the even-numbered 5 bits (0, 0, 1, 1, 0) are associated with u11, and therefore the real part Re(zs) of the signal point zs corresponding to the symbol y=(0, 0, 1, 0, 0, 1, 1, 1, 0, 0) is u11.

FIG. 35B, the odd-numbered 5 bits (0, 1, 0, 1, 0) are associated with u3, and therefore the imaginary part Im(zs) of the signal point zs corresponding to the symbol y=(0, 0, 1, 0, 0, 1, 1, 1, 0, 0) is u3.

Meanwhile, when the coding rate r of the LDPC code is 6/15, for example, u3 is 0.1295 and u11 is 0.7196 according to FIG. 34 in regard to the 1D NUC used in a case where the modulation method is 1024QAM and the coding rate r (CR) of the LDPC code=6/15.

Therefore, the real part $Re(z_s)$ of the signal point $z_s$ corresponding to the symbol y=(0, 0, 1, 0, 0, 1, 1, 1, 0, 0) is u11=0.7196 and the imaginary part $Im(z_s)$ is u3=0.1295. As a result, the coordinate of the signal point $z_s$ corresponding to the symbol y=(0, 0, 1, 0, 0, 1, 1, 1, 0, 0) is expressed by 0.7196+j0.1295.

Note that the signal points of the 1D NUC are arranged in a lattice on a straight line parallel to the I axis and a straight line parallel to the Q axis in the constellation. However, the interval between signal points is not constant. Furthermore, average power of the signal points on the constellation can be normalized in transmission of (data mapped to) the signal points. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$.

The transmission system in FIG. 7 can use the constellation defined in ATSC 3.0 as described above.

FIGS. 36 to 47 illustrate coordinates of signal points of UCs defined in DVB-C.2.

In other words, FIG. 36 is a diagram illustrating a real part $Re(z_q)$ of a coordinate $z_q$ of a signal point of QPSK-UC (UC in QPSK) defined in DVB-C.2. FIG. 37 is a diagram illustrating an imaginary part $Im(z_q)$ of a coordinate $z_q$ of a signal point of QPSK-UC defined in DVB-C.2.

FIG. 38 is a diagram illustrating a real part $Re(z_q)$ of a coordinate $z_q$ of a signal point of 16QAM-UC (UC of 16QAM) defined in DVB-C.2. FIG. 39 is a diagram illustrating an imaginary part $Im(z_q)$ of a coordinate $z_q$ of a signal point of 16QAM-UC defined in DVB-C.2.

FIG. 40 is a diagram illustrating a real part $Re(z_q)$ of a coordinate $z_q$ of a signal point of 64QAM-UC (UC of 64QAM) defined in DVB-C.2. FIG. 41 is a diagram illustrating an imaginary part $Im(z_q)$ of a coordinate $z_q$ of a signal point of 64QAM-UC specified in DVB-C.2.

FIG. 42 is a diagram illustrating a real part $Re(z_q)$ of a coordinate $z_q$ of a signal point of 256QAM-UC (UC of 256QAM) defined in DVB-C.2. FIG. 43 is a diagram illustrating an imaginary part $Im(z_q)$ of coordinate $z_q$ of a signal point of 256QAM-UC defined in DVB-C.2.

FIG. 44 is a diagram illustrating a real part $Re(z_q)$ of a coordinate $z_q$ of a signal point of 1024QAM-UC (UC of 1024QAM) defined in DVB-C.2. FIG. 45 is a diagram illustrating an imaginary part $Im(z_q)$ of a coordinate $z_q$ of a signal point of 1024QAM-UC specified in DVB-C.2.

FIG. 46 is a diagram illustrating a real part $Re(z_q)$ of a coordinate $z_q$ of a signal point of 4096QAM-UC (UC of 4096QAM) defined in DVB-C.2. FIG. 47 is a diagram illustrating an imaginary part $Im(z_q)$ of a coordinate $z_q$ of a signal point of 4096QAM-UC defined in DVB-C.2.

Note that, in FIGS. 36 to 47, $y_{i,q}$ represent the (i+1)th bit from the head of the m-bit symbol (for example, a 2-bit symbol in QPSK) of $2^m$QAM. Furthermore, average power of the signal points on the constellation can be normalized in transmission of (data mapped to) the signal points of UC.

Normalization can be performed by, where the root mean square of absolute values of all (the coordinates of) the signal points on the constellation is $P_{ave}$, multiplying each signal point $z_q$ on the constellation by a reciprocal $1/(\sqrt{P_{ave}})$ of the square root $\sqrt{P_{ave}}$ of the root mean square value $P_{ave}$.

In the transmission system in FIG. 7, the UC defined in DVB-C.2 as described above can be used.

FIGS. 48, 49, 50, 51, 52, 53A, 53B, 54, 55, and 56 are diagrams illustrating examples of coordinates of signal points of other NUCs.

That is, FIG. 48 is a diagram illustrating examples of coordinates of signal points of 16QAM-2D-NUC.

FIG. 49 is a diagram illustrating examples of coordinates of signal points of 64QAM-2D-NUC.

FIGS. 50 and 51 are diagrams illustrating examples of coordinates of signal points of 256QAM-2D-NUC.

Note that FIG. 51 is a diagram following FIG. 50.

In FIGS. 48 to 51, the coordinate of the signal point $z_s$ is expressed in the form of a complex number, and j represents an imaginary unit, similarly to FIG. 33.

In FIGS. 48 to 51, w # k represents a coordinate of a signal point in the first quadrant of the constellation, similarly to FIG. 33.

Here, as described in FIG. 33, when the m-bit symbol can be expressed by, for example, an integer value of 0 to $2^m-1$ and $b=2^m/4$, the symbols y(0), y(1), . . . , y($2^m-1$) expressed by integer values of 0 to $2^m-1$ can be classified into four groups of symbols y(0) to y(b−1), y(b) to y(2b−1), y(2b) to y(3b−1), and y(3b) to y(4b−1).

In FIGS. 48 to 51, the suffix k of w # k takes an integer value in the range of 0 to b−1, and w # k represents a coordinate of a signal point corresponding to the symbol y(k) in the range of symbols y(0) to y(b−1), similarly to FIG. 33.

Moreover, in FIGS. 48 to 51, a coordinate of a signal point corresponding to the symbol y(k+3b) in the range of symbols y(3b) to y(4b−1) is represented by −w # k, similarly to FIG. 33.

Note that, in FIG. 33, a coordinate of a signal point corresponding to the symbol y(k+b) in the range of symbols y(b) to y(2b−1) is represented as −conj(w # k), and a coordinate of a signal point corresponding to the symbol y(k+2b) in the range of symbols y(2b) to y(3b−1) is represented as conj(w # k). However, the sign of conj is inverted in FIGS. 48 to 51.

In other words, in FIGS. 48 to 51, a coordinate of a signal point corresponding to the symbol y(k+b) in the range of symbols y(b) to y(2b−1) is represented as conj(w # k), and a coordinate of a signal point corresponding to the symbol y(k+2b) in the range of symbols y(2b) to y(3b−1) is represented as −conj (w # k).

FIG. 52 is a diagram illustrating examples of coordinates of signal points of 1024QAM-1D-NUC.

In other words, FIG. 52 is a diagram illustrating a relationship between the real part Re($z_s$) and the imaginary part Im($z_s$) of the complex number as the coordinate of the signal point $z_s$ of 1024QAM-1D-NUC and the (component u # k of) the position vector u.

FIGS. 53A and 53B are diagrams illustrating the relationship between the symbol y of 1024QAM and (the component u # k of) the position vector u in FIG. 52.

In other words, now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

FIG. 53A illustrates a correspondence between the odd-numbered 5 bits y0,s, y2,s, y4,s, y6,s, y8,s of the 10-bit symbol y, and the position vector u # k representing the real part Re(zs) of (the coordinate of) the signal point zs corresponding to the symbol y.

FIG. 53B illustrates a correspondence between the even-numbered 5 bits y1,s, y3,s, y5,s, y7,s, y9,s of the 10-bit symbol y, and the position vector u # k representing the imaginary part Im(zs) of the signal point zs corresponding to the symbol y.

Since the way of obtaining the coordinate of the signal point zs of when the 10-bit symbol y of 1024QAM is mapped to the signal point zs of 1024QAM-1D-NUC defined in FIGS. 52, 53A, and 53B are similar to the case described in FIGS. 34, 35A, and 35B, description is omitted.

FIG. 54 is a diagram illustrating examples of coordinates of signal points of 4096QAM-1D-NUC.

In other words, FIG. 54 is a diagram illustrating a relationship between the real part Re($z_s$) and the imaginary part Im($z_s$) of the complex number as the coordinate of the signal point $z_s$ of 4096QAM-1D-NUC and the position vector u (u # k).

FIGS. 55 and 56 are diagrams illustrating the relationship between the symbol y of 4096QAM and (the component u # k of) the position vector u in FIG. 54.

In other words, now, it is assumed that the 12-bit symbol y of 4096QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$, $y_{10,s}$, $y_{11,s}$.

FIG. 55 illustrates a correspondence between the odd-numbered 6 bits $y_{0,s}$, $y_{2,s}$, $y_{4,s}$, $y_{6,s}$, $y_{8,s}$, yd of the 12-bit symbol y, and the position vector u # k representing the real part Re($z_s$) of the signal point $z_s$ corresponding to the symbol y.

FIG. 56 illustrates a correspondence between the even-numbered 6 bits $y_{1,s}$, $y_{3,s}$, $y_{5,s}$, $y_{7,s}$, $y_{9,s}$, $y_{11,s}$ of the 12-bit symbol y, and the position vector u # k representing the imaginary part Im($z_s$) of the signal point $z_s$ corresponding to the symbol y.

Since the way of obtaining the coordinate of the signal point zs of when the 12-bit symbol y of 4096QAM is mapped to the signal point zs of 4096QAM-1D-NUC defined in FIGS. 54 to 56 is similar to the case described in FIGS. 34, 35A, and 35B, description is omitted.

Note that average power of the signal points on the constellation can be normalized in transmission of (data mapped to) the signal points of the NUCs in FIGS. 48, 49, 50, 51, 52, 53A, 53B, 54, 55, and 56. Normalization can be performed by, where the root mean square of absolute values of all (the coordinates of) the signal points on the constellation is Pave, multiplying each signal point zs on the constellation by a reciprocal 1/(√Pave) of the square root √Pave of the root mean square value Pave. In FIGS. 35A and 35B described above, the odd-numbered bits of the symbol y are associated with the position vector u # k representing the imaginary part Im(zs) of the signal point zs and the even-numbered bits of the symbol y are associated with the position vector u # k representing the real part Re(zs) of the signal point zs. In FIGS. 53A and 53B, and FIGS. 55 and 56, conversely, the odd-numbered bits of the symbol y are associated with the position vector u # k representing the real part Re(zs) of the signal point zs and the even-numbered bits of the symbol y are associated with the position vector u # k representing the imaginary part Im(zs) of the signal point zs.

<Block Interleaver 25>

Figure 57:
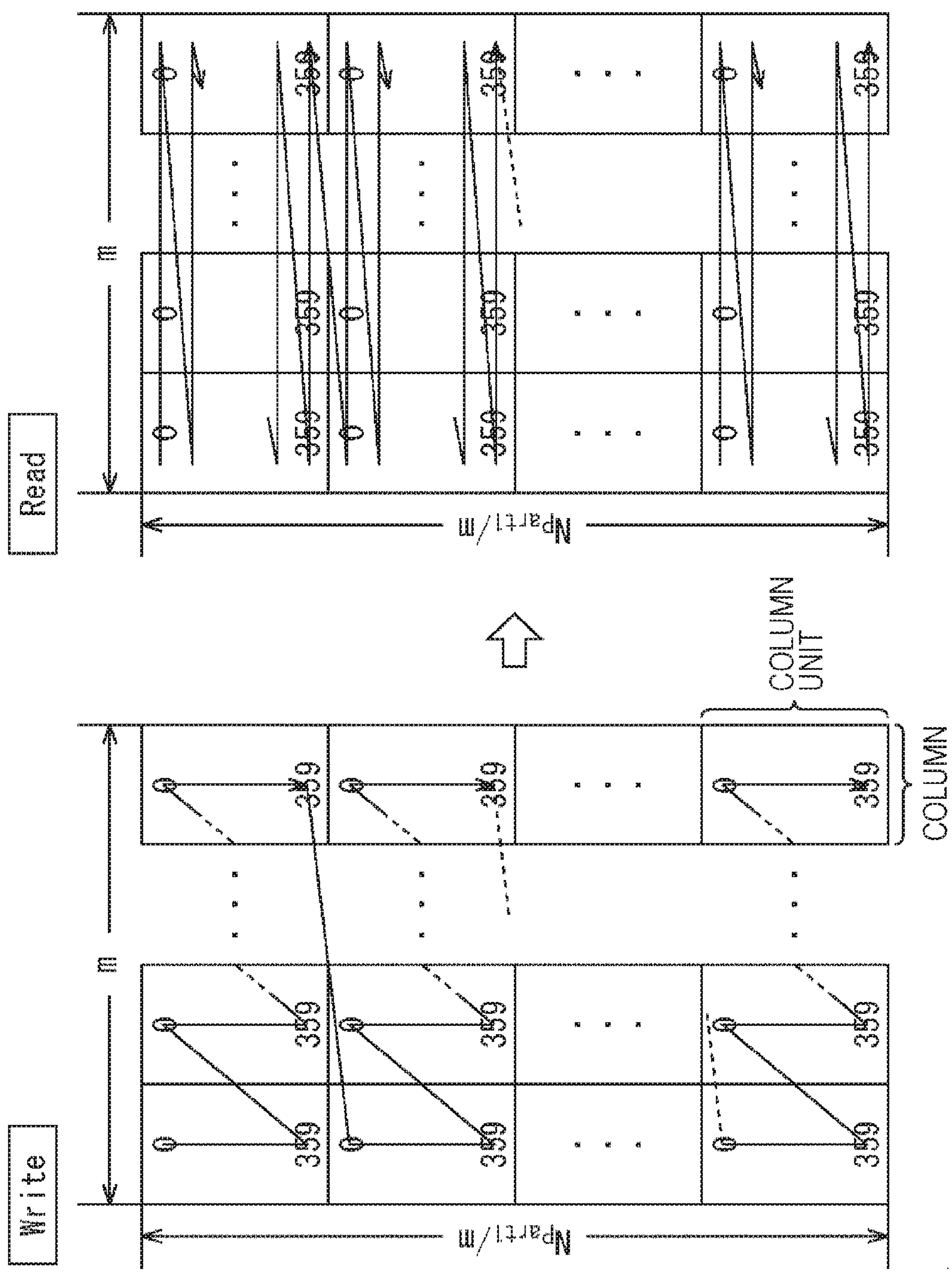
FIG. 57 is a diagram for describing block interleaving performed by a block interleaver 25.

FIG. 57 is a diagram for describing block interleaving performed by the block interleaver 25 in FIG. 9.

The block interleaving is performed by dividing the LDPC code of one codeword into a part called part 1 and a part called part 2 from the head of the LDPC code.

Npart 1+Npart 2 is equal to the code length N, where the length (bit length) of part 1 is Npart 1 and the length of part 2 is Npart 2.

Conceptually, in the block interleaving, columns as storage regions each storing Npart1/m bits in a column (vertical) direction as one direction are arranged in a row direction orthogonal to the column direction by the number m equal to the bit length m of the symbol, and each column is divided from the top into a small unit of 360 bits that is the parallel factor P. This small unit of column is also called column unit.

In the block interleaving, as illustrated in FIG. 57, writing of part 1 of the LDPC code of one codeword downward (in the column direction) from the top of the first column unit of the column is performed in the columns from left to right direction.

Then, when the writing to the first column unit of the rightmost column is completed, the writing returns to the leftmost column, and writing downward from the top of the second column unit of the column is performed in the columns from the left to right direction, as illustrated in FIG. 57. Hereinafter, writing of part 1 of the LDPC code of one codeword is similarly performed.

When the writing of part 1 of the LDPC code of one codeword is completed, part 1 of the LDPC code is read in units of m bits in the row direction from the first column of all the m columns, as illustrated in FIG. 57.

The unit of m bits of part 1 is supplied from the block interleaver 25 to the mapper 117 (FIG. 8) as the m-bit symbol.

The reading of part 1 in units of m bits is sequentially performed toward lower rows of the m columns. When the reading of part 1 is completed, part 2 is divided into units of m bits from the top and is supplied from the block interleaver 25 to the mapper 117 as the m-bit symbol.

Therefore, part 1 is symbolized while being interleaved, and part 2 is sequentially dividing into m bits and symbolized without being interleaved.

Npart1/m as the length of the column is a multiple of 360 as the parallel factor P, and the LDPC code of one codeword is divided into part 1 and part 2 so that Npart1/m becomes a multiple of 360.

FIG. 58 is a diagram illustrating examples of part 1 and part 2 of the LDPC code with the code length N of 69120 bits in the case where the modulation method is QPSK, 16QAM, 64QAM, 256QAM, 1024QAM, and 4096QAM.

In FIG. 58, part 1 is 68400 bits and part 2 is 720 bits in the case where the modulation method is 1024QAM, and part 1 is 69120 bits and part 2 is 0 bits in the cases where the modulation methods are QPSK, 16QAM, 64QAM, 256QAM, and 4096QAM. The number of columns required for block interleaving is equal to the number of bits m of the symbol.

<Group-Wise Interleaving>

Figure 59:
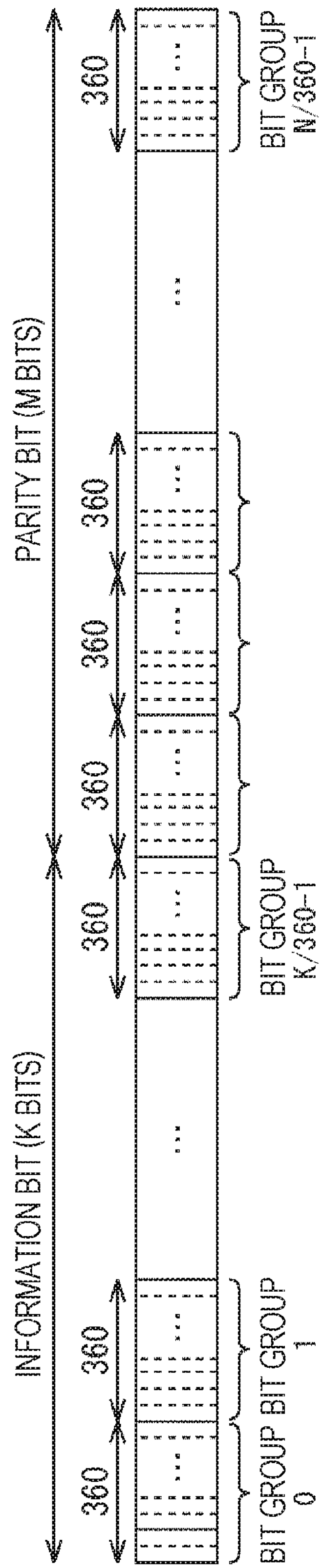
FIG. 59 is a diagram for describing group-wise interleaving performed by a group-wise interleaver 24.

FIG. 59 is a diagram for describing group-wise interleaving performed by the group-wise interleaver 24 in FIG. 9.

In the group-wise interleaving, as illustrated in FIG. 59, the LDPC code of one codeword is interleaved in units of bit groups according to a predetermined pattern (hereinafter also referred to as GW pattern) where one section of 360 bits is set as a bit group, the one section of 360 bits being obtained by dividing the LDPC code of one code into units of 360 bits, the unit being equal to the parallel factor P, from the head of the LDPC code.

Here, the (i+1)th bit group from the head of when the LDPC code of one codeword is divided into bit groups is hereinafter also described as bit group i.

In a case where the parallel factor P is 360, for example, an LDPC code with the code length N of 1800 bits is divided into 5 (=1800/360) bit groups of bit groups 0, 1, 2, 3, and 4.

Moreover, for example, an LDPC code with the code length N of 69120 bits is divided into 192 (=69120/360) bit groups of the bit groups 0, 1, . . . , 191.

Furthermore, hereinafter, the GW pattern is represented by a sequence of numbers representing a bit group. For example, regarding the LDPC code with the code length N of 1,800 bits, GW patterns 4, 2, 0, 3, and 1 indicate interleaving (rearranging) arrangement of the bit groups 0, 1, 2, 3, and 4 into arrangement of the bit groups 4, 2, 0, 3, and 1.

For example, now, it is assumed that the (i+1)th code bit from the head of the LDPC code with the code length N of 1800 bits is represented by $x_i$.

In this case, according to the group-wise interleaving of the GW patterns 4, 2, 0, 3, and 1, the 1800-bit LDPC code $\{x_0, x_1, \ldots, x_{1799}\}$ is interleaved in arrangement of $\{x_{1440}, x_{1441}, \ldots, x_{1799}\}$, $\{x_{720}, x_{721}, \ldots, x_{1079}\}$, $\{x_0, x_1, \ldots, x_{359}\}$, $\{x_{1080}, x_{1081}, \ldots x_{1439}\}$, and $\{x_{360}, x_{361}, \ldots, x_{719}\}$.

The GW pattern can be set for each code length N of the LDPC code, each coding rate r, each modulation method, each constellation, or each combination of two or more of the code length N, the coding rate r, the modulation method, and the constellation.

<Example of GW Pattern for LDPC Code>

FIG. 60 is a diagram illustrating an example of the GW pattern for the LDPC code with the code length N of 69120 bits.

According to the GW pattern in FIG. 60, a sequence of bit groups 0 to 191 of the 69120-bit LDPC code is interleaved into a sequence of bit groups 12, 8, 132, 26, 3, 18, 19, 98, 37, 190, 123, 81, 95, 167, 76, 66, 27, 46, 105, 28, 29, 170, 20, 96, 35, 177, 24, 86, 114, 63, 52, 80, 119, 153, 121, 107, 97, 129, 57, 38, 15, 91, 122, 14, 104, 175, 150, 1, 124, 72, 90, 32, 161, 78, 44, 73, 134, 162, 5, 11, 179, 93, 6, 152, 180, 68, 36, 103, 160, 100, 138, 146, 9, 82, 187, 147, 7, 87, 17, 102, 69, 110, 130, 42, 16, 71, 2, 169, 58, 33, 136, 106, 140, 84, 79, 143, 156, 139, 55, 116, 4, 21, 144, 64, 70, 158, 48, 118, 184, 50, 181, 120, 174, 133, 115, 53, 127, 74, 25, 49, 88, 22, 89, 34, 126, 61, 94, 172, 131, 39, 99, 183, 163, 111, 155, 51, 191, 31, 128, 149, 56, 85, 109, 10, 151, 188, 40, 83, 41, 47, 178, 186, 43, 54, 164, 13, 142, 117, 92, 113, 182, 168, 165, 101, 171, 159, 60, 166, 77, 30, 67, 23, 0, 65, 141, 185, 112, 145, 135, 108, 176, 45, 148, 137, 125, 62, 75, 189, 59, 173, 154, 157.

<Configuration Example of Reception Device 12>

Figure 61:
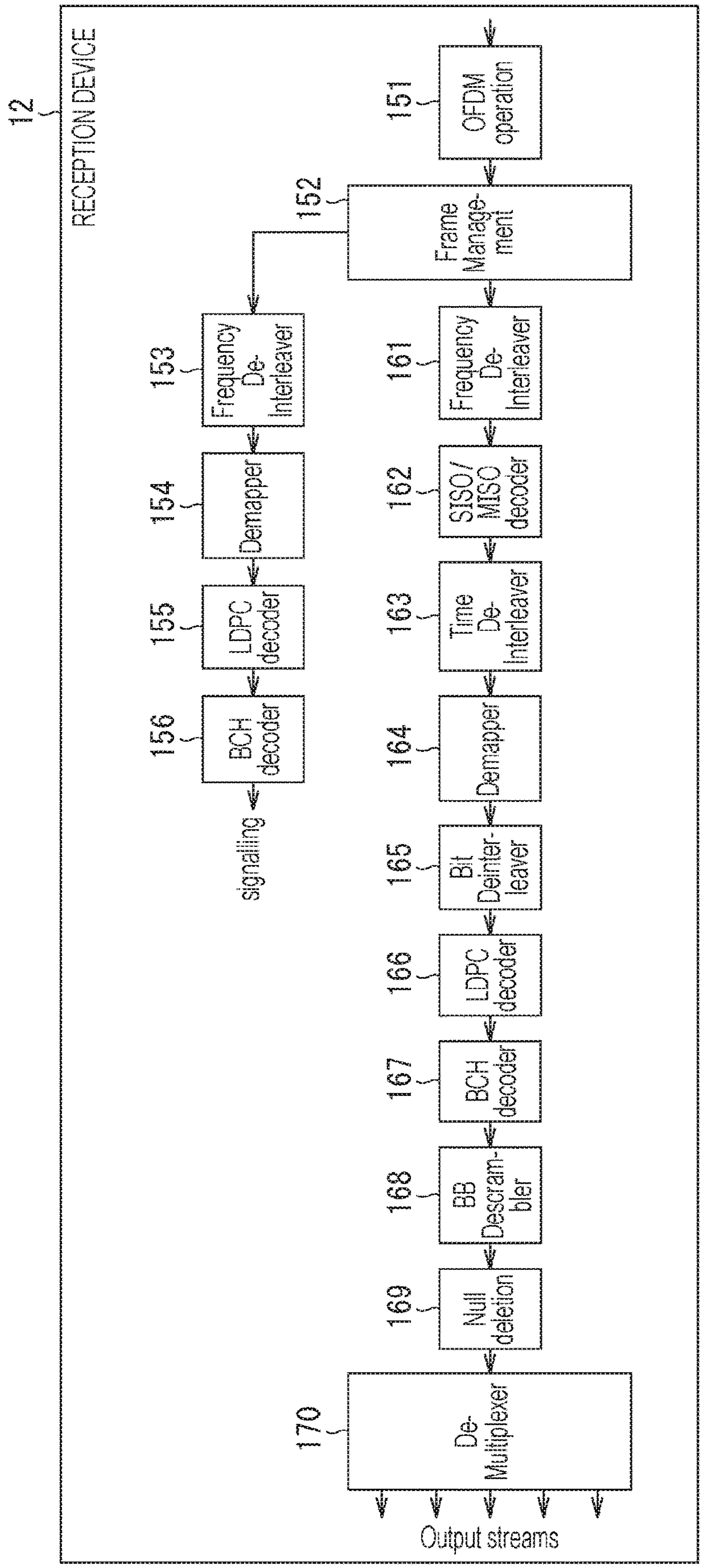
FIG. 61 is a block diagram illustrating a configuration example of a reception device 12.

FIG. 61 is a block diagram illustrating a configuration example of the reception device 12 in FIG. 7.

An OFDM processing unit (OFDM operation) 151 receives an OFDM signal from the transmission device 11 (FIG. 7) and performs signal processing for the OFDM signal. Data obtained by performing the signal processing by the OFDM processing unit 151 is supplied to a frame management unit 152.

The frame management unit 152 processes (interprets) a frame configured by the data supplied from the OFDM processing unit 151, and supplies a signal of resulting target data and a signal of control data to frequency deinterleavers 161 and 153, respectively.

The frequency deinterleaver 153 performs frequency deinterleaving for the data from the frame management unit 152 in units of symbols, and supplies the data to a demapper 154.

The demapper 154 performs demapping (signal point arrangement decoding) and quadrature demodulation for the data (data on the constellation) from the frequency deinterleaver 153 on the basis of arrangement (constellation) of the signal points determined by the quadrature modulation performed on the transmission device 11 side, and supplies resulting data ((likelihood) of the LDPC code) to an LDPC decoder 155.

The LDPC decoder 155 performs LDPC decoding for the LDPC code from the demapper 154, and supplies resulting LDPC target data (here, BCH code) to a BCH decoder 156.

The BCH decoder 156 performs BCH decoding for the LDPC target data from the LDPC decoder 155, and outputs resulting control data (signaling).

Meanwhile, the frequency deinterleaver 161 performs frequency deinterleaving in units of symbols for the data from the frame management unit 152, and supplies the data to an SISO/MISO decoder 162.

The SISO/MISO decoder 162 performs space-time decoding of the data from the frequency deinterleaver 161 and supplies the data to a time deinterleaver 163.

The time deinterleaver 163 deinterleaves the data from the SISO/MISO decoder 162 in units of symbols and supplies the data to a demapper 164.

The demapper 164 performs demapping (signal point arrangement decoding) and quadrature demodulation for the data (data on the constellation) from the time deinterleaver 163 on the basis of arrangement (constellation) of the signal points determined by the quadrature modulation performed on the transmission device 11 side, and supplies resulting data to a bit deinterleaver 165.

The bit deinterleaver 165 performs bit deinterleaving for the data from the demapper 164, and supplies (likelihood of) the LDPC code that is data after the bit deinterleaving to the LDPC decoder 166.

The LDPC decoder 166 performs LDPC decoding for the LDPC code from the bit deinterleaver 165, and supplies resulting LDPC target data (here, the BCH code) to a BCH decoder 167.

The BCH decoder 167 performs BCH decoding for the LDPC target data from the LDPC decoder 155, and supplies resulting data to a BB descrambler 168.

The BB descrambler 168 applies BB descrambling to the data from the BCH decoder 167, and supplies resulting data to a null deletion unit 169.

The null deletion unit 169 deletes the null inserted by the padder 112 in FIG. 8 from the data from the BB descrambler 168, and supplies the data to the demultiplexer 170.

The demultiplexer 170 demultiplexes each of one or more streams (target data) multiplexed into the data from the null deletion unit 169, applies necessary processing, and outputs a result as an output stream.

Note that the reception device 12 can be configured without including a part of the blocks illustrated in FIG. 61. In other words, in a case where the transmission device 11 (FIG. 8) is configured without including the time interleaver 118, the SISO/MISO encoder 119, the frequency interleaver 120, and the frequency interleaver 124, for example, the reception device 12 can be configured without including the time deinterleaver 163, the SISO/MISO decoder 162, the frequency deinterleaver 161, and the frequency deinterleaver 153 that are blocks respectively corresponding to the time interleaver 118, the SISO/MISO encoder 119, the frequency interleaver 120, and the frequency interleaver 124 of the transmission device 11.

<Configuration Example of Bit DeInterleaver 165>

Figure 62:
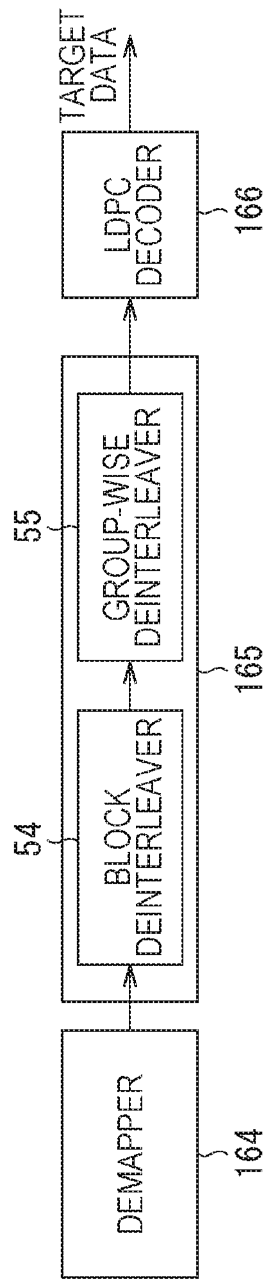
FIG. 62 is a block diagram illustrating a configuration example of a bit deinterleaver 165.

FIG. 62 is a block diagram illustrating a configuration example of the bit deinterleaver 165 in FIG. 61.

The bit deinterleaver 165 is configured by a block deinterleaver 54 and a group-wise deinterleaver 55, and performs (bit) deinterleaving of the symbol bit of the symbol that is the data from the demapper 164 (FIG. 61).

In other words, the block deinterleaver 54 performs, for the symbol bit of the symbol from demapper 164, block deinterleaving corresponding to the block interleaving performed by the block interleaver 25 in FIG. 9 (processing reverse to the block interleaving), in other words, block deinterleaving of returning the positions of (the likelihood of) the code bits of the LDPC code rearranged by the block interleaving to the original positions, and supplies a resulting LDPC code to the group-wise deinterleaver 55.

The group-wise deinterleaver 55 performs, for example, for the LDPC code from the block deinterleaver 54, group-wise deinterleaving corresponding to the group-wise interleaving performed by the group-wise interleaver 24 in FIG. 9 (processing reverse to the group-wise interleaving), in other words, group-wise deinterleaving of rearranging, in units of bit groups, the code bits of the LDPC code changed in arrangement in units of bit groups by the group-wise interleaving described in FIG. 59 to restore the original arrangement.

Here, in a case where the parity interleaving, the group-wise interleaving, and the block interleaving have been applied to the LDPC code to be supplied from the demapper 164 to the bit deinterleaver 165, the bit deinterleaver 165 can perform all of parity deinterleaving corresponding to the parity interleaving (processing reverse to the parity interleaving, in other words, parity deinterleaving of returning the code bits of the LDPC code changed in arrangement by the parity interleaving to the original arrangement), the block deinterleaving corresponding to the block interleaving, and the group-wise deinterleaving corresponding to the group-wise interleaving.

Note that the bit deinterleaver 165 in FIG. 62 is provided with the block deinterleaver 54 for performing the block deinterleaving corresponding to the block interleaving, and the group-wise deinterleaver 55 for performing the group-wise deinterleaving corresponding to the group-wise interleaving, but the bit deinterleaver 165 is not provided with a block for performing the parity deinterleaving corresponding to the parity interleaving and does not perform the parity deinterleaving.

Therefore, the LDPC code for which the block deinterleaving and the group-wise deinterleaving are performed and the parity deinterleaving is not performed is supplied from the (group-wise deinterleaver 55) of the bit deinterleaver 165 to the LDPC decoder 166.

The LDPC decoder 166 performs LDPC decoding for the LDPC code from the bit deinterleaver 165, using a transformed parity check matrix obtained by performing at least column permutation corresponding to the parity interleaving for the parity check matrix H by the type B method used for the LDPC coding by the LDPC encoder 115 in FIG. 8, or a transformed parity check matrix (FIG. 29) obtained by performing row permutation for the parity check matrix (FIG. 27) by the type A method, and outputs resulting data as a decoding result of the LDPC target data.

Figure 63:
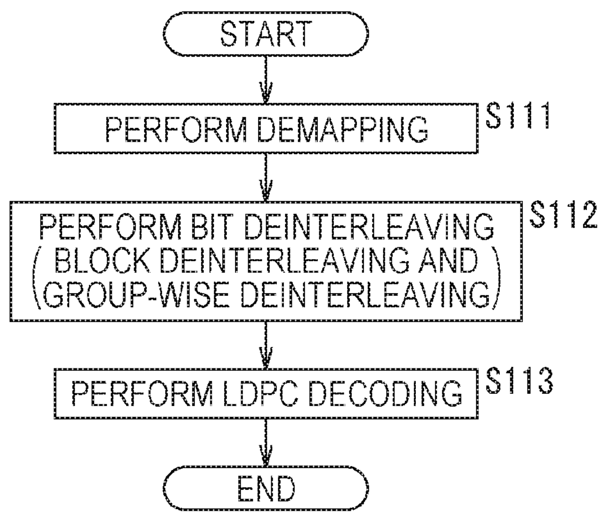
FIG. 63 is a flowchart for describing an example of processing performed by a demapper 164, a bit deinterleaver 165, and an LDPC decoder 166.

FIG. 63 is a flowchart for describing processing performed by the demapper 164, the bit deinterleaver 165, and the LDPC decoder 166 in FIG. 62.

In step S111, the demapper 164 performs demapping and quadrature demodulation for the data (the data on the constellation mapped to the signal points) from the time deinterleaver 163 and supplies the data to the bit deinterleaver 165. The processing proceeds to step S112.

In step S112, the bit deinterleaver 165 performs deinterleaving (bit deinterleaving) for the data from the demapper 164. The process proceeds to step S113.

In other words, in step S112, in the bit deinterleaver 165, the block deinterleaver 54 performs block deinterleaving for the data (symbol) from the demapper 164, and supplies code bits of the resulting LDPC code to the group-wise deinterleaver 55.

The group-wise deinterleaver 55 performs group-wise deinterleaving for the LDPC code from the block deinterleaver 54, and supplies (the likelihood) of the resulting LDPC code to the LDPC decoder 166.

In step S113, the LDPC decoder 166 performs LDPC decoding for the LDPC code from the group-wise deinterleaver 55 using the parity check matrix H used for the LDPC coding by the LDPC encoder 115 in FIG. 8, in other words, the transformed parity check matrix obtained from the parity check matrix H, for example, and supplies resulting data as a decoding result of the LDPC target data to the BCH decoder 167.

Note that, even in FIG. 62, the block deinterleaver 54 for performing the block deinterleaving and the group-wise deinterleaver 55 for performing the group-wise deinterleaving are separately configured, as in the case in FIG. 9, for convenience of description. However, the block deinterleaver 54 and the group-wise deinterleaver 55 can be integrally configured.

Furthermore, in a case where the group-wise interleaving is not performed in the transmission device 11, the reception device 12 can be configured without including the group-wise deinterleaver 55 for performing the group-wise deinterleaving.

<LDPC Decoding>

The LDPC decoding performed by the LDPC decoder 166 in FIG. 61 will be further described.

The LDPC decoder 166 in FIG. 61 performs the LDPC decoding for the LDPC code from the group-wise deinterleaver 55, for which the block deinterleaving and the group-wise deinterleaving have been performed and the parity deinterleaving has not been performed, using the transformed parity check matrix obtained by performing at least column permutation corresponding to the parity interleaving for the parity check matrix H by the type B method used for the LDPC coding by the LDPC encoder 115 in FIG. 8, or the transformed parity check matrix (FIG. 29) obtained by performing row permutation for the parity check matrix (FIG. 27) by the type A method.

Here, LDPC decoding for enabling suppression of a circuit scale and suppression of an operation frequency within a sufficiently feasible range by being performed using a transformed parity check matrix has been previously proposed (for example, see U.S. Pat. No. 4,224,777).

Therefore, first, the LDPC decoding using a transformed parity check matrix, which has been previously proposed, will be described with reference to FIGS. 64 to 67.

Figure 64:
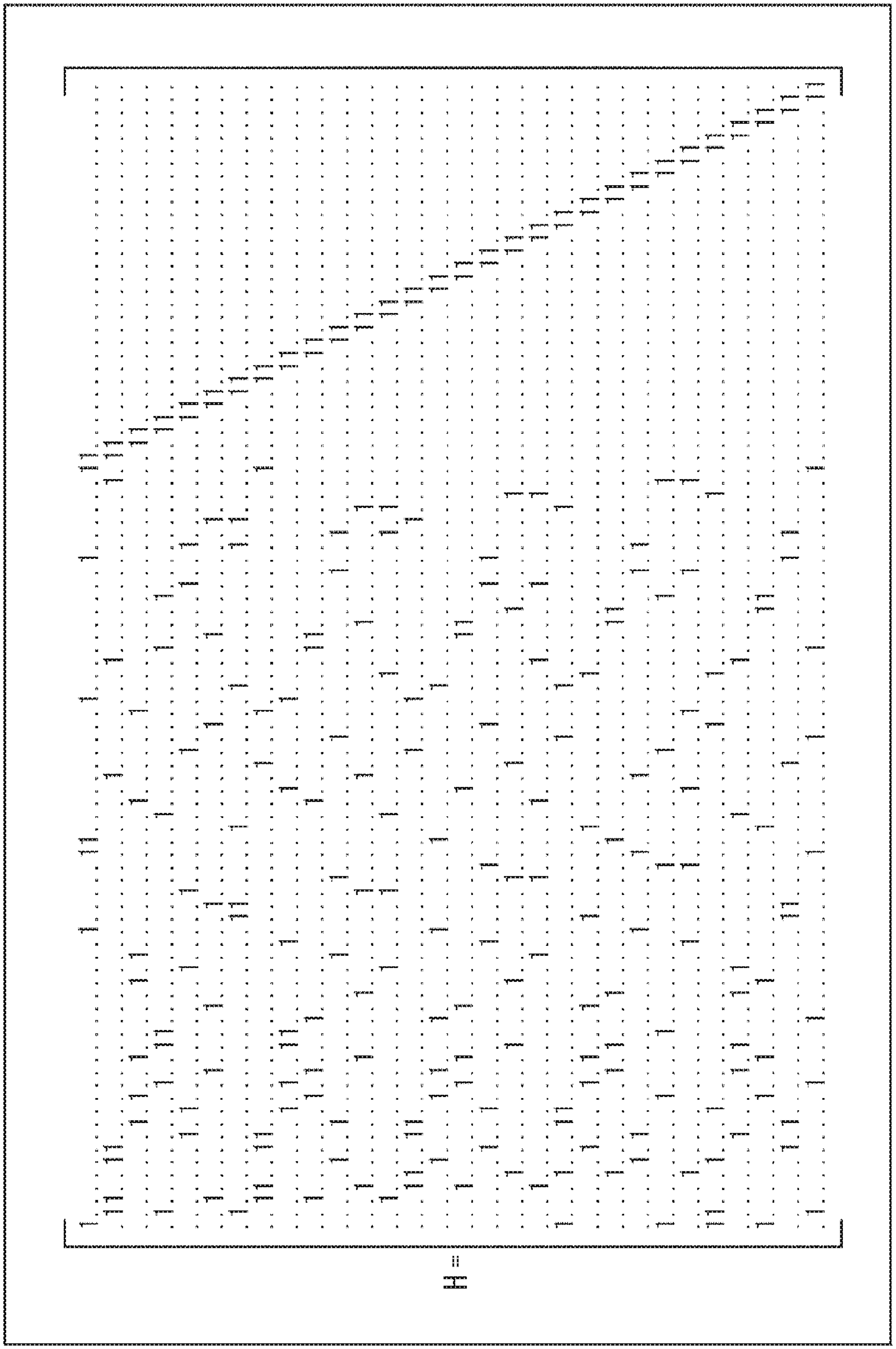
FIG. 64 is a diagram illustrating an example of a parity check matrix of an LDPC code.

FIG. 64 is a diagram illustrating an example of the parity check matrix H of the LDPC code with the code length N of 90 and the coding rate of 2/3.

Note that, in FIG. 64 (similarly performed in FIGS. 65 and 66 described below), 0 is expressed by a period (.).

In the parity check matrix H in FIG. 64, the parity matrix has a step structure.

Figure 65:
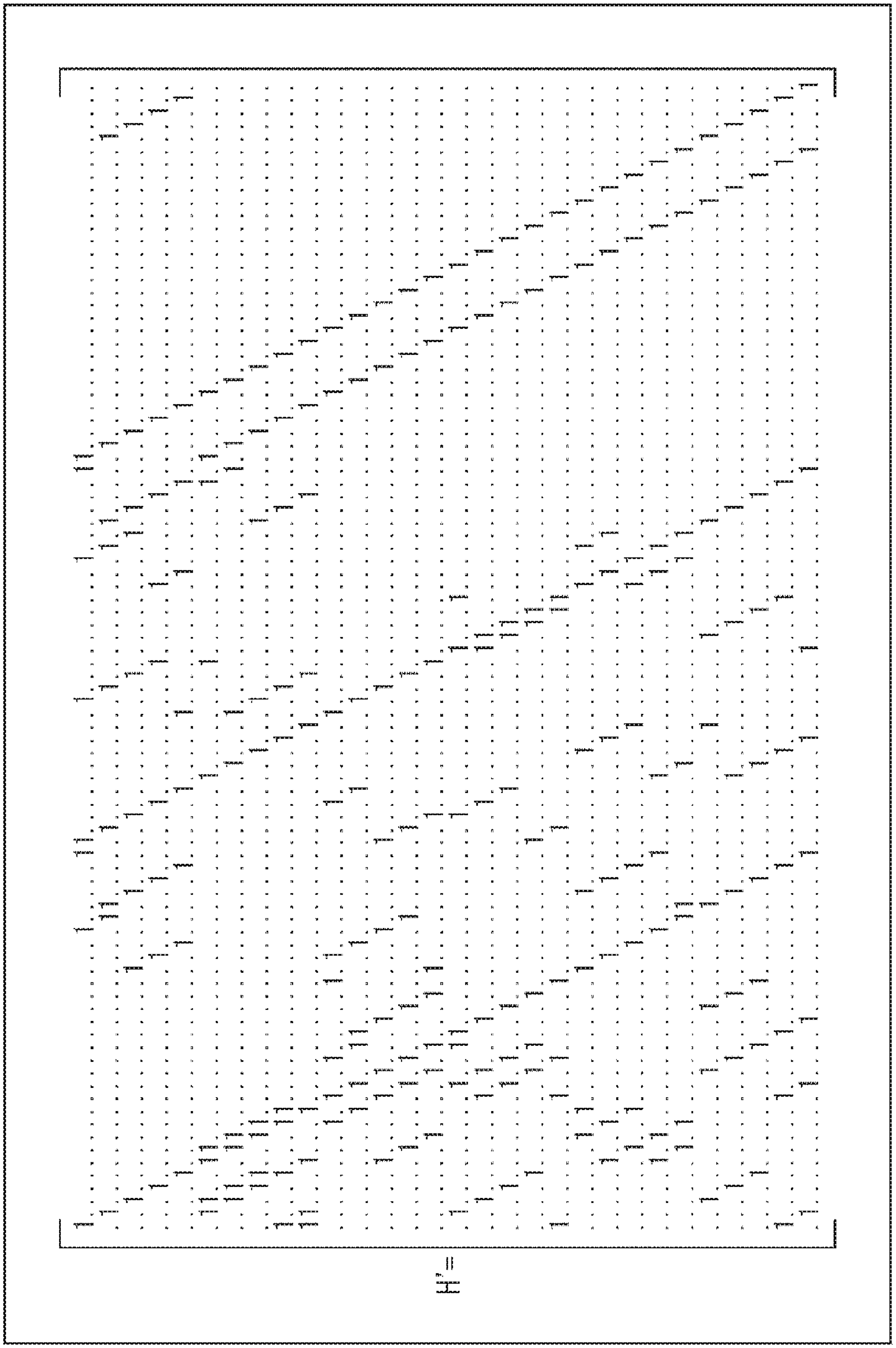
FIG. 65 is a diagram illustrating an example of a matrix (transformed parity check matrix) obtained by applying row permutation and column permutation to a parity check matrix.

FIG. 65 is a diagram illustrating a parity check matrix H' obtained by applying row permutation of the expression (11) and column permutation of the expression (12) to the parity check matrix H in FIG. 64

$$\text{Row permutation: } (6s+t+1)\text{th row} \rightarrow (5t+s+1)\text{th row} \quad (11)$$

$$\text{Column permutation: } (6x+y+61)\text{th column} \rightarrow (5y+x+61)\text{th column} \quad (12)$$

Note that, in the expressions (11) and (12), s, t, x and y are integers in ranges of $0 \le s < 5$, $0 \le t < 6$, $0 \le x < 5$, and $0 \le t < 6$, respectively.

According to the row permutation of the expression (11), permutation is performed in such a manner that the 1, 7, 13, 19, 19 and 25th rows where the remainder becomes 1 when being divided by 6 are respectively permutated to the 1, 2, 3, 4, and 5th rows, and the 2, 8, 14, 20, and 26th rows where the remainder becomes 2 when being divided by 6 are respectively permutated to the 6, 7, 8, 9, and 10th rows.

Furthermore, according to the column permutation of the expression (12), permutation is performed for the 61st and subsequent columns (parity matrix) in such a manner that the 61, 67, 73, 79, and 85th columns where the remainder becomes 1 when being divided by 6 are respectively permutated to the 61, 62, 63, 64, and 65, and the 62, 68, 74, 80, and 86th columns where the remainder becomes 2 when being divided by 6 are respectively permutated to the 66, 67, 68, 69, and 70th columns.

A matrix obtained by performing the row and column permutation for the parity check matrix H in FIG. 64 is the parity check matrix H' in FIG. 65.

Here, the row permutation of the parity check matrix H does not affect the arrangement of the code bits of the LDPC code.

Furthermore, the column permutation of the expression (12) corresponds to parity interleaving with the information length K of 60, the parallel factor P of 5, and the divisor q (=M/P) of the parity length M (30 here) of 6, of the parity interleaving of interleaving the position of the (K+Py+x+1)th code bit with the (K+qx+y+1)th code bit.

Therefore, the parity check matrix H' in FIG. 65 is a transformed parity check matrix obtained by performing at least the column permutation of permutating the (K+qx+y+1)th column to the (K+Py+x+1)th column, of the parity check matrix (hereinafter referred to as original parity check matrix as appropriate) H in FIG. 64.

When multiplying the transformed parity check matrix H' in FIG. 65 by a resultant obtained by performing the same permutation as the expression (12) for the LDPC code of the original parity check matrix H in FIG. 64, a 0 vector is output. In other words, assuming that a row vector obtained by applying the column permutation of the expression (12) to the row vector c as the LDPC code (one codeword) of the original parity check matrix H is represented by c', $H'c'^T$ naturally becomes a 0 vector because $Hc^T$ becomes a 0 vector from the nature of the parity check matrix.

From the above, the transformed parity check matrix H' in FIG. 65 is a parity check matrix of the LDPC code c' obtained by performing the column permutation of the expression (12) for the LDPC code c of the original parity check matrix H.

Therefore, a similar decoding result to the case of decoding the LDPC code of the original parity check matrix H using the parity check matrix H can be obtained by performing the column permutation of the expression (12) for the LDPC code c of the original parity check matrix H, decoding (LDPC decoding) the LDPC code c' after the column permutation using the transformed parity check matrix H' in FIG. 65, and applying reverse permutation to the column permutation of the expression (12) to the decoding result.

Figure 66:
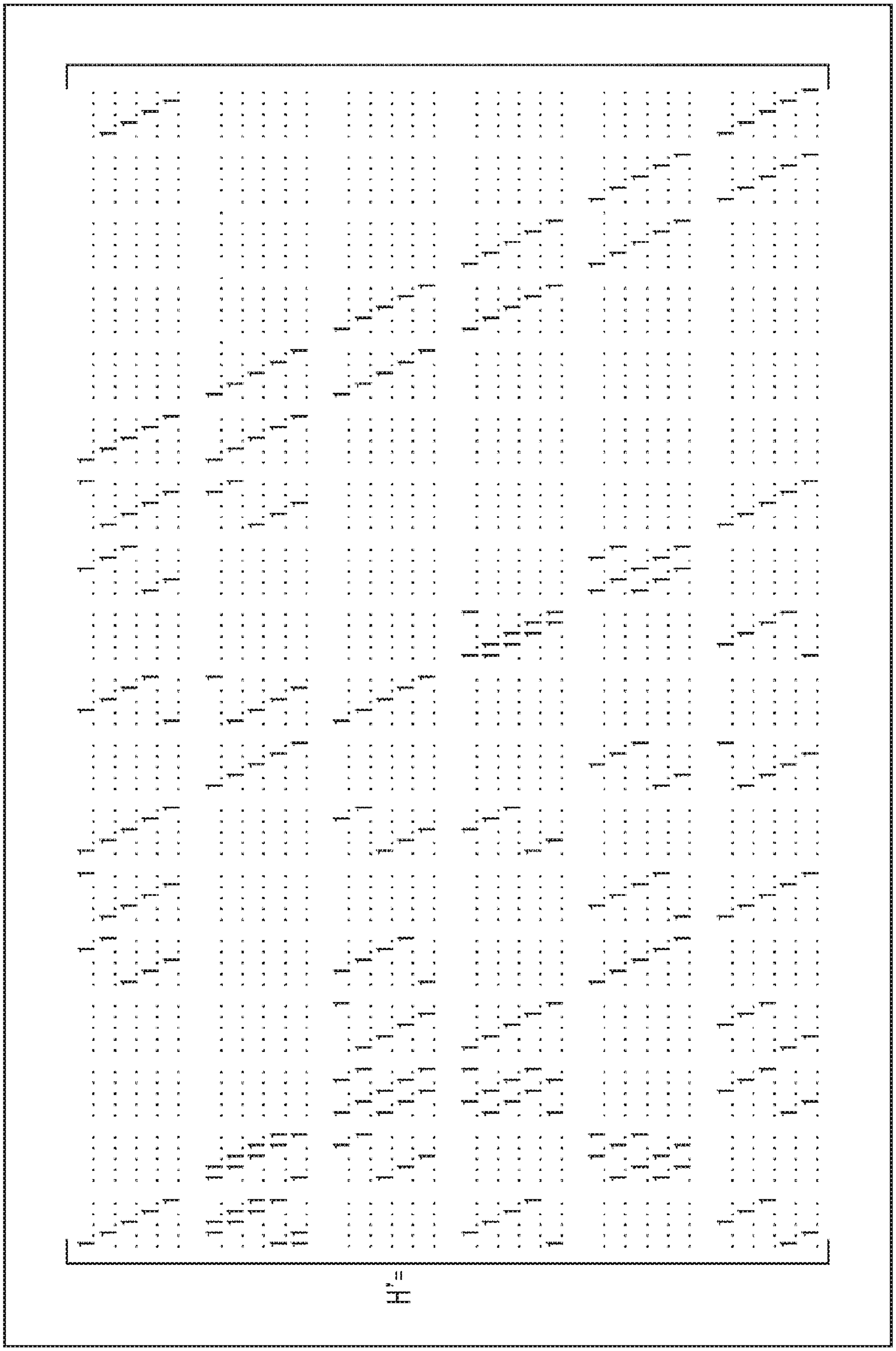
FIG. 66 is a diagram illustrating an example of a transformed parity check matrix divided into 5×5 units.

FIG. 66 is a diagram illustrating the transformed parity check matrix H' in FIG. 65, which is separated in units of 5×5 (5 rows by 5 columns) matrix.

In FIG. 66, the transformed parity check matrix H' is represented by a combination of an identity matrix of 5×5 (=P×P) as the parallel factor P, a matrix where one or more of is in the identity matrix become 0 (hereinafter, the matrix is referred to as quasi identify matrix), a matrix obtained by cyclically shifting the identity matrix or the quasi identify matrix (hereinafter the matrix is referred to as shift matrix as appropriate), and a sum of two or more of the identity matrix, the quasi identify matrix, and the shift matrix (hereinafter, the matrix is referred to as sum matrix as appropriate), and a 5×5 zero matrix.

It can be said that the transformed parity check matrix H' in FIG. 66 is configured by the 5×5 identity matrix, the quasi identity matrix, the shift matrix, the sum matrix, and the 0 matrix. Therefore, these 5×5 matrices (the identity matrix, the quasi identity matrix, the shift matrix, the sum matrix, and the 0 matrix) constituting the transformed parity check matrix H' are hereinafter referred to as configuration matrices as appropriate.

For decoding of an LDPC code of a parity check matrix represented by a P×P configuration matrix, an architecture that simultaneously performs P check node operations and variable node operations can be used.

Figure 67:
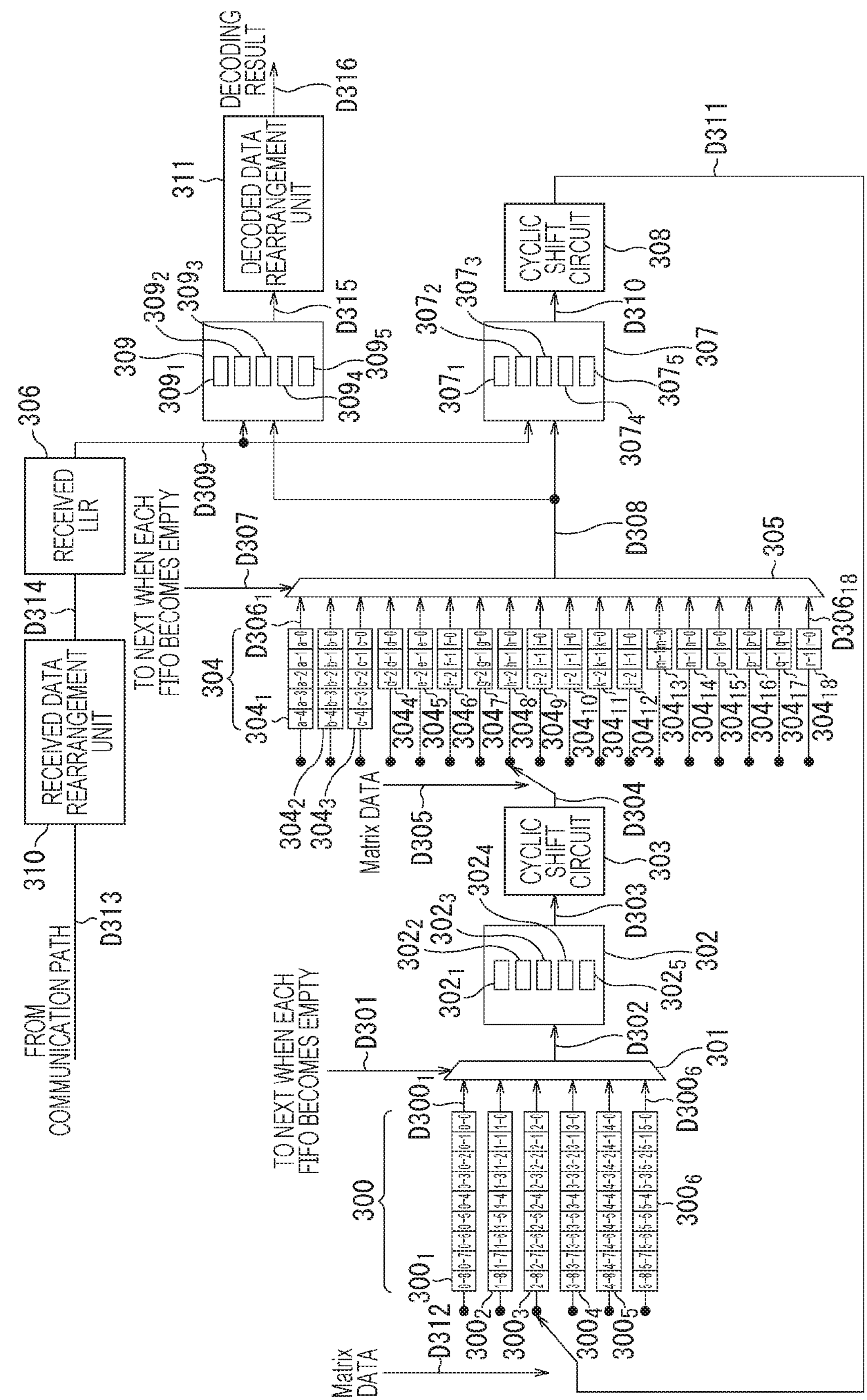
FIG. 67 is a block diagram illustrating a configuration example of a decoding device that collectively performs P node operations.

FIG. 67 is a block diagram illustrating a configuration example of a decoding device that performs such decoding.

In other words, FIG. 67 illustrates a configuration example of a decoding device that decodes the LDPC code using the transformed parity check matrix H' in FIG. 66 obtained by performing at least the column permutation of the expression (12) for the original parity check matrix H in FIG. 64.

The decoding device in FIG. 67 includes an edge data storage memory 300 including six FIFO $\mathbf{300}_1$ to $\mathbf{300}_6$, a selector 301 for selecting the FIFO $\mathbf{300}_1$ to $\mathbf{300}_6$, a check node calculation unit 302, two cyclic shift circuits 303 and 308, an edge data storage memory 304 including eighteen FIFO $\mathbf{304}_1$ to $\mathbf{304}_{18}$, a selector 305 for selecting the FIFO $\mathbf{304}_1$ to $\mathbf{304}_{18}$, a received data memory 306 for storing received data, a variable node calculation unit 307, a decoded word calculation unit 309, a received data rearrangement unit 310, and a decoded data rearrangement unit 311.

First, a method of storing data in the edge data storage memories 300 and 304 will be described.

The edge data storage memory 300 is configured by the six FIFO $\mathbf{300}_1$ to $\mathbf{300}_6$, the six corresponding to a number obtained by dividing the number of rows of 30 of the transformed parity check matrix H' in FIG. 66 by the number of rows (parallel factor P) of 5 of the configuration matrix. The FIFO $\mathbf{300}_y$ (y=1, 2, . . . , 6) includes storage regions of a plurality of stages, and messages corresponding to five edges, the five corresponding to the number of rows and the number of columns (parallel factor P) of the configuration matrix, can be read and write at the same time with respect to the storage regions of the respective stages. Furthermore, the number of stages of the storage regions of the FIFO $\mathbf{300}_y$ is nine that is the maximum value of the number of is (Hamming weights) in the row direction of the transformed parity check matrix in FIG. 66.

In the FIFO $\mathbf{300}_1$, data (message vi from the variable node) corresponding to the positions of 1 of the 1st to 5th rows of the transformed parity check matrix H' in FIG. 66 (a message $v_i$ from the variable node is stored close to each other (ignoring 0) for each row in the cross direction. In other words, data corresponding to the positions of 1 of the 5×5 identity matrix of from (1, 1) to (5, 5) of the transformed parity check matrix H' is stored in the storage region of the first stage of the FIFO $\mathbf{300}_1$, where the j-th row i-th column is represented by (j, i). Data corresponding to the positions of 1 of the shift matrix of from (1, 21) to (5, 25) of the transformed parity check matrix H' (the shift matrix obtained by cyclically shifting the 5×5 identity matrix by only 3 in the right direction) is stored in the storage region of the second stage. Data is stored in association with the transformed parity check matrix H', similarly in the storage regions of the third to eighth stages. Then, data corresponding to the positions of 1 of the shift matrix of from (1, 86) to (5, 90) of the transformed parity check matrix H' (the shift matrix obtained by permutating 1 in the 1st row of the 5×5 identity matrix to 0 and cyclically shifting the identity matrix by only 1 in the left direction) is stored in the storage region of the ninth stage.

Data corresponding to the positions of 1 of from the 6th to 10th rows of the transformed parity check matrix H' in FIG. 66 is stored in the FIFO $\mathbf{300}_2$. In other words, data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the first stage of the FIFO $\mathbf{300}_2$. Furthermore, data corresponding to the positions of 1 of the second shift matrix constituting the sum matrix of from (6, 1) to (10, 5) of the transformed parity check matrix H' is stored in the storage region of the second stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix is stored in the same address (the same FIFO of FIFOs $\mathbf{300}_1$ to $\mathbf{300}_6$).

Hereinafter, data is stored in association with the transformed parity check matrix H', similarly in the storage regions of the third to ninth stages.

Data are similarly stored in the FIFO $\mathbf{300}_3$ to $\mathbf{300}_6$ in association with the transformed parity check matrix H'.

The edge data storage memory 304 is configured by the eighteen FIFO $\mathbf{304}_1$ to $\mathbf{304}_{18}$, the eighteen corresponding to a number obtained by dividing the number of columns of 90 of the transformed parity check matrix H' by the number of columns (parallel factor P) of 5 of the configuration matrix. The FIFO $\mathbf{304}_x$ (x=1, 2, . . . , 18) includes storage regions of a plurality of stages, and messages corresponding to five edges, the five corresponding to the number of rows and the number of columns (parallel factor P) of the configuration matrix, can be read and written at the same time with respect to the storage regions of the respective stages.

In the FIFO $\mathbf{304}_1$, data (message $u_j$ from the check node) corresponding to the positions of 1 of the 1st to 5th columns of the transformed parity check matrix H' in FIG. 66 are stored close to each other (ignoring 0) for each column in the vertical direction. In other words, data corresponding to the positions of 1 of the 5×5 identity matrix of from (1, 1) to (5, 5) of the transformed parity check matrix H' is stored in the storage region of the first stage of the FIFO $\mathbf{304}_1$. Data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the second stage. Furthermore, data corresponding to the positions of 1 of the second shift matrix constituting the sum matrix of from (6, 1) to (10, 5) of the transformed parity check matrix H' is stored in the storage region of the third stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix is stored in the same address (the same FIFO of FIFOs $\mathbf{304}_1$ to $\mathbf{304}_{18}$).

Hereinafter, data is stored in association with the transformed parity check matrix H', similarly in the storage regions of the fourth and fifth stages. The number of stages of the storage regions of the FIFO $\mathbf{304}_1$ is five that is the maximum value of the number of is (Hamming weights) in the row direction in the 1st to 5th columns of the transformed parity check matrix H'.

Data is similarly stored in the FIFOs $\mathbf{304}_2$ and $\mathbf{304}_3$ in association with the transformed parity check matrix H', and respective lengths (stages) are five. Data is similarly stored in the FIFOs $\mathbf{304}_4$ to $\mathbf{304}_{12}$ in association with the transformed parity check matrix H', and respective lengths are three. Data is similarly stored in the FIFOs $\mathbf{304}_{13}$ and $\mathbf{304}_{18}$ in association with the transformed parity check matrix H', and respective lengths are two.

Next, the operation of the decoding device in FIG. 67 will be described.

The edge data storage memory 300 includes six FIFOs $\mathbf{300}_1$ to $\mathbf{300}_6$, and selects FIFO to store data from among the six FIFOs $\mathbf{300}_1$ to $\mathbf{300}_6$ according to information (matrix data) D312 indicating which row of the transformed parity check matrix H' in FIG. 66 five messages D311 supplied from the previous cyclic shift circuit 308 belong to, and collectively stores the five messages D311 to the selected FIFO in order. Furthermore, in reading data, the edge data storage memory 300 sequentially reads the five messages D$\mathbf{300}_1$ from the FIFO $\mathbf{300}_1$ and supplies the read messages to the next selector 301. The edge data storage memory 300 sequentially reads the messages from the FIFOs $\mathbf{300}_2$ to $\mathbf{300}_6$ after completion of the reading of the message from the FIFO $\mathbf{300}_1$, and supplies the messages to the selector 301.

The selector 301 selects the five messages from the FIFO currently being read out, of the FIFOs $\mathbf{300}_1$ to $\mathbf{300}_6$, according to a select signal D301, and supplies the messages as message D302 to the check node calculation unit 302.

The check node calculation unit 302 includes five check node calculators $\mathbf{302}_1$ to $\mathbf{302}_5$, and performs the check node operation according to the expression (7), using the messages D302 (D$\mathbf{302}_1$ to D$\mathbf{302}_5$) (the messages $v_i$ of the expression (7)) supplied through the selector 301, and supplies five messages D303 (D$\mathbf{303}_1$ to D$\mathbf{303}_5$) obtained as a result of the check node operation (messages $u_j$ of the expression (7)) to the cyclic shift circuit 303.

The cyclic shift circuit 303 cyclically shifts the five messages D$\mathbf{303}_1$ to D$\mathbf{303}_5$ obtained by the check node calculation unit 302, on the basis of information (matrix data) D305 indicating how many identity matrices (or quasi identify matrices), which are the basis of the transformed parity check matrix H', have been cyclically shifted for the corresponding edge, and supplies a result as a message D304 to the edge data storage memory 304.

The edge data storage memory 304 includes eighteen FIFOs $\mathbf{304}_1$ to $\mathbf{304}_{18}$, and selects FIFO to store data from among the FIFOs $\mathbf{304}_1$ to $\mathbf{304}_{18}$ according to information (matrix data) D305 indicating which row of the transformed parity check matrix H' five messages D304 supplied from the previous cyclic shift circuit 303 belong to, and collectively stores the five messages D304 to the selected FIFO in order. Furthermore, in reading data, the edge data storage memory 304 sequentially reads five messages D$\mathbf{306}_1$ from the FIFO $\mathbf{304}_1$ and supplies the read messages to the next selector 305. The edge data storage memory 304 sequentially reads the messages from the FIFOs $\mathbf{304}_2$ to $\mathbf{304}_{18}$ after completion of the reading of the message from the FIFO $\mathbf{304}_1$, and supplies the messages to the selector 305.

The selector 305 selects the five messages from the FIFO currently being read out, of the FIFOs $\mathbf{304}_1$ to $\mathbf{304}_{18}$, according to a select signal D307, and supplies the messages as message D308 to the variable node calculation unit 307 and the decoded word calculation unit 309.

Meanwhile, the received data rearrangement unit 310 rearranges an LDPC code D313 corresponding to the parity check matrix H in FIG. 64, which has been received via the communication path 13, by performing the column permutation of the expression (12), and supplies data as received data D314 to the received data memory 306. The received data memory 306 calculates and stored received LLR (log likelihood ratio) from the received data D314 supplied from the received data rearrangement unit 310, and groups five received LLRs and collectively supplies the five received LLRs as a received value D309 to the variable node calculation unit 307 and the decoded word calculation unit 309.

The variable node calculation unit 307 includes five variable node calculators $\mathbf{307}_1$ to $\mathbf{307}_5$, and performs the variable node operation according to the expression (1), using the messages D308 (D$\mathbf{308}_1$ to D$\mathbf{308}_5$) (messages $u_j$ of the expression (1)) supplied via the selector 305, and the five received values D309 (received values $u_{0i}$ of the expression (1)) supplied from the received data memory 306, and supplies messages D310 (D$\mathbf{310}_1$ to D$\mathbf{310}_5$) (messages $v_i$ of the expression (1)) obtained as a result of the operation to the cyclic shift circuit 308.

The cyclic shift circuit 308 cyclically shifts the messages D$\mathbf{310}_1$ to D$\mathbf{310}_5$ calculated by the variable node calculation unit 307 on the basis of information indicating how many identity matrices (or quasi identify matrices), which are the basis of the transformed parity check matrix H', have been cyclically shifted for the corresponding edge, and supplies a result as a message D311 to the edge data storage memory 300.

By one round of the above operation, one decoding (variable node operation and check node operation) of the LDPC code can be performed. After decoding the LDPC code a predetermined number of times, the decoding device in FIG. 67 obtains and outputs a final decoding result in the decoded word calculation unit 309 and the decoded data rearrangement unit 311.

In other words, the decoded word calculation unit 309 includes five decoded word calculators $309_1$ to $309_5$, and calculates, as a final stage of the plurality of times of decoding, the decoding result (decoded word) on the basis of the expression (5), using the five messages D308 (D$308_1$ to D$308_5$) (messages $u_j$ of the expression (5)) output by the selector 305, and the five received values D309 (received values $u_{0i}$ of the expression (5)) supplied from the received data memory 306, and supplies resulting decoded data D315 to the decoded data rearrangement unit 311.

The decoded data rearrangement unit 311 rearranges the decoded data D315 supplied from the decoded word calculation unit 309 by performing reverse permutation to the column permutation of the expression (12), and outputs a final decoding result D316.

As described above, by applying at least one or both of the row permutation and the column permutation to the parity check matrix (original parity check matrix) to transform the parity check matrix into a parity check matrix (transformed parity check matrix) that can be represented by a combination of a P×P identity matrix, a quasi identity matrix in which one or more of is in the identity matrix are 0, a shift matrix obtained by cyclically shifting the identity matrix or the quasi identity, a sum matrix that is a sum of two or more of the identity matrix, the quasi identify matrix, and the shift matrix, and a P×P zero matrix, in other words, by a combination of the configuration matrices, an architecture to perform P check node operations and variable node operations at the same time for decoding of the LDPC code, the P being a number smaller than the number of rows and the number of columns of the parity check matrix, can be adopted. In the case of adopting the architecture to perform P node operations (check node operations and variable node operations) at the same time, the P being the number smaller than the number of rows and the number of columns of the parity check matrix, a large number of repetitive decodings can be performed while suppressing the operation frequency to the feasible range, as compared with a case of performing the number of node operations at the same time, the number being equal to the number of rows and the number of columns of the parity check matrix.

The LDPC decoder 166 constituting the reception device 12 in FIG. 61 performs the LDPC decoding by performing the P check node operations and variable node operations at the same time, for example, similarly to the decoding device in FIG. 67.

In other words, to simplify the description, assuming that the parity check matrix of the LDPC code output by the LDPC encoder 115 constituting the transmission device 11 in FIG. 8 is the parity check matrix H with the parity matrix having a step structure, as illustrated in FIG. 64, for example, the parity interleaver 23 of the transmission device 11 performs the parity interleaving of interleaving the position of the (K+Py+x+1)th code bit with (K+qx+y+1)th code bit with the setting of the information length K of 60, the parallel factor P of 5, the divisor q (=M/P) of the parity length M of 6.

Since this parity interleaving corresponds to the column permutation of the expression (12) as described above, the LDPC decoder 166 does not need to perform the column permutation of the expression (12).

Therefore, the reception device 12 in FIG. 61 performs similar processing to the decoding device in FIG. 67 except that the LDPC code for which the parity deinterleaving has not been performed, in other words, the LDPC code in the state where the column permutation by the expression (12) has been performed, is supplied from the group-wise deinterleaver 55 to the LDPC decoder 166, as described above, and the LDPC decoder 166 does not perform the column permutation of the expression (12).

Figure 68:
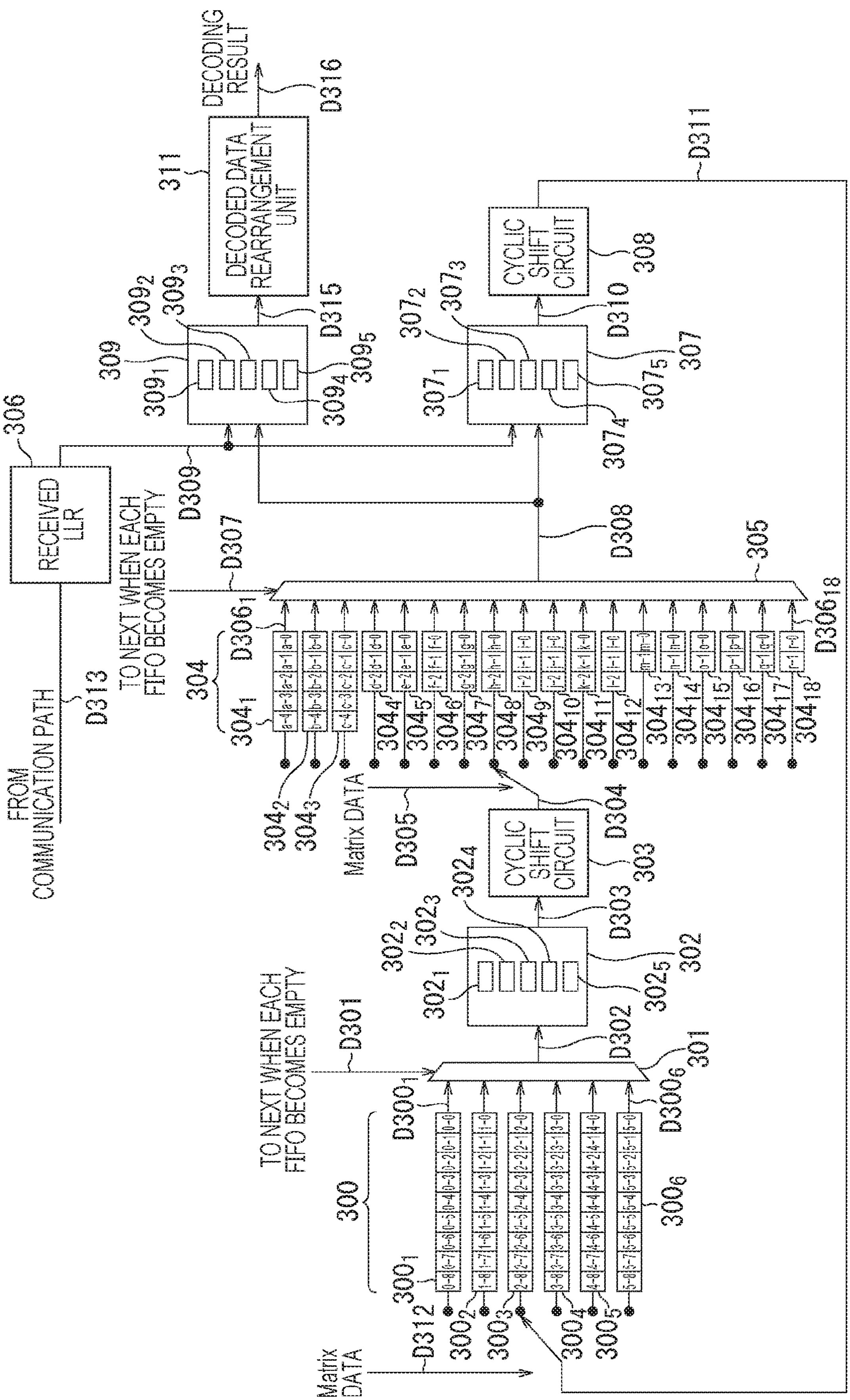
FIG. 68 is a block diagram illustrating a configuration example of the LDPC decoder 166.

In other words, FIG. 68 is a diagram illustrating a configuration example of the LDPC decoder 166 in FIG. 61.

In FIG. 68, the LDPC decoder 166 is similarly configured to the decoding device in FIG. 67 except that the received data rearrangement unit 310 in FIG. 67 is not provided, and performs similar processing to the decoding device in FIG. 67 except that the column permutation of the expression (12) is not performed. Therefore, description is omitted.

As described above, since the LDPC decoder 166 can be configured without including the received data rearrangement unit 310, the scale can be reduced as compared with the decoding device in FIG. 67.

Note that, in FIGS. 64 to 68, to simplify the description, the code length N of 90, the information length K of 60, the parallel factor (the numbers of rows and columns of the configuration matrix) P of 5, and the divisor q (=M/P) of the parity length M of 6 are set for the LDPC code. However, the code length N, the information length K, the parallel factor P, and the divisor q (=M/P) are not limited to the above-described values.

In other words, in the transmission device 11 in FIG. 8, what the LDPC encoder 115 outputs is the LDPC codes with the code lengths N of 64800, 16200, 69120, and the like, the information length K of N−Pq (=N−M), the parallel factor P of 360, and the divisor q of M/P. However, the LDPC decoder 166 in FIG. 68 can be applied to a case of performing the LDPC decoding by performing the P check node operations and variable node operations at the same time for such LDPC codes.

Furthermore, after the decoding of the LDPC code in the LDPC decoder 166, the parity part of the decoding result is unnecessary, and in a case of outputting only the information bits of the decoding result, the LDPC decoder 166 can be configured without the decoded data rearrangement unit 311.

<Configuration Example of Block Deinterleaver 54>

Figure 69:
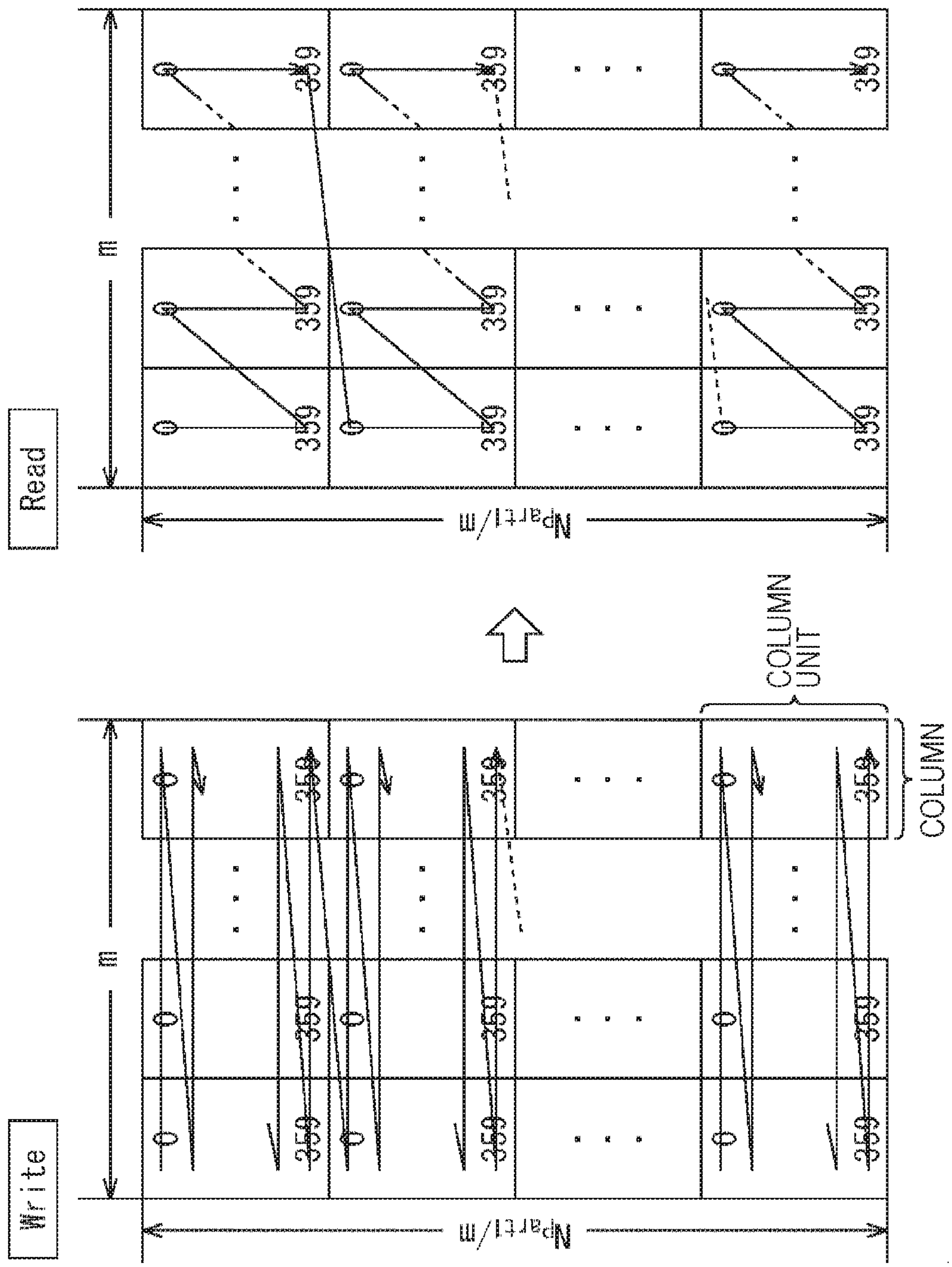
FIG. 69 is a diagram for describing block deinterleaving performed by a block deinterleaver 54.

FIG. 69 is a diagram for describing block deinterleaving performed by the block deinterleaver 54 in FIG. 62.

In the block deinterleaving, reverse processing to the block interleaving by the block interleaver 25 described in FIG. 57 is performed to return (restore) the arrangement of the code bits of the LDPC code to the original arrangement.

In other words, in the block deinterleaving, for example, as in the block interleaving, the LDPC code is written and read with respect to m columns, the m being equal to the bit length m of the symbol, whereby the arrangement of the code bits of the LDPC code is returned to the original arrangement.

Note that, in the block deinterleaving, writing of the LDPC code is performed in the order of reading the LDPC code in the block interleaving. Moreover, in the block deinterleaving, reading of the LDPC code is performed in the order of writing the LDPC code in the block interleaving.

In other words, in regard to part 1 of the LDPC code, part 1 of the LDPC code in units of m-bit symbol is written in the row direction from the 1st row of all the m columns, as illustrated in FIG. 69. In other words, the code bit of the LDPC code, which is the m-bit symbol, is written in the row direction.

Writing of part 1 in units of m bits is sequentially performed toward lower rows of the m columns, and when the writing of part 1 is completed, as illustrated in FIG. 69, reading of part 1 downward from the top of the first column unit of the column is performed in the columns from the left to right direction.

When the reading to the rightmost column is completed, the reading returns to the leftmost column, and reading downward from the top of the second column unit of the column is performed in the columns from the left to right direction, as illustrated in FIG. 69. Hereinafter, reading of part 1 of the LDPC code of one codeword is similarly performed.

When the reading of part 1 of the LDPC code of one codeword is completed, in regard to part 2 in units of m-bit symbols, the units of m-bit symbols are sequentially concatenated after part 1, whereby the LDPC code in units of symbols is returned to the arrangement of code bits of the LDPC code (the LDCP code before block interleaving) of the original one codeword.

<Another Configuration Example of Bit Deinterleaver 165>

Figure 70:
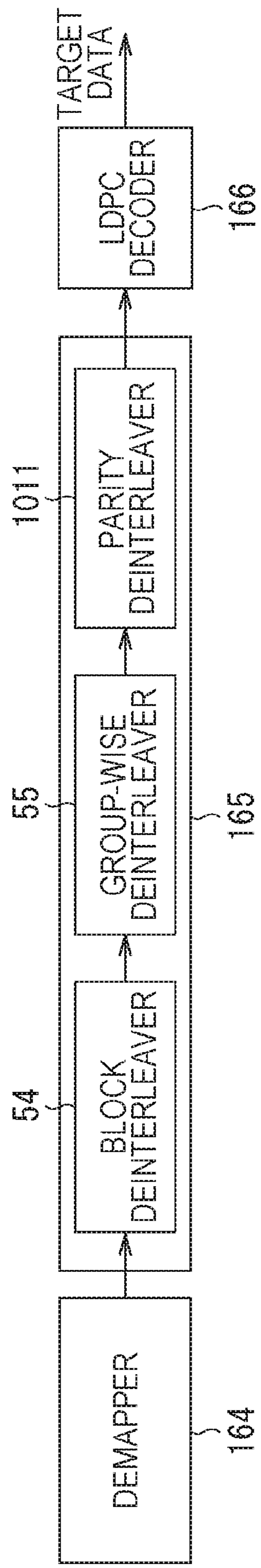
FIG. 70 is a block diagram illustrating another configuration example of the bit deinterleaver 165.

FIG. 70 is a block diagram illustrating another configuration example of the bit deinterleaver 165 in FIG. 61.

Note that, in FIG. 70, parts corresponding to those in FIG. 62 are given the same reference numerals, and hereinafter, description thereof will be omitted as appropriate.

In other words, the bit deinterleaver 165 in FIG. 70 is similarly configured to the case in FIG. 62 except that a parity deinterleaver 1011 is newly provided.

In FIG. 70, the bit deinterleaver 165 includes the block deinterleaver 54, the group-wise deinterleaver 55, and the parity deinterleaver 1011, and performs bit deinterleaving for the code bits of the LDPC code from the demapper 164.

In other words, the block deinterleaver 54 performs, for the LDPC code from demapper 164, block deinterleaving corresponding to the block interleaving performed by the block interleaver 25 of the transmission device 11 (processing reverse to the block interleaving), in other words, block deinterleaving of returning the positions of the code bits rearranged by the block interleaving to the original positions, and supplies a resulting LDPC code to the group-wise deinterleaver 55.

The group-wise deinterleaver 55 performs, for the LDPC code from the block deinterleaver 54, group-wise deinterleaving corresponding to group-wise interleaving as rearrangement processing performed by the group-wise interleaver 24 of the transmission device 11.

The LDPC code obtained as a result of group-wise deinterleaving is supplied from the group-wise deinterleaver 55 to the parity deinterleaver 1011.

The parity deinterleaver 1011 performs, for the bit codes after the group-wise deinterleaving in the group-wise deinterleaver 55, parity deinterleaving corresponding to the parity interleaving performed by the parity interleaver 23 of the transmission device 11 (processing reverse to the parity interleaving), in other words, parity deinterleaving of returning the arrangement of the code bits of the LDPC code changed in arrangement by the parity interleaving to the original arrangement.

The LDPC code obtained as a result of the parity deinterleaving is supplied from the parity deinterleaver 1011 to the LDPC decoder 166.

Therefore, in the bit deinterleaver 165 in FIG. 70, the LDPC code for which the block deinterleaving, group-wise deinterleaving, and the parity deinterleaving have been performed, in other words, the LDPC code obtained by the LDPC coding according to the parity check matrix H, is supplied to the LDPC decoder 166.

The LDPC decoder 166 performs LDPC decoding for the LDPC code from the bit deinterleaver 165 using the parity check matrix H used for the LDPC coding by the LDPC encoder 115 of the transmission device 11.

In other words, in the type B method, the LDPC decoder 166 performs, for the LDPC code from the bit deinterleaver 165, the LDPC decoding using the parity check matrix H itself (of the type B method) used for the LDPC coding by the LDPC encoder 115 of the transmission device 11 or using the transformed parity check matrix obtained by performing at least column permutation corresponding to the parity interleaving for the parity check matrix H. Furthermore, in the type A method, the LDPC decoder 166 performs, for the LDPC code from the bit deinterleaver 165, the LDPC decoding using the parity check matrix (FIG. 28) obtained by applying column permutation to the parity check matrix (FIG. 27) (of the type A method) used for the LDPC coding by the LDPC encoder 115 of the transmission device 11 or using the transformed parity check matrix (FIG. 29) obtained by applying row permutation to the parity check matrix (FIG. 27) used for the LDPC coding.

Here, in FIG. 70, since the LDPC code obtained by LDPC coding according to the parity check matrix H is supplied from (the parity deinterleaver 1011 of) the bit deinterleaver 165 to the LDPC decoder 166, in a case of performing LDPC decoding of the LDPC code using the parity check matrix H itself by the type B method used for the LDPC coding by the LDPC encoder 115 of the transmission device 11 or using the parity check matrix (FIG. 28) obtained by applying column permutation to the parity check matrix (FIG. 27) by the type A method used for the LDPC coding, the LDPC decoder 166 can be configured as a decoding device for performing LDPC decoding by a full serial decoding method in which operations of messages (a check node message and a variable node message) are sequentially performed for one node at a time or a decoding device for performing LDPC decoding by a full parallel decoding method in which operations of messages are performed simultaneously (parallelly) for all nodes.

Furthermore, in the LDPC decoder 166, in a case of performing LDPC decoding of the LDPC code using the transformed parity check matrix obtained by applying at least column permutation corresponding to the parity interleaving to the parity check matrix H by the type B method used for the LDPC coding by the LDPC encoder 115 of the transmission device 11 or using the transformed parity check matrix (FIG. 29) obtained by applying row permutation to the parity check matrix (FIG. 27) by the type A method used for the LDPC coding, the LDPC decoder 166 can be configured as an architecture decoding device for simultaneously performing the check node operation and the variable node operation for P nodes (or divisors of P other than 1), the architecture decoding device being also a decoding device (FIG. 67) including the received data rearrangement unit 310 for rearranging the code bits of the LDPC code by applying column permutation similar to the column permutation (parity interleaving) for obtaining the transformed parity check matrix to the LDPC code.

Note that, in FIG. 70, for convenience of description, the block deinterleaver 54 for performing block deinterleaving, the group-wise deinterleaver 55 for performing group-wise deinterleaving, and the parity deinterleaver 1011 for performing parity deinterleaving are separately configured. However, two or more of the block deinterleaver 54, the group-wise deinterleaver 55, and the parity deinterleaver 1011 can be integrally configured similarly to the parity interleaver 23, the group-wise interleaver 24, and the block interleaver 25 of the transmission device 11.

<Configuration Example of Reception System>

Figure 71:
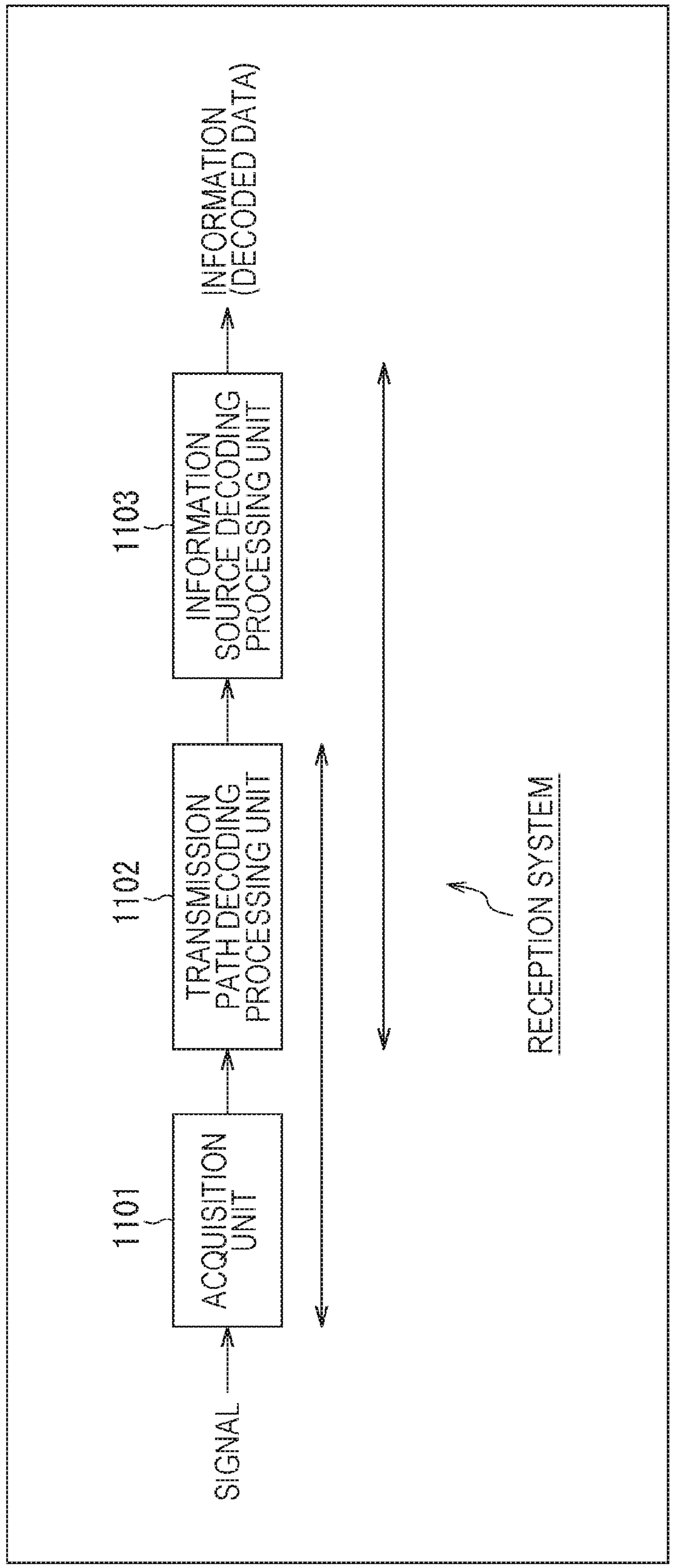
FIG. 71 is a block diagram illustrating a first configuration example of a reception system to which a reception device 12 is applicable.

FIG. 71 is a block diagram illustrating a first configuration example of the reception system to which the reception device 12 is applicable.

In FIG. 71, the reception system includes an acquisition unit 1101, a transmission path decoding processing unit 1102, and an information source decoding processing unit 1103.

The acquisition unit 1101 acquires a signal including the LDPC code obtained by performing at least the LDPC coding for the LDPC target data such as image data and audio data of a program or the like, via a transmission path (communication path, not illustrated) such as, for example, terrestrial digital broadcasting, satellite digital broadcasting, a cable television (CATV) network, the Internet, or another network, and supplies the signal to the transmission path decoding processing unit 1102.

Here, in a case where the signal acquired by the acquisition unit 1101 is broadcasted from, for example, a broadcasting station via terrestrial waves, satellite waves, cable television (CATV) networks, or the like, the acquisition unit 1101 is configured by a tuner, a set top box (STB), or the like. Furthermore, in a case where the signal acquired by the acquisition unit 1101 is transmitted from a web server by multicast like an internet protocol television (IPTV), for example, the acquisition unit 1101 is configured by, for example, a network interface (I/F) such as a network interface card (NIC).

The transmission path decoding processing unit 1102 corresponds to the reception device 12. The transmission path decoding processing unit 1102 applies transmission path decoding processing including at least processing of correcting an error occurring in the transmission path to the signal acquired by the acquisition unit 1101 via the transmission path, and supplies a resulting signal to the information source decoding processing unit 1103.

In other words, the signal acquired by the acquisition unit 1101 via the transmission path is a signal obtained by performing at least error correction coding for correcting an error occurring in the transmission path, and the transmission path decoding processing unit 1102 applies the transmission path decoding processing such as the error correction processing to such a signal, for example.

Here, examples of the error correction coding include LDPC coding and BCH coding. Here, at least the LDPC coding is performed as the error correction coding.

Furthermore, the transmission path decoding processing may include demodulation of a modulated signal, and the like.

The information source decoding processing unit 1103 applies information source decoding processing including at least processing of decompressing compressed information into original information to the signal to which the transmission path decoding processing has been applied.

In other words, compression encoding for compressing information is sometimes applied to the signal acquired by the acquisition unit 1101 via the transmission path in order to reduce the amount of data such as image and sound as the information. In that case, the information source decoding processing unit 1103 applies the information source decoding processing such as processing of decompressing the compressed information into the original information (decompression processing) to the signal to which the transmission path decoding processing has been applied.

Note that, in a case where the compression encoding has not been applied to the signal acquired by the acquisition unit 1101 via the transmission path, the information source decoding processing unit 1103 does not perform the processing of decompressing the compressed information into the original information.

Here, an example of the decompression processing includes MPEG decoding. Furthermore, the transmission path decoding processing may include descrambling in addition to the decompression processing.

In the reception system configured as described above, the acquisition unit 1101 acquires the signal obtained by applying the compression encoding such as MPEG coding to data such as image and sound, for example, and further applying the error correction coding such as the LDPC coding to the compressed data, via the transmission path, and supplies the acquired signal to the transmission path decoding processing unit 1102.

The transmission path decoding processing unit 1102 applies processing similar to the processing performed by the reception device 12 to the signal from the acquisition unit 1101 as the transmission path decoding processing, and supplies the resulting signal to the information source decoding processing unit 1103.

The information source decoding processing unit 1103 applies the information source decoding processing such as MPEG decoding to the signal from the transmission path decoding processing unit 1102, and outputs resulting image or sound.

The reception system in FIG. 71 as described above can be applied to, for example, a television tuner for receiving television broadcasting as digital broadcasting.

Note that the acquisition unit 1101, the transmission path decoding processing unit 1102, and the information source decoding processing unit 1103 can be configured as independent devices (hardware (integrated circuits (ICs)) or software modules), respectively.

Furthermore, the acquisition unit 1101, the transmission path decoding processing unit 1102, and the information source decoding processing unit 1103 can be configured as a set of the acquisition unit 1101 and the transmission path decoding processing unit 1102, a set of the transmission path decoding processing unit 1102 and the information source decoding processing unit 1103, or a set of the acquisition unit 1101, the transmission path decoding processing unit 1102, and the information source decoding processing unit 1103, as an independent device.

Figure 72:
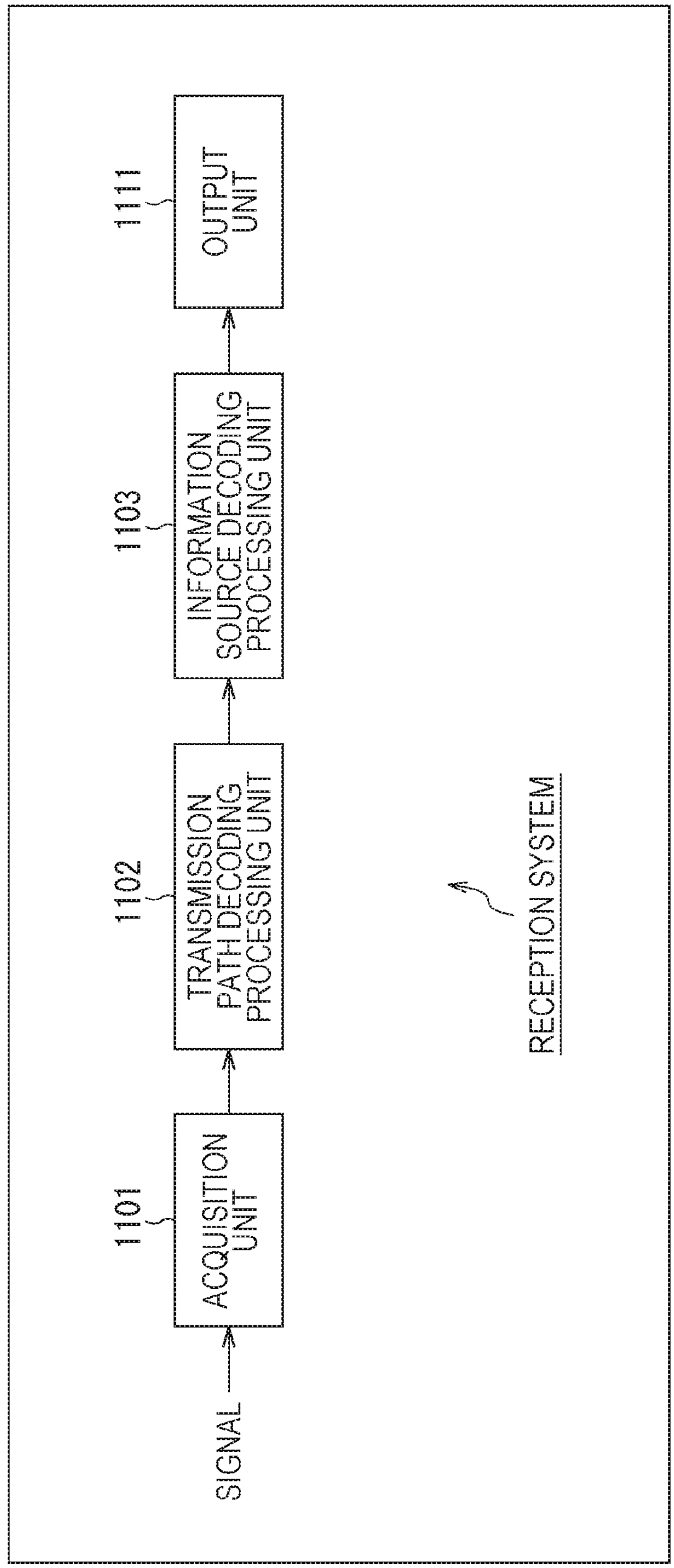
FIG. 72 is a block diagram illustrating a second configuration example of the reception system to which the reception device 12 is applicable.

FIG. 72 is a block diagram illustrating a second configuration example of the reception system to which the reception device 12 is applicable.

Note that, in FIG. 72, parts corresponding to those in FIG. 71 are given the same reference numerals, and hereinafter, description thereof will be omitted as appropriate.

The reception system in FIG. 72 is common to the case in FIG. 71 in including the acquisition unit 1101, the transmission path decoding processing unit 1102, and the information source decoding processing unit 1103 but is different from the case in FIG. 71 in newly including an output unit 1111.

The output unit 1111 is, for example, a display device for displaying an image or a speaker for outputting a sound, and outputs an image, a sound, or the like as a signal output from the information source decoding processing unit 1103. In other words, the output unit 1111 displays an image or outputs a sound.

The reception system in FIG. 72 as described above can be applied to, for example, a television (TV) receiver for receiving television broadcasting as the digital broadcasting, a radio receiver for receiving radio broadcasting, or the like.

Note that, in a case where the compression encoding has not been applied to the signal acquired by the acquisition unit 1101, the signal output by the transmission path decoding processing unit 1102 is supplied to the output unit 1111.

Figure 73:
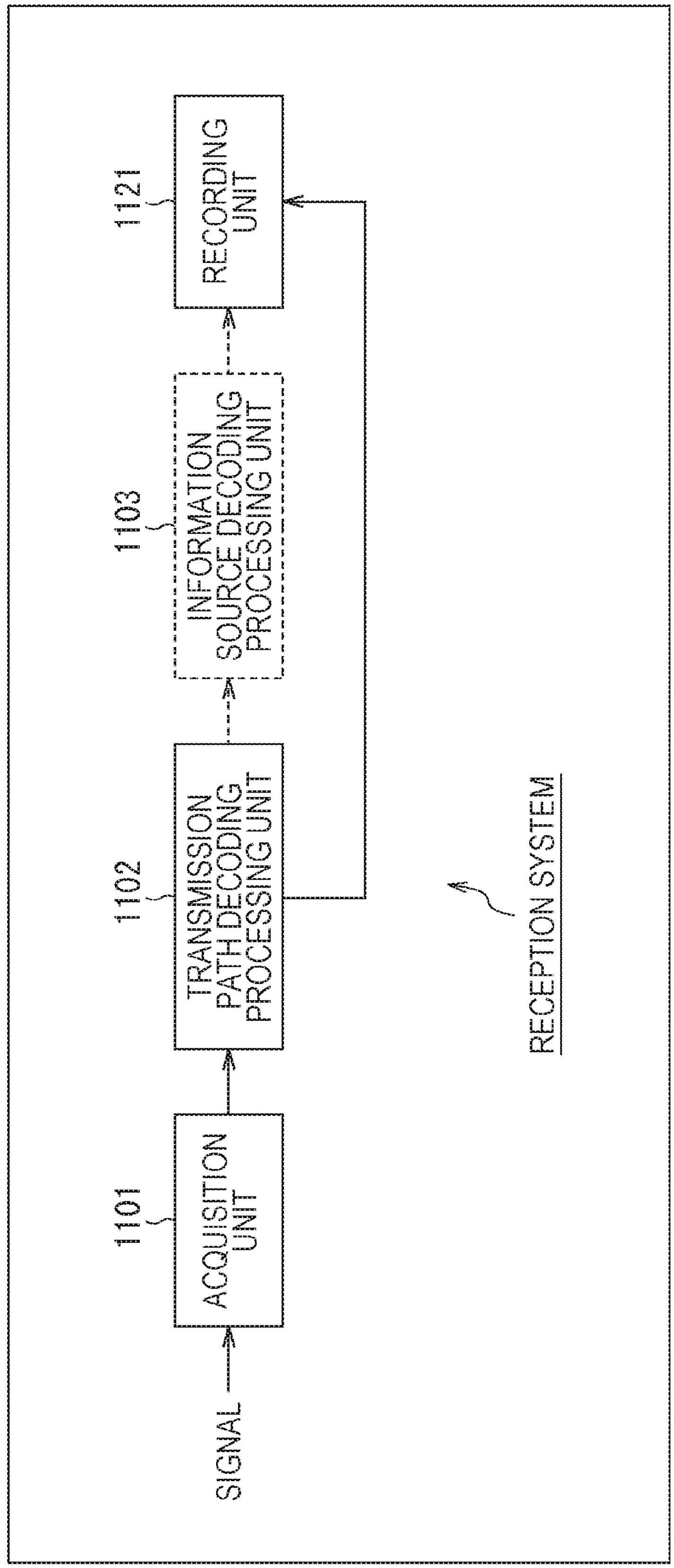
FIG. 73 is a block diagram illustrating a third configuration example of the reception system to which the reception device 12 is applicable.

FIG. 73 is a block diagram illustrating a third configuration example of the reception system to which the reception device 12 is applicable.

Note that, in FIG. 72, parts corresponding to those in FIG. 71 are given the same reference numerals, and hereinafter, description thereof will be omitted as appropriate.

The reception system in FIG. 73 is common to the case in FIG. 71 in including the acquisition unit 1101 and the transmission path decoding processing unit 1102.

However, the reception system in FIG. 73 is different from the case in FIG. 71 in not including the information source decoding processing unit 1103 and newly including a recording unit 1121.

The recording unit 1121 records (stores) the signal (for example, a TS packet of TS of MPEG) output by the transmission path decoding processing unit 1102 on a recording (storage) medium such as an optical disk, a hard disk (magnetic disk), or a flash memory.

The reception system in FIG. 73 as described above can be applied to a recorder for recording television broadcasting or the like.

Note that, in FIG. 73, the reception system includes the information source decoding processing unit 1103, and the information source decoding processing unit 1103 can record the signal to which the information source decoding processing has been applied, in other words, the image or sound obtained by decoding, in the recording unit 1121.

<Punctured LDPC Code>

Figure 74:
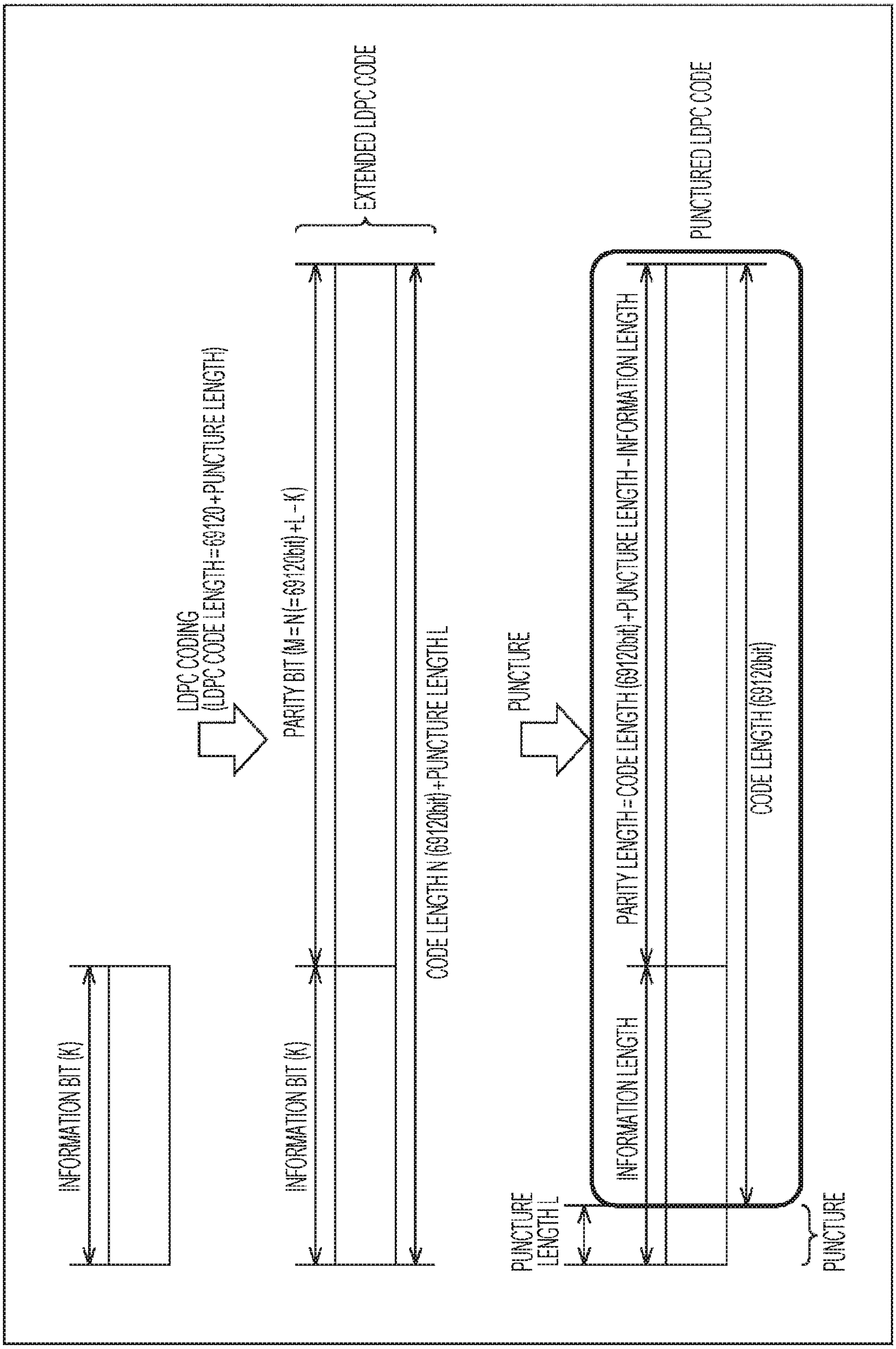
FIG. 74 is a diagram for describing a punctured LDPC code.

FIG. 74 is a diagram for describing a punctured LDPC code.

For the data transmission of the transmission system in FIG. 7, an LDPC code obtained by performing LDPC coding for information bits on the basis of the parity check matrix, or a punctured LDPC code obtained by puncturing (deleting) part of the bits of the LDPC code obtained by the LDPC coding can be used.

Hereinafter, the code length of the punctured LDPC code is represented by N, and for example, N=69120 (bits).

Furthermore, the information length of the information bits is represented by K, and the coding rate of the punctured LDPC code is represented by r. The coding rate r is expressed by the expression r=K/N.

In the punctured LDPC coding for coding the information bits of the information length K to the punctured LDPC code with the coding rate r, LDPC coding for the information bits with the information length K=N×r is performed on the basis of an extended parity check matrix having rows and columns each extended by a predetermined puncture length L with respect to a parity check matrix of an LDPC code with the code length N and the coding rate r, as illustrated in FIG. 74, so that an extended LDPC code having parity bits with a parity length M=N+L−K is generated.

Then, in the punctured LDPC coding, a head of the information bits of the extended LDPC code is punctured by the puncture length L, so that a punctured LDPC code with the code length N and the coding rate r is generated.

Since the code length of the extended LDPC code is (N+L) bits, and bits of the puncture length L are punctured from the (N+L) bits, an N-bit punctured LDPC code is obtained according to the puncturing of the (N+L)-bit extended LDPC code.

The punctured LDPC code includes only K-L bits, not K bits, as the information bits, but the information bits targeted for punctured LDPC coding are K bits, and the punctured LDPC code obtained by the punctured LDPC coding for the information bits has N bits. Therefore, the coding rate r of the punctured LDPC code becomes K/N.

Figure 75B:
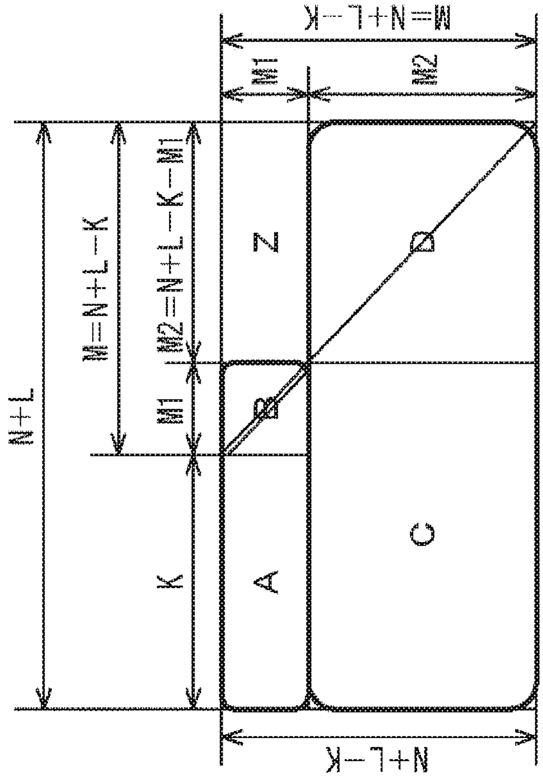
FIGS. 75A and 75B are diagrams a structure of an extended parity check matrix of a type A method for encoding K-bit information bits into an (N+L)-bit extended LDPC code.
Figure 75A:
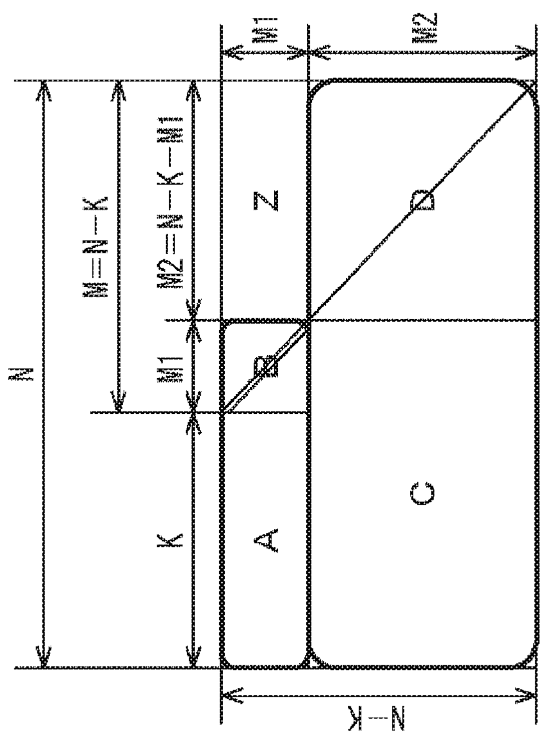

FIGS. 75A and 75B are diagrams for describing a structure of the extended parity check matrix by the type A method for encoding K-bit information bits into the (N+L)-bit extended LDPC code.

FIG. 75A illustrates a structure of a parity check matrix of a type A code with the code length N and the coding rate r (hereinafter the parity check matrix is also referred to as type A regular parity check matrix).

The structure of the type A regular parity check matrix is as described in FIG. 22.

In other words, the type A regular parity check matrix is an (N−K)-row N-column matrix including an A matrix, a B matrix, a C matrix, a D matrix, and a Z matrix.

Then, the A matrix is a matrix of M1 rows and K columns, the B matrix is a matrix of M1 rows and M1 columns, the C matrix is a matrix of N−K−M1 (=M2) rows and K+M1 columns, the D matrix is an identity matrix of N−K−M1 (=M2) rows and N−K−M1 (=M2) columns, and the Z matrix is a zero matrix of M1 rows and N−K−M1 (=M2) columns.

FIG. 75B illustrates a structure of an extended parity check matrix (hereinafter also referred to as type A extended parity check matrix) having rows and columns each extended by a predetermined puncture length L with respect to the type A regular parity check matrix in FIG. 75A.

The type A extended parity check matrix includes the A matrix, the B matrix, the C matrix, the D matrix, and the Z matrix, similarly to the type A regular parity check matrix.

Note that the type A extended parity check matrix is a matrix of N+L−K rows and N+L columns, having rows and columns each extended by the puncture length L, as compared with the type A regular parity check matrix.

Then, the A matrix is a matrix of M1 rows and K columns, the B matrix is a matrix of M1 rows and M1 columns, the C matrix is a matrix of N+L−K−M1 rows and K+M1 columns, the D matrix is an identity matrix of M2 (=N+L−K−M1) rows and M2 columns, and the Z matrix is a zero matrix of M1 rows and M2 (=N+L−K−M1) columns.

Here, the parity length M of the type A regular parity check matrix is expressed by an expression M=N−K, and the parity length M of the type A extended parity check matrix is expressed by an expression M=N+L−K. Therefore, the parity length M of the type A extended parity check matrix is longer by the puncture length L than the parity length M of the type A regular parity check matrix.

When the parity length M is expressed by an expression M=M1+M2, using the parameter M1, M2 of the type A regular parity check matrix is expressed by an expression M2=N−K−M1, and M2 of the type A extended parity check matrix is expressed by an expression M2=N+L−K−M1.

In the type A extended parity check matrix, one or both of M1 and M2 are larger than M1 and M2 of the type A regular parity check matrix.

Figure 76A:
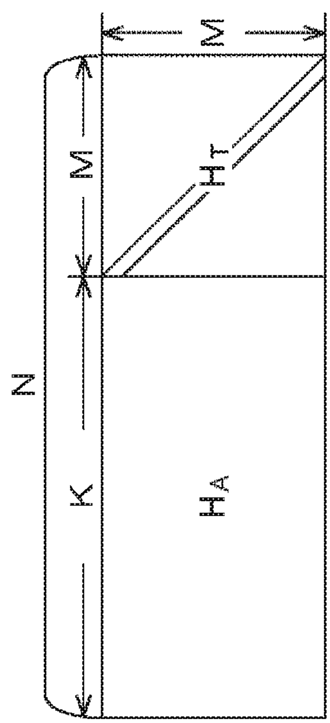
FIGS. 76A and 76B are diagrams for describing a structure of an extended parity check matrix of a type B method for encoding K-bit information bits into an (N+L)-bit extended LDPC code.
Figure 76B:
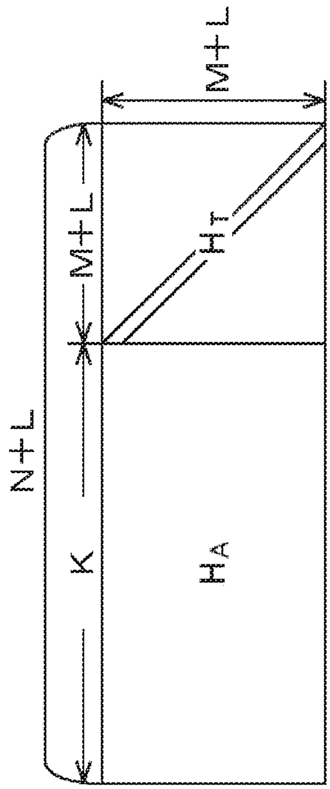

FIGS. 76A and 76B are diagrams for describing a structure of the extended parity check matrix by the type B method for encoding K-bit information bits into the (N+L)-bit extended LDPC code.

FIG. 76A illustrates a structure of a parity check matrix of a type B code with the code length N and the coding rate r (hereinafter the parity check matrix is also referred to as type B regular parity check matrix).

The structure of the type B regular parity check matrix is as described in FIG. 10.

In other words, the type B regular parity check matrix is a matrix of M (=N−K) rows and N columns in which an information matrix $H_A$ of a portion corresponding to the information bits and a parity matrix $H_T$ corresponding to parity bits are arranged side by side.

Then, the information matrix $H_A$ is a matrix of M rows and K (=N×r) columns, and the parity matrix $H_T$ is a matrix of M rows and M columns. Note that the parity matrix $H_T$ has a step structure as described in FIG. 11.

FIG. 76B illustrates a structure of an extended parity check matrix (hereinafter also referred to as type B extended parity check matrix) having rows and columns each extended by the predetermined puncture length L with respect to the type B regular parity check matrix in FIG. 76A.

The type B extended parity check matrix is a matrix in which the information matrix $H_A$ and the parity matrix $H_T$ are arranged side by side, similarly to the type B regular parity check matrix.

Note that the type B extended parity check matrix is a matrix of M+L rows and N+L columns, having rows and columns each extended by the puncture length L, as compared with the type B regular parity check matrix.

Then, the information matrix $H_A$ is a matrix of M+L rows and K columns, and the parity matrix $H_T$ is a matrix of M+L rows and M+L columns.

Therefore, the parity length M+L (=N+L−K) of the type B extended parity check matrix is longer by the puncture length L than the parity length M of the type B regular parity check matrix. As a result, in the type B extended parity check matrix, the number of rows of the information matrix $H_A$ is larger by the puncture length L than that in the type B regular parity check matrix, and the number of rows and columns of the parity matrix $H_T$ are larger by the puncture length L than those in the type B regular parity check matrix.

Figure 77:
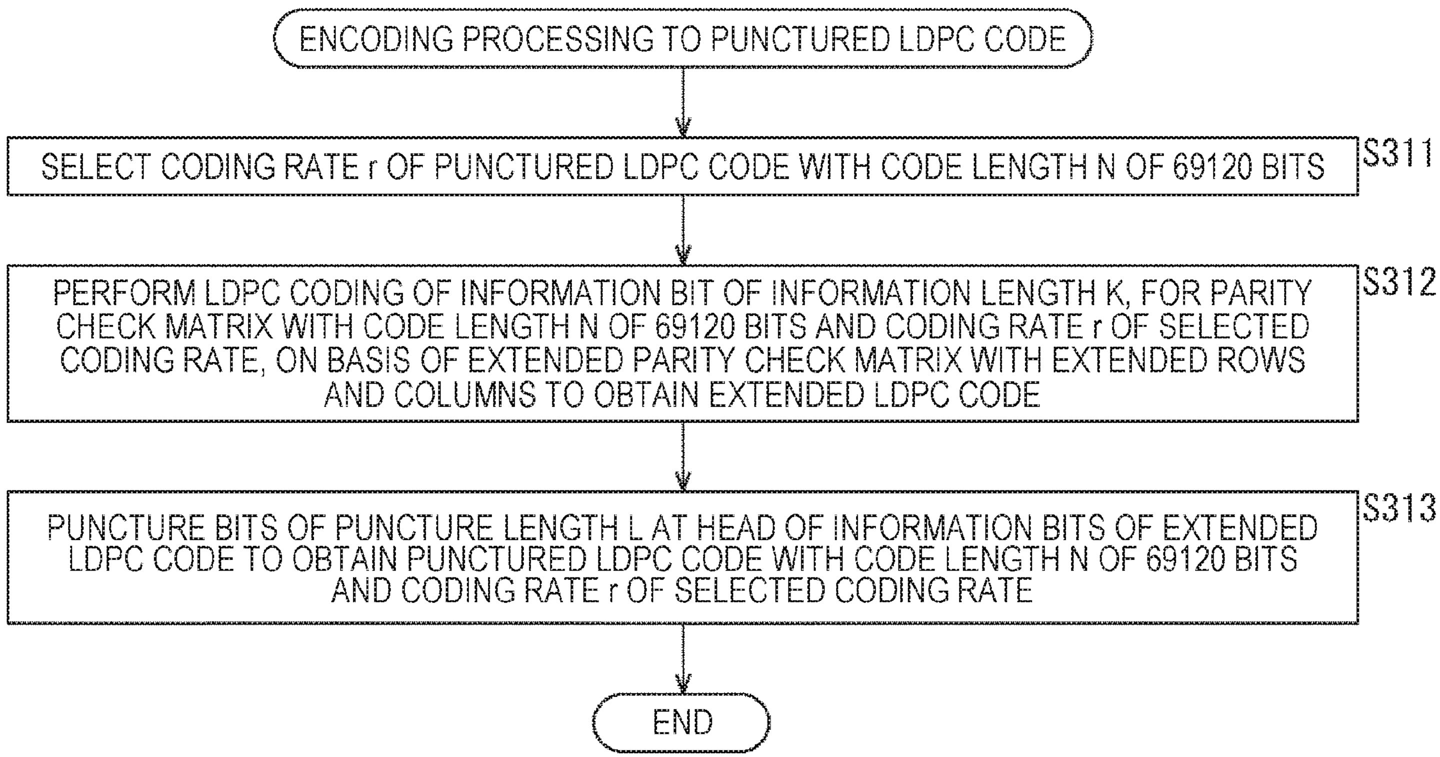
FIG. 77 is a flowchart for describing an example of processing (encoding processing) of the LDPC encoder 115 in a case where a punctured LDPC code with a code length N=69120 is used for data transmission.

FIG. 77 is a flowchart for describing an example of processing (encoding processing) of the LDPC encoder 115 (FIG. 8) in the case where the punctured LDPC code with the code length N=69120 is used for data transmission.

In step S311, the LDPC encoder 115 selects the coding rate r of the punctured LDPC code with the code length N=69120. For example, the LDPC encoder 115 selects, as a selected coding rate, a coding rate determined in advance, a coding rate specified by the operator of the transmission device 11, and the like.

In step S312, the LDPC encoder 115 performs the LDPC coding for the information bits of the information length K=N×r on the basis of the extended parity check matrix having rows and columns each extended by a predetermined puncture length L with respect to the parity check matrix with the code length N of 69120 bits and the coding rate r of the selected coding rate, thereby generating (obtaining) the extended LDPC code having the parity bits of the parity length M=N+L−K and the code length of N+L.

In step S313, the LDPC encoder 115 punctures the head of the information bits of the extended LDPC code by the puncture length L to generate (obtain) the punctured LDPC code with the code length N and the coding rate r, and supplies the punctured LDPC code to the subsequent bit interleaver 116 (FIG. 8).

Figure 78:
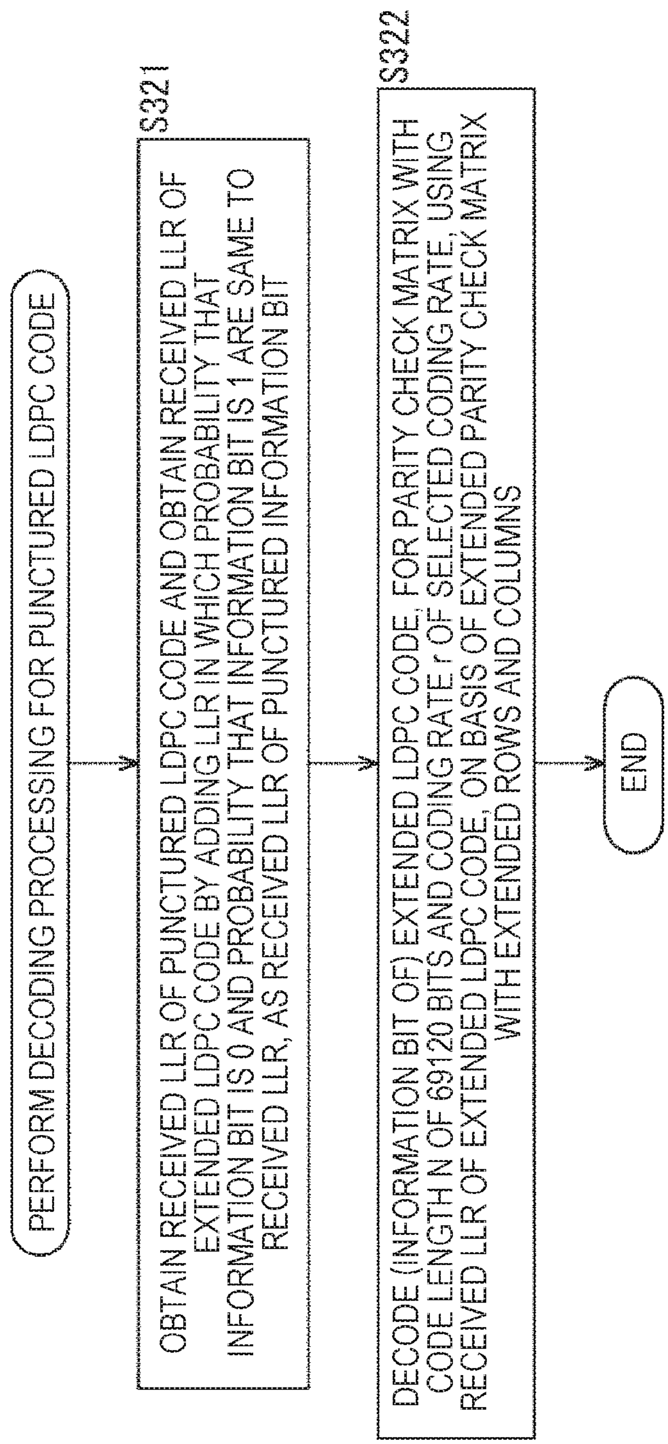
FIG. 78 is a flowchart for describing an example of processing (decoding processing) of the LDPC decoder 166 in a case where a punctured LDPC code with a code length N=69120 is used for data transmission.

FIG. 78 is a flowchart for describing an example of processing (decoding processing) of the LDPC decoder 166 (FIG. 61) in the case where the punctured LDPC code with the code length N=69120 is used for data transmission.

In step S321, the LDPC decoder 166 obtains the received LLR of the punctured LDPC code from the bit deinterleaver 165, and adds an LLR indicating that a probability of the information bits being 0 and a probability of the information bits being 1 are the same to the received LLR as received LLR of L bits of the head of the information bits punctured by the LDPC encoder 115, thereby obtaining the received LLR of the extended LDPC code.

In step S322, the LDPC decoder 166 decodes (the information bits of) the extended LDPC code using the received LLR of the extended LDPC code on the basis of the extended parity check matrix having rows and columns extended with respect to the parity check matrix of the code length N of 69120 bits and the coding rate r of the selected coding rate.

Here, as the extended LDPC code, for example, the type A code or the type B code corresponding to the parity check matrix H having a cyclic structure with the parallel factor P of 360 similar to DVB-T.2, ATSC3.0, or the like, can be adopted.

Moreover, as the extended LDPC code, for example, the LDPC code from which the punctured LDPC code can be obtained can be adopted, the punctured LDPC code having the code length N longer than 64 k bits of DVB-T.2 or ATSC3.0, in other words, the code length N of 69120 bits, and the coding rate r of 2/16, 3/16, 4/16, 5/16, 6/16, 7/16, 8/16, 9/16, 10/16, 11/16, 12/16, 13/16, or 14/16.

As the extended LDPC code, for example, an LDPC code from which the punctured LDPC code with good BER can be obtained can be adopted by the simulation described in FIGS. 30 and 31, for example. In the simulation, for example, the puncture length L for puncturing the extended LDPC code can be obtained together with (the parity check matrix of) the extended LDPC code using BER as an index.

According to the punctured LDPC code obtained by puncturing the extended LDPC code obtained as described above by the puncture length L similarly obtained, favorable communication quality can be secured in data transmission.

Hereinafter, examples of the parity check matrix initial value table representing the extended parity check matrix of the extended LDPC code obtained by the simulation and the puncture length L will be described.

Figure 79:
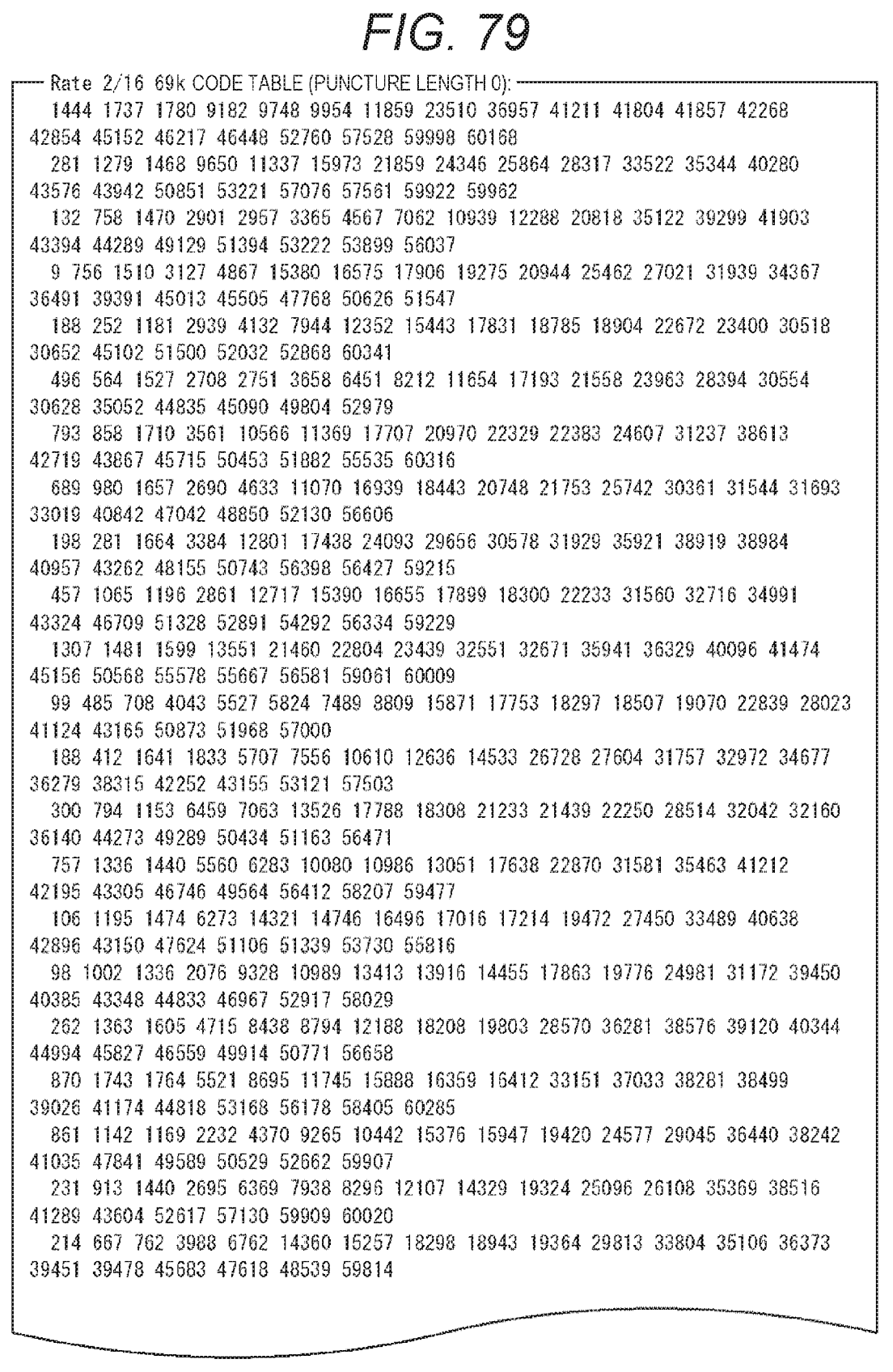
Figure 80:
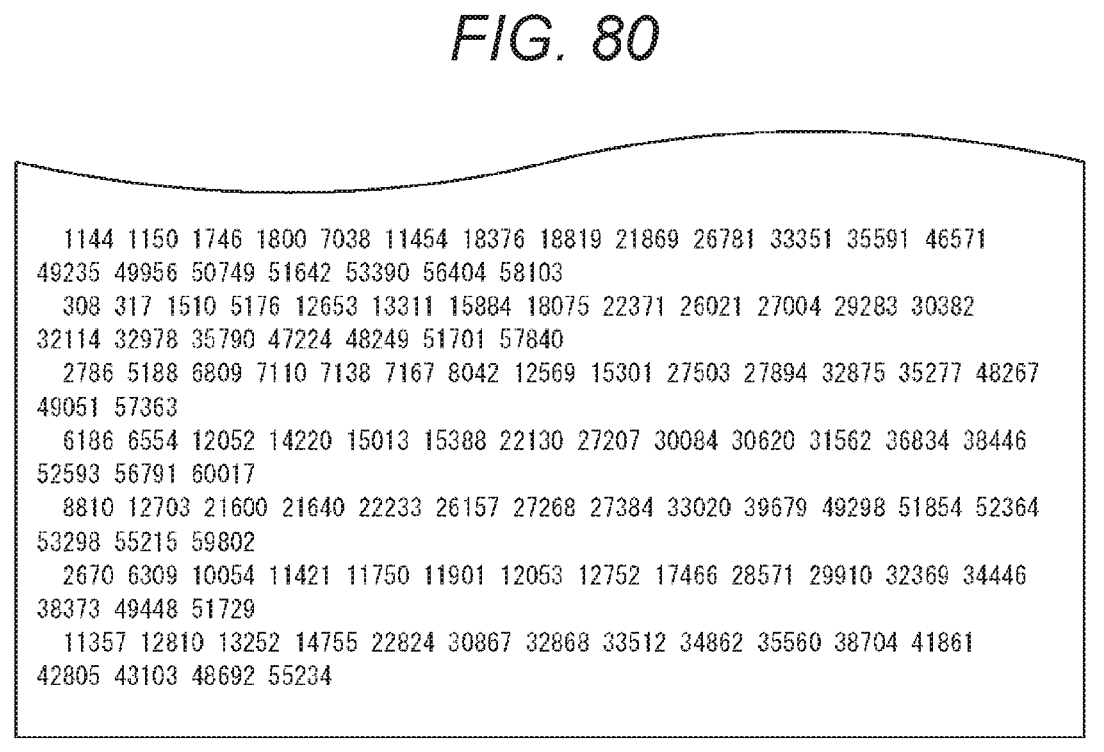

FIGS. 79 and 80 are diagrams illustrating examples of a parity check matrix initial value table (code table) representing a type A extended parity check matrix of an extended LDPC code of the type A method (before puncturing) (hereinafter also referred to as type A extended LDPC code for (69k, 2/16)) to be used in a case of obtaining a punctured LDPC code with the code length N of 69120 (69 k) bits and the coding rate r (Rate) of 2/16.

Note that FIG. 80 is a diagram following FIG. 79.

Puncturing with the puncture length L=0 is performed for a type A extended LDPC code for (69k, 2/16). Therefore, the punctured LDPC code obtained by puncturing the type A extended LDPC code for (69k, 2/16) is the same as the type A extended LDPC code for (69k, 2/16) before puncturing.

Figure 81:
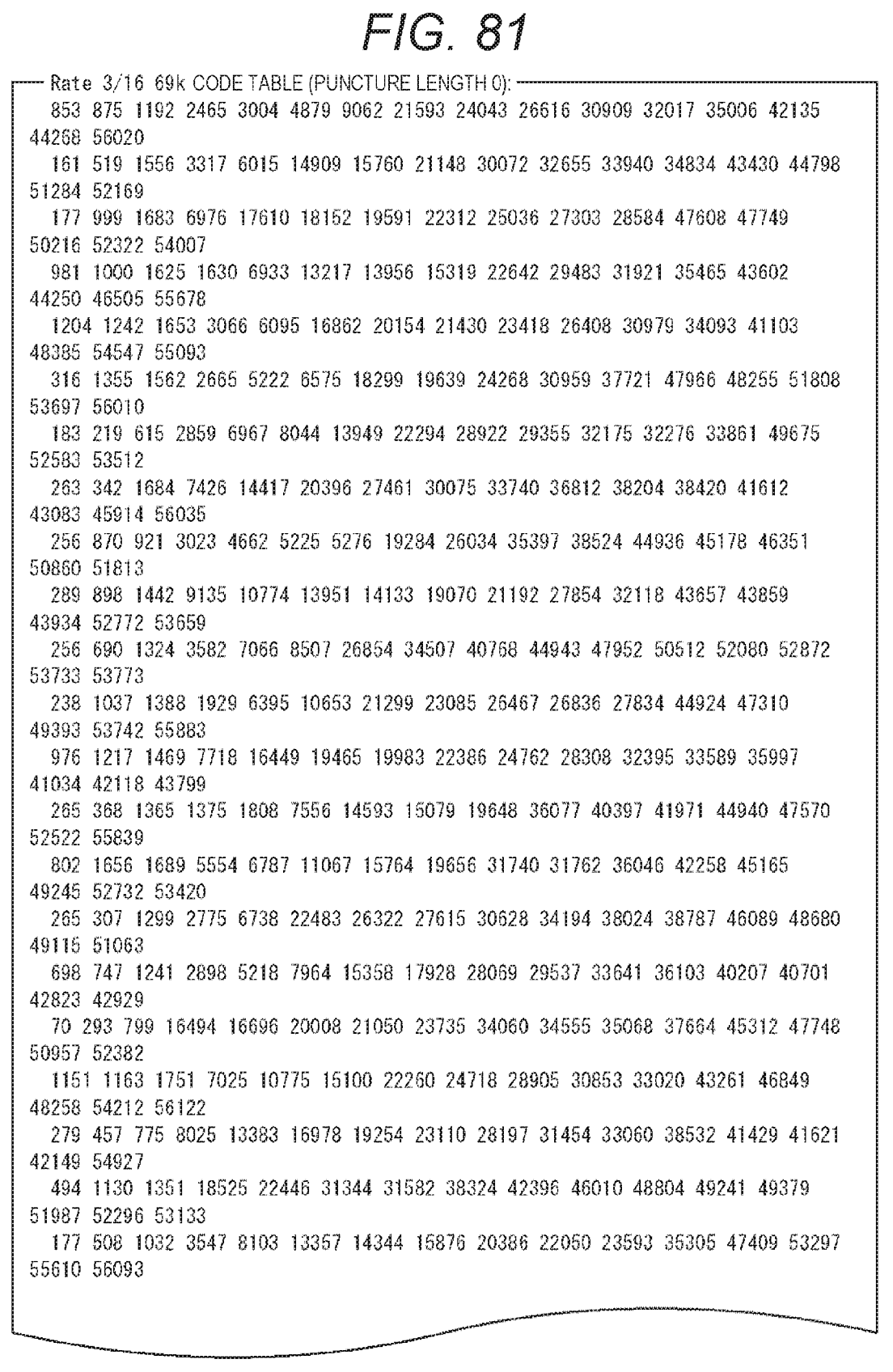
Figure 82:
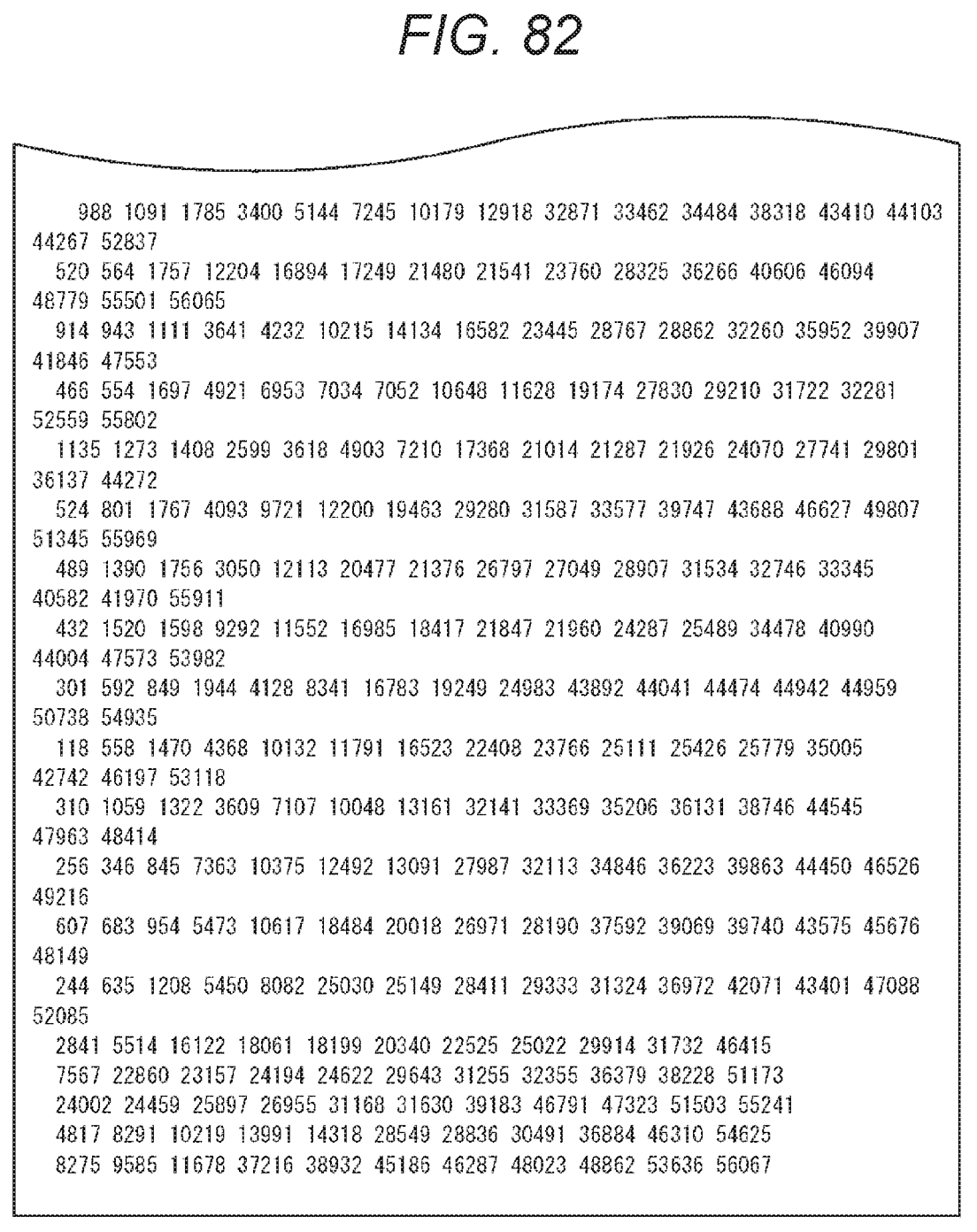

FIGS. 81 and 82 are diagrams illustrating examples of a parity check matrix initial value table representing a type A extended parity check matrix of an extended LDPC code of the type A method (hereinafter also referred to as type A extended LDPC code for (69k, 3/16)) to be used in a case of obtaining a punctured LDPC code with the code length N of 69120 bits and the coding rate r of 3/16.

Note that FIG. 82 is a diagram following FIG. 81.

Puncturing with the puncture length L=0 is performed for a type A extended LDPC code for (69k, 3/16). Therefore, the punctured LDPC code obtained by puncturing the type A extended LDPC code for (69k, 3/16) is the same as the type A extended LDPC code for (69k, 3/16) before puncturing.

Figure 83:
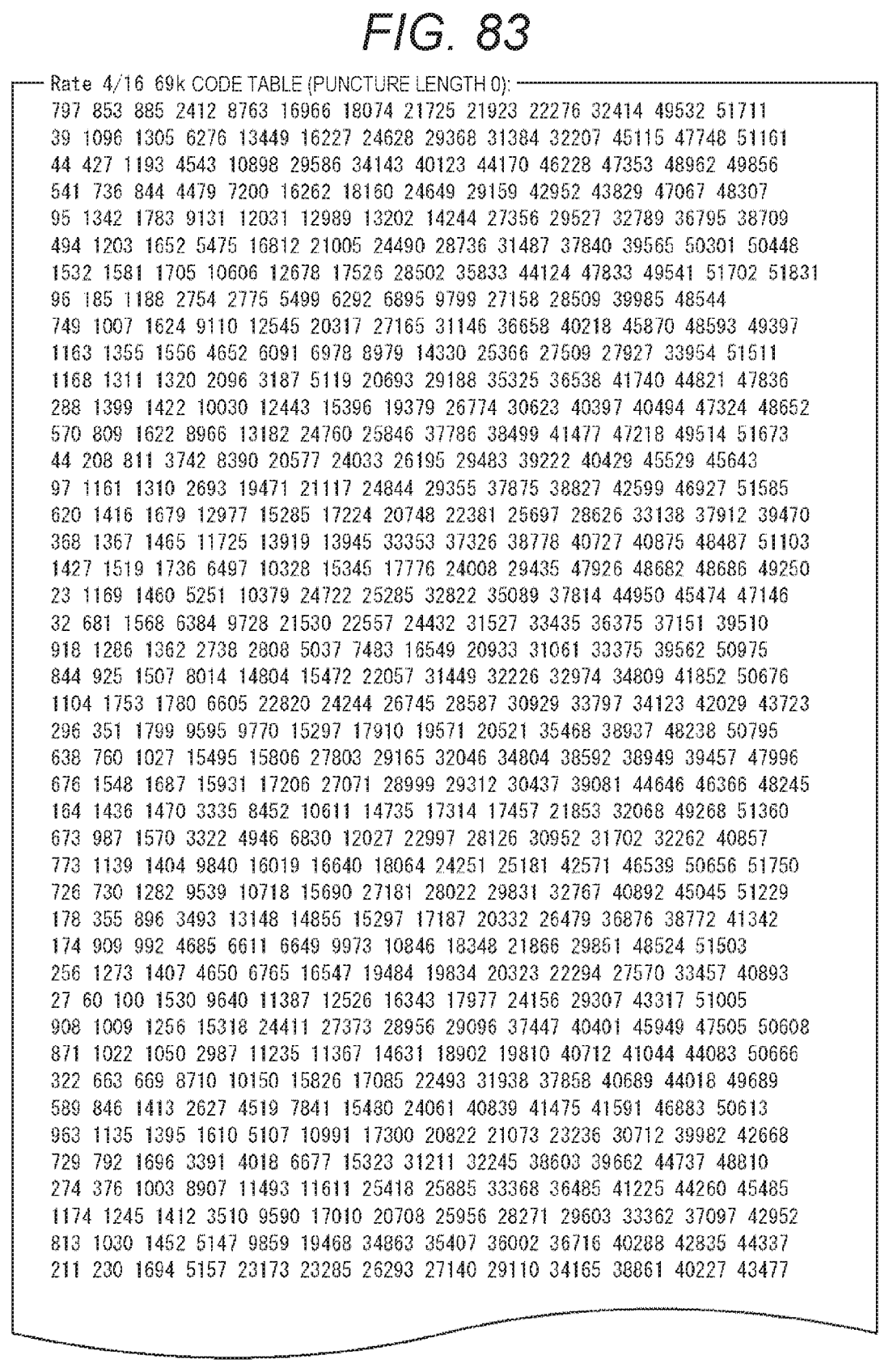
Figure 84:
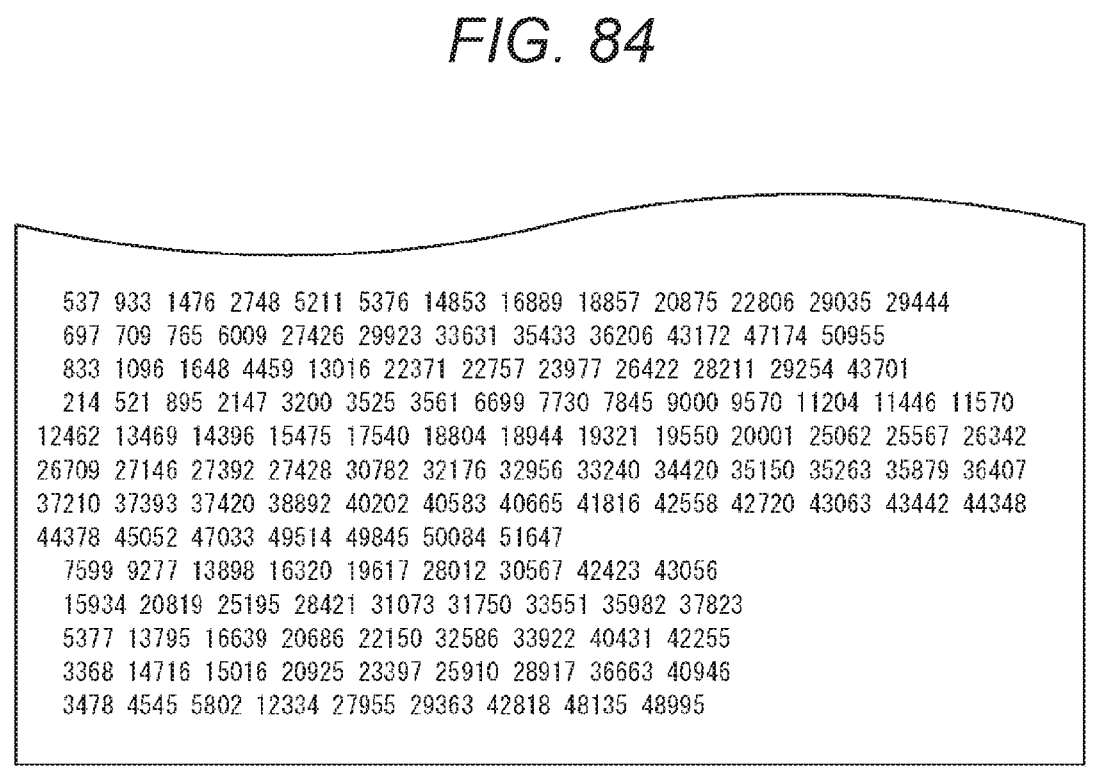

FIGS. 83 and 84 are diagrams illustrating examples of a parity check matrix initial value table representing a type A extended parity check matrix of an extended LDPC code of the type A method (hereinafter also referred to as type A extended LDPC code for (69k, 4/16)) to be used in a case of obtaining a punctured LDPC code with the code length N of 69120 bits and the coding rate r of 4/16.

Note that FIG. 84 is a diagram following FIG. 83.

Puncturing with the puncture length L=0 is performed for a type A extended LDPC code for (69k, 4/16). Therefore, the punctured LDPC code obtained by puncturing the type A extended LDPC code for (69k, 4/16) is the same as the type A extended LDPC code for (69k, 4/16) before puncturing.

Figure 85:
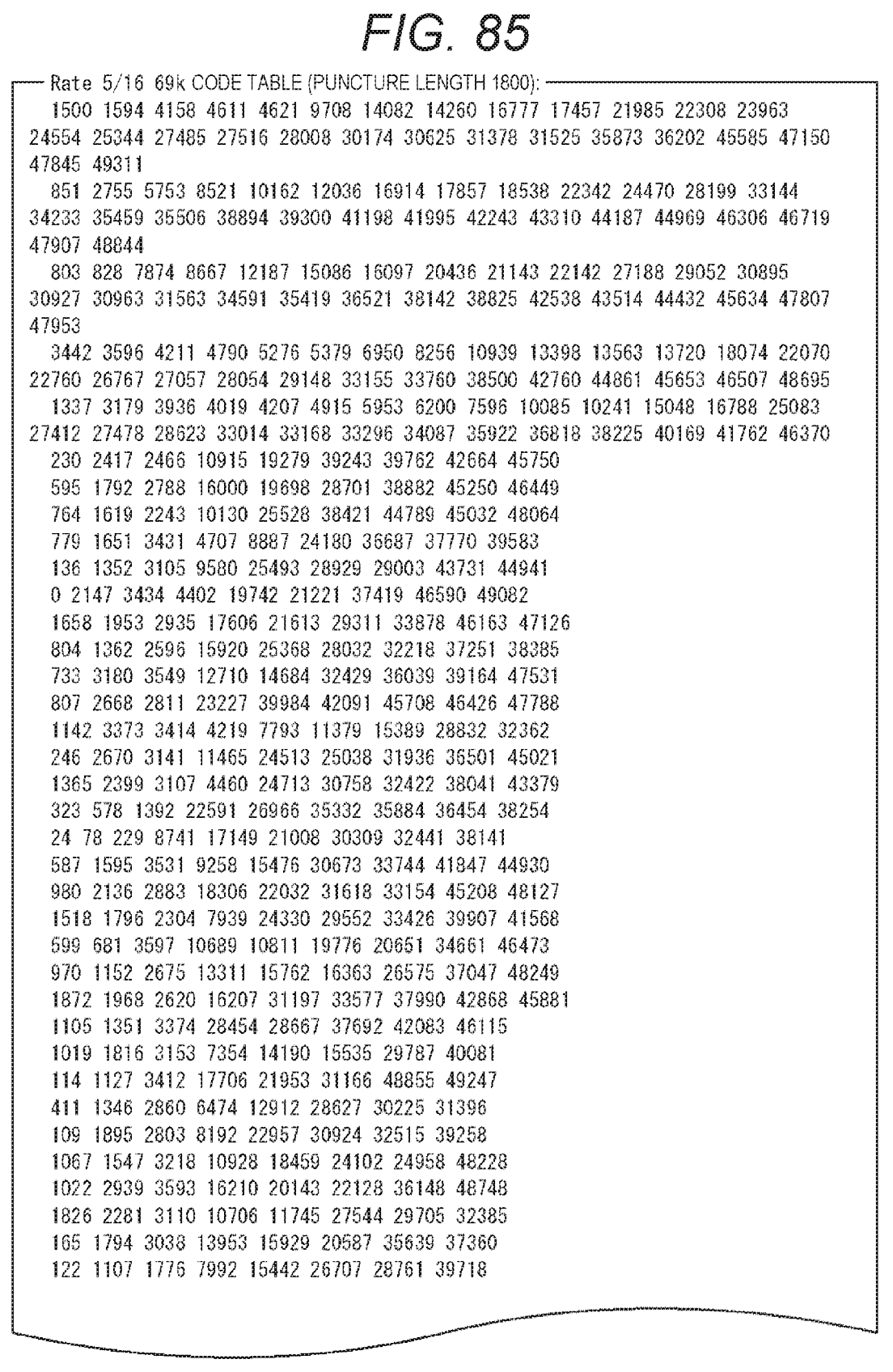
Figure 86:
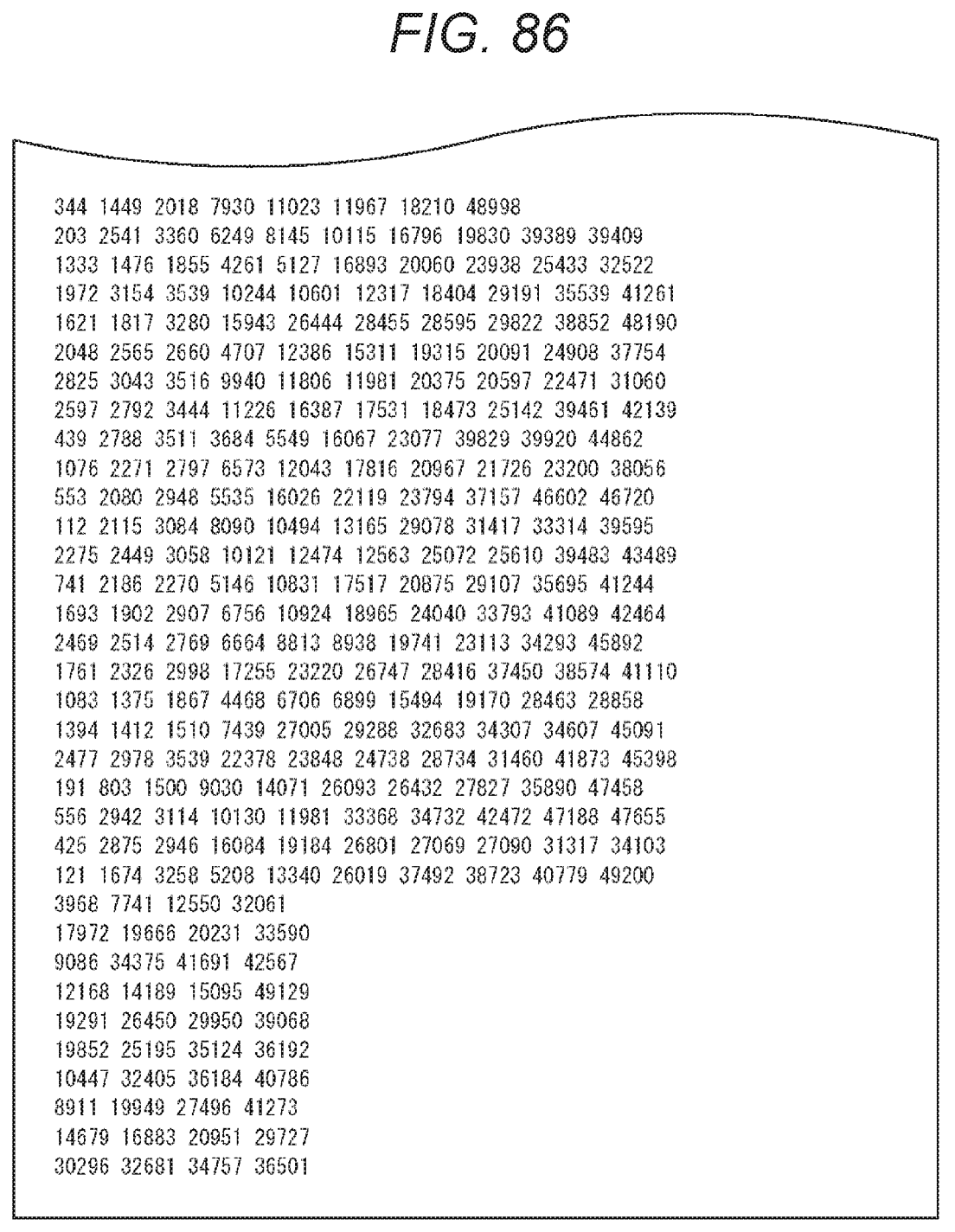

FIGS. 85 and 86 are diagrams illustrating examples of a parity check matrix initial value table representing a type A extended parity check matrix of an extended LDPC code of the type A method (hereinafter also referred to as type A extended LDPC code for (69k, 5/16)) to be used in a case of obtaining a punctured LDPC code with the code length N of 69120 bits and the coding rate r of 5/16.

Note that FIG. 86 is a diagram following FIG. 85.

Puncturing with the puncture length L=1800 is performed for a type A extended LDPC code for (69k, 5/16). Therefore, the punctured LDPC code obtained by puncturing the type A extended LDPC code for (69k, 5/16) is shorter by the puncture length L=1800 than the type A extended LDPC code for (69k, 5/16) before puncturing.

Figure 87:
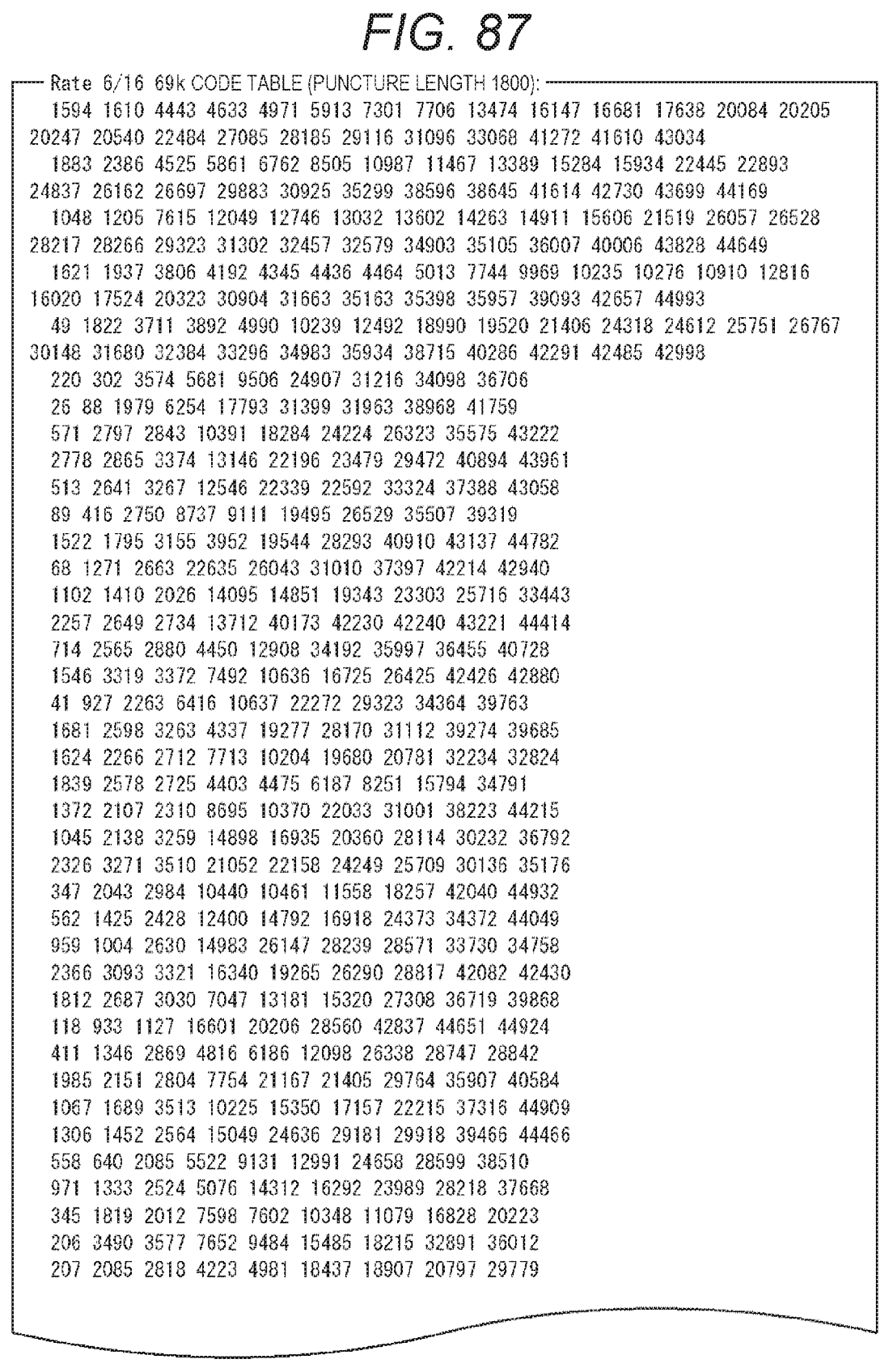
Figure 88:
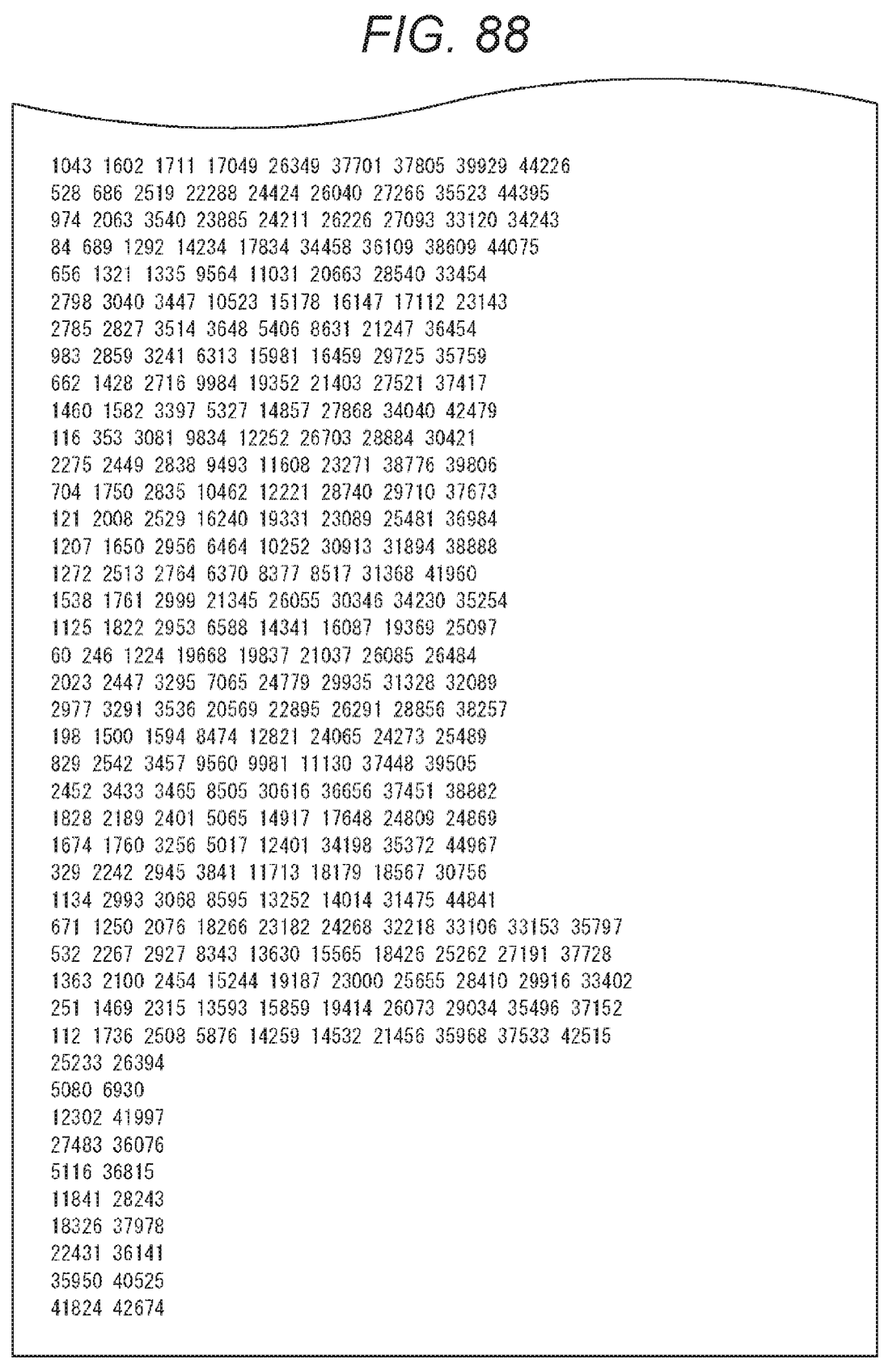

FIGS. 87 and 88 are diagrams illustrating examples of a parity check matrix initial value table representing a type A extended parity check matrix of an extended LDPC code of the type A method (hereinafter also referred to as type A extended LDPC code for (69k, 6/16)) to be used in a case of obtaining a punctured LDPC code with the code length N of 69120 bits and the coding rate r of 6/16.

Note that FIG. 88 is a diagram following FIG. 87.

Puncturing with the puncture length L=1800 is performed for a type A extended LDPC code for (69k, 6/16). Therefore, the punctured LDPC code obtained by puncturing the type A extended LDPC code for (69k, 6/16) is shorter by the puncture length L=1800 than the type A extended LDPC code for (69k, 6/16) before puncturing.

Figure 89:
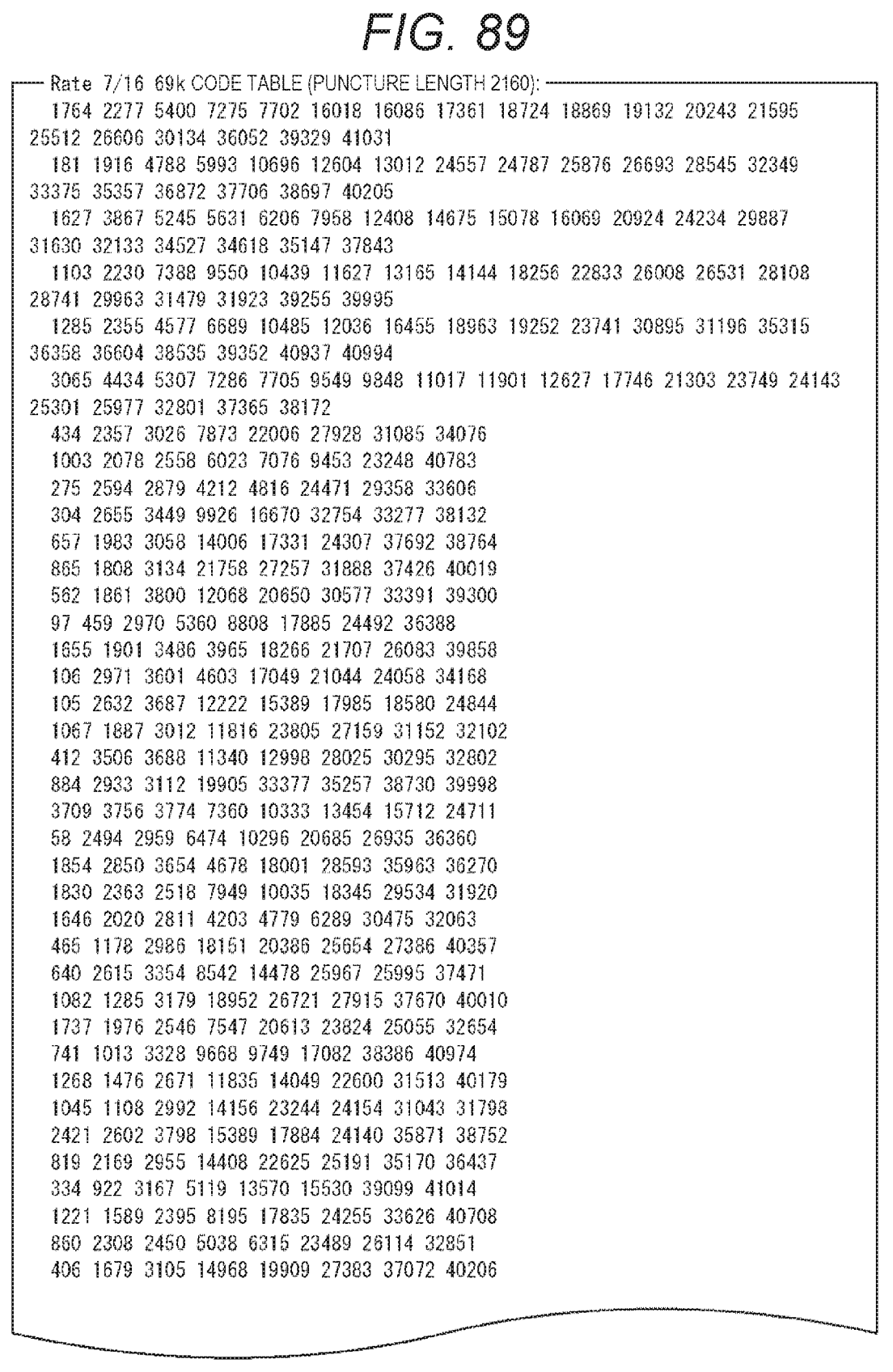
Figure 90:
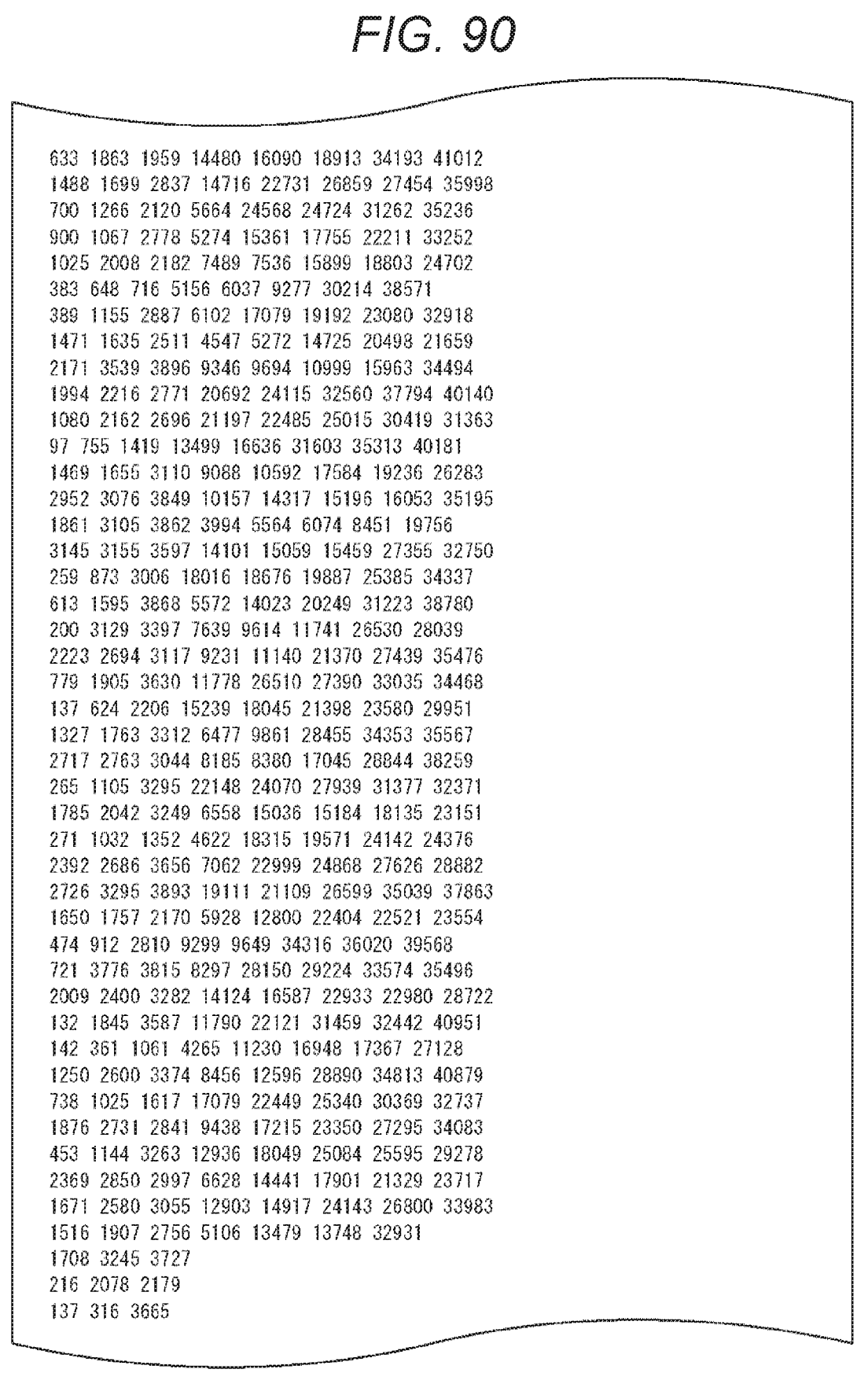
Figure 91:
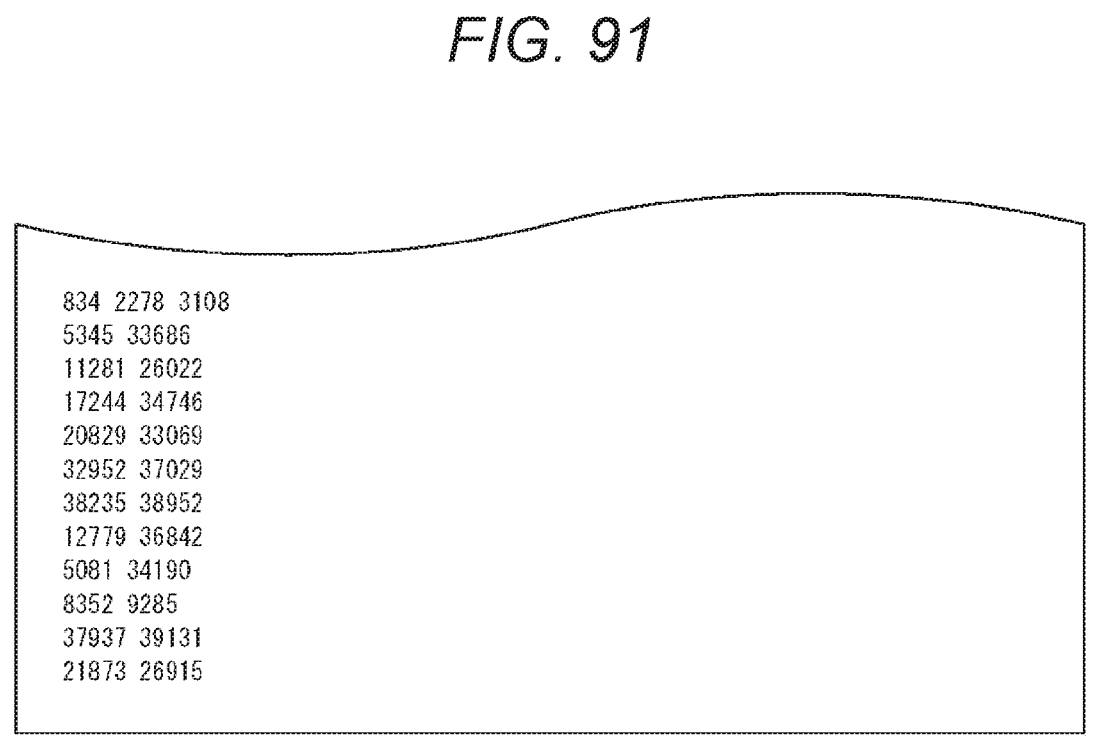

FIGS. 89, 90, and 91 are diagrams illustrating examples of a parity check matrix initial value table representing a type A extended parity check matrix of an extended LDPC code of the type A method (hereinafter also referred to as type A extended LDPC code for (69k, 7/16)) to be used in a case of obtaining a punctured LDPC code with the code length N of 69120 bits and the coding rate r of 7/16.

Note that FIG. 90 is a diagram following FIG. 89 and FIG. 91 is a diagram following FIG. 90.

Puncturing with the puncture length L=2160 is performed for a type A extended LDPC code for (69k, 7/16). Therefore, the punctured LDPC code obtained by puncturing the type A extended LDPC code for (69k, 7/16) is shorter by the puncture length L=2160 than the type A extended LDPC code for (69k, 7/16) before puncturing.

Figure 92:
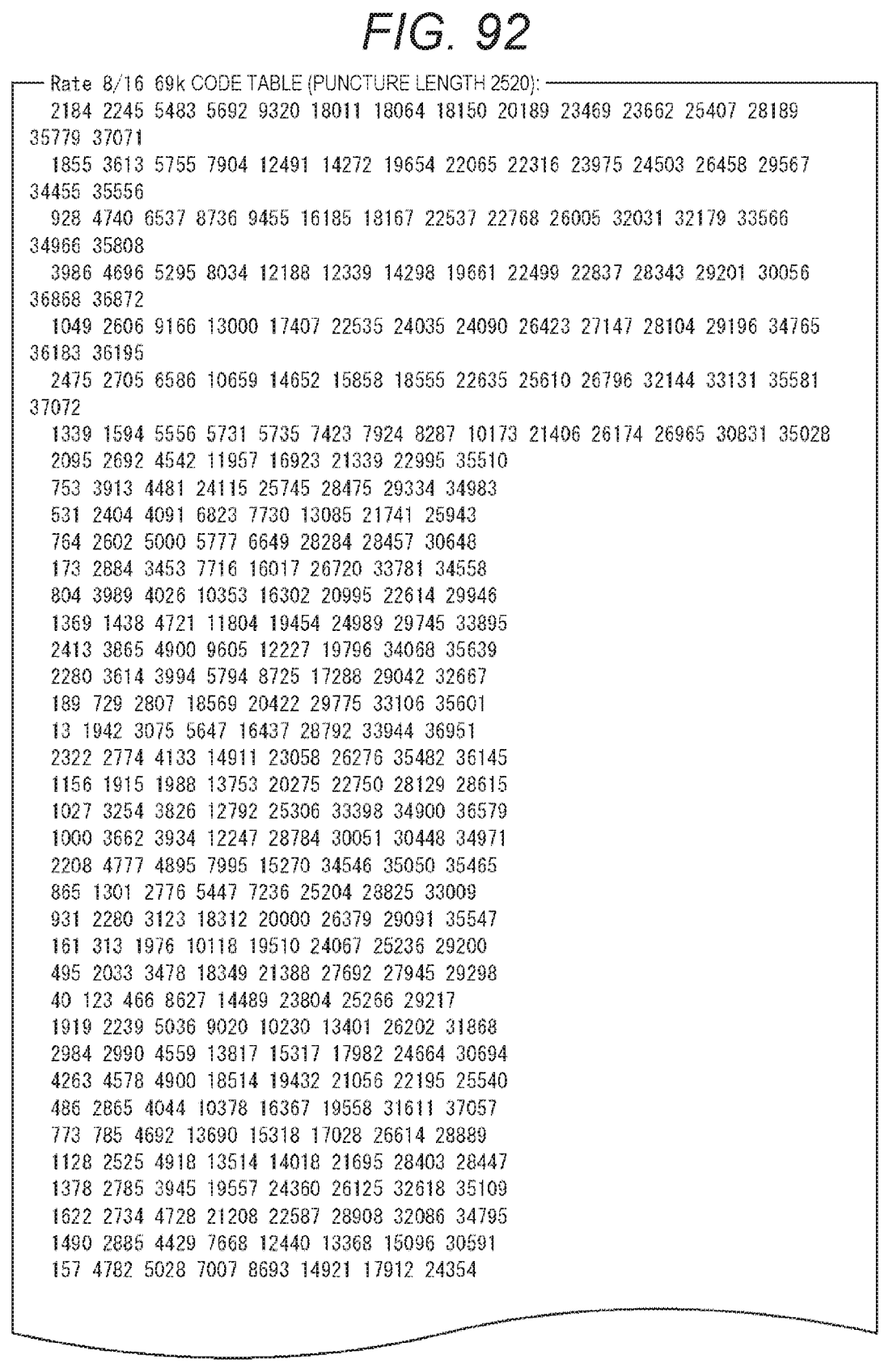
Figure 93:
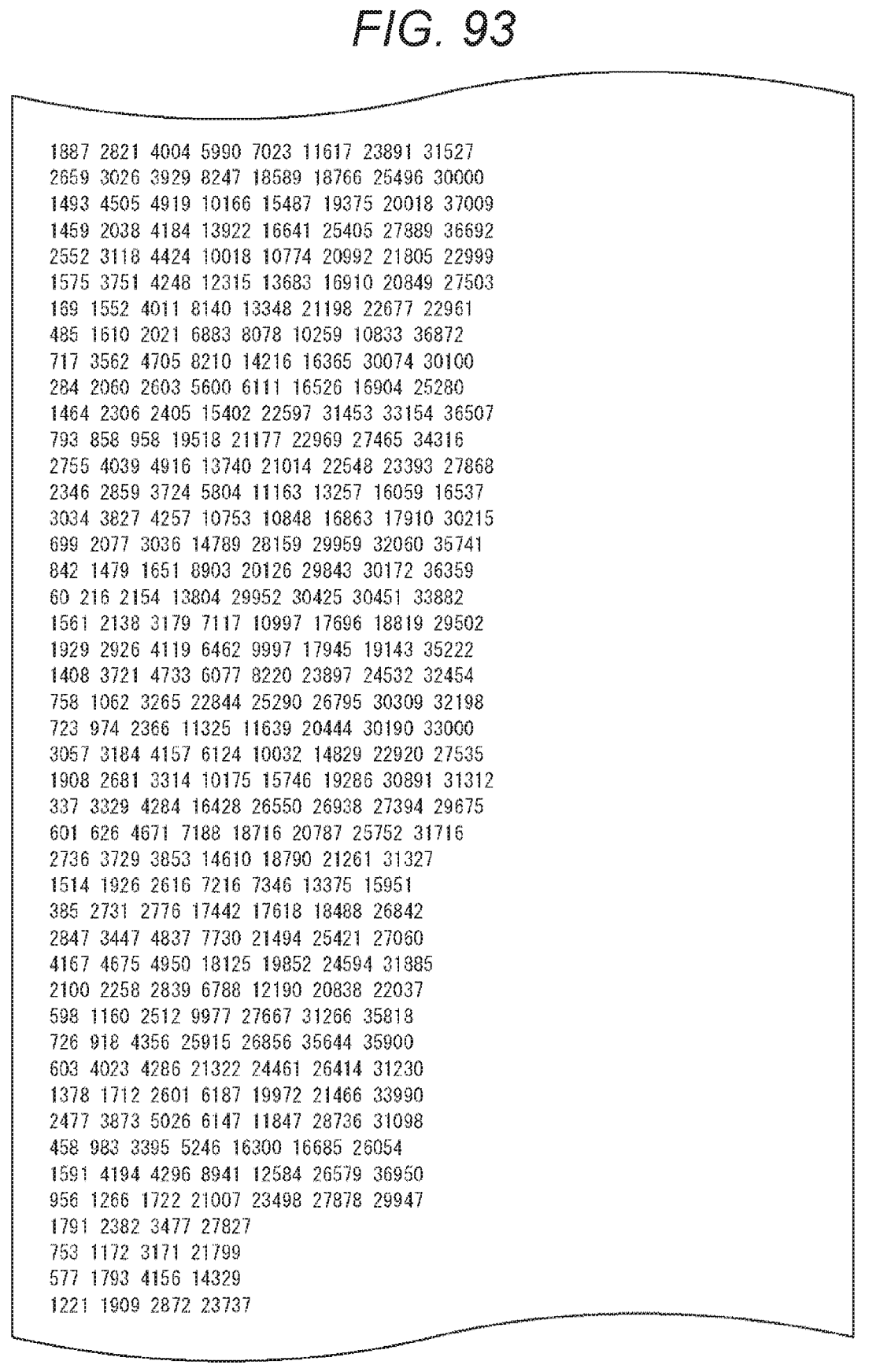
Figure 94:
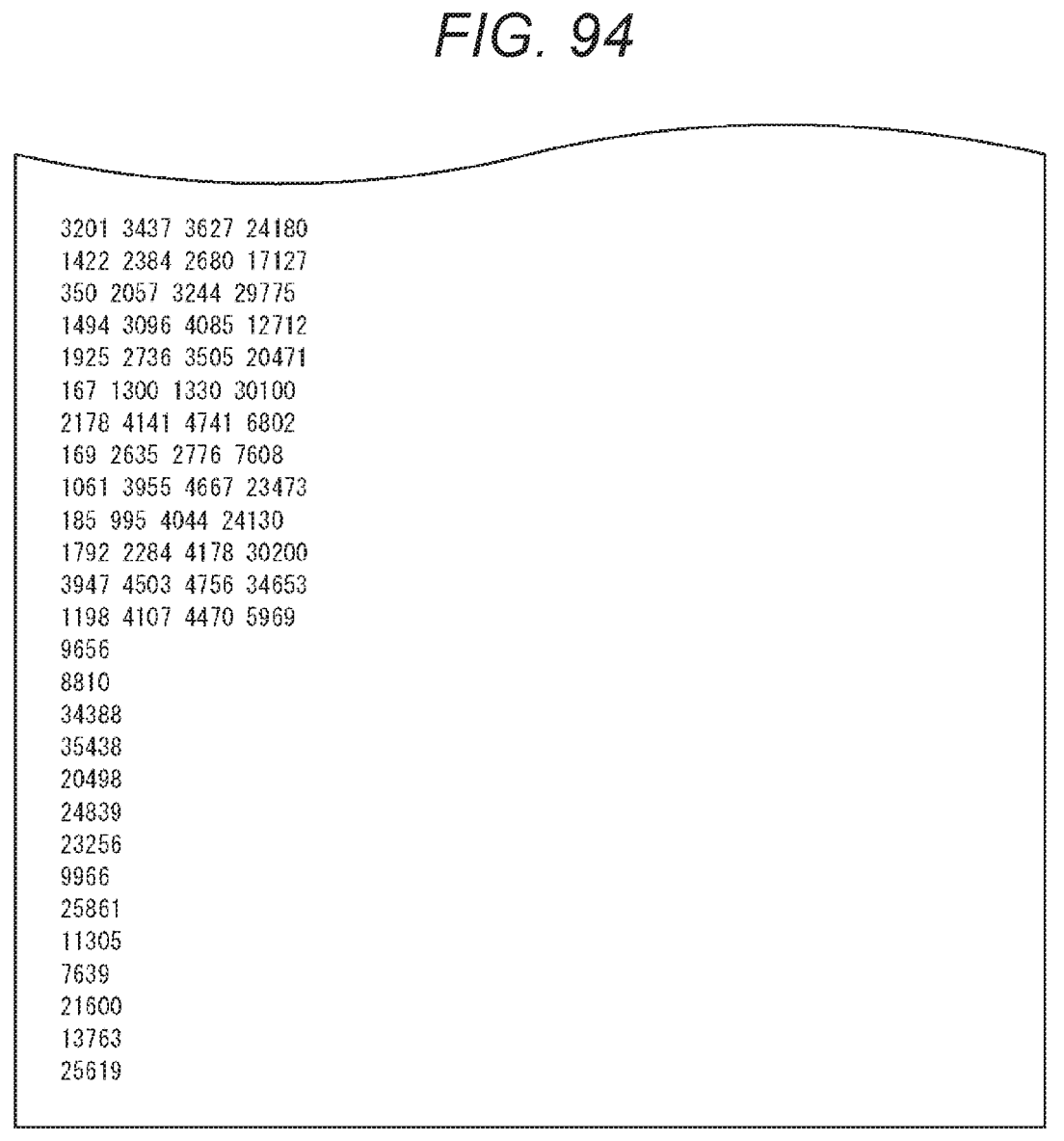

FIGS. 92, 93, and 94 are diagrams illustrating examples of a parity check matrix initial value table representing a type A extended parity check matrix of an extended LDPC code of the type A method (hereinafter also referred to as type A extended LDPC code for (69k, 8/16)) to be used in a case of obtaining a punctured LDPC code with the code length N of 69120 bits and the coding rate r of 8/16.

Note that FIG. 93 is a diagram following FIG. 92 and FIG. 94 is a diagram following FIG. 93.

Puncturing with the puncture length L=2520 is performed for a type A extended LDPC code for (69k, 8/16). Therefore, the punctured LDPC code obtained by puncturing the type A extended LDPC code for (69k, 8/16) is shorter by the puncture length L=2520 than the type A extended LDPC code for (69k, 8/16) before puncturing.

FIGS. 95, 96, 97, and 98 are diagrams illustrating examples of a parity check matrix initial value table representing a type A extended parity check matrix of an extended LDPC code of the type A method (hereinafter also referred to as type A extended LDPC code for (69k, 9/16)) to be used in a case of obtaining a punctured LDPC code with the code length N of 69120 bits and the coding rate r of 9/16.

Figure 95:
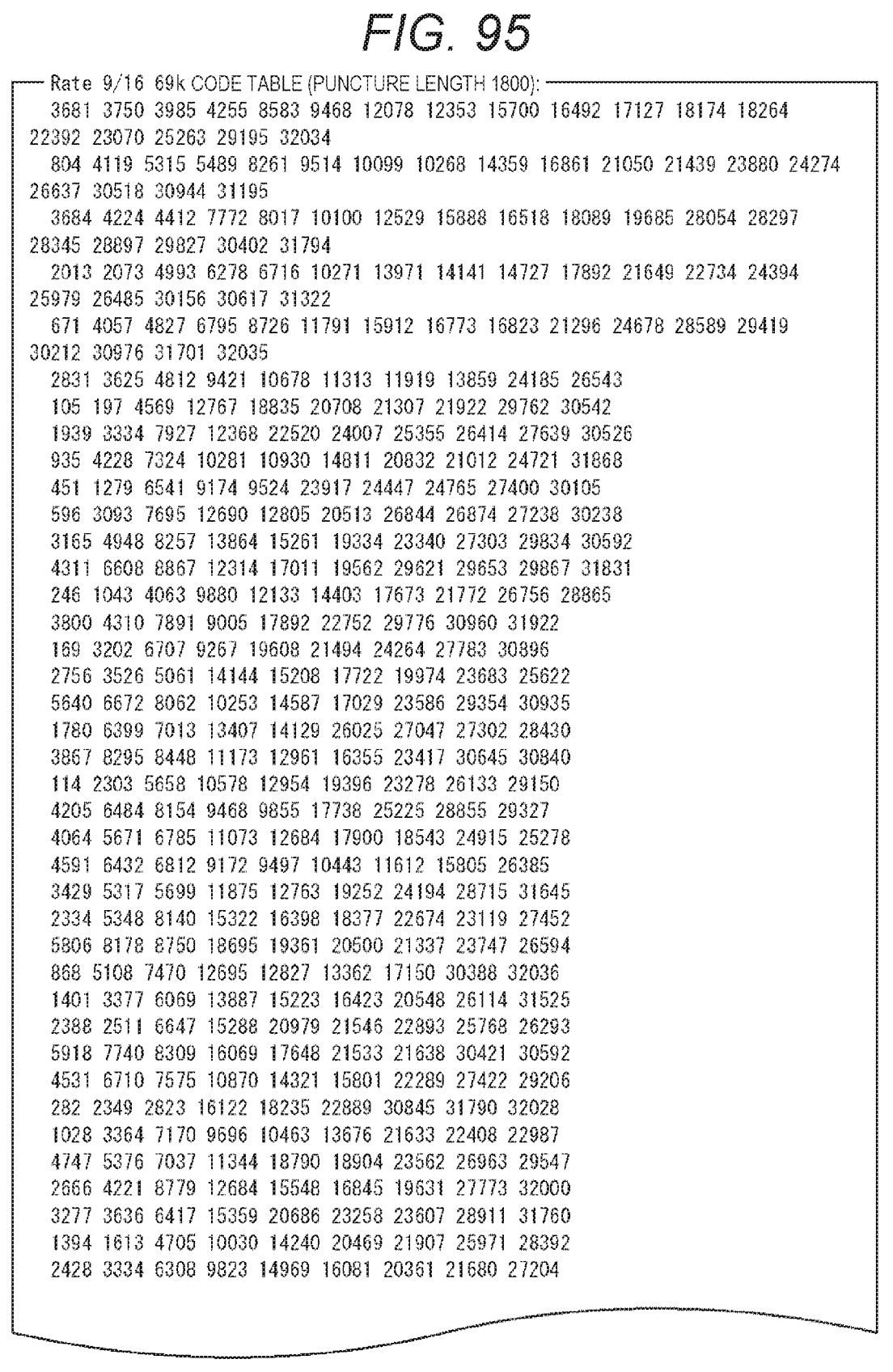
Figure 96:
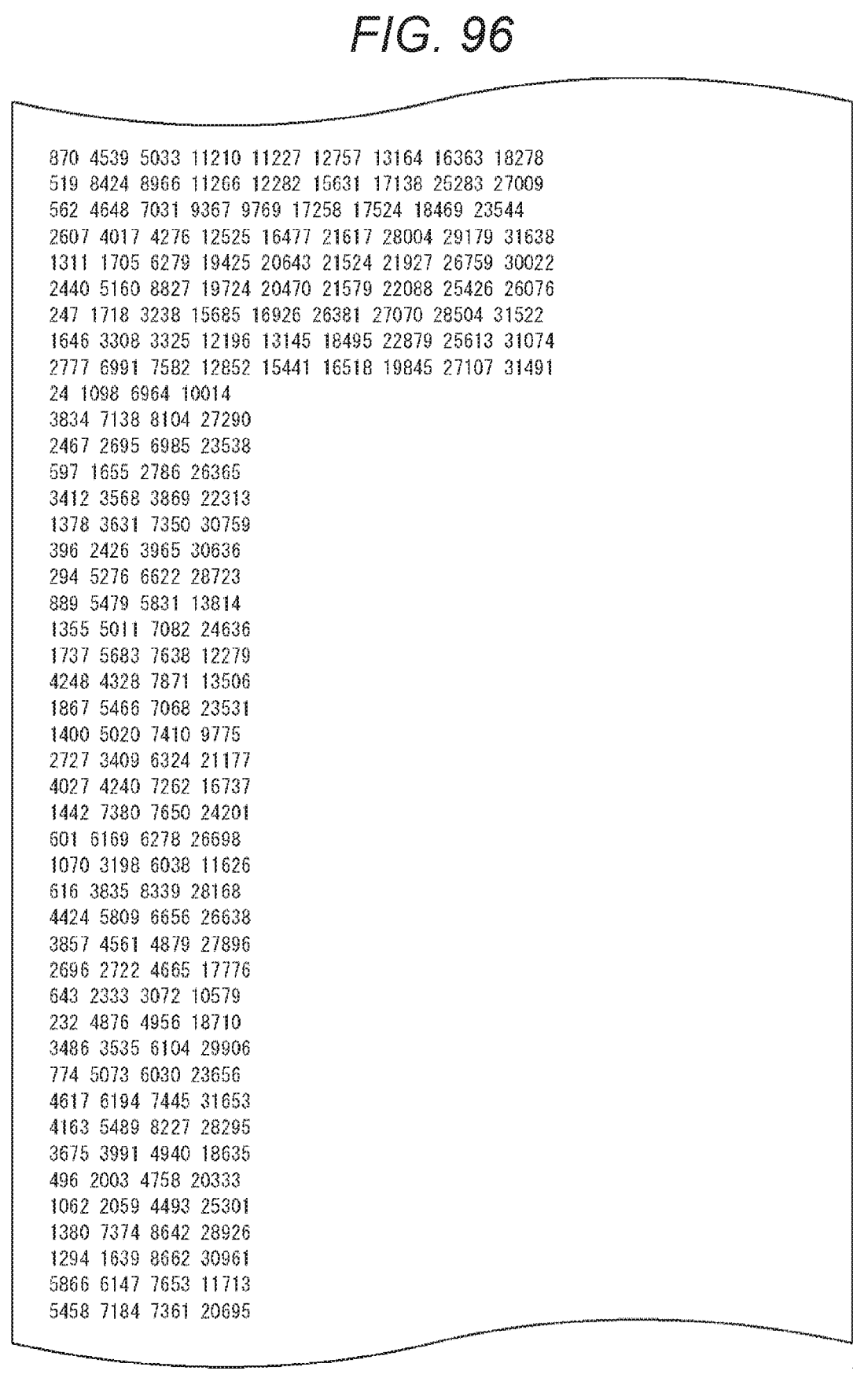
Figure 97:
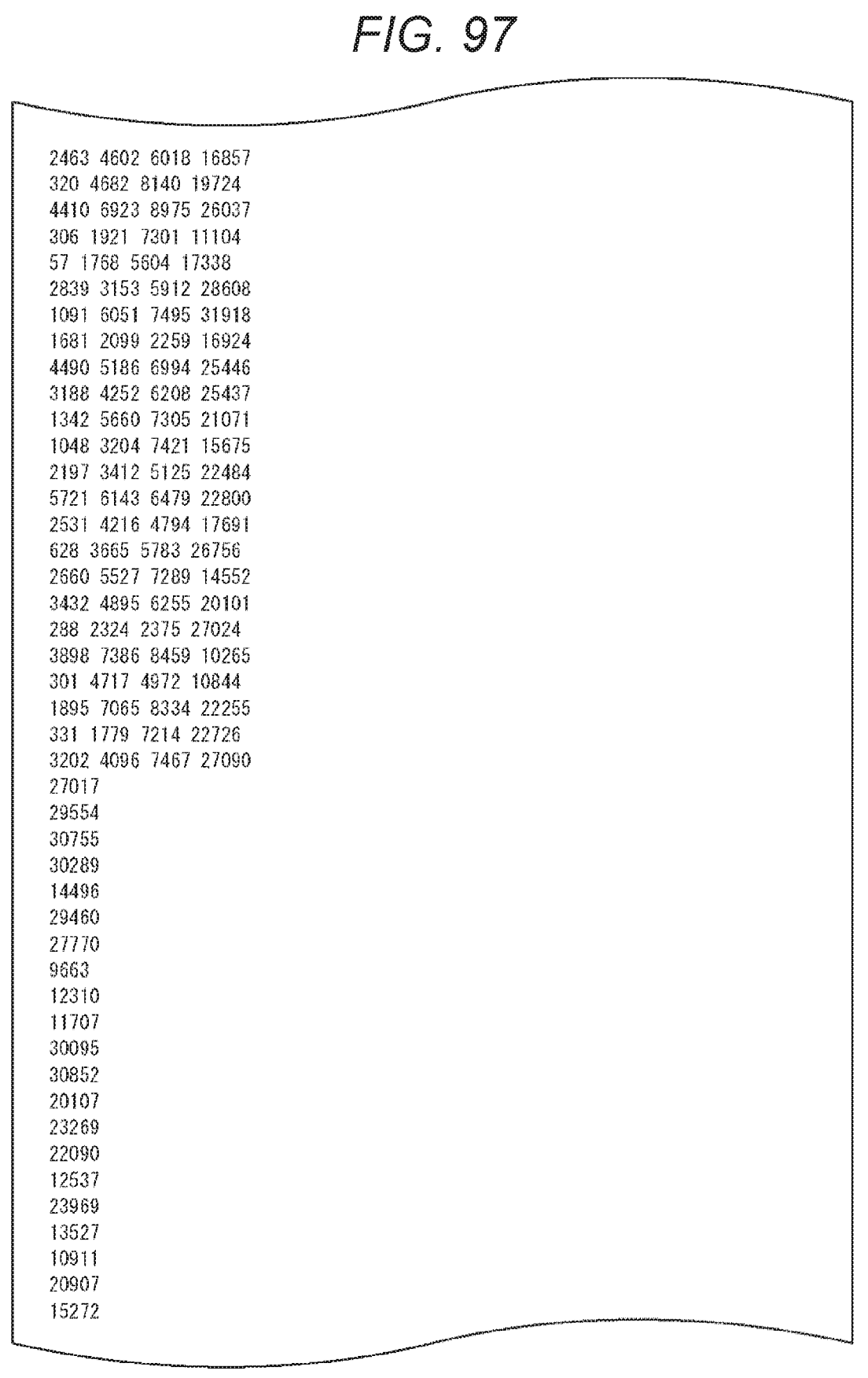
Figure 98:
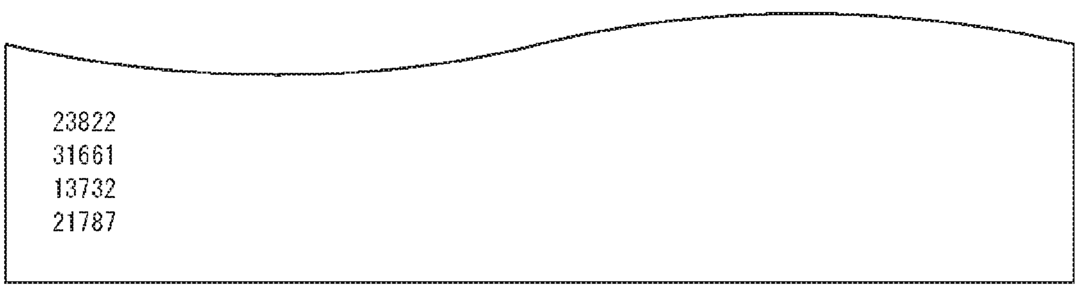
FIG. 98 is a diagram illustrating an example of a parity check matrix initial value table representing a type A extended parity check matrix of a type A extended LDPC code for (69k, 9/16).

Note that FIG. 96 is a diagram following FIG. 95 and FIG. 97 is a diagram following FIG. 96. Note that FIG. 98 is a diagram following FIG. 97.

Puncturing with the puncture length L=1800 is performed for a type A extended LDPC code for (69k, 9/16). Therefore, the punctured LDPC code obtained by puncturing the type A extended LDPC code for (69k, 9/16) is shorter by the puncture length L=1800 than the type A extended LDPC code for (69k, 9/16) before puncturing.

FIGS. 99, 100, and 101 are diagrams illustrating examples of a parity check matrix initial value table representing a type B extended parity check matrix of an extended LDPC code of the type B method (hereinafter also referred to as type B extended LDPC code for (69k, 9/16)) to be used in a case of obtaining a punctured LDPC code with the code length N of 69120 bits and the coding rate r of 9/16.

Note that FIG. 100 is a diagram following FIG. 99 and FIG. 101 is a diagram following FIG. 100.

Puncturing with the puncture length L=1080 is performed for a type B extended LDPC code for (69k, 9/16). Therefore, the punctured LDPC code obtained by puncturing the type B extended LDPC code for (69k, 9/16) is shorter by the puncture length L=1080 than the type B extended LDPC code for (69k, 9/16) before puncturing.

FIGS. 102, 103, 104, 105 are diagrams illustrating examples of a parity check matrix initial value table representing a type B extended parity check matrix of an extended LDPC code of the type B method (hereinafter also referred to as type B extended LDPC code for (69k, 10/16)) to be used in a case of obtaining a punctured LDPC code with the code length N of 69120 bits and the coding rate r of 10/16.

Note that FIG. 103 is a diagram following FIG. 102 and FIG. 104 is a diagram following FIG. 103. Note that FIG. 105 is a diagram following FIG. 104.

Puncturing with the puncture length L=360 is performed for a type B extended LDPC code for (69k, 10/16). Therefore, the punctured LDPC code obtained by puncturing the type B extended LDPC code for (69k, 10/16) is shorter by the puncture length L=360 than the type B extended LDPC code for (69k, 10/16) before puncturing.

FIGS. 106, 107, 108, and 109 are diagrams illustrating examples of a parity check matrix initial value table representing a type B extended parity check matrix of an extended LDPC code of the type B method (hereinafter also referred to as type B extended LDPC code for (69k, 11/16)) to be used in a case of obtaining a punctured LDPC code with the code length N of 69120 bits and the coding rate r of 11/16.

Note that FIG. 107 is a diagram following FIG. 106 and FIG. 108 is a diagram following FIG. 107. Note that FIG. 109 is a diagram following FIG. 108.

Puncturing with the puncture length L=1440 is performed for a type B extended LDPC code for (69k, 11/16). Therefore, the punctured LDPC code obtained by puncturing the type B extended LDPC code for (69k, 11/16) is shorter by the puncture length L=1440 than the type B extended LDPC code for (69k, 11/16) before puncturing.

FIGS. 110, 111, 112, and 113 are diagrams illustrating examples of a parity check matrix initial value table representing a type B extended parity check matrix of an extended LDPC code of the type B method (hereinafter also referred to as type B extended LDPC code for (69k, 12/16)) to be used in a case of obtaining a punctured LDPC code with the code length N of 69120 bits and the coding rate r of 12/16.

Note that FIG. 111 is a diagram following FIG. 110 and FIG. 112 is a diagram following FIG. 111. Note that FIG. 113 is a diagram following FIG. 112.

Puncturing with the puncture length L=1440 is performed for a type B extended LDPC code for (69k, 12/16). Therefore, the punctured LDPC code obtained by puncturing the type B extended LDPC code for (69k, 12/16) is shorter by the puncture length L=1440 than the type B extended LDPC code for (69k, 12/16) before puncturing.

FIGS. 114, 115, 116, and 117 are diagrams illustrating examples of a parity check matrix initial value table representing a type B extended parity check matrix of an extended LDPC code of the type B method (hereinafter also referred to as type B extended LDPC code for (69k, 13/16)) to be used in a case of obtaining a punctured LDPC code with the code length N of 69120 bits and the coding rate r of 13/16.

Note that FIG. 115 is a diagram following FIG. 114 and FIG. 116 is a diagram following FIG. 115. Note that FIG. 117 is a diagram following FIG. 116.

Puncturing with the puncture length L=720 is performed for a type B extended LDPC code for (69k, 13/16). Therefore, the punctured LDPC code obtained by puncturing the type B extended LDPC code for (69k, 13/16) is shorter by the puncture length L=720 than the type B extended LDPC code for (69k, 13/16) before puncturing.

FIGS. 118, 119, 120, and 121 are diagrams illustrating examples of a parity check matrix initial value table representing a type B extended parity check matrix of an extended LDPC code of the type B method (hereinafter also referred to as type B extended LDPC code for (69k, 14/16)) to be used in a case of obtaining a punctured LDPC code with the code length N of 69120 bits and the coding rate r of 14/16.

Note that FIG. 119 is a diagram following FIG. 118 and FIG. 120 is a diagram following FIG. 119. Note that FIG. 121 is a diagram following FIG. 120.

Puncturing with the puncture length L=720 is performed for a type B extended LDPC code for (69k, 14/16). Therefore, the punctured LDPC code obtained by puncturing the type B extended LDPC code for (69k, 14/16) is shorter by the puncture length L=720 than the type B extended LDPC code for (69k, 14/16) before puncturing.

Figure 122:
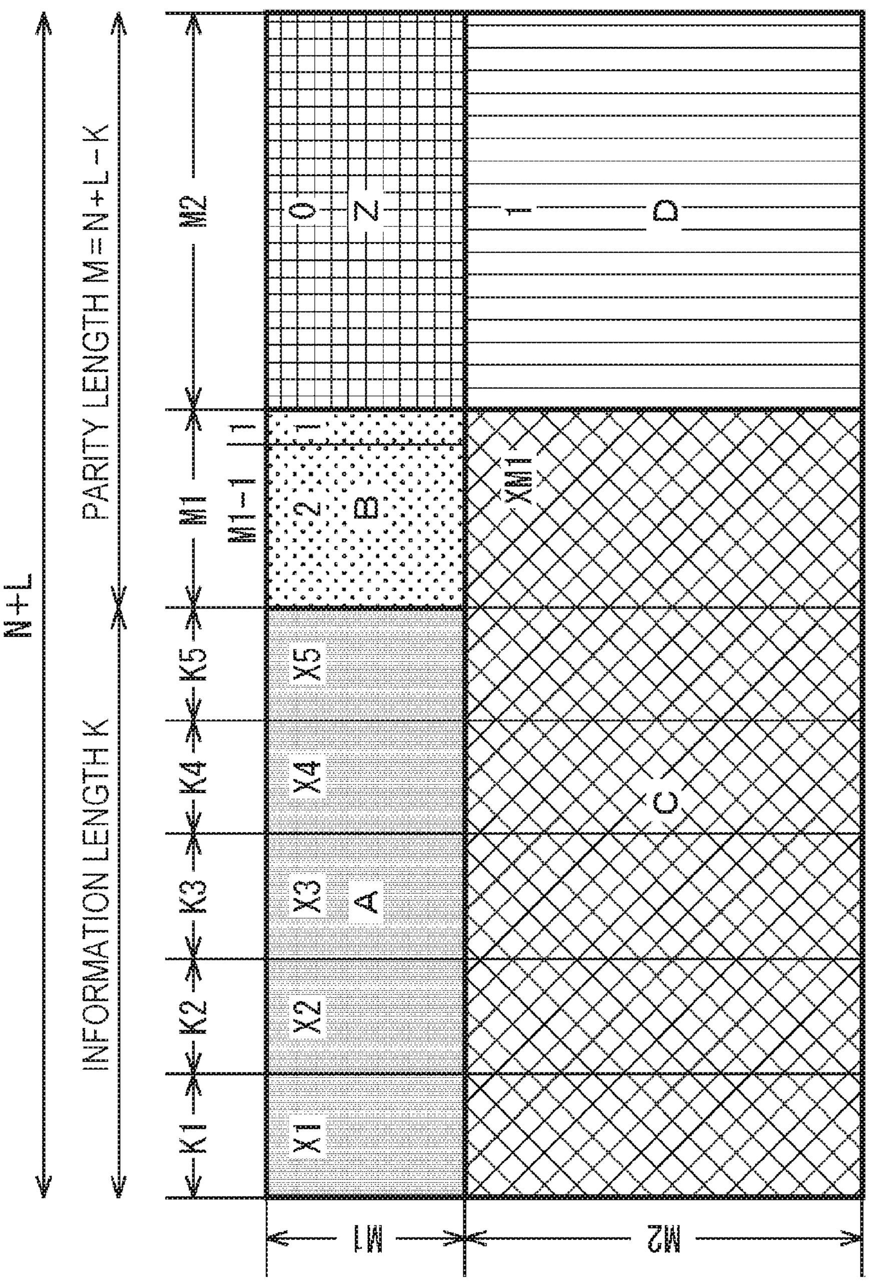

FIG. 122 is a diagram for describing column weights of the type A extended parity check matrix represented by the parity check matrix initial value table of the type A method in FIGS. 79 to 98.

For the type A extended parity check matrix, as illustrated in FIG. 122, the column weight of K1 columns from the first column of the A matrix and the C matrix is represented as X1, the column weight of subsequent K2 columns of the A matrix and the C matrix is represented as X2, the column weight of subsequent K3 columns of the A matrix and the C matrix is represented as X3, the column weight of subsequent K4 columns of the A matrix and the C matrix is represented as X4, and the column weight of subsequent K5 columns of the A matrix and the C matrix is represented as X5.

Here, the number of columns of the A matrix is equal to an information length K=K1+K2+K3+K4+K5, and the number of columns of the C matrix is K+M1 larger than the information length K=K1+K2+K3+K4+K5.

Furthermore, for the type A extended parity check matrix, the column weight of the (K+1)th to the M1 column of the C matrix is represented as XM1.

In the type A extended parity check matrix, the parity length M=N+L−K is equal to a sum M1+M2 of the number of columns M1 of the B matrix and the number of columns M2 of the Z matrix.

A code length N+L of the type A extended parity check matrix is a sum 69120+L of the code length N=69120 and the puncture length L of the punctured LDPC code, and can be represented as K1+K2+K3+K4+K5+M1+M2.

Furthermore, for the type A extended parity check matrix, the column weight of the first column to the M1−1 column of the B matrix is 2, and the column weight of the M1 column (last column) of the B matrix is 1. Moreover, the column weight of the D matrix is 1 and the column weight of the Z matrix is 0.

FIG. 123 is a diagram illustrating parameters of the type A extended parity check matrix represented by the parity check matrix initial value table of the type A method in FIGS. 79 to 98.

X1 to X5, K1 to K5, XM1, M1, M2, the information length K, and the puncture length L in FIG. 122 as parameters of the type A extended parity check matrix of the extended LDPC code of the type A method used in the case of obtaining the punctured LDPC code of r=2/16, 3/16, 4/16, 5/16, 6/16, 7/16, 8/16, or 9/16 are as illustrated in FIG. 123.

In other words, for the type A extended parity check matrix of the extended LDPC code of the type A method used in the case of obtaining the punctured LDPC code of r=2/16, the information length K, the puncture length L, (X1, K1), (X2, K2), (X3, K3), (X4, K4), (X5, K5), XM1, M1, and M2 are 8640, 0, (21, 1440), (20, 7200), (0, 0), (0, 0), (0, 0), 16, 1800, and 58680.

For the type A extended parity check matrix of the extended LDPC code of the type A method used in the case of obtaining the punctured LDPC code of r=3/16, the information length K, the puncture length L, (X1, K1), (X2, K2), (X3, K3), (X4, K4), (X5, K5), XM1, M1, and M2 are 12960, 0, (16, 11520), (15, 1440), (0, 0), (0, 0), (0, 0), 11, 1800, and 54360.

For the type A extended parity check matrix of the extended LDPC code of the type A method used in the case of obtaining the punctured LDPC code of r=4/16, the information length K, the puncture length L, (X1, K1), (X2, K2), (X3, K3), (X4, K4), (X5, K5), XM1, M1, and M2 are 17280, 0, (13, 16200), (12, 720), (45, 360), (0, 0), (0, 0), 9, 1800, and 50040.

For the type A extended parity check matrix of the extended LDPC code of the type A method used in the case of obtaining the punctured LDPC code of r=5/16, the information length K, the puncture length L, (X1, K1), (X2, K2), (X3, K3), (X4, K4), (X5, K5), XM1, M1, and M2 are 21600, 1800, (28, 720), (27, 1080), (9, 7560), (8, 3960), (10, 8280), 4, 3600, and 45720.

For the type A extended parity check matrix of the extended LDPC code of the type A method used in the case of obtaining the punctured LDPC code of r=6/16, the information length K, the puncture length L, (X1, K1), (X2, K2), (X3, K3), (X4, K4), (X5, K5), XM1, M1, and M2 are 25920, 1800, (25, 1800), (9, 13680), (8, 8640), (10, 1800), (0, 0), 2, 3600, and 41400.

For the type A extended parity check matrix of the extended LDPC code of the type A method used in the case of obtaining the punctured LDPC code of r=7/16, the information length K, the puncture length L, (X1, K1), (X2, K2), (X3, K3), (X4, K4), (X5, K5), XM1, M1, and M2 are 30240, 2160, (19, 2160), (8, 26280), (7, 360), (3, 1440), (0, 0), 2, 3960, and 37080.

For the type A extended parity check matrix of the extended LDPC code of the type A method used in the case of obtaining the punctured LDPC code of r=8/16, the information length K, the puncture length L, (X1, K1), (X2, K2), (X3, K3), (X4, K4), (X5, K5), XM1, M1, and M2 are 34560, 2520, (15, 1800), (14, 720), (8, 20880), (7, 5040), (4, 6120), 1, 5040, and 32040.

For the type A extended parity check matrix of the extended LDPC code of the type A method used in the case of obtaining the punctured LDPC code of r=9/16, the information length K, the puncture length L, (X1, K1), (X2, K2), (X3, K3), (X4, K4), (X5, K5), XM1, M1, and M2 are 38880, 1800, (18, 1440), (17, 360), (10, 3240), (9, 12240), (4, 21600), 1, 9000, and 23040.

The parameters X1 to X5, K1 to K5, XM1, and M1 (M2), and the puncture length L are set to further improve the performance (e.g., BER or the like) of the punctured LDPC code.

Figure 124:
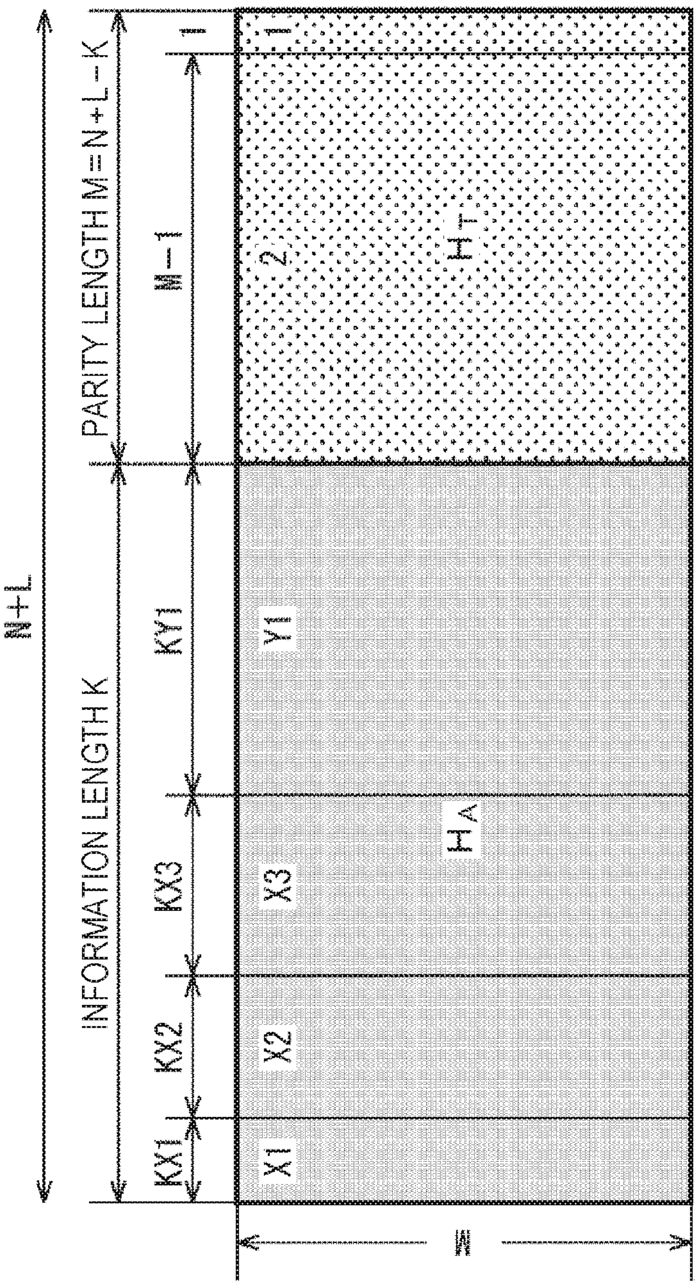

FIG. 124 is a diagram for describing column weights of the type B extended parity check matrix represented by the parity check matrix initial value table of the type B method in FIGS. 99 to 121.

For type B extended parity check matrix, as illustrated in FIG. 124, the column weight of KX1 columns from the first column is represented as X1, the column weight of subsequent KX2 columns is represented as X2, the column weight of subsequent KX3 columns is represented as X3, and the column weight of subsequent KY1 columns is represented as Y1.

Note that KX1+KX2+KX3+KY1 is equal to the information length K, and KX1+KX2+KX3+KY1+M is equal to the code length N+L=69120+L of the extended LDPC code.

Furthermore, for the type B extended parity check matrix, the column weight of the last M columns, in other words, the M−1 columns of the parity matrix $H_T$ excluding the last one column is 2, and the column weight of the last one column is 1.

FIG. 125 is a diagram illustrating parameters of the type B extended parity check matrix represented by the parity check matrix initial value table of the type B method in FIGS. 99 to 121.

X1, KX1, X2, KX2, X3, KX3, Y1, KY1, M, the information length K, and the puncture length L in FIG. 124 as parameters of the type B extended parity check matrix of the extended LDPC code of the type B method used in the case of obtaining the punctured LDPC code of r=9/16, 10/16, 11/16, 12/16, 13/16, or 14/16 are as illustrated in FIG. 125.

In other words, for the type B extended parity check matrix of the extended LDPC code of the type B method used in the case of obtaining the punctured LDPC code of r=9/16, the information length K, the puncture length L, X1, KX1, X2, KX2, X3, KX3, Y1, KY1, and M are 38880, 1080, 29, 1080, 17, 3240, 12, 3240, 3, 31320, and 31320.

For the type B extended parity check matrix of the extended LDPC code of the type B method used in the case of obtaining the punctured LDPC code of r=10/16, the information length K, the puncture length L, X1, KX1, X2, KX2, X3, KX3, Y1, KY1, and M are 43200, 360, 73, 360, 38, 360, 14, 8280, 3, 34200, and 26280.

For the type B extended parity check matrix of the extended LDPC code of the type B method used in the case of obtaining the punctured LDPC code of r=11/16, the information length K, the puncture length L, X1, KX1, X2, KX2, X3, KX3, Y1, KY1, and M are 47520, 1440, 29, 1440, 8, 1800, 9, 5760, 3, 38520, and 23040.

For the type B extended parity check matrix of the extended LDPC code of the type B method used in the case of obtaining the punctured LDPC code of r=12/16, the information length K, the puncture length L, X1, KX1, X2, KX2, X3, KX3, Y1, KY1, and M are 51840, 1440, 24, 1440, 9, 4680, 8, 1440, 3, 44280, and 18720.

For the type B extended parity check matrix of the extended LDPC code of the type B method used in the case of obtaining the punctured LDPC code of r=13/16, the information length K, the puncture length L, X1, KX1, X2, KX2, X3, KX3, Y1, KY1, and M are 56160, 720, 34, 720, 10, 3600, 11, 4320, 3, 47520, and 13680.

For the type B extended parity check matrix of the extended LDPC code of the type B method used in the case of obtaining the punctured LDPC code of r=14/16, the information length K, the puncture length L, X1, KX1, X2, KX2, X3, KX3, Y1, KY1, and M are 60480, 720, 24, 720, 12, 1080, 10, 4680, 3, 54000, and 9360.

The parameters X1, KX1, X2, KX2, X3, KX3, Y1, KY1 and the puncture length L (parity length M=N+L−K) are set to further improve the performance (e.g., BER or the like) of the punctured LDPC code.

According to the punctured LDPC code as described above, good BER/FER and capacity (communication path capacity) can be realized.

Here, in the extended parity check matrix, the column weight (for example, X1) on the left side tends to be larger than the column weight (for example, X3) on the right side, as illustrated in FIGS. 123 and 125.

Therefore, in the extended LDPC code, bits on the left side (on the head side) are connected to a larger number of nodes (check nodes) in the Tanner graph of the extended parity check matrix. As a result, in the extended LDPC code, if an error occurs in a left bit, the influence of the error may be propagated to many nodes and prevent improvement of BER.

Therefore, for the extended LDPC code, puncturing the bits on the left side, that is, the bits on the head side of the information bit can suppress propagation of the influence of the error to many nodes and prevention of improvement of BER.

Note that, here, the bits on the head side of the extended LDPC code (the head portion of the information bits) are punctured, but the bits to be punctured are limited to the bits on the head side of the extended LDPC code.

In other words, puncturing of the extended LDPC code can be performed, for example, for arbitrary bits such as part of the parity bits of the extended LDPC code.

<Embodiment of Computer>

Next, the above-described series of processing can be executed by hardware or software. In a case of executing the series of processing by software, a program that configures the software is installed in a general-purpose computer or the like.

Figure 126:
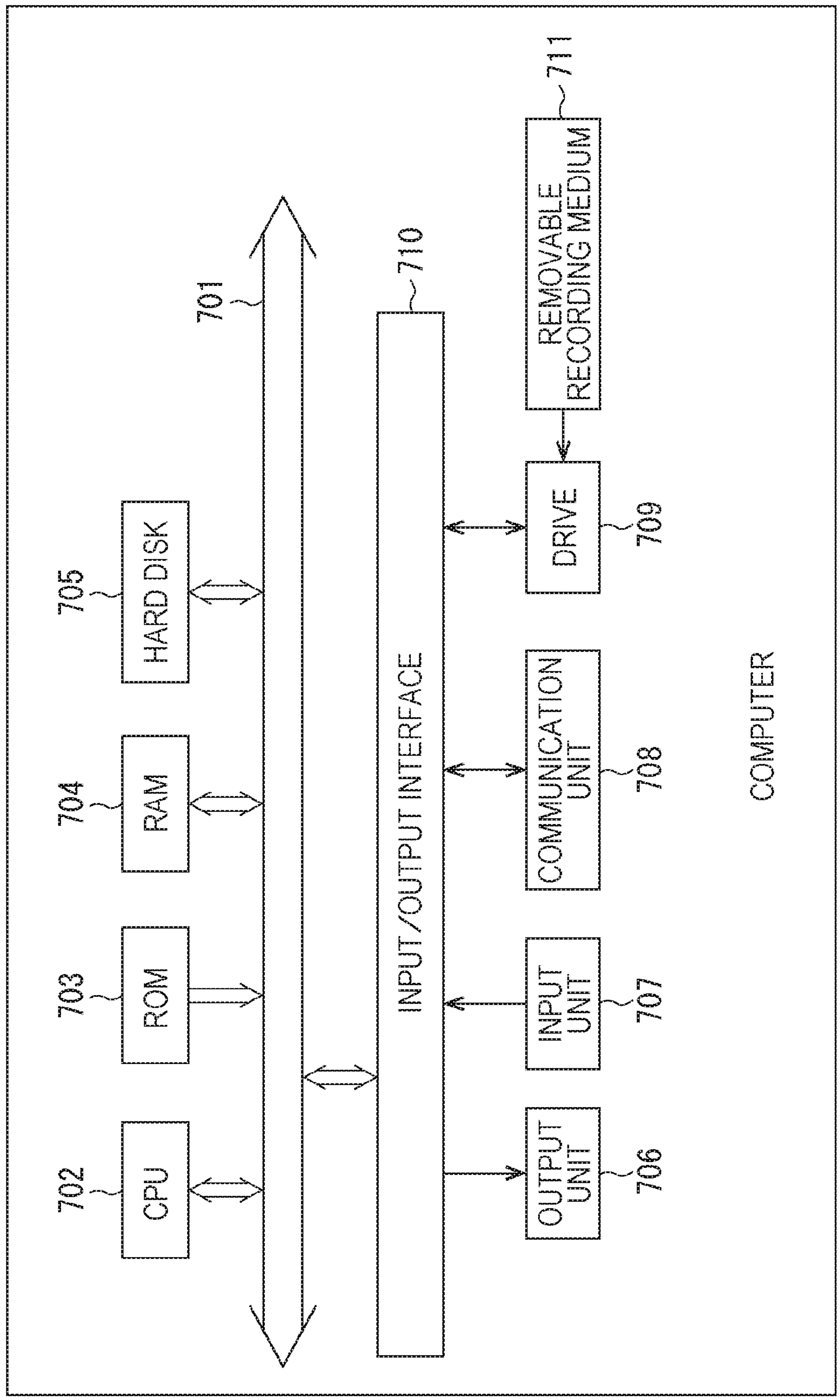

Thus, FIG. 126 illustrates a configuration example of an embodiment of a computer to which a program for executing the above-described series of processing is installed.

The program can be recorded in advance in a hard disk 705 or a ROM 703 as a recording medium built in the computer.

Alternatively, the program can be temporarily or permanently stored (recorded) on a removable recording medium 711 such as a flexible disk, a compact disc read only memory (CD-ROM), a magneto optical (MO) disk, a digital versatile disc (DVD), a magnetic disk, or a semiconductor memory. Such a removable recording medium 711 can be provided as so-called package software.

Note that the program can be installed from the above-described removable recording medium 711 to the computer, can be transferred from a download site to the computer via a satellite for digital satellite broadcasting, or can be transferred by wired means to the computer via a network such as a local area network (LAN) or the internet, and the program thus transferred can be received by a communication unit 708 and installed on the built-in hard disk 705 in the computer.

The computer incorporates a central processing unit (CPU) 702. An input/output interface 710 is connected to the CPU 702 via a bus 701. The CPU 702 executes the program stored in the read only memory (ROM) 703 according to a command when the command is input by the user by an operation of an input unit 707 including a keyboard, a mouse, a microphone, and the like via the input/output interface 710. Alternatively, the CPU 702 loads the program stored in the hard disk 705, the program transferred from the satellite or the network, received by the communication unit 708, and installed in the hard disk 705, or the program read from the removable recording medium 711 attached to a drive 709 and installed in the hard disk 705 to a random access memory (RAM) 704 and executes the program. As a result, the CPU 702 performs the processing according to the above-described flowchart or the processing performed by the configuration of the above-described block diagram. Then, the CPU 702 causes an output unit 706 including a liquid crystal display (LCD), a speaker, and the like to output the processing result, the communication unit 708 to transmit the processing result, and the hard disk 705 to record the processing result, via the input/output interface 710, as necessary, for example.

Here, processing steps describing the program for causing the computer to perform various types of processing does not necessarily need to be processed chronologically according to the order described in the flowcharts, and includes processing executed in parallel or individually (for example, processing by parallel processing or object).

Furthermore, the program may be processed by one computer or may be processed in a distributed manner by a plurality of computers. Moreover, the program may be transferred to a remote computer and executed.

Note that embodiments of the present technology are not limited to the above-described embodiments, and various modifications can be made without departing from the gist of the present technology.

For example, (the parity check matrix initial value table of) the above-described new LDPC code and GW pattern can be used for a satellite channel, a ground wave, a cable (wired channel), and another communication path 13 (FIG. 7). Moreover, the new LDPC code and GW pattern can be used for data transmission other than digital broadcasting.

Note that the effects described in the present specification are merely examples and are not limited, and other effects may be exhibited.

REFERENCE SIGNS LIST

11 Transmission device
12 Reception device
23 Parity interleaver
24 Group-wise interleaver
25 Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit
132 OFDM generation unit
151 OFDM processing unit
152 Frame management unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Edge data storage memory
301 Selector
302 Check node calculation unit
303 Cyclic shift circuit
304 Edge data storage memory
305 Selector
306 Received data memory
307 Variable node calculation unit
308 Cyclic shift circuit
309 Decoded word calculation unit
310 Received data rearranging unit
311 Decoded data rearranging unit
601 Coding processing unit
602 Storage unit
611 Coding rate setting unit
612 Initial value table reading unit
613 Parity check matrix generation unit
614 Information bit reading unit
615 Coding parity operation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse permutation unit
1002 Memory
1011 Parity deinterleaver

1101 Acquisition unit
1101 Transmission path decoding processing unit
1103 Information source decoding processing unit
1111 Output unit
1121 Recording unit

The invention claimed is:

1. A transmission device, comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 9/16, and puncture a head of the information bits of the extended LDPC code by the puncture length L to generate a punctured LDPC code with the code length N of 69120 bits and the coding rate r of 9/16, wherein the puncture length L is 1080, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309
1620 1897 3433 6033 6981 7135 9050 9376 10666 13610 14319 15116 17381 17760 20227 21874 23357 24234 24522 25925 26353 26967 28227 28506 29251 29441 30060 30986 31091
1697 2272 3024 5561 6589 7986 8685 9396 10573 12011 14098 16126 16759 16804 18059 18547 20087 20914 21286 21538 22540 24458 26648 27340 28792 28826 29864 30528 31295
89 454 483 695 2280 2835 3144 4970 6829 9853 12615 15904 16729 20640 23848 27573 29312
4591 6748 11640 13018 14778 15843 17885 18377 20224 21833 22954 23726 25488 27761 28222 29259 29778
242 710 1570 2623 3133 3257 4453 7853 16055 16408 17180 20157 20277 21448 22859 25006 31218
2004 5038 5159 8471 10803 11018 15651 17765 20995 24165 24257 24306 26164 27463 28488 28826 29380
755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524
3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668 31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579

590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

2. A transmission method, comprising:

an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 9/16, and puncturing a head of the information bits of the extended LDPC code by the puncture length L to generate a punctured LDPC code with the code length N of 69120 bits and the coding rate r of 9/16, wherein the puncture length L is 1080, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309
1620 1897 3433 6033 6981 7135 9050 9376 10666 13610 14319 15116 17381 17760 20227 21874 23357 24234 24522 25925 26353 26967 28227 28506 29251 29441 30060 30986 31091
1697 2272 3024 5561 6589 7986 8685 9396 10573 12011 14098 16126 16759 16804 18059 18547 20087 20914 21286 21538 22540 24458 26648 27340 28792 28826 29864 30528 31295
89 454 483 695 2280 2835 3144 4970 6829 9853 12615 15904 16729 20640 23848 27573 29312
4591 6748 11640 13018 14778 15843 17885 18377 20224 21833 22954 23726 25488 27761 28222 29259 29778
242 710 1570 2623 3133 3257 4453 7853 16055 16408 17180 20157 20277 21448 22859 25006 31218
2004 5038 5159 8471 10803 11018 15651 17765 20995 24165 24257 24306 26164 27463 28488 28826 29380
755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524
3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668
31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001

4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

3. A reception device, comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 9/16, and puncturing a head of the information bits of the extended LDPC code by the puncture length L to generate a punctured LDPC code with the code length N of 69120 bits and the coding rate r of 9/16, wherein the puncture length L is 1080, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309
1620 1897 3433 6033 6981 7135 9050 9376 10666 13610 14319 15116 17381 17760 20227 21874 23357 24234 24522 25925 26353 26967 28227 28506 29251 29441 30060 30986 31091
1697 2272 3024 5561 6589 7986 8685 9396 10573 12011 14098 16126 16759 16804 18059 18547 20087 20914 21286 21538 22540 24458 26648 27340 28792 28826 29864 30528 31295
89 454 483 695 2280 2835 3144 4970 6829 9853 12615 15904 16729 20640 23848 27573 29312
4591 6748 11640 13018 14778 15843 17885 18377 20224 21833 22954 23726 25488 27761 28222 29259 29778
242 710 1570 2623 3133 3257 4453 7853 16055 16408 17180 20157 20277 21448 22859 25006 31218
2004 5038 5159 8471 10803 11018 15651 17765 20995 24165 24257 24306 26164 27463 28488 28826 29380
755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524

3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668
31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

4. A reception method, comprising:

a decoding step of decoding a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 9/16, and puncturing a head of the information bits of the extended LDPC code by the puncture length L to generate a punctured LDPC code with the code length N of 69120 bits and the coding rate r of 9/16, wherein the puncture length L is 1080, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 723 781 1388 3060 4271 7280 7468 9021 9753 10185 12643 12901 13575 13809 14285 14478 15069 16467 18290 18505 19022 19472 20759 22172 27104 28752 29835 30831 31309

1620 1897 3433 6033 6981 7135 9050 9376 10666 13610 14319 15116 17381 17760 20227 21874 23357 24234 24522 25925 26353 26967 28227 28506 29251 29441 30060 30986 31091
1697 2272 3024 5561 6589 7986 8685 9396 10573 12011 14098 16126 16759 16804 18059 18547 20087 20914 21286 21538 22540 24458 26648 27340 28792 28826 29864 30528 31295
89 454 483 695 2280 2835 3144 4970 6829 9853 12615 15904 16729 20640 23848 27573 29312
4591 6748 11640 13018 14778 15843 17885 18377 20224 21833 22954 23726 25488 27761 28222 29259 29778
242 710 1570 2623 3133 3257 4453 7853 16055 16408 17180 20157 20277 21448 22859 25006 31218
2004 5038 5159 8471 10803 11018 15651 17765 20995 24165 24257 24306 26164 27463 28488 28826 29380
755 3621 4468 6694 6756 14092 14129 14400 15017 20052 22490 23042 24698 28425 28541 30045 30486
7 621 1211 4098 11752 12080 13227 15004 17359 18687 23170 23479 24501 27042 27466 28238 29909
553 6987 8440 9596 11059 11853 12271 14413 14912 16736 16982 17615 20918 22586 25528 29158 29838
6199 6384 7031 7628 19831 20096 22240 22968 23198 23811 24453 24846 24971 26366 27747 29215 30861
396 2135 2913 5364 8082 9967 13434 17293 19440 19687 23273 27397 28840 29333 29392 29683 30223
586 5373 11840 14118 14170 15300 18550 20804 22553 27032 27283 28385
217 2802 5004 12123 13048 15986 19677 21659 22175 22394 23718 24128
648 1958 3508 5127 9238 11939 13886 18348 19773 23638 26227 30729
3893 8133 8600 10046 12651 18576 18665 19209 20689 25078 28352 28524
3026 5164 13169 14079 15656 16754 17794 20083 20246 23872 26005 30450
4851 4882 5925 8452 10057 11070 11725 21083 23252 29070 30608 31252
6688 8303 8582 8764 15723 16277 17054 18883 22842 22940 23539 28970
9607 11750 15772 16971 17190 20592 23323 26419 26898 27490 29091 29399
1012 2607 7224 8102 8817 9674 9770 17979 18893 24996 29668 31315
3584 17014 31265
12000 17144 24886
6902 18241 20350
1199 2754 24431
13260 17335 22894
8888 19827 24948
9274 13805 28264
433 14041 14952
5363 10179 31256
9154 12640 25511
14335 22293 30957
8842 19987 27063
16410 16593 23534
4822 5664 17535
1475 16019 26422
7252 21940 29278
8782 11586 15476
1052 9697 24777
10191 15809 18930
2986 3032 17552
5657 11833 16001
4179 5130 31086
1758 22168 29270
3084 6131 25691
9333 11079 24520
1967 12799 16145
11440 15981 19796
468 6793 14919
9093 13955 30797
17173 25766 27476
4582 4809 10147
5963 17543 21876
14180 15874 28620
17016 24149 30556
14738 17104 17948
15634 17778 22335
728 14554 23232
5991 10705 11245
8045 23380 30580
5686 24591 26518
5591 11501 11609
4343 12894 18875
22562 24339 29973
8746 9630 26437
5229 10200 14780
24267 25130 30609
15 1383 3794
13327 24877 28195
8574 24293 26737
9336 9730 19754
2068 6710 23636
11845 12387 13435
4795 18096 25579
590 12684 13811
1349 8518 29460
963 18419 22976
3057 19095 26881
4734 6527 20320
17454 21268 24658
6077 19792 26610
4466 14709 27325
6137 15076 24579
6449 19034 19754
4950 17466 25784
1057 9565 21979
11834 14753 16610
10460 13992 25301
5035 25738 26623
2092 20670 21405
11911 21918 24068
3653 3719 21050
2096 13350 28971
15322 20225 26055
16987 23172 23946
13424 15893 25683
9347 16252 23298
2203 8155 11928
568 2107 10649
13204 17014 17260
12178 12279 21289
17601 21051 28415
2662 16039 19981
21552 25872 30771
14456 19097 28700
12805 17154 26223
1670 13112 13857
6983 15456 16578.

5. A transmission device, comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 10/16, and puncture a head of the information bits of the extended LDPC code by the puncture length L to generate a punctured LDPC code with the code length N of 69120 bits and the coding rate r of 10/16, wherein the puncture length L is 360, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128

81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208

2719 3861 6596 12408 13668 15486 16885 16977 18274 19208 19890 21346 23207 24566

169 623 1360 1514 2215 3773 13467 14433 17011 17642 17974 19056 21002 26082

1809 4208 4378 7127 8992 9253 13095 14428 20298 20434 20780 22453 23987 24226 3750 5548 5627 11806 12055 12600 16367 19283 20279 23674 23859 24746 25047 25557

626 989 3029 3501 9868 11097 11829 14550 18865 19686 20277 20679 22667 23024

66 468 9319 10107 12086 12575 14287 15673 17399 19430 21403 23712 25071 26139 5890 7144 8092 9954 10405 12492 14034 14770 16442 18975 19293 19963 24493 25001

5242 5386 5857 6353 16616 18682 19482 20494 20865 21691 22128 23279 24524 25858

313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773

7180 8463 10630 11065 13125 15606 15615 16108 16806 17007 21027 23775 23872 25603

2544 4045 4102 4379 4977 9300 9816 11806 14082 14953 20047 21810 24398 26233

5608 6955 7100 7354 8443 13176 13715 14311 17707 19197 19199 19549 19778 25688 7204 8079 9865 13251 14247 14416 15848 17260 19621 22165 22584 24251 24445 24668

812 2157 6111 6800 7428 8121 8209 10540 15043 15915 20957 23054 24932 26228

738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953

884 1173 5946 6802 7126 8073 9725 12993 13284 14460 18413 19355 20788 22183

1523 2486 2507 2513 2887 3775 4748 4983 8397 10526 15292 20542 24554 26120

415 920 1483 2585 7547 9312 9463 9762 10763 11681 12495

13553 16626 20550

8510 14430 18465

8516 11383 15056

5788 8873 12241

3576 4705 13247

7913 15707 20264

4994 16076 24518

3118 14498 26083

13530 19421 22760

1268 9435 12503

5430 6784 9179

19982 22263 25877

4800 9769 20997

3614 4723 10452

10818 17002 18966

20536 22129 25754

4386 11862 21876

8556 12401 20631

625 3186 20530

213 1157 11180

20874 20939 23730

7210 7835 20578

1688 8640 17771

10436 10992 19787

9947 11250 15184

5660 10592 21566

1096 11572 24822

7144 19336 24754

862 15406 22500

2671 16002 17029

3960 7516 14638

16601 17840 21707

3795 5088 22317

12646 13728 22927

5142 5473 20644

15959 16640 21629

884 4142 14642

8025 9929 19307

12368 13927 21189

1874 8772 12530

4188 10407 22338

1754 17998 18329

9307 17615 20181

3017 3095 24365

1812 11208 21889

4866 16991 19462

11251 14300 20871

7825 13396 21596

7895 10014 13628

1835 6842 8973
536 2005 14500
11035 14258 16465
10330 17828 23837
2215 14775 17613
13464 16717 18077
21737 24089 25823
12163 16025 22009
10733 11651 14422
1397 10954 11495
12972 13143 14664
3125 6046 18565
615 21505 21948
3758 11341 22714
17956 25056 25311
3113 17145 22344
15975 20969 21484
13465 14838 17582
7220 8973 13474
881 3386 22042
12855 20216 26257
941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

6. A transmission method, comprising:

an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 10/16, and puncturing a head of the information bits of the extended LDPC code by the puncture length L to generate a punctured LDPC code with the code length N of 69120 bits and the coding rate r of 10/16, wherein the puncture length L is 360, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128
81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208
2719 3861 6596 12408 13668 15486 16885 16977 18274 19208 19890 21346 23207 24566
169 623 1360 1514 2215 3773 13467 14433 17011 17642 17974 19056 21002 26082
1809 4208 4378 7127 8992 9253 13095 14428 20298 20434 20780 22453 23987 24226 3750 5548 5627 11806 12055 12600 16367 19283 20279 23674 23859 24746 25047 25557
626 989 3029 3501 9868 11097 11829 14550 18865 19686 20277 20679 22667 23024
66 468 9319 10107 12086 12575 14287 15673 17399 19430 21403 23712 25071 26139 5890 7144 8092 9954 10405 12492 14034 14770 16442 18975 19293 19963 24493 25001
5242 5386 5857 6353 16616 18682 19482 20494 20865 21691 22128 23279 24524 25858
313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773
7180 8463 10630 11065 13125 15606 15615 16108 16806 17007 21027 23775 23872 25603
2544 4045 4102 4379 4977 9300 9816 11806 14082 14953 20047 21810 24398 26233
5608 6955 7100 7354 8443 13176 13715 14311 17707 19197 19199 19549 19778 25688 7204 8079 9865 13251 14247 14416 15848 17260 19621 22165 22584 24251 24445 24668
812 2157 6111 6800 7428 8121 8209 10540 15043 15915 20957 23054 24932 26228
738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953
884 1173 5946 6802 7126 8073 9725 12993 13284 14460 18413 19355 20788 22183
1523 2486 2507 2513 2887 3775 4748 4983 8397 10526 15292 20542 24554 26120

415 920 1483 2585 7547 9312 9463 9762 10763 11681 12495
13553 16626 20550
8510 14430 18465
8516 11383 15056
5788 8873 12241
3576 4705 13247
7913 15707 20264
4994 16076 24518
3118 14498 26083
13530 19421 22760
1268 9435 12503
5430 6784 9179
19982 22263 25877
4800 9769 20997
3614 4723 10452
10818 17002 18966
20536 22129 25754
4386 11862 21876
8556 12401 20631
625 3186 20530
213 1157 11180
20874 20939 23730
7210 7835 20578
1688 8640 17771
10436 10992 19787
9947 11250 15184
5660 10592 21566
1096 11572 24822
7144 19336 24754
862 15406 22500
2671 16002 17029
3960 7516 14638
16601 17840 21707
3795 5088 22317
12646 13728 22927
5142 5473 20644
15959 16640 21629
884 4142 14642
8025 9929 19307
12368 13927 21189
1874 8772 12530
4188 10407 22338
1754 17998 18329
9307 17615 20181
3017 3095 24365
1812 11208 21889
4866 16991 19462
11251 14300 20871
7825 13396 21596
7895 10014 13628
1835 6842 8973
536 2005 14500
11035 14258 16465
10330 17828 23837
2215 14775 17613
13464 16717 18077
21737 24089 25823
12163 16025 22009
10733 11651 14422
1397 10954 11495
12972 13143 14664
3125 6046 18565
615 21505 21948
3758 11341 22714
17956 25056 25311
3113 17145 22344
15975 20969 21484
13465 14838 17582
7220 8973 13474
881 3386 22042
12855 20216 26257
941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

7. A reception device comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 10/16, and puncturing a head of the information bits of the extended LDPC code by the puncture length L to generate a punctured LDPC code with the code length N of 69120 bits and the coding rate r of 10/16, wherein the puncture length L is 360, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129

21590 21632 22158 22215 24094 24212 24794 25222 25420 25603 25664 25996 26128
81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208
2719 3861 6596 12408 13668 15486 16885 16977 18274 19208 19890 21346 23207 24566
169 623 1360 1514 2215 3773 13467 14433 17011 17642 17974 19056 21002 26082
1809 4208 4378 7127 8992 9253 13095 14428 20298 20434 20780 22453 23987 24226 3750 5548 5627 11806 12055 12600 16367 19283 20279 23674 23859 24746 25047 25557
626 989 3029 3501 9868 11097 11829 14550 18865 19686 20277 20679 22667 23024
66 468 9319 10107 12086 12575 14287 15673 17399 19430 21403 23712 25071 26139 5890 7144 8092 9954 10405 12492 14034 14770 16442 18975 19293 19963 24493 25001
5242 5386 5857 6353 16616 18682 19482 20494 20865 21691 22128 23279 24524 25858
313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773
7180 8463 10630 11065 13125 15606 15615 16108 16806 17007 21027 23775 23872 25603
2544 4045 4102 4379 4977 9300 9816 11806 14082 14953 20047 21810 24398 26233
5608 6955 7100 7354 8443 13176 13715 14311 17707 19197 19199 19549 19778 25688 7204 8079 9865 13251 14247 14416 15848 17260 19621 22165 22584 24251 24445 24668
812 2157 6111 6800 7428 8121 8209 10540 15043 15915 20957 23054 24932 26228
738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953
884 1173 5946 6802 7126 8073 9725 12993 13284 14460 18413 19355 20788 22183
1523 2486 2507 2513 2887 3775 4748 4983 8397 10526 15292 20542 24554 26120
415 920 1483 2585 7547 9312 9463 9762 10763 11681 12495 13553 16626 20550
8510 14430 18465
8516 11383 15056
5788 8873 12241
3576 4705 13247
7913 15707 20264
4994 16076 24518
3118 14498 26083
13530 19421 22760
1268 9435 12503
5430 6784 9179
19982 22263 25877
4800 9769 20997
3614 4723 10452
10818 17002 18966
20536 22129 25754
4386 11862 21876
8556 12401 20631
625 3186 20530
213 1157 11180
20874 20939 23730
7210 7835 20578
1688 8640 17771
10436 10992 19787
9947 11250 15184
5660 10592 21566
1096 11572 24822
7144 19336 24754
862 15406 22500
2671 16002 17029
3960 7516 14638
16601 17840 21707
3795 5088 22317
12646 13728 22927
5142 5473 20644
15959 16640 21629
884 4142 14642
8025 9929 19307
12368 13927 21189
1874 8772 12530
4188 10407 22338
1754 17998 18329
9307 17615 20181
3017 3095 24365
1812 11208 21889
4866 16991 19462
11251 14300 20871
7825 13396 21596
7895 10014 13628
1835 6842 8973
536 2005 14500
11035 14258 16465
10330 17828 23837
2215 14775 17613
13464 16717 18077
21737 24089 25823
12163 16025 22009
10733 11651 14422
1397 10954 11495
12972 13143 14664
3125 6046 18565
615 21505 21948
3758 11341 22714
17956 25056 25311
3113 17145 22344
15975 20969 21484
13465 14838 17582
7220 8973 13474
881 3386 22042
12855 20216 26257
941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973

9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

8. A reception method, comprising:

a decoding step of decoding a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 10/16, and puncturing a head of the information bits of the extended LDPC code by the puncture length L to generate a punctured LDPC code with the code length N of 69120 bits and the coding rate r of 10/16, wherein the puncture length L is 360, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 1055 1093 1449 1943 2474 5197 5324 5399 5809 5871 5986 6481 6517 6556 7054 7204 7255 7490 7896 7995 8800 9152 9935 10103 10371 10825 11160 11317 11358 12140 12153 12498 12659 12712 13420 14364 14399 14599 14634 14809 15482 15568 15674 16622 17057 17516 17574 17837 18057 18389 18407 18545 18705 18746 18870 18916 18920 19697 20368 21129 21590 21632 22158 22215 24094 24212 24794 25222 25420 25603 25664 25996 26128
81 304 396 569 1957 2369 2690 4168 4639 5648 5763 7884 8264 8897 9728 10653 10909 11928 13291 13329 14072 14117 14717 17315 17816 18188 19843 20008 22247 22374 22967 23724 24183 24598 25027 25092 25514 26208
2719 3861 6596 12408 13668 15486 16885 16977 18274 19208 19890 21346 23207 24566
169 623 1360 1514 2215 3773 13467 14433 17011 17642 17974 19056 21002 26082
1809 4208 4378 7127 8992 9253 13095 14428 20298 20434 20780 22453 23987 24226 3750 5548 5627 11806 12055 12600 16367 19283 20279 23674 23859 24746 25047 25557
626 989 3029 3501 9868 11097 11829 14550 18865 19686 20277 20679 22667 23024
66 468 9319 10107 12086 12575 14287 15673 17399 19430 21403 23712 25071 26139 5890 7144 8092 9954 10405 12492 14034 14770 16442 18975 19293 19963 24493 25001
5242 5386 5857 6353 16616 18682 19482 20494 20865 21691 22128 23279 24524 25858
313 2411 4482 6753 8342 11309 14487 16553 19496 24232 24625 24628 24924 25393 497 1752 4483 9956 11882 12334 15614 16292 17482 18987 22693 22871 22937 23870 182 1650 2350 4222 10158 10896 11890 16027 16536 18146 18581 18773 19801 19897 554 2967 3235 4240 6797 7789 10047 11659 15364 16620 17355 19815 22071 25773
7180 8463 10630 11065 13125 15606 15615 16108 16806 17007 21027 23775 23872 25603
2544 4045 4102 4379 4977 9300 9816 11806 14082 14953 20047 21810 24398 26233
5608 6955 7100 7354 8443 13176 13715 14311 17707 19197 19199 19549 19778 25688 7204 8079 9865 13251 14247 14416 15848 17260 19621 22165 22584 24251 24445 24668
812 2157 6111 6800 7428 8121 8209 10540 15043 15915 20957 23054 24932 26228
738 1649 3062 5366 9829 11100 13814 14403 15308 15718 16158 20510 20909 26012 2672 4219 7466 7792 8541 11303 11789 12279 16631 20442 21410 23495 25657 26231 4054 4681 7292 9560 10612 13078 13352 13781 14724 16253 16711 18710 22710 25953
884 1173 5946 6802 7126 8073 9725 12993 13284 14460 18413 19355 20788 22183
1523 2486 2507 2513 2887 3775 4748 4983 8397 10526 15292 20542 24554 26120
415 920 1483 2585 7547 9312 9463 9762 10763 11681 12495
13553 16626 20550
8510 14430 18465
8516 11383 15056
5788 8873 12241
3576 4705 13247
7913 15707 20264
4994 16076 24518
3118 14498 26083
13530 19421 22760
1268 9435 12503
5430 6784 9179
19982 22263 25877
4800 9769 20997
3614 4723 10452
10818 17002 18966
20536 22129 25754
4386 11862 21876
8556 12401 20631
625 3186 20530
213 1157 11180
20874 20939 23730
7210 7835 20578
1688 8640 17771
10436 10992 19787
9947 11250 15184
5660 10592 21566
1096 11572 24822
7144 19336 24754
862 15406 22500
2671 16002 17029
3960 7516 14638
16601 17840 21707

3795 5088 22317
12646 13728 22927
5142 5473 20644
15959 16640 21629
884 4142 14642
8025 9929 19307
12368 13927 21189
1874 8772 12530
4188 10407 22338
1754 17998 18329
9307 17615 20181
3017 3095 24365
1812 11208 21889
4866 16991 19462
11251 14300 20871
7825 13396 21596
7895 10014 13628
1835 6842 8973
536 2005 14500
11035 14258 16465
10330 17828 23837
2215 14775 17613
13464 16717 18077
21737 24089 25823
12163 16025 22009
10733 11651 14422
1397 10954 11495
12972 13143 14664
3125 6046 18565
615 21505 21948
3758 11341 22714
17956 25056 25311
3113 17145 22344
15975 20969 21484
13465 14838 17582
7220 8973 13474
881 3386 22042
12855 20216 26257
941 1363 19432
2344 16404 21337
216 5137 9491
8273 9255 17237
3197 21882 22368
3444 6273 17754
4923 6611 8984
13117 15167 20405
9307 12429 18727
16549 18161 18706
3886 13747 21359
3008 9398 21655
6364 7595 14973
9953 15334 17951
15766 16690 18959
7433 12301 13985
1897 9883 10722
16884 20279 21278
6288 7765 16140
2453 10023 14296
2814 7983 12688
6937 11324 20529
2804 21569 24703
877 13777 14460
2099 5537 24372
7349 15181 20610.

9. A transmission device, comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 11/16, and puncture a head of the information bits of the extended LDPC code by the puncture length L to generate a punctured LDPC code with the code length N of 69120 bits and the coding rate r of 11/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104
1223 1343 1582 2389 2457 2524 4278 5155 5309 6801 6848 6856 7504 9555 10582 11127 12596 14665 16067 17209 18124 18945 19359 19836 20717 21026 21042 21752 22822
1252 2410 4061 4847 6319 6912 8847 9724 11029 12296 13360 13534 14120 14581 15402 15619 15988 16861 17114 17389 18708 19641 20523 21198 21857 21989 22282 22364 22982
509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713
152 1158 1338 1983 3287 5798 11794 16716
156 532 1476 12617 14920 15466 15781 18998
3677 7934 11473 17794 18208 18276 19678 21229
3820 4864 6235 8097 12654 17762 20954 21584
3342 10355 10565 11032 14395 16956 20922 20989 22452
531 2662 4931 8679 10369 16527 17238 18168 21983
880 3029 9775 11071 12791 17778 19893 20173 22001
41 427 8138 8867 10585 13703 17145 20968 22923
5145 7064 9028 12496 12966 15267 18786 21580 21897
4722 6208 8851 11104 12317 14426 16624 16947 17527
4564 5622 14577 16348 17025 17965 20354 21467 22693
5128 9887 17989 18286 19896 21227 21578 21627 22241
309 3372 3979 5902 7332 12724 14632 17135 21837
1578 3964 10409 10809 14398 16615 19847 20157 20927
405 3665 8722 10438 13662 14486 15354 17359 20035
156 2071 8916 9572 11757 15911 16290 16471 17445
473 1437 2579 6794 8780 13490 14544 17384 22603
2878 3729 6006 10209 13658 13688 15210 19288 20814
6303 7417 9343 14115 14763 14866 18480 20937 22400
2222 3789 9713 10357 11478 12332 13077 17563 19102
7108 7496 7815
1001 3587 4275

1632 7412 10427
6519 17926 22479
1858 14652 15718
12029 15919 16890
16773 17303 22849
6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993
1618 9423 11897
8257 9434 14576
818 10982 21831
6716 10597 22631
13476 18975 22617
3382 3550 3616
4401 12899 16087
10381 11637 21054
4874 12524 22481
7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786
401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

10. A transmission method, comprising:

an encoding step of performing LDPC coding for information bits with an information length $K=N\times r$ to generate an extended LDPC code having parity bits with a parity length $M=N+L-K$ on a basis of an extended parity check matrix having rows and columns each extended by a puncture length L with respect to a parity check matrix of an LDPC code with a code length N of 69120 bits and a coding rate r of 11/16, and puncturing a head of the information bits of the extended LDPC code by the puncture length L to generate a punctured LDPC code with the code length N of 69120 bits and the coding rate r of 11/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104
1223 1343 1582 2389 2457 2524 4278 5155 5309 6801 6848 6856 7504 9555 10582 11127 12596 14665 16067 17209 18124 18945 19359 19836 20717 21026 21042 21752 22822
1252 2410 4061 4847 6319 6912 8847 9724 11029 12296 13360 13534 14120 14581 15402 15619 15988 16861 17114 17389 18708 19641 20523 21198 21857 21989 22282 22364 22982
509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713
152 1158 1338 1983 3287 5798 11794 16716
156 532 1476 12617 14920 15466 15781 18998
3677 7934 11473 17794 18208 18276 19678 21229
3820 4864 6235 8097 12654 17762 20954 21584
3342 10355 10565 11032 14395 16956 20922 20989 22452
531 2662 4931 8679 10369 16527 17238 18168 21983
880 3029 9775 11071 12791 17778 19893 20173 22001
41 427 8138 8867 10585 13703 17145 20968 22923
5145 7064 9028 12496 12966 15267 18786 21580 21897
4722 6208 8851 11104 12317 14426 16624 16947 17527
4564 5622 14577 16348 17025 17965 20354 21467 22693
5128 9887 17989 18286 19896 21227 21578 21627 22241
309 3372 3979 5902 7332 12724 14632 17135 21837
1578 3964 10409 10809 14398 16615 19847 20157 20927
405 3665 8722 10438 13662 14486 15354 17359 20035
156 2071 8916 9572 11757 15911 16290 16471 17445
473 1437 2579 6794 8780 13490 14544 17384 22603
2878 3729 6006 10209 13658 13688 15210 19288 20814
6303 7417 9343 14115 14763 14866 18480 20937 22400
2222 3789 9713 10357 11478 12332 13077 17563 19102
7108 7496 7815
1001 3587 4275
1632 7412 10427
6519 17926 22479
1858 14652 15718
12029 15919 16890
16773 17303 22849
6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993
1618 9423 11897
8257 9434 14576
818 10982 21831
6716 10597 22631
13476 18975 22617
3382 3550 3616
4401 12899 16087
10381 11637 21054
4874 12524 22481
7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786

401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

11. A reception device, comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 11/16, and puncturing a head of the information bits of the extended LDPC code by the puncture length L to generate a punctured LDPC code with the code length N of 69120 bits and the coding rate r of 11/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104
1223 1343 1582 2389 2457 2524 4278 5155 5309 6801 6848 6856 7504 9555 10582 11127 12596 14665 16067 17209 18124 18945 19359 19836 20717 21026 21042 21752 22822
1252 2410 4061 4847 6319 6912 8847 9724 11029 12296 13360 13534 14120 14581 15402 15619 15988 16861 17114 17389 18708 19641 20523 21198 21857 21989 22282 22364 22982
509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713
152 1158 1338 1983 3287 5798 11794 16716
156 532 1476 12617 14920 15466 15781 18998
3677 7934 11473 17794 18208 18276 19678 21229
3820 4864 6235 8097 12654 17762 20954 21584
3342 10355 10565 11032 14395 16956 20922 20989 22452
531 2662 4931 8679 10369 16527 17238 18168 21983
880 3029 9775 11071 12791 17778 19893 20173 22001
41 427 8138 8867 10585 13703 17145 20968 22923
5145 7064 9028 12496 12966 15267 18786 21580 21897
4722 6208 8851 11104 12317 14426 16624 16947 17527
4564 5622 14577 16348 17025 17965 20354 21467 22693
5128 9887 17989 18286 19896 21227 21578 21627 22241
309 3372 3979 5902 7332 12724 14632 17135 21837
1578 3964 10409 10809 14398 16615 19847 20157 20927
405 3665 8722 10438 13662 14486 15354 17359 20035
156 2071 8916 9572 11757 15911 16290 16471 17445
473 1437 2579 6794 8780 13490 14544 17384 22603
2878 3729 6006 10209 13658 13688 15210 19288 20814
6303 7417 9343 14115 14763 14866 18480 20937 22400
2222 3789 9713 10357 11478 12332 13077 17563 19102
7108 7496 7815
1001 3587 4275
1632 7412 10427
6519 17926 22479
1858 14652 15718
12029 15919 16890
16773 17303 22849
6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993
1618 9423 11897
8257 9434 14576
818 10982 21831
6716 10597 22631
13476 18975 22617
3382 3550 3616
4401 12899 16087
10381 11637 21054
4874 12524 22481

7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786
401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

12. A reception method, comprising:

a decoding step of decoding a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 11/16, and puncturing a head of the information bits of the extended LDPC code by the puncture length L to generate a punctured LDPC code with the code length N of 69120 bits and the coding rate r of 11/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 181 407 507 574 986 3461 3978 5481 5541 6632 7366 7812 10132 10562 11339 12012 12047 13394 13453 13607 14180 14222 15025 15265 16371 19936 21147 21946 22104
1223 1343 1582 2389 2457 2524 4278 5155 5309 6801 6848 6856 7504 9555 10582 11127 12596 14665 16067 17209 18124 18945 19359 19836 20717 21026 21042 21752 22822
1252 2410 4061 4847 6319 6912 8847 9724 11029 12296 13360 13534 14120 14581 15402 15619 15988 16861 17114 17389 18708 19641 20523 21198 21857 21989 22282 22364 22982
509 817 3340 3463 3554 3680 4723 4990 5203 6341 7416 8547 9335 9554 11650 11696 12329 12880 13558 15241 16023 19332 19627 20327 20747 21521 21548 21915 23026 2399 10875 11990 14797 15518 16878 17409 18713
152 1158 1338 1983 3287 5798 11794 16716
156 532 1476 12617 14920 15466 15781 18998
3677 7934 11473 17794 18208 18276 19678 21229
3820 4864 6235 8097 12654 17762 20954 21584
3342 10355 10565 11032 14395 16956 20922 20989 22452
531 2662 4931 8679 10369 16527 17238 18168 21983
880 3029 9775 11071 12791 17778 19893 20173 22001
41 427 8138 8867 10585 13703 17145 20968 22923
5145 7064 9028 12496 12966 15267 18786 21580 21897
4722 6208 8851 11104 12317 14426 16624 16947 17527
4564 5622 14577 16348 17025 17965 20354 21467 22693
5128 9887 17989 18286 19896 21227 21578 21627 22241
309 3372 3979 5902 7332 12724 14632 17135 21837
1578 3964 10409 10809 14398 16615 19847 20157 20927
405 3665 8722 10438 13662 14486 15354 17359 20035
156 2071 8916 9572 11757 15911 16290 16471 17445
473 1437 2579 6794 8780 13490 14544 17384 22603
2878 3729 6006 10209 13658 13688 15210 19288 20814
6303 7417 9343 14115 14763 14866 18480 20937 22400
2222 3789 9713 10357 11478 12332 13077 17563 19102
7108 7496 7815
1001 3587 4275
1632 7412 10427
6519 17926 22479
1858 14652 15718
12029 15919 16890
16773 17303 22849

6685 13898 21270
8654 17902 19817
1132 8820 12498
12628 17215 22138
11600 20211 21633
1882 13193 15136
5366 6007 20235
445 721 5052
7141 13800 14466
2630 10410 22797
8623 12644 18354
4711 13411 14398
1840 2393 14235
11036 12167 13764
6645 14543 16056
6796 9875 20601
3267 10865 22488
3669 7936 23010
9339 14110 20104
20710 20895 22725
33 14635 18029
11691 12078 22200
4107 4975 12925
10758 15566 19392
5225 16150 18508
6263 7778 8532
5179 15850 18204
4744 6609 18715
2209 2280 13101
4164 7362 13011
2181 3775 22906
7261 16280 21555
2292 3280 18005
8131 8172 17993
1618 9423 11897
8257 9434 14576
818 10982 21831
6716 10597 22631
13476 18975 22617
3382 3550 3616
4401 12899 16087
10381 11637 21054
4874 12524 22481
7646 12589 13207
11508 13081 16437
539 10709 17795
4381 7927 8274
5922 17172 22500
8346 18095 19510
4115 8461 8543
3174 9486 13873
16636 17880 22075
6437 7026 19403
2895 3846 7504
17850 18094 22504
39 1023 4016
9827 18301 20741
6284 17898 18281
6880 7161 14561
4267 4489 17400
8732 9098 9918
3571 13312 21831
9288 18244 21910
962 6209 21638
757 13506 16953
7013 14029 19726
3471 4856 14929
12833 15640 18135
4460 14554 19565
3319 10819 20100
4507 11131 18073
4799 13990 14574
12834 16423 18991
775 6998 16156
8705 10867 12208
7689 10301 18614
1129 3669 19584
1572 15210 15776
8188 16113 17683
2676 2718 15453
1554 9803 21328
11326 14891 19148
12538 17074 17620
9891 11688 18890
6917 7432 11935
1655 6011 8786
401 4841 7862
9673 12687 12996
8926 9052 15628
12950 15481 20893
1983 11799 14656
15841 19048 22631
10656 14043 21118
9409 12661 19289
1223 10236 11907
5166 11334 12207
2722 5274 13250
16270 18853 22099
3284 3551 19928
4221 5197 21994.

13. A transmission device, comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 12/16, and puncture a head of the information bits of the extended LDPC code by the puncture length L to generate a punctured LDPC code with the code length N of 69120 bits and the coding rate r of 12/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709

92 518 886 1241 1985 3717 4551 5603 5660 6135 6289 7673 8561 9131 10696 12502 12622 16116 16393 17047 17276 17385 17530 18319

3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366

1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

14. A transmission method, comprising:

an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 12/16, and puncturing a head of the information bits of the extended LDPC code by the puncture length L to generate a punctured LDPC code with the code length N of 69120 bits and the coding rate r of 12/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051

3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

15. A reception device, comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 12/16, and puncturing a head of the information bits of the extended LDPC code by the puncture length L to generate a punctured LDPC code with the code length N of 69120 bits and the coding rate r of 12/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267

7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124
7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

16. A reception method, comprising:

a decoding step of decoding a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 12/16, and puncturing a head of the information bits of the extended LDPC code by the puncture length L to generate a punctured LDPC code with the code length N of 69120 bits and the coding rate r of 12/16, wherein the puncture length L is 1440, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 330 411 3491 4358 6894 7626 7908 8440 8583 8893 9474 9797 10096 10362 10983 11052 11362 13629 15949 17180 17570 18276 18479 18709
92 518 886 1241 1985 3717 4551 5603 5660 6135 6289 7673 8561 9131 10696 12502 12622 16116 16393 17047 17276 17385 17530 18319
3835 4245 4266 4660 5124 5752 6941 7226 9567 10535 10683 11121 11133 12870 12890 13071 13483 14505 14621 15635 16796 17182 18137 18533
246 278 1372 1375 3310 4063 5772 6608 7148 7556 9163 9987 12372 13088 14285 14717 15332 15837 16133 17218 17281 17866 18191 18715
250 404 1678 1880 2976 9499 10098 16873 17499
2750 4039 6967 7944 9470 10489 13031 16531 17802
1969 8795 9748 10986 12091 13689 14149 15234 17491
15 938 1041 1568 2661 4716 9610 12044 13611
506 582 1226 10267 12119 12627 12804 14945 15990
2981 3117 6440 9328 10248 14456 14537 14848 17260
3974 5285 6749 8416 11660 14438 16866 17015 17540
2674 4009 8588 8980 13441 13737 17002 17883 18206
706 864 2160 2447 7030 8426 14026 14731 16168
35 7216 8061 8957 10365 11155 14423 16401 17881
341 6628 8603 10144 12392 13995 15279 16862 18647
4232 5759 7083 7332 8926 10541 13509 17469 17869
3828 5070 10035 11742 13774 14223 16539 17450 18448
3714 4169 4544 11804 13291 13833 14562 14617
8043 15234 15795 17254 17536 17747 17850 18233
256 1757 3185 4801 5938 10312 11776 13927
2282 3183 8447 8785 11634 13487 16438 16997
5455 7080 18338
1578 2325 7516
9359 11759 14492
7232 12241 12613
668 8190 13233
12467 13384 15060
386 2157 9904
5885 6048 14125
7134 11274 11921
3030 8867 18400
2338 12359 15961
11122 14960 16911
7588 11119 15027
11478 12339 17177
12101 17115 18616
7883 9353 12000
4987 8569 14267
7210 16294 17762
8998 16284 18672
2863 7353 17654
3589 10429 17477
5050 7048 14572
595 4761 9395
5233 7612 13676
10195 13671 14157
11291 16637 18372
2822 12303 16095
5768 11676 14829
962 10151 10256
9449 13976 15801
5374 10717 16530
4638 8023 14930
5858 14776 15260
94 11285 18094
7539 13433 18531
2654 7000 14902
3840 10265 12505
543 10907 15173
10495 11202 14564
1962 10124 14608
8051 11898 16741
8746 17301 18275
3003 8396 11232
5473 15276 18683
7500 7557 13326
3322 5199 11865
9485 10560 15107
2889 3333 9954
9314 13707 15806
1198 4228 13810
2244 5079 6923
7023 9459 14596
4864 10315 14801
1813 2462 10484
1779 6024 7514
1802 3036 3405
1041 17513 18602
2678 13247 14648
5362 6619 12258
1073 2980 9670
6711 7673 8389
305 626 11930
1155 11340 12916
10257 16423 18383
2868 2917 6051
3582 11370 13064
9437 10493 17105
8433 10172 14418
5072 10759 18282
9350 10215 13356
8735 10626 13832
447 3546 6748
4791 6431 13984
14685 15861 18276
3417 6880 6952
3686 11273 18378
7713 13496 17931
5672 14537 15769
5245 6104 8536
8826 14691 18270
14 2287 14479
804 7971 14854
5144 14846 16855
5583 11851 14959
3442 5821 7934
7409 8041 14131
7136 10816 15289
2891 7561 17637
830 5084 8218
11014 13734 18575
616 1852 16021
3916 11391 12153
2822 10431 14737
11828 12710 15901
2667 3628 9831
3686 9009 16332
3853 11370 14687
2954 11806 15435
630 10449 14949
5688 7073 9892
8355 8836 15124

7496 15377 17853
1276 12342 15912
12811 13085 14388
2213 6630 12543
2159 2494 17346
7963 9161 15586
12111 13883 14339
9474 10172 11329
5602 9682 15366
1341 5648 7137
1278 4880 6384
324 10143 10307
7249 7352 7858
10519 12696 16989
1602 11908 12581
9602 15495 18614
11404 17113 18381
7645 8651 15695
7822 8285 10271
1033 4208 9911
2207 9222 9332
4310 13247 17947.

17. A transmission device comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 13/16, and puncture a head of the information bits of the extended LDPC code by the puncture length L to generate a punctured LDPC code with the code length N of 69120 bits and the coding rate r of 13/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797
619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221
1019 4104 5268 6216 7349 8114 9859 10301 13243 13280
530 2246 2414 4631 7301 9274 11647 11955 12663 13059
225 1018 1227 1386 2976 5536 7036 9033 10482 11576
155 288 2183 5745 6947 7659 8563 12346 12776 13071
2936 4854 5083 6930 8031 8840 9501 10569 12062 12785
761 1147 1428 3452 6428 7136 8806 11070 11132 13593
105 327 686 1946 7023 7505 8874 9358 10188 11019
900 2187 4699 4709 6856 9172 10564 10620 10807 12587
814 2253 2888 3712 4821 6146 7520 8520 10634 12429
1951 2950 6379 6558 9818 10037 12323 12395 13215 13303
321 509 1740 1805 5535 6157 7599 10242 10789 10842 11807
4844 6162 6540 7013 8168 8964 10131 12001 12314 13272 13613
3069 4192 5360 6248 6300 7571 7696 9078 11191 12736 13000
3067 3686 6457 6513 7575 8865 9865 10057 10384 12313 13466
3214 3337 4170 9141 9774 10144 10677 10695 10835 11540 12763
1020 1255 2334 3516 4343 5855 7543 12602 12813 12824 12976
164 912 2118 2333 6185 6388 8618 9845 10148 12053 12814
455 1237 2193 5199 6165 8111 8601 9106 10342 11794 11916
109 340 861 1533 5419 5672 7900 9716 9801 10558 12811
568 1697 2215 4035 5214 6064 8014 8636 9041 10325 11454
3549 3748 4382 5543 8120 8263 8379 10975 12382 12431 13300
2245 2385 5775 6138 6820 7317 7766 8784 8825 10630 11347
1 764 1246
8416 9350 12397
4398 8000 13020
1759 10963 13372
1727 3642 8661
5775 7113 11020
8133 9981 10268
3836 8363 12622
5134 9058 11769
4193 7425 13240
7688 10194 12725
7184 11537 12001
1132 3867 7888
3349 3560 11041
433 4314 12967
1325 8438 13658
1564 5528 13539
7513 7780 10869
2809 7959 8955
627 973 10661
5784 7363 8211
1399 8638 10768
4052 5964 12722
6122 6568 13381
2363 7714 13655
3978 6190 11156
5205 9738 13515
3776 8673 12354
7177 7281 8465
2114 2703 7660
611 5174 11514
5376 10178 11815
3688 5062 6739
2048 4347 10802
3789 6898 7545
1304 2603 8694
2676 4586 5579
1483 3524 13577

4179 9669 12851
1974 2005 7057
4837 8554 10690
2608 5607 7049
3985 4904 8642
457 3834 6501
919 3965 13431
7608 11280 12007
2125 2272 4433
2604 7647 9544
4816 6187 6900
7415 10693 13516
3696 7466 7842
6825 9764 11248
2944 6360 10110
2603 4914 7295
3518 10197 13369
2485 11345 11582
2480 5024 10865
6315 8241 10363
9876 10783 13097
3823 4143 11519
2283 4680 6439
10575 10854 13354
294 3722 13646
5846 11230 12312
3733 10629 10856
5999 8633 13366
897 2524 10312
5189 5888 6414
602 3574 7904
5547 6009 12900
594 4594 12908
487 8047 10049
6469 8337 11707
2063 2892 4231
7606 9280 10764
2505 2634 11612
1939 6442 11951
2683 6599 10738
3045 4592 7602
2169 7629 11263
2125 4160 9613
5168 6441 7231
4567 6151 11032
2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114
1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

18. A transmission method, comprising:

an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 13/16, and puncturing a head of the information bits of the extended LDPC code by the puncture length L to generate a punctured LDPC code with the code length N of 69120 bits and the coding rate r of 13/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797

619 684 862 1287 1474 2056 2659 2763 2992 3392 3677 3730

3910 3953 6246 6252 6724 6961 7167 7456 7574 8225 8521 8628 9152

9564 9933 10045 10086 10433 10822 12375 13001 13221

1019 4104 5268 6216 7349 8114 9859 10301 13243 13280

530 2246 2414 4631 7301 9274 11647 11955 12663 13059

225 1018 1227 1386 2976 5536 7036 9033 10482 11576
155 288 2183 5745 6947 7659 8563 12346 12776 13071
2936 4854 5083 6930 8031 8840 9501 10569 12062 12785
761 1147 1428 3452 6428 7136 8806 11070 11132 13593
105 327 686 1946 7023 7505 8874 9358 10188 11019
900 2187 4699 4709 6856 9172 10564 10620 10807 12587
814 2253 2888 3712 4821 6146 7520 8520 10634 12429
1951 2950 6379 6558 9818 10037 12323 12395 13215 13303
321 509 1740 1805 5535 6157 7599 10242 10789 10842 11807
4844 6162 6540 7013 8168 8964 10131 12001 12314 13272 13613
3069 4192 5360 6248 6300 7571 7696 9078 11191 12736 13000
3067 3686 6457 6513 7575 8865 9865 10057 10384 12313 13466
3214 3337 4170 9141 9774 10144 10677 10695 10835 11540 12763
1020 1255 2334 3516 4343 5855 7543 12602 12813 12824 12976
164 912 2118 2333 6185 6388 8618 9845 10148 12053 12814
455 1237 2193 5199 6165 8111 8601 9106 10342 11794 11916
109 340 861 1533 5419 5672 7900 9716 9801 10558 12811
568 1697 2215 4035 5214 6064 8014 8636 9041 10325 11454
3549 3748 4382 5543 8120 8263 8379 10975 12382 12431 13300
2245 2385 5775 6138 6820 7317 7766 8784 8825 10630 11347
1 764 1246
8416 9350 12397
4398 8000 13020
1759 10963 13372
1727 3642 8661
5775 7113 11020
8133 9981 10268
3836 8363 12622
5134 9058 11769
4193 7425 13240
7688 10194 12725
7184 11537 12001
1132 3867 7888
3349 3560 11041
433 4314 12967
1325 8438 13658
1564 5528 13539
7513 7780 10869
2809 7959 8955
627 973 10661
5784 7363 8211
1399 8638 10768
4052 5964 12722
6122 6568 13381
2363 7714 13655
3978 6190 11156
5205 9738 13515
3776 8673 12354
7177 7281 8465
2114 2703 7660
611 5174 11514
5376 10178 11815
3688 5062 6739
2048 4347 10802
3789 6898 7545
1304 2603 8694
2676 4586 5579
1483 3524 13577
4179 9669 12851
1974 2005 7057
4837 8554 10690
2608 5607 7049
3985 4904 8642
457 3834 6501
919 3965 13431
7608 11280 12007
2125 2272 4433
2604 7647 9544
4816 6187 6900
7415 10693 13516
3696 7466 7842
6825 9764 11248
2944 6360 10110
2603 4914 7295
3518 10197 13369
2485 11345 11582
2480 5024 10865
6315 8241 10363
9876 10783 13097
3823 4143 11519
2283 4680 6439
10575 10854 13354
294 3722 13646
5846 11230 12312
3733 10629 10856
5999 8633 13366
897 2524 10312
5189 5888 6414
602 3574 7904
5547 6009 12900
594 4594 12908
487 8047 10049
6469 8337 11707
2063 2892 4231
7606 9280 10764
2505 2634 11612
1939 6442 11951
2683 6599 10738
3045 4592 7602
2169 7629 11263
2125 4160 9613
5168 6441 7231
4567 6151 11032
2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450

6322 8338 12504
5601 7794 11455
745 7445 9911
3064 8406 9114
1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

19. A reception device, comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 13/16, and puncturing a head of the information bits of the extended LDPC code by the puncture length L to generate a punctured LDPC code with the code length N of 69120 bits and the coding rate r of 13/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797
619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221
1019 4104 5268 6216 7349 8114 9859 10301 13243 13280
530 2246 2414 4631 7301 9274 11647 11955 12663 13059
225 1018 1227 1386 2976 5536 7036 9033 10482 11576
155 288 2183 5745 6947 7659 8563 12346 12776 13071
2936 4854 5083 6930 8031 8840 9501 10569 12062 12785
761 1147 1428 3452 6428 7136 8806 11070 11132 13593
105 327 686 1946 7023 7505 8874 9358 10188 11019
900 2187 4699 4709 6856 9172 10564 10620 10807 12587
814 2253 2888 3712 4821 6146 7520 8520 10634 12429
1951 2950 6379 6558 9818 10037 12323 12395 13215 13303
321 509 1740 1805 5535 6157 7599 10242 10789 10842 11807
4844 6162 6540 7013 8168 8964 10131 12001 12314 13272 13613
3069 4192 5360 6248 6300 7571 7696 9078 11191 12736 13000
3067 3686 6457 6513 7575 8865 9865 10057 10384 12313 13466
3214 3337 4170 9141 9774 10144 10677 10695 10835 11540 12763
1020 1255 2334 3516 4343 5855 7543 12602 12813 12824 12976
164 912 2118 2333 6185 6388 8618 9845 10148 12053 12814
455 1237 2193 5199 6165 8111 8601 9106 10342 11794 11916
109 340 861 1533 5419 5672 7900 9716 9801 10558 12811
568 1697 2215 4035 5214 6064 8014 8636 9041 10325 11454
3549 3748 4382 5543 8120 8263 8379 10975 12382 12431 13300
2245 2385 5775 6138 6820 7317 7766 8784 8825 10630 11347
1 764 1246
8416 9350 12397
4398 8000 13020
1759 10963 13372
1727 3642 8661
5775 7113 11020
8133 9981 10268
3836 8363 12622
5134 9058 11769
4193 7425 13240
7688 10194 12725
7184 11537 12001
1132 3867 7888
3349 3560 11041
433 4314 12967
1325 8438 13658
1564 5528 13539
7513 7780 10869
2809 7959 8955
627 973 10661
5784 7363 8211
1399 8638 10768
4052 5964 12722
6122 6568 13381

2363 7714 13655
3978 6190 11156
5205 9738 13515
3776 8673 12354
7177 7281 8465
2114 2703 7660
611 5174 11514
5376 10178 11815
3688 5062 6739
2048 4347 10802
3789 6898 7545
1304 2603 8694
2676 4586 5579
1483 3524 13577
4179 9669 12851
1974 2005 7057
4837 8554 10690
2608 5607 7049
3985 4904 8642
457 3834 6501
919 3965 13431
7608 11280 12007
2125 2272 4433
2604 7647 9544
4816 6187 6900
7415 10693 13516
3696 7466 7842
6825 9764 11248
2944 6360 10110
2603 4914 7295
3518 10197 13369
2485 11345 11582
2480 5024 10865
6315 8241 10363
9876 10783 13097
3823 4143 11519
2283 4680 6439
10575 10854 13354
294 3722 13646
5846 11230 12312
3733 10629 10856
5999 8633 13366
897 2524 10312
5189 5888 6414
602 3574 7904
5547 6009 12900
594 4594 12908
487 8047 10049
6469 8337 11707
2063 2892 4231
7606 9280 10764
2505 2634 11612
1939 6442 11951
2683 6599 10738
3045 4592 7602
2169 7629 11263
2125 4160 9613
5168 6441 7231
4567 6151 11032
2182 11214 11654
913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114
1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

20. A reception method comprising:

a decoding step of decoding a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 13/16, and puncturing a head of the information bits of the extended LDPC code by the puncture length L to generate a punctured LDPC code with the code length N of 69120 bits and the coding rate r of 13/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 304 1155 1377 1827 1836 2446 2501 3051 3188 4108 4530 5343 5634 5740 5801 6666 6808 6981 7428 7590 7607 8183 8509 8650 9028 9305 9559 9574 9760 10373 10545 11325 12089 12797

619 684 862 1287 1474 2056 2659 2763 2992 3392 3677 3730 3910 3953 6246 6252 6724 6961 7167 7456 7574 8225 8521 8628 9152 9564 9933 10045 10086 10433 10822 12375 13001 13221

1019 4104 5268 6216 7349 8114 9859 10301 13243 13280

530 2246 2414 4631 7301 9274 11647 11955 12663 13059

225 1018 1227 1386 2976 5536 7036 9033 10482 11576

155 288 2183 5745 6947 7659 8563 12346 12776 13071

2936 4854 5083 6930 8031 8840 9501 10569 12062 12785

761 1147 1428 3452 6428 7136 8806 11070 11132 13593

105 327 686 1946 7023 7505 8874 9358 10188 11019

900 2187 4699 4709 6856 9172 10564 10620 10807 12587

814 2253 2888 3712 4821 6146 7520 8520 10634 12429

1951 2950 6379 6558 9818 10037 12323 12395 13215 13303

321 509 1740 1805 5535 6157 7599 10242 10789 10842 11807

4844 6162 6540 7013 8168 8964 10131 12001 12314 13272 13613

3069 4192 5360 6248 6300 7571 7696 9078 11191 12736 13000

3067 3686 6457 6513 7575 8865 9865 10057 10384 12313 13466

3214 3337 4170 9141 9774 10144 10677 10695 10835 11540 12763

1020 1255 2334 3516 4343 5855 7543 12602 12813 12824 12976

164 912 2118 2333 6185 6388 8618 9845 10148 12053 12814

455 1237 2193 5199 6165 8111 8601 9106 10342 11794 11916

109 340 861 1533 5419 5672 7900 9716 9801 10558 12811

568 1697 2215 4035 5214 6064 8014 8636 9041 10325 11454

3549 3748 4382 5543 8120 8263 8379 10975 12382 12431 13300

2245 2385 5775 6138 6820 7317 7766 8784 8825 10630 11347

1 764 1246

8416 9350 12397

4398 8000 13020

1759 10963 13372

1727 3642 8661

5775 7113 11020

8133 9981 10268

3836 8363 12622

5134 9058 11769

4193 7425 13240

7688 10194 12725

7184 11537 12001

1132 3867 7888

3349 3560 11041

433 4314 12967

1325 8438 13658

1564 5528 13539

7513 7780 10869

2809 7959 8955

627 973 10661

5784 7363 8211

1399 8638 10768

4052 5964 12722

6122 6568 13381

2363 7714 13655

3978 6190 11156

5205 9738 13515

3776 8673 12354

7177 7281 8465

2114 2703 7660

611 5174 11514

5376 10178 11815

3688 5062 6739

2048 4347 10802

3789 6898 7545

1304 2603 8694

2676 4586 5579

1483 3524 13577

4179 9669 12851

1974 2005 7057

4837 8554 10690

2608 5607 7049

3985 4904 8642

457 3834 6501

919 3965 13431

7608 11280 12007

2125 2272 4433

2604 7647 9544

4816 6187 6900

7415 10693 13516

3696 7466 7842

6825 9764 11248

2944 6360 10110

2603 4914 7295

3518 10197 13369

2485 11345 11582

2480 5024 10865

6315 8241 10363

9876 10783 13097

3823 4143 11519

2283 4680 6439

10575 10854 13354

294 3722 13646

5846 11230 12312

3733 10629 10856

5999 8633 13366

897 2524 10312

5189 5888 6414

602 3574 7904

5547 6009 12900

594 4594 12908

487 8047 10049

6469 8337 11707

2063 2892 4231

7606 9280 10764

2505 2634 11612

1939 6442 11951

2683 6599 10738

3045 4592 7602

2169 7629 11263

2125 4160 9613

5168 6441 7231

4567 6151 11032

2182 11214 11654

913 9030 9365
4860 9569 10501
1583 1623 9168
3296 3809 5844
6709 8830 11368
416 7418 10470
5877 6929 11494
4092 4126 7074
977 3600 6355
235 2621 8531
5741 7411 7557
5294 5369 9277
7684 9178 12485
1169 10902 12122
9396 11316 13450
6322 8338 12504
5601 7794 11455
745 7445 9911
3064 8406 9114
1605 3147 6804
7176 9669 13133
2097 6181 11855
2944 13046 13181
8914 9340 12810
750 1632 11186
6936 8295 9144
3865 5887 7071
1047 7002 12363
6362 6703 13643
2888 10113 12118
485 1235 11122
87 2688 8518
4947 8986 10644
3107 4620 11394
1660 9311 13621
2582 3179 3434
4711 7616 7899
4836 9786 10614
2390 6465 12707
2017 8607 11126
1560 4877 7165
3952 7813 11321
3312 5177 8900
8691 9334 9873
3849 7521 8203
957 2493 7934
5577 8832 10539
8403 11124 11991.

21. A transmission device, comprising:

an encoding unit configured to perform LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 14/16, and puncture a head of the information bits of the extended LDPC code by the puncture length L to generate a punctured LDPC code with the code length N of 69120 bits and the coding rate r of 14/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494 4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250

702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

22. A transmission method, comprising:

an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 14/16, and puncturing a head of the information bits of the extended LDPC code by the puncture length L to generate a punctured LDPC code with the code length N of 69120 bits and the coding rate r of 14/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494 4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250
702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831

7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

23. A reception device, comprising:

a decoding unit configured to decode a punctured LDPC code obtained from data transmitted by a transmission method including an encoding step of performing LDPC coding for information bits with an information length K=N×r to generate an extended LDPC code having parity bits with a parity length M=N+L−K on a basis of an extended parity check matrix having rows and columns each extended by a puncture length L with respect to a parity check matrix of an LDPC code with a code length N of 69120 bits and a coding rate r of 14/16, and puncturing a head of the information bits of the extended LDPC code by the puncture length L to generate a punctured LDPC code with the code length N of 69120 bits and the coding rate r of 14/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494 4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284

690 4731 9101
5267 8342 9269
3449 3663 4250
702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822
4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

24. A reception method, comprising:

a decoding step of decoding a punctured LDPC code obtained from data transmitted by a transmission method including an encoding step of performing LDPC coding for information bits with an information length $K=N\times r$ to generate an extended LDPC code having parity bits with a parity length $M=N+L-K$ on a basis of an extended parity check matrix having rows and columns each extended by a puncture length L with respect to a parity check matrix of an LDPC code with a code length N of 69120 bits and a coding rate r of 14/16, and puncturing a head of the information bits of the extended LDPC code by the puncture length L to generate a punctured LDPC code with the code length N of 69120 bits and the coding rate r of 14/16, wherein the puncture length L is 720, the LDPC code includes the information bits and the parity bits, the extended parity check matrix includes an information matrix portion corresponding to the information bits and a parity matrix portion corresponding to the parity bits, the information matrix portion is represented by a parity check matrix initial value table, and the parity check matrix initial value table is a table representing positions of elements of 1 of the information matrix portion for every 360 columns, and is 133 328 347 665 1125 1352 1427 1982 3132 3375 3457 3602 4780 5185 5204 5413 5666 5843 7116 7683 7834 8061 8184 8883
56 401 889 1349 1743 1948 2417 3161 4011 4152 4290 4494
4842 4968 5004 5578 5892 6019 6614 7808 8459 8817 8861 9221
862 1893 2282 3900 4835 6050 6137 6710 6817 7325 8486 9343
2003 2378 2588 2858 3621 5612 5635 6341 6997 7598 8627 9143
554 848 2015 3093 5018 5064 5618 5698 6489 7467 7629 8434
525 1285 3019 3644 4963 6320 6652 7722 7917 9107
207 690 1153 2322 3196 4207 5860 6258 8150 9015
1160 3762 4492 4649 5189 6280 7344 7635 8430 9153
1147 2480 4409 4751 4879 5040 6901 7025 8451 8636
1640 2178 2613 5260 6532 6786 8589 8674 8968 9071
52 1165 1693 1827 4936 5131 5563 5630 5854 6224
387 1068 3266 3997 4797 5726 6274 7573 7853 8964
2331 2371 2700 2905 3820 7347 7383 8227 8904 9222
337 1254 1427 3164 3460 4609 5086 5988 6344 8488
265 3192 4475 4883 6348 7186 7954 8399 8903 9087
488 1470 1523 2721 3068 3896 4213 4703 5781 7102
1621 3341 3976 5826 5860 7270 8417 8461 8572 9081
275 994 1191 3128 5021 5225 5422 7037 7188 9313
5408 6043 6963
5813 7048 8668
3367 4689 4896
1658 1772 4567
2449 3534 7307
709 8052 9067
1124 5537 8109
2744 3942 9051
1842 4791 5524
1191 3213 3795
558 4465 6543
358 4655 6509
3668 6516 7506
2135 7173 7366
2110 4704 8851
400 2138 2536
395 936 7068
5107 8481 8775
230 4342 6750
4593 6945 8163
1388 2724 4660
2238 3414 4278
1991 6441 8121
521 3689 7902
2373 3843 9170
2925 4788 9242
877 3370 6012
185 6299 8523
5484 5582 5781
1285 5236 9284
690 4731 9101
5267 8342 9269
3449 3663 4250
702 1008 1594
265 568 7726
2617 5932 8994
848 2101 8383
3082 7591 7835
6692 8754 9003
353 2886 9094
2489 7489 8593
5364 7442 7803
2501 8161 8618
2280 3720 4510
8259 8586 8965
3310 7597 7923
4076 5690 7098
2064 3725 8927
154 1002 4149
1949 4629 6903
2812 6719 7152
3071 4313 7218
6701 7163 9350
731 884 1672
602 4669 5106
1350 6050 6209
753 6616 6996
6338 7271 7303
240 5378 6557
5851 6043 8074
909 2763 4793
4713 6006 8014
2650 2925 8334
3331 5914 8615
4581 5372 7014
101 6172 7516
3168 4580 7558
937 2329 4948
3703 5869 7011
2283 3846 9056
263 670 5737
5678 6489 8368
2200 7315 7359
3861 8650 8787
5596 5845 7448
3202 5557 8929
130 4356 7568
2623 5595 6507
1411 3816 6382
1472 2075 5712
1080 3409 7312
843 6145 6777
140 6801 7935
3740 6526 8318
2315 4459 5817
4417 4532 7802
6213 8376 8824
7851 7984 8001
1417 5088 7946
4310 4528 6605
3709 6203 8354
1858 2302 5822

4962 7131 9345
87 520 2944
47 3039 3175
4477 8278 8437
56 1731 9022
4299 4883 8444
1597 8566 9053
2935 4954 5831
7022 7764 9221
3908 6155 9124
3142 4291 4991
4412 5229 7208
1101 6114 6274
5363 6935 9306
2932 3679 4006
1535 4191 8684
939 5726 5998
4197 5641 6541
1336 6956 7769
1836 4068 6159
1348 9169 9332
2761 5368 7317
578 1586 5476
715 5461 7704
3101 3883 3948
2758 3732 9327
252 2448 7977
1837 1843 6458
679 2958 3603
3351 4441 7019
1894 3862 3866
2125 6820 8363
4007 4499 8615
1216 4378 7954
271 2417 3619
1680 5576 7728
3016 9055 9297
3653 4578 7466
2483 4179 7344
1548 1941 5207
1136 2490 5042
712 6437 7028
3375 3386 9021
834 4502 9071
3432 5045 5365
2856 3201 4665
2501 5130 9272
148 7815 9016
4426 9035 9341
952 3773 6231
1933 2508 6601
349 1735 4919
1900 4294 6577
2978 7431 7446
2237 4602 7900
4215 5920 8916
2766 5768 7854
180 4691 5337.

* * * * *